US011022881B2

(12) United States Patent
Honda et al.

(10) Patent No.: US 11,022,881 B2
(45) Date of Patent: Jun. 1, 2021

(54) PHOTOACID GENERATOR, CHEMICALLY AMPLIFIED RESIST COMPOSITION, AND PATTERNING PROCESS

(71) Applicant: Shin-Etsu Chemical Co., Ltd., Tokyo (JP)

(72) Inventors: Kazuya Honda, Joetsu (JP); Takayuki Fujiwara, Joetsu (JP); Masaki Ohashi, Joetsu (JP); Kazuhiro Katayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 142 days.

(21) Appl. No.: 16/379,032

(22) Filed: Apr. 9, 2019

(65) Prior Publication Data

US 2019/0324367 A1 Oct. 24, 2019

(30) Foreign Application Priority Data

Apr. 18, 2018 (JP) ............................ JP2018-079867

(51) Int. Cl.
*G03F 7/004* (2006.01)
*G03F 7/039* (2006.01)

(52) U.S. Cl.
CPC .......... *G03F 7/0045* (2013.01); *G03F 7/0392* (2013.01)

(58) Field of Classification Search
CPC .... G03F 7/0045; G03F 7/0392; G03F 7/0048; G03F 7/11; G03F 7/0397; G03F 7/0046
USPC ...................................................... 430/270.1
See application file for complete search history.

(56) References Cited

U.S. PATENT DOCUMENTS

| | | | |
|---|---|---|---|
| 7,511,169 | B2 | 3/2009 | Ohsawa et al. |
| 8,034,547 | B2 | 10/2011 | Tsubaki et al. |
| 8,227,183 | B2 | 7/2012 | Tsubaki et al. |
| 2018/0088464 | A1 | 3/2018 | Fujiwara et al. |

FOREIGN PATENT DOCUMENTS

| | | | |
|---|---|---|---|
| JP | 2007-145797 | A | 6/2007 |
| JP | 2008-281974 | A | 11/2008 |
| JP | 2008-281975 | A | 11/2008 |
| JP | 4554665 | B2 | 9/2010 |
| JP | 201852832 | A | 4/2018 |

OTHER PUBLICATIONS

Office Action dated Nov. 25, 2019, issued in counterpart TW Application No. 108113123 (5 pages).
Dammel et al., "193 nm Immersion Lithography—Taking the Plunge", Journal of Photopolymer Science and Technology, published by The Technical Association of Photopolymers, Japan, 2004, vol. 17, No. 4, p. 587, cited in Specification (18 pages).

*Primary Examiner* — Caleen O Sullivan
(74) *Attorney, Agent, or Firm* — Westerman, Hattori, Daniels & Adrian, LLP

(57) ABSTRACT

A photoacid generator having formula (1a) is provided. A chemically amplified resist composition comprising the PAG forms a pattern of rectangular profile with a good balance of sensitivity and LWR when processed by photolithography using ArF excimer laser, EB or EUV.

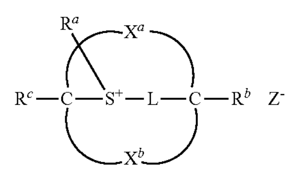

(1a)

12 Claims, 14 Drawing Sheets

PHOTOACID GENERATOR, CHEMICALLY AMPLIFIED RESIST COMPOSITION, AND PATTERNING PROCESS

CROSS-REFERENCE TO RELATED APPLICATION

This non-provisional application claims priority under 35 U.S.C. § 119(a) on Patent Application No. 2018-079867 filed in Japan on Apr. 18, 2018, the entire contents of which are hereby incorporated by reference.

TECHNICAL FIELD

This invention relates to a photoacid generator, a chemically amplified resist composition comprising the same, and a patterning process using the resist composition.

BACKGROUND ART

While a number of recent efforts are being made to achieve a finer pattern rule in the drive for higher integration and operating speeds in LSI devices, DUV and EUV lithography processes are thought to hold particular promise as the next generation in microfabrication technology. In particular, photolithography using an ArF excimer laser is requisite to the micropatterning technique capable of achieving a feature size of 0.13 μm or less.

The ArF lithography started partial use from the fabrication of 130-nm node devices and became the main lithography since 90-nm node devices. Although lithography using $F_2$ laser (wavelength 157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. See Non-Patent Document 1. The ArF immersion lithography is now implemented on the commercial stage. The immersion lithography requires a resist material which is substantially insoluble in water.

In the photolithography using an ArF excimer laser (wavelength 193 nm), a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polymers of acrylic acid and derivatives thereof, norbornene-maleic anhydride alternating copolymers, polynorbornene, ring-opening metathesis polymerization (ROMP) polymers, and hydrogenated ROMP polymers have been proposed as the base resin. This choice is effective to some extent in that the transparency of a resin alone is increased.

Recently a highlight is put on the negative tone resist adapted for organic solvent development as well as the positive tone resist adapted for alkaline development. It would be desirable if a very fine hole pattern, which is not achievable with the positive tone, is resolvable through negative tone exposure. To this end, a positive resist material featuring a high resolution is subjected to organic solvent development to form a negative pattern. An attempt to double a resolution by combining two developments, alkali development and organic solvent development is under study.

As the ArF resist material for negative tone development with organic solvent, positive ArF resist compositions of the prior art design may be used. Such pattern forming processes are described in Patent Documents 1 to 3.

To meet the current rapid progress of microfabrication technology, development efforts are put on not only the process, but also the resist material. Studies have also been made on photoacid generators (PAGs). Commonly used are sulfonium salts of triphenylsulfonium cation with perfluoroalkanesulfonic acid anion. These salts generate perfluoroalkanesulfonic acids, especially perfluorooctanesulfonic acid (PFOS), which are considered problematic with respect to their non-degradability, biological concentration and toxicity. It is rather restricted to apply these salts to the resist material. Instead, PAGs capable of generating perfluorobutanesulfonic acid are currently used, but are awkward to achieve a high resolution because of substantial diffusion of the generated acid in the resist material. To address the problem, partially fluorinated alkane sulfonic acids and salts thereof are developed. For instance, Patent Document 1 refers to the prior art PAGs capable of generating α,α-difluoroalkanesulfonic acid, such as di(4-tert-butylphenyl) iodonium 1,1-difluoro-2-(1-naphthyl)ethanesulfonate and PAGs capable of generating α,α,β,β-tetrafluoroalkanesulfonic acid. Despite a reduced degree of fluorine substitution, these PAGs still have the following problems. Since they do not have a decomposable substituent group such as ester structure, they are unsatisfactory from the aspect of environmental safety due to ease of decomposition. The molecular design to change the size of alkanesulfonic acid is limited. Fluorine-containing starting reactants are expensive.

As the circuit line width is reduced, the degradation of contrast by acid diffusion becomes more serious for the resist material. The reason is that the pattern feature size is approaching the diffusion length of acid. This invites a lowering of mask fidelity and a degradation of pattern rectangularity because a dimensional shift on wafer (known as mask error factor (MEF)) relative to a dimensional shift on mask is exaggerated. Accordingly, to gain more benefits from a reduction of exposure light wavelength and an increase of lens NA, the resist material is required to increase a dissolution contrast or restrain acid diffusion, as compared with the prior art materials. One approach is to lower the bake temperature for suppressing acid diffusion and hence, improving MEF. A low bake temperature, however, inevitably leads to a low sensitivity.

Incorporating a bulky substituent or polar group into PAG is effective for suppressing acid diffusion. Patent Document 4 describes a PAG having 2-acyloxy-1,1,3,3,3-pentafluoropropane-11-sulfonic acid which is fully soluble and stable in organic solvents and allows for a wide span of molecular design. In particular, a PAG having incorporated therein a bulky substituent, 2-(1-adamantyloxy)-1,1,3,3,3-pentafluoropropane-1-sulfonic acid is characterized by slow acid diffusion. A resist composition comprising this PAG, however, is still insufficient in precise control of acid diffusion, and its lithography performance is unsatisfactory when evaluated totally in terms of MEF, pattern profile and sensitivity.

As resist patterns with high resolution are currently required, not only lithography characteristics including pattern profile, contrast, MEEF and roughness are necessary, but improvements in (surface) defects of resist patterns as developed become more requisite. The surface defects refer to all faults which are detected when the resist pattern as developed is observed from just above by a surface flaw detector (trade name KLA by KLA-Tencor Co., Ltd.). Such faults include scum, foam, debris, and bridges between resist pattern features after development. These defects form because PAG or other resist components have low solubility in casting solvent and leave undissolved residues after developer immersion.

CITATION LIST

Patent Document 1: JP-A 2008-281974
Patent Document 2: JP-A 2008-281975
Patent Document 3: JP 4554665
Patent Document 4: JP-A 2007-145797
Non-Patent Document 1: Journal of Photopolymer Science and Technology, Vol. 17, No. 4, p 587 (2004)

DISCLOSURE OF THE INVENTION

The photoacid generator (PAG) produces an acid which must satisfy many requirements including a sufficient acid strength to cleave acid labile groups in a resist material, high sensitivity, stability in the resist material during shelf storage, adequately controlled diffusion in the resist material, low volatility, minimal foreign matter left after development and resist removal, and good degradability in that it is decomposed away after the expiration of its role in lithography without imposing a load to the environment. In the case of ArF immersion lithography, minimal dissolution in water is also desirable. No resist compositions using prior art PAGs satisfy these requirements.

An object of the invention is to provide a photoacid generator, a chemically amplified resist composition comprising the photoacid generator, and a patterning process using the resist composition, wherein the composition forms a pattern of rectangular profile with a good balance of sensitivity and LWR, when processed by photolithography using high-energy radiation such as ArF excimer laser, EB or EUV as energy source.

The inventors have found that a resist composition comprising a photoacid generator in the form of an onium salt having a specific structure forms a pattern with a good balance of sensitivity and LWR, and is thus a quite effective resist material for precise micropatterning.

In one aspect, the invention provides a photoacid generator comprising a compound having the formula (1a).

(1a)

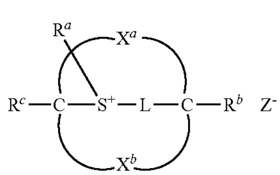

Herein $X^a$ and $X^b$ are each independently a $C_1$-$C_{30}$ divalent hydrocarbon group which may contain a heteroatom, L is a single bond or a $C_1$-$C_{30}$ divalent hydrocarbon group which may contain a heteroatom, $R^a$ is a $C_1$-$C_{30}$ monovalent hydrocarbon group which may contain a heteroatom, $R^b$ and $R^c$ are each independently hydrogen or a $C_1$-$C_{30}$ monovalent hydrocarbon group which may contain a heteroatom, $R^b$ and $R^c$ may bond together to form a ring, one or both of $R^b$ and R may bond with some carbon atoms or heteroatoms in $X^a$ or $X^b$ to form a ring, and $Z^-$ is an organic anion.

The photoacid generator is preferably a compound having the formula (1b):

(1b)

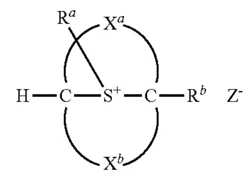

wherein $X^a$, $X^b$, $R^a$, $R^b$, and Z are as defined above.

In another aspect, the invention provides a chemically amplified resist composition comprising the photoacid generator defined above, a base resin, and an organic solvent.

Preferably, the base resin is a polymer comprising recurring units having the formula (a) and recurring units having the formula (b).

(a)

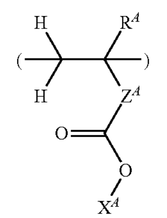

(b)

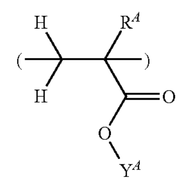

Herein $R^A$ is each independently hydrogen, fluorine, methyl or trifluoromethyl, $Z^A$ is a single bond, phenylene group, naphthylene group or (backbone)-C(=O)—O—$Z^B$—, $Z^B$ is a $C_1$-$C_{10}$ alkanediyl group which may contain a hydroxyl radical, ether bond, ester bond or lactone ring, or phenylene group or naphthylene group, $X^A$ is an acid labile group, and $Y^A$ is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

The resist composition may further comprise a photoacid generator other than the photoacid generator defined above; a quencher; and/or a surfactant which is insoluble or substantially insoluble in water and soluble in alkaline developer, and/or a surfactant which is insoluble or substantially insoluble in water and alkaline developer.

In a further aspect, the invention provides a pattern forming process comprising the steps of applying the chemically amplified resist composition defined above onto a substrate to form a resist film, exposing the resist film to high-energy radiation, and developing the exposed resist film in a developer.

Preferably, the exposure step is carried out by immersion lithography using a liquid having a refractive index of at least 1.0 between the resist film and a projection lens. More preferably, a protective film is coated on the resist film prior to the exposure step, and immersion lithography is carried out while the liquid is held between the protective film and the projection lens.

Typically, the high-energy radiation is KrF excimer laser, ArF excimer laser, EB or EUV of wavelength 3 to 15 nm.

Advantageous Effects of Invention

A resist composition comprising the inventive photoacid generator, when processed by lithography, forms a pattern with a good balance of sensitivity and LWR. It is thus a quite effective resist material for precise micropatterning.

DESCRIPTION OF THE PREFERRED EMBODIMENTS

Figure 1:
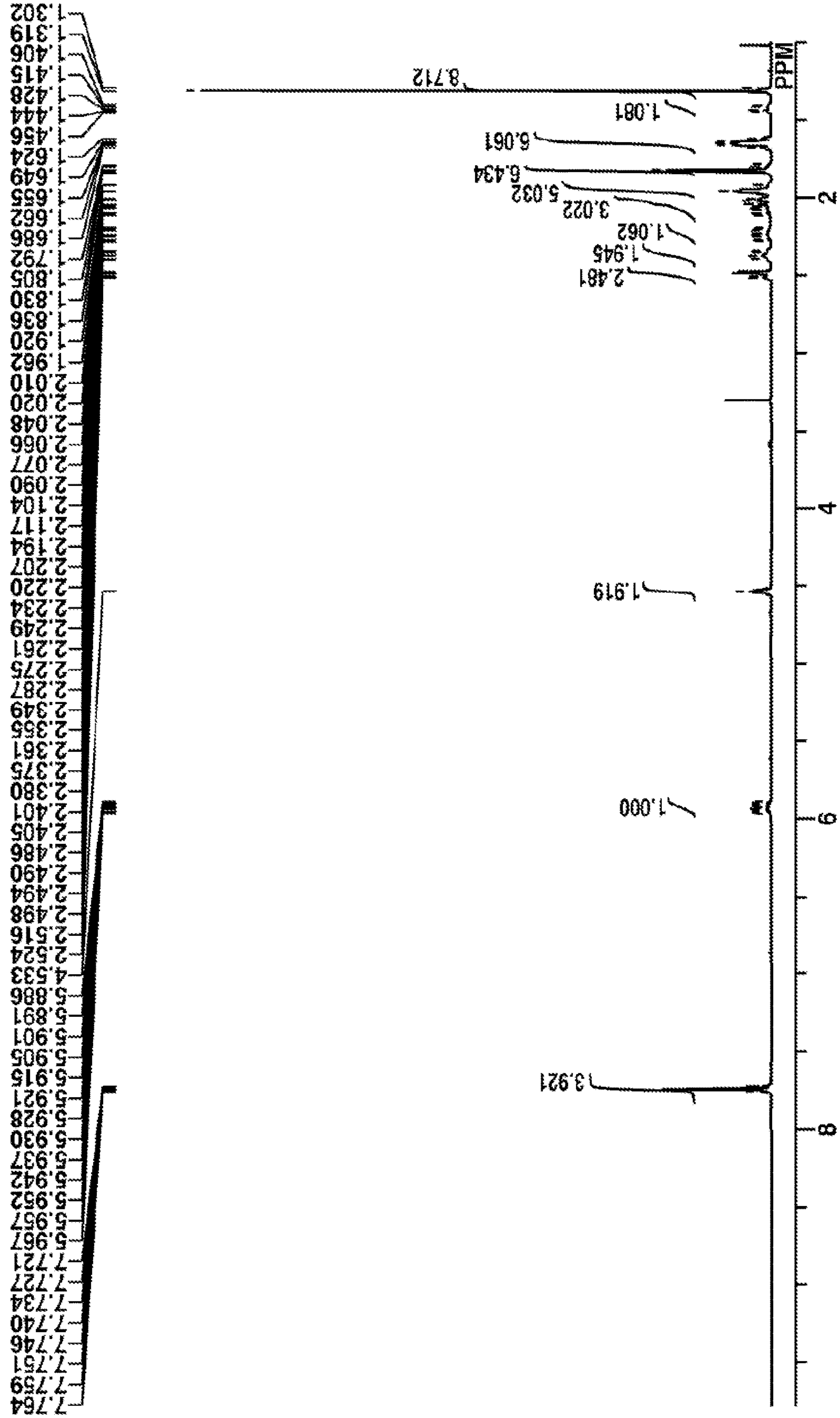
FIG. 1 is a diagram showing the $^1$H-NMR/DMSO-$d_6$ spectrum of PAG-1 in Example 1-1.

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line denotes a valence bond.

The abbreviations have the following meaning.

EB: electron beam
EUV: extreme ultraviolet
PAG: photoacid generator
PEB: post-exposure bake
LWR: line width roughness
MEF: mask error factor
MEEF: mask error enhancement factor
CDU: critical dimension uniformity The term "high-energy radiation" is intended to encompass KrF excimer laser, ArF excimer laser, EB, and EUV.

Photoacid Generator

The invention provides a photoacid generator having the formula (1a).

(1a)

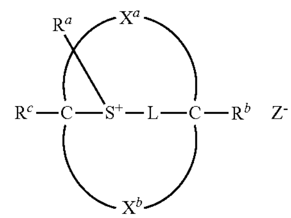

In formula (1a), $X^a$ and $X^b$ are each independently a $C_1$-$C_{30}$ divalent hydrocarbon group which may contain a heteroatom.

The divalent hydrocarbon groups represented by $X^a$ and $X^b$ may be straight, branched or cyclic. Suitable divalent hydrocarbon groups include straight or branched alkanediyl groups such as methylene, ethylene, propane-1,2-diyl, propane-1,3-diyl, butane-1,2-diyl, butane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; divalent saturated cyclic hydrocarbon groups such as cyclopentanediyl, cyclohexanediyl, norbornanediyl, and adamantanediyl; divalent unsaturated aliphatic hydrocarbon groups such as vinylene and propene-1,3-diyl; divalent aromatic hydrocarbon groups such as phenylene and naphthylene; and divalent heterocyclic groups such as thiophene-2,3-diyl.

In the divalent hydrocarbon group, one or more or even all hydrogen atoms may be substituted by a substituent containing a heteroatom such as oxygen, sulfur, nitrogen or halogen, so that the group may contain a hydroxyl, amino, cyano or haloalkyl radical.

Also in the divalent hydrocarbon group, one or more carbon atoms may be substituted by a substituent containing a heteroatom such as oxygen, sulfur, or nitrogen, so that the group may contain an ether bond, sulfide bond, carbonyl radical, ester bond, —N(R)— (wherein R is hydrogen or an optionally heteroatom-containing $C_1$-$C_{10}$ monovalent hydrocarbon group), amide bond, imino bond, sulfonyl radical, sulfinyl radical, sulfonic acid ester bond, sulfonamide bond, carbonate bond, carbamate bond, or carboxylic anhydride (—C(═O)—O—C(═O)—).

From the standpoint of availability of starting reactants, $X^a$ and $X^b$ are preferably straight alkanediyl groups or divalent aromatic hydrocarbon groups, which are unsubstituted or in which one or more hydrogen is substituted by a radical containing a heteroatom such as oxygen, sulfur, nitrogen or halogen.

In formula (1a), L is a single bond or a $C_1$-$C_{30}$ divalent hydrocarbon group which may contain a heteroatom. The divalent hydrocarbon group represented by L may be straight, branched or cyclic. Examples are the same as exemplified above for the divalent hydrocarbon groups represented by $X^a$ and $X^b$. From the standpoint of availability of starting reactants, L is preferably a single bond or a straight or branched alkanediyl group.

In formula (1a), $R^a$ is a $C_1$-$C_{30}$ monovalent hydrocarbon group which may contain a heteroatom. The monovalent hydrocarbon group represented by $R^a$ may be straight, branched or cyclic. Examples include straight or branched alkyl groups such as methyl, ethyl, n-propyl, isopropyl, n-butyl, isobutyl, sec-butyl, and tert-butyl; monovalent saturated alicyclic hydrocarbon groups such as cyclopropyl, cyclopentyl, cyclohexyl, cyclopropylmethyl, 4-methylcyclohexyl, cyclohexylmethyl, norbornyl and adamantyl; alkenyl groups such as vinyl, propenyl, butenyl, hexenyl, and cyclohexenyl; alkynyl groups such as ethynyl, butynyl, 2-cyclohexylethynyl, and 2-phenylethynyl; aryl groups such as phenyl, methylphenyl, ethylphenyl, n-propylphenyl, isopropylphenyl, n-butylphenyl, isobutylphenyl, sec-butylphenyl, tert-butylphenyl, n-pentylphenyl, n-hexylphenyl, n-heptylphenyl, n-octylphenyl, n-nonylphenyl, n-decylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, n-pentylnaphthyl, n-hexylnaphthyl, n-heptyinaphthyl, n-octylnaphthyl, n-nonylnaphthyl, n-decylnaphthyl, and azulenyl; monovalent heterocyclic groups such as thienyl, benzothienyl, pyrolyl, indolyl, and thienothienyl; aralkyl groups such as benzyl, 1-phenylethyl, and 2-phenylethyl; and arylcarbonylalkyl groups such as benzoylmethyl and 1-benzoylethyl. Of these, aryl or arylcarbonylalkyl groups are preferred as $R^a$.

In the monovalent hydrocarbon group, one or more or even all hydrogen atoms may be substituted by a substituent containing a heteroatom such as oxygen, sulfur, nitrogen or halogen, so that the group may contain a hydroxyl, nitro, amino, cyano or haloalkyl radical.

Also in the monovalent hydrocarbon group, one or more carbon atoms may be substituted by a substituent containing a heteroatom such as oxygen, sulfur, or nitrogen, so that the group may contain an ether bond, sulfide bond, carbonyl radical, ester bond, —N(R)— (wherein R is hydrogen or an optionally heteroatom-containing $C_1$-$C_{10}$ monovalent hydrocarbon group), amide bond, imino bond, sulfonyl radical, sulfinyl radical, sulfonic acid ester bond, sulfonamide bond, carbonate bond, carbamate bond, or carboxylic anhydride (—C(═O)—O—C(═O)—).

In formula (1a), $R^b$ and $R^c$ are each independently hydrogen or a $C_1$-$C_{30}$ monovalent hydrocarbon group which may contain a heteroatom. The monovalent hydrocarbon groups represented by $R^b$ and $R^c$ may be straight, branched or cyclic. Examples are the same as exemplified above for the monovalent hydrocarbon groups represented by $R^a$.

$R^b$ and $R^c$ may bond together to form a ring, or one or both of $R^b$ and $R^c$ may bond with some carbon atoms or heteroatoms in $X^a$ or $X^b$ to form a ring, typically a lactone, sultone, sultam or sulfolane ring. In the ring, one or more or even all hydrogen atoms may be substituted by a heteroatom-containing radical as mentioned above, or one or more carbon atoms may be substituted by a heteroatom-containing radical as mentioned above.

Preferably, both $R^b$ and $R^c$ are hydrogen.

In formula (1a), $Z^-$ is an organic anion. Examples include alkoxide, phenoxide, carboxylate, sulfonate, sulfinate, sulfuric monoester, amidate, sulfonamidate, bis(acyl)imidate, acylsulfonylimidate, bis(sulfonyl)imidate, and tris(sulfonyl) methide anions. Of these, carboxylate, sulfonate, bis(sulfonyl)imidate, acylsulfonylamidate, and tris(sulfonyl)methide anions are preferred.

When the inventive PAG is used in a resist composition adapted for photolithography, the organic anion Z is preferably selected from anions having the following formulae (1A) to (1D).

(1A)

(1B)

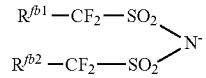

(1C)

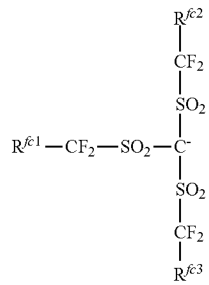

(1D)

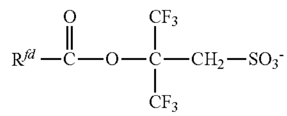

In formula (1A), $R^{fa}$ is fluorine or a $C_1$-$C_{40}$ monovalent hydrocarbon group which may contain a heteroatom. The monovalent hydrocarbon group may be straight, branched or cyclic, and examples thereof are the same as exemplified below for $R^e$ in formula (1A').

The anion of formula (1A) preferably has the following formula (1A').

(1A')

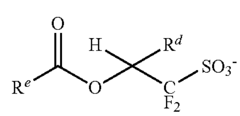

In formula (1A'), $R^d$ is hydrogen or trifluoromethyl, preferably trifluoromethyl. $R^e$ is a $C_1$-$C_{38}$ monovalent hydrocarbon group which may contain a heteroatom. The heteroatom is preferably selected from oxygen, nitrogen, sulfur and halogen, with oxygen being more preferred. The monovalent hydrocarbon group is preferably of 6 to 30 carbon atoms because a high resolution is achievable in forming fine size patterns. The monovalent hydrocarbon group may be straight, branched or cyclic. Examples include straight or branched alkyl groups such as methyl, ethyl, propyl, isopropyl, butyl, isobutyl, sec-butyl, tert-butyl, pentyl, neopentyl, cyclopentyl, hexyl, heptyl, 2-ethylhexyl, nonyl, undecyl, tridecyl, pentadecyl, heptadecyl, and icosanyl; monovalent saturated alicyclic hydrocarbon groups such as cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; monovalent unsaturated aliphatic hydrocarbon groups such as allyl and 3-cyclohexenyl; and aralkyl groups such as benzyl and diphenylmethyl. Suitable heteroatom-containing monovalent hydrocarbon groups include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. In the foregoing groups, one or more hydrogen atoms may be substituted by a substituent containing a heteroatom such as oxygen, sulfur, nitrogen or halogen, or one or more carbon atoms may be substituted by a substituent containing a heteroatom such as oxygen, sulfur or nitrogen, so that the group may contain a hydroxyl radical, cyano radical, carbonyl radical, ether bond, ester bond, sulfonic acid ester bond, carbonate bond, lactone ring, sultone ring, carboxylic anhydride or haloalkyl radical.

In formula (1B), $R^{fb1}$ and $R^{fb2}$ are each independently fluorine or a $C_1$-$C_{40}$ monovalent hydrocarbon group which may contain a heteroatom. The monovalent hydrocarbon group may be straight, branched or cyclic, and examples thereof are as exemplified above for $R^e$. $R^{fb1}$ and $R^{fb2}$ are preferably fluorine or a $C_1$-$C_4$ straight fluoroalkyl group. $R^{fb1}$ and $R^{fb2}$ may bond together to form a ring with the linkage ($—CF_2—SO_2—N^-—SO_2—CF_2—$) to which they are attached, and preferably a combination of $R^{fb1}$ and $R^{fb2}$ is fluoroethylene or fluoropropylene.

In formula (1C), $R^{fc1}$, $R^{fc2}$ and $R^{fc3}$ are each independently fluorine or a $C_1$-$C_{40}$ monovalent hydrocarbon group which may contain a heteroatom. The monovalent hydrocarbon group may be straight, branched or cyclic, and examples thereof are as exemplified above for $R^e$. Preferably $R^{fc1}$, $R^{fc2}$ and $R^{fc3}$ are fluorine or $C_1$-$C_4$ straight fluoroalkyl groups. $R^{fc1}$ and $R^{fc2}$ may bond together to form a ring with the linkage ($—CF_2—SO_2—C—SO_2—CF_2—$) to which they are attached, and preferably a combination of $R^{fc1}$ and $R^{fc2}$ is fluoroethylene or fluoropropylene.

In formula (1D), $R^{fd}$ is a $C_1$-$C_{40}$ monovalent hydrocarbon group which may contain a heteroatom. The monovalent hydrocarbon group may be straight, branched or cyclic, and examples thereof are as exemplified above for R.

The compound having the anion of formula (1D) has a sufficient acid strength to cleave acid labile groups in the resist polymer because it is free of fluorine at α-position of sulfo group, but has two trifluoromethyl groups at β-position. Thus the compound is a useful PAG.

Of the compounds having formula (1a), those compounds having the following formula (1b) are preferred.

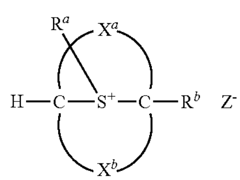

(1b)

In formula (1b), $X^a$, $X^b$, $R^a$, $R^b$, and $Z^-$ are as defined above. $R^b$ is preferably hydrogen.

For the compound having formula (1a), exemplary structures excluding $R^a$ are given below, but not limited thereto. Herein $R^a$ is as defined above.

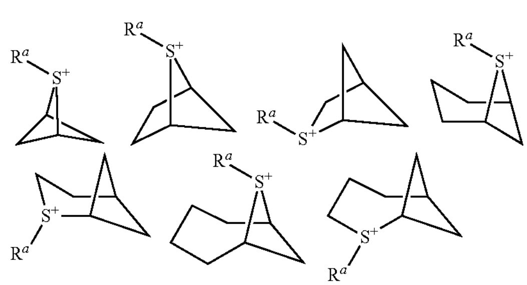

-continued

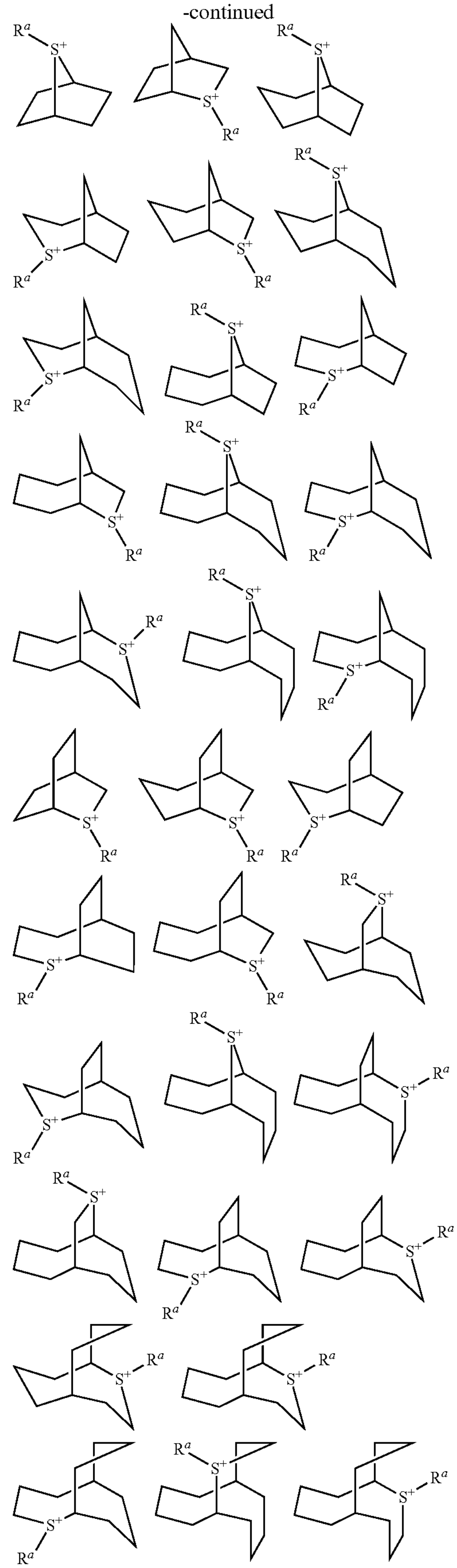

-continued
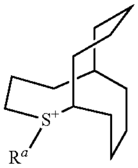
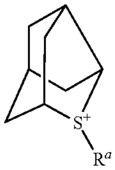
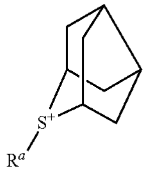
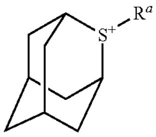
The cation moiety of the compound having formula (1a) is exemplified by the following structures, but not limited thereto.
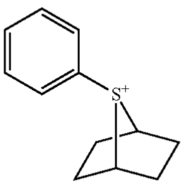
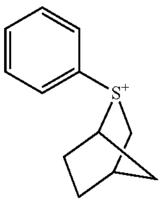
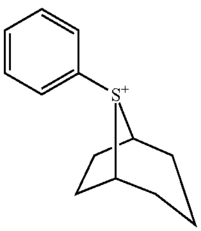
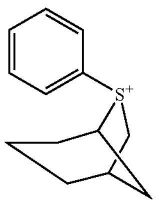
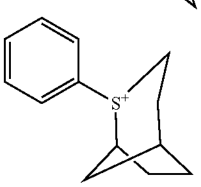
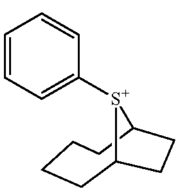
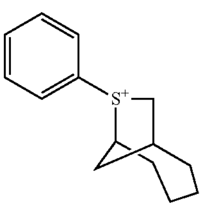
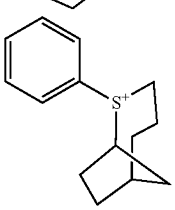
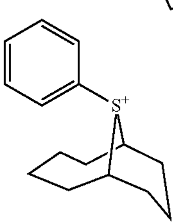
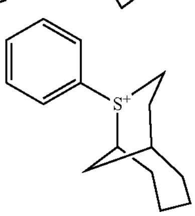
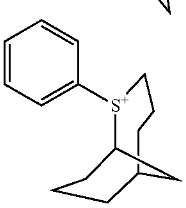
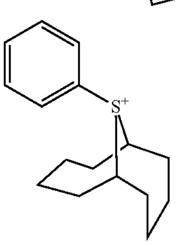
-continued
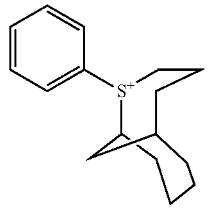
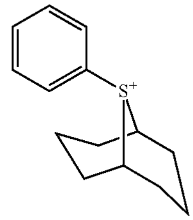
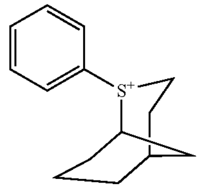
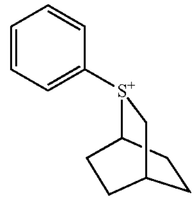
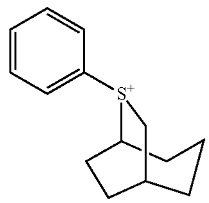
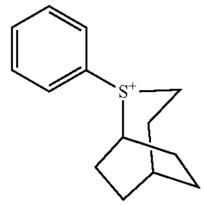
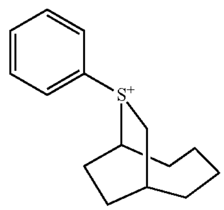
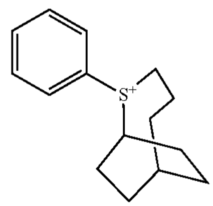
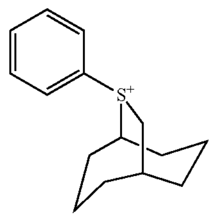
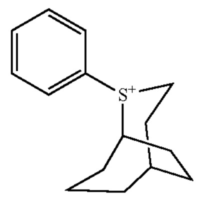
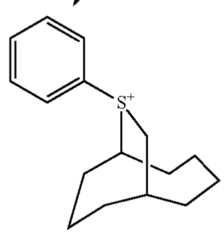
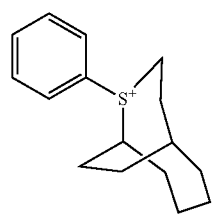
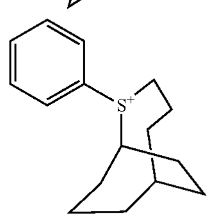
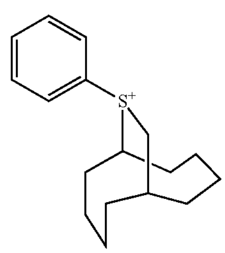
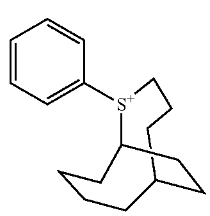
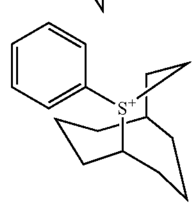

-continued
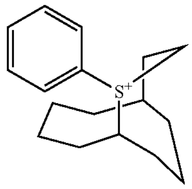
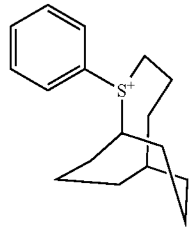
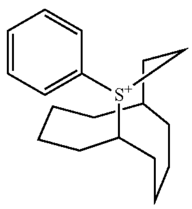
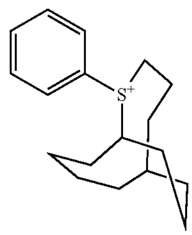
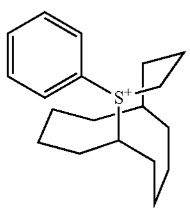
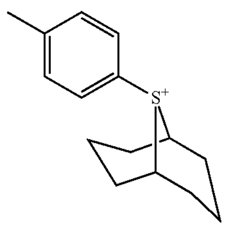
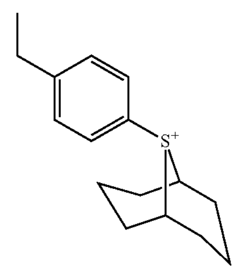
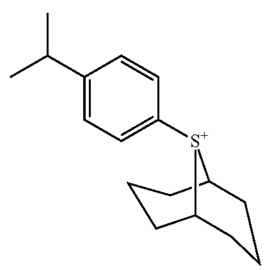
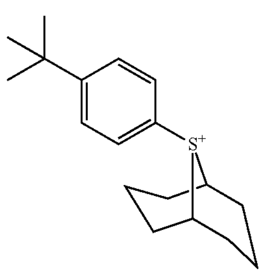
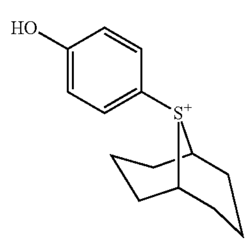
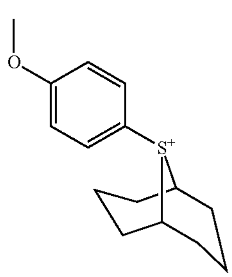
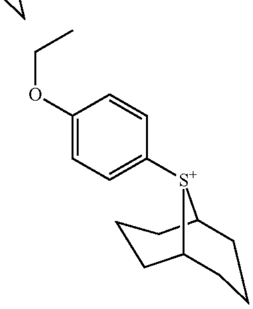
-continued
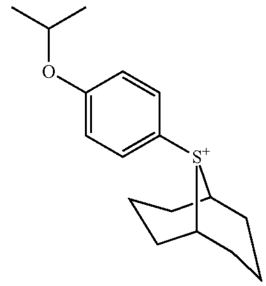
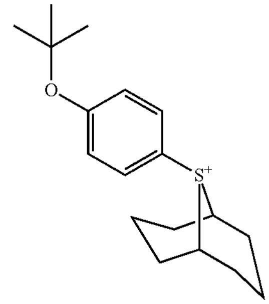
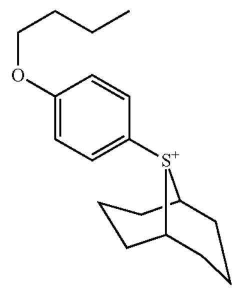
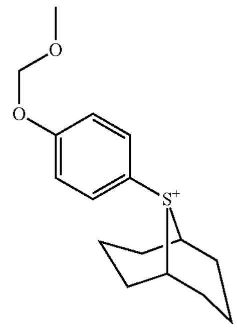
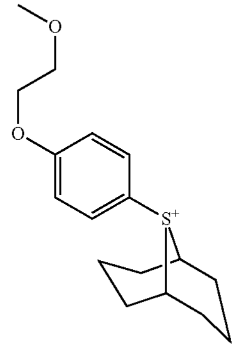
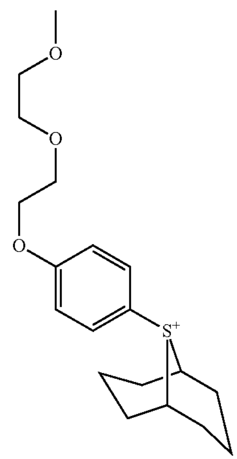
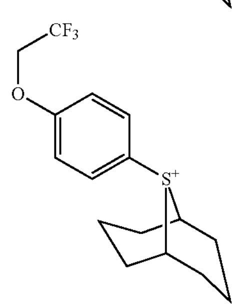
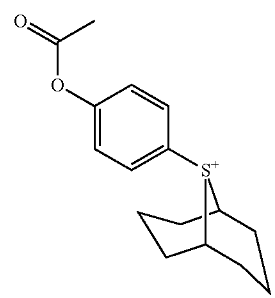
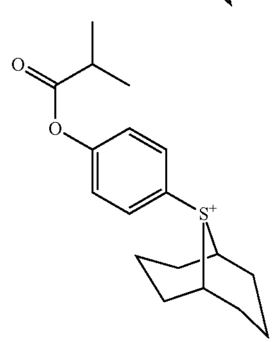

-continued
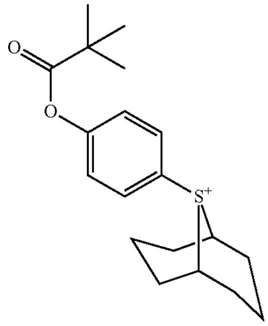
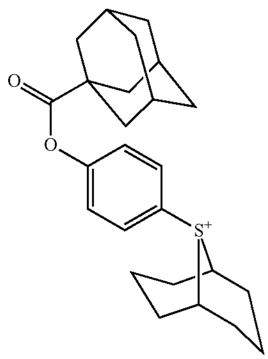
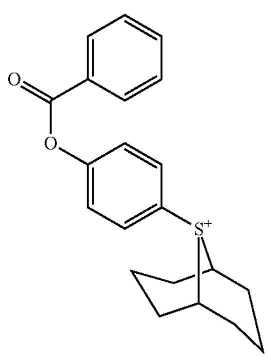
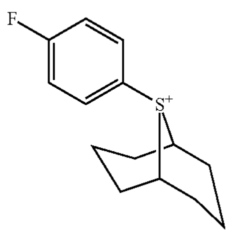
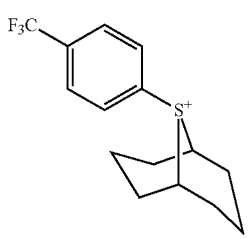
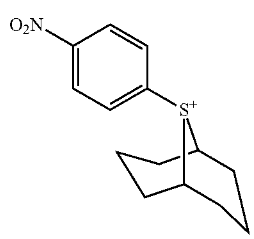
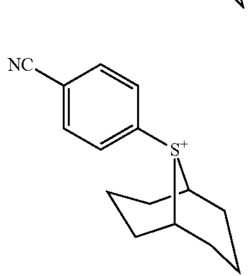
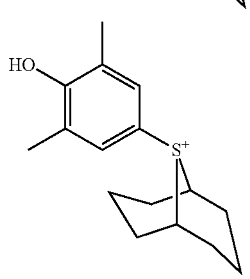
-continued
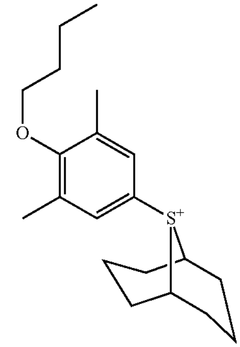
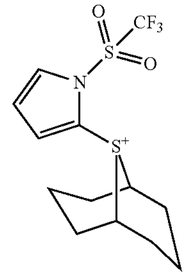
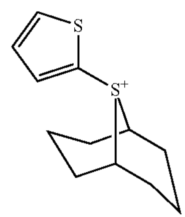
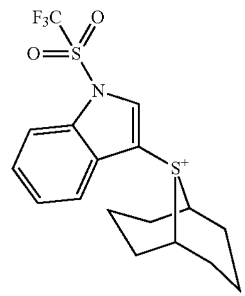
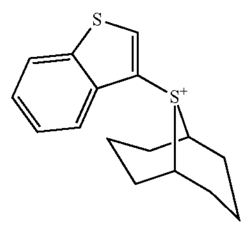
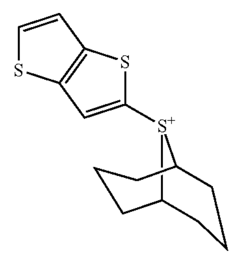
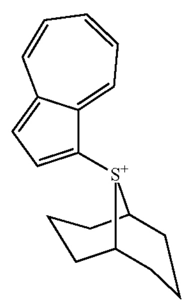
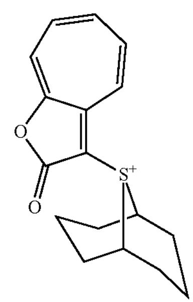
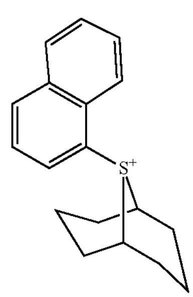
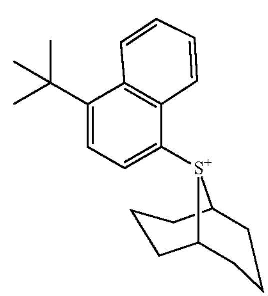

-continued
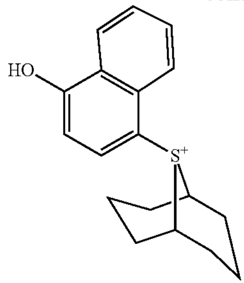
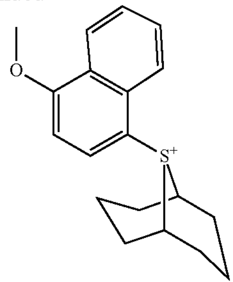
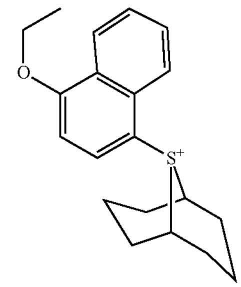
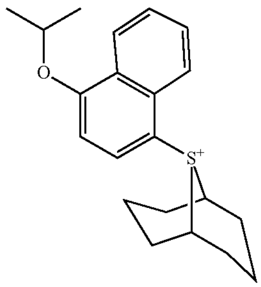
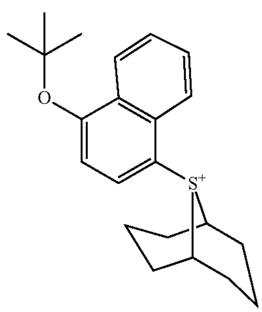
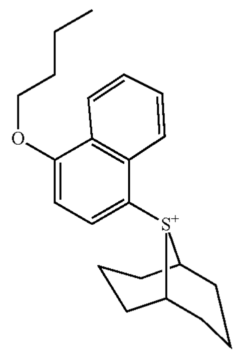
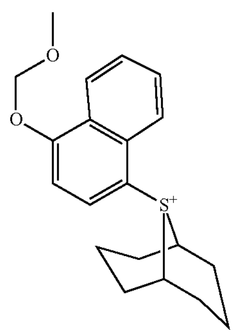
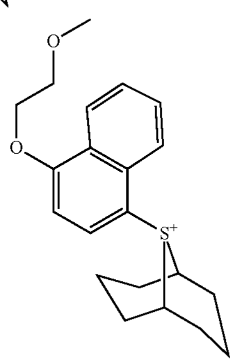
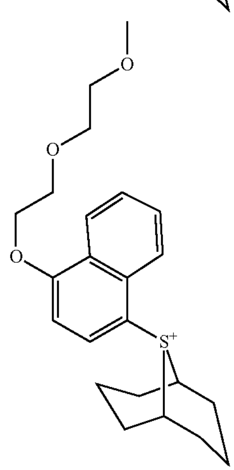
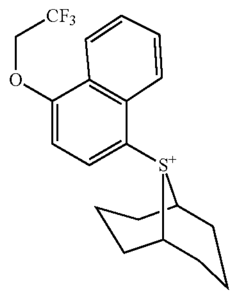
-continued
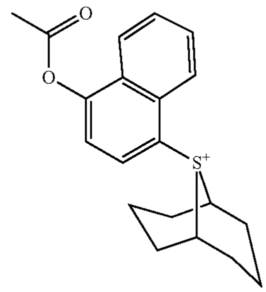
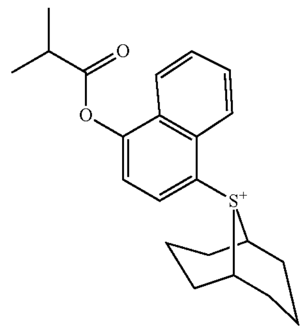
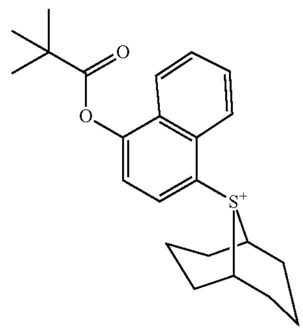
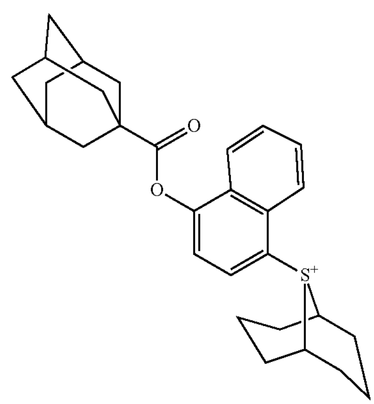
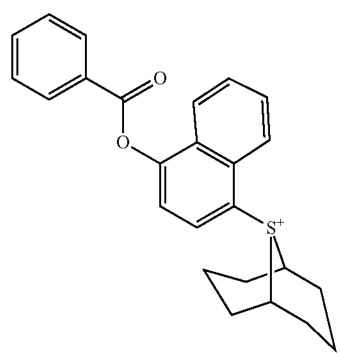

-continued
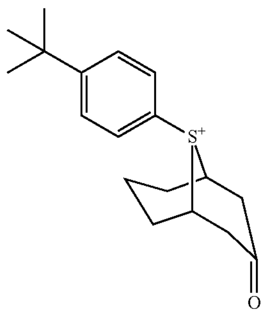
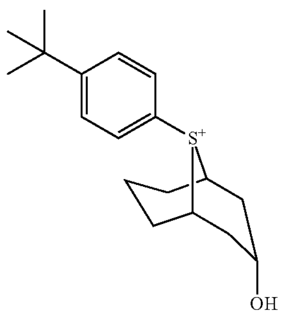
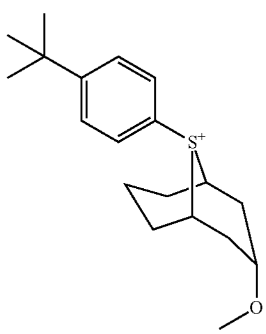
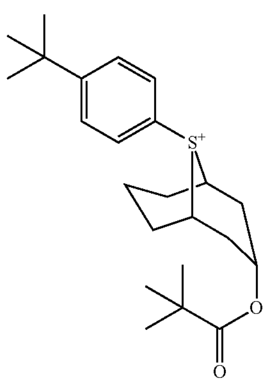
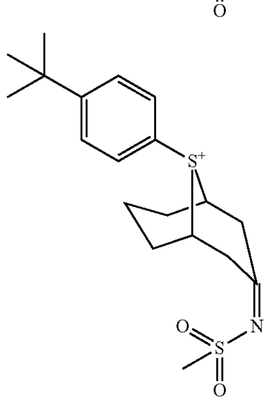
-continued
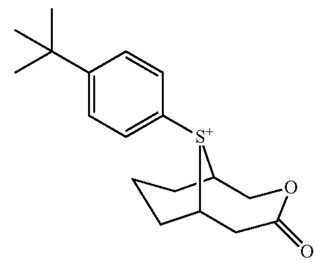
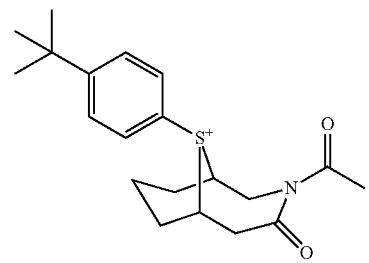
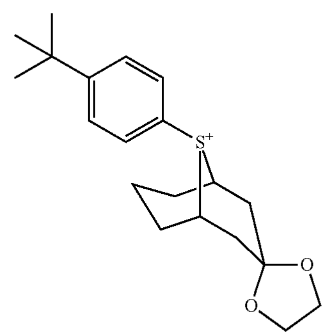
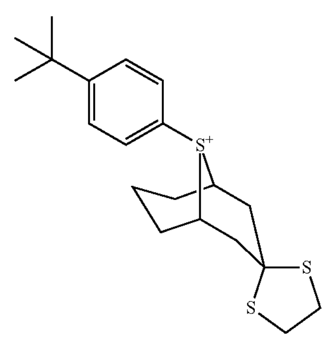
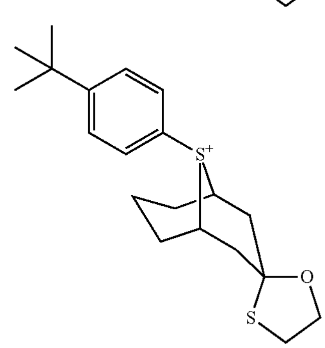

-continued
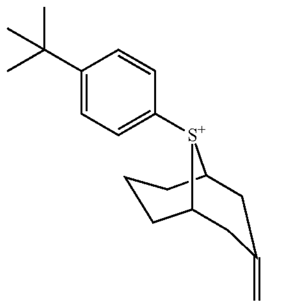
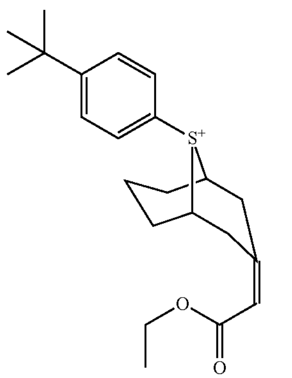
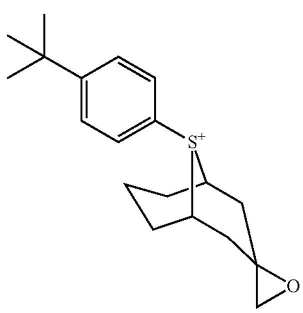
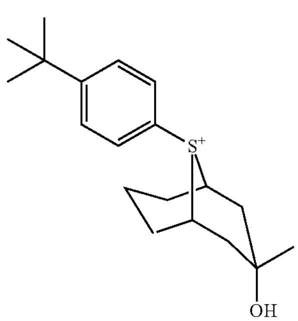
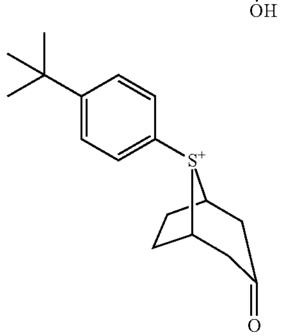
-continued
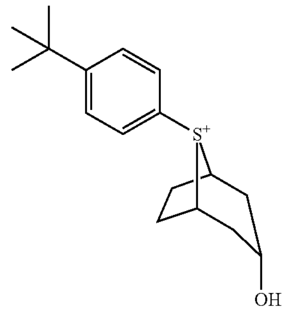
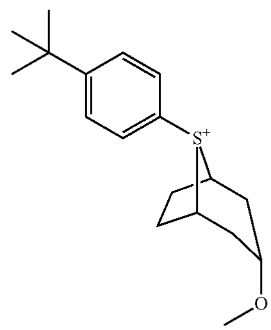
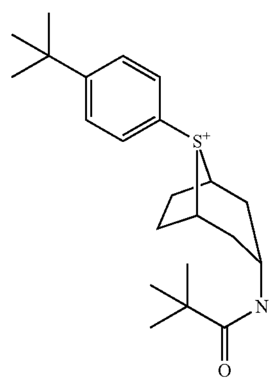
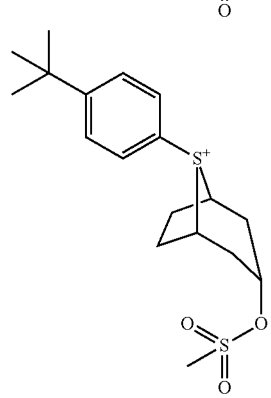
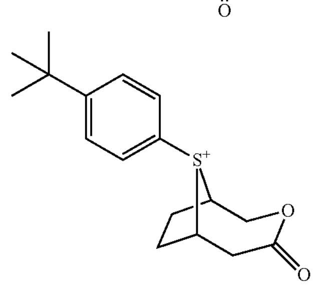

-continued
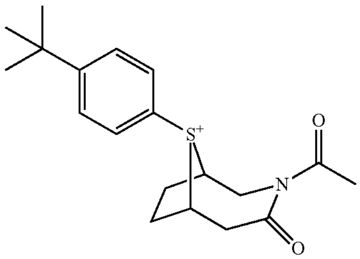
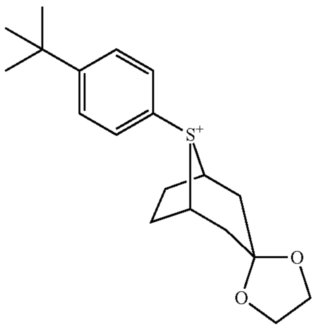
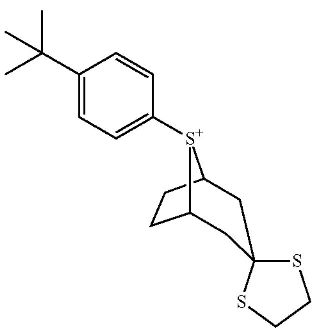
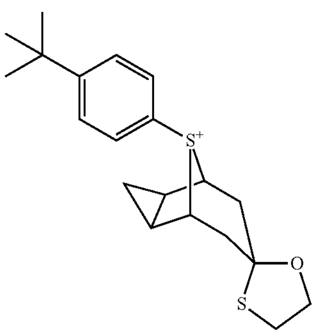
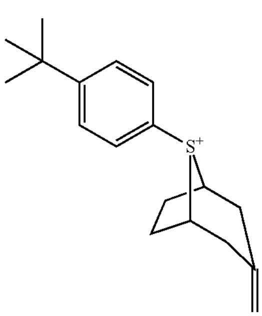
-continued
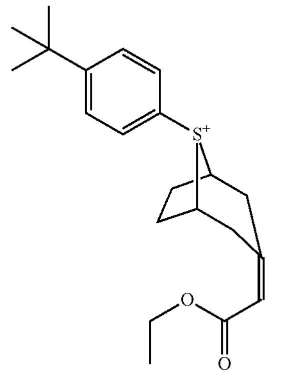
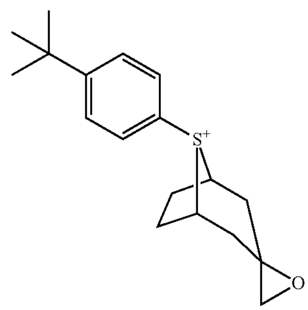
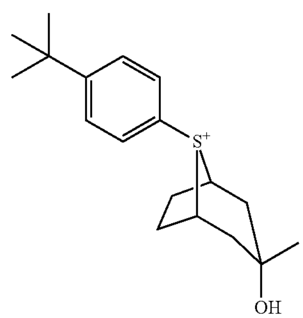
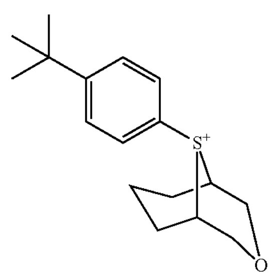
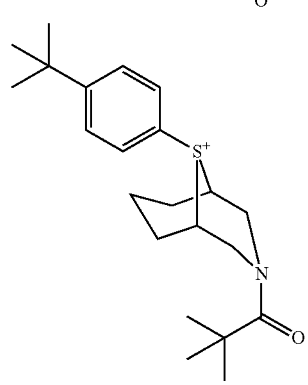

-continued
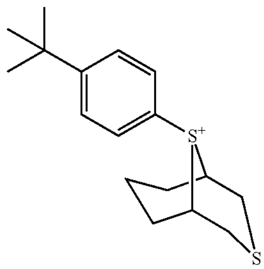
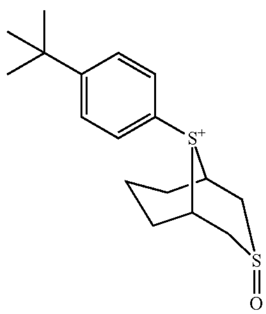
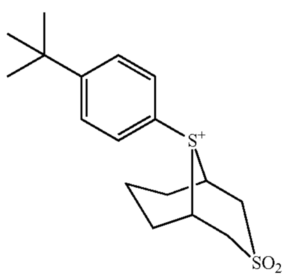
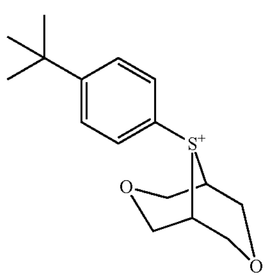
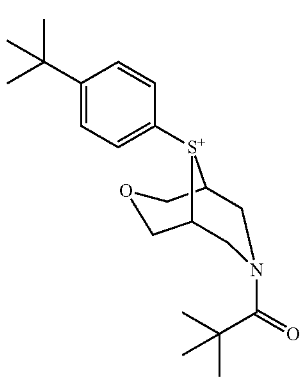
-continued
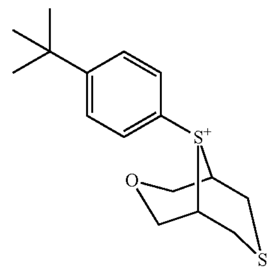
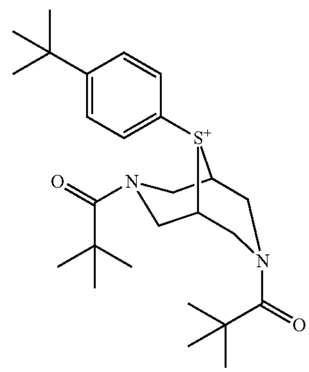
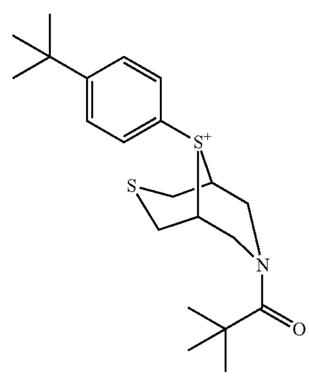
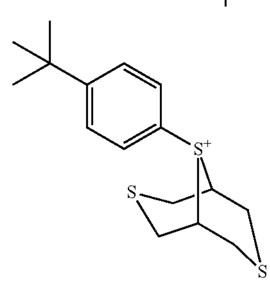
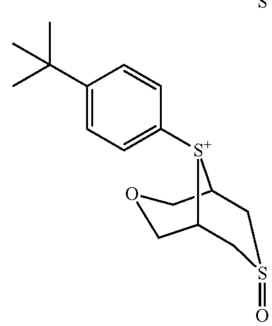

-continued
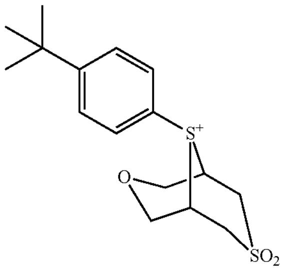
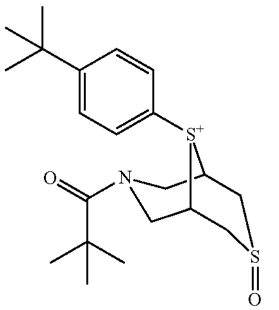
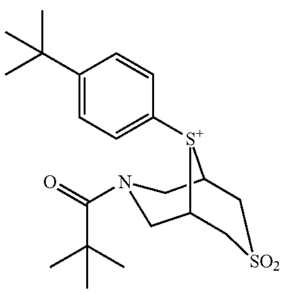
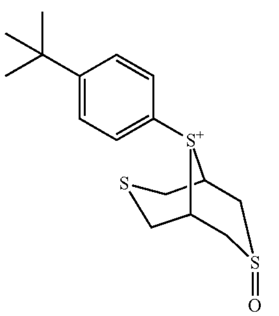
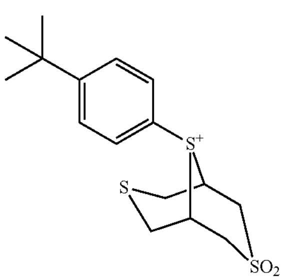
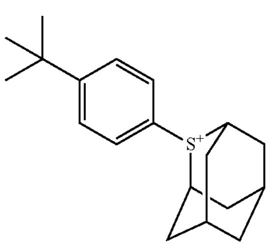
-continued
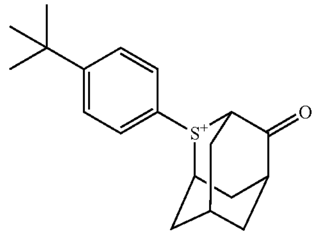
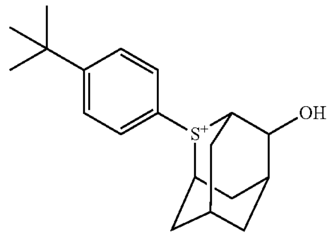
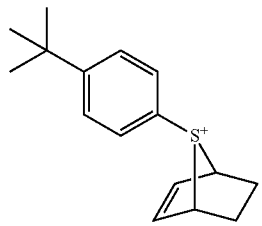
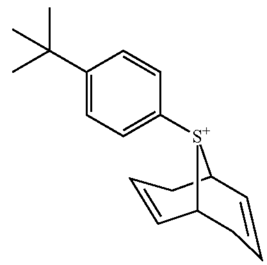
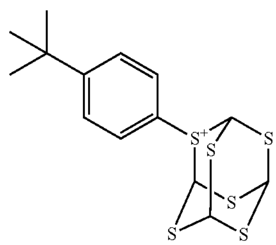
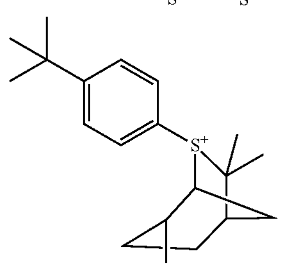
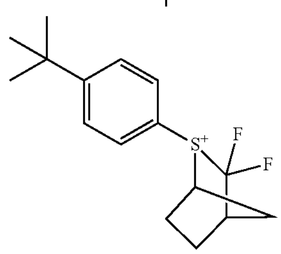
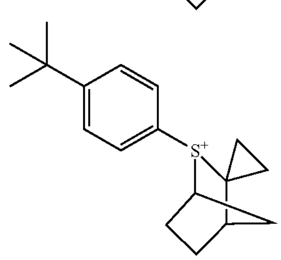

-continued
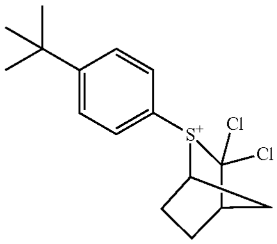
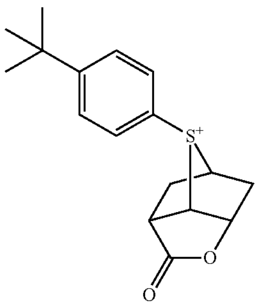
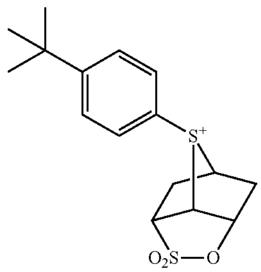
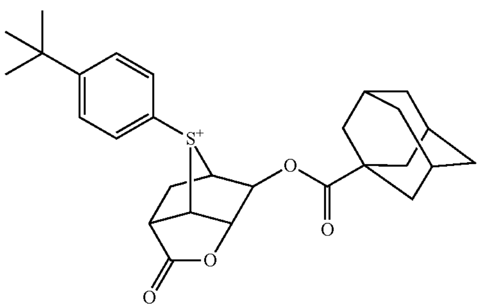
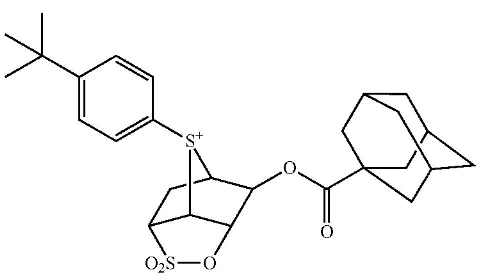
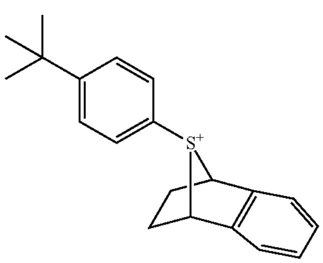
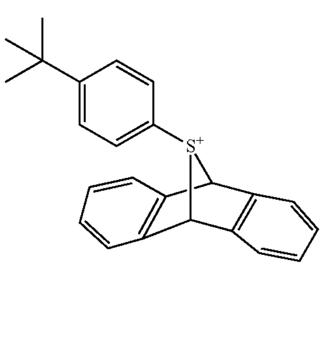
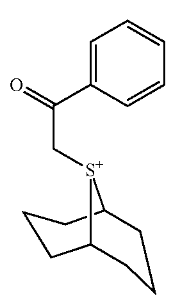
-continued
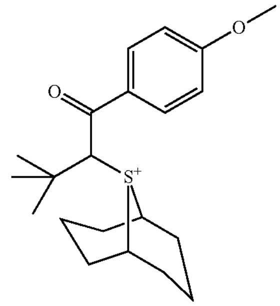
The anion moiety of the compound having formula (1a) is exemplified by the following structures, but not limited thereto. Herein, $R^{FA}$ is hydrogen or trifluoromethyl.
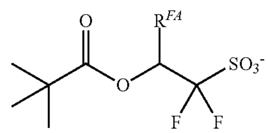
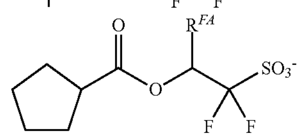
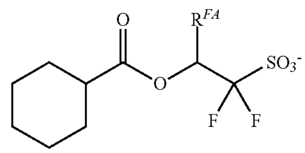
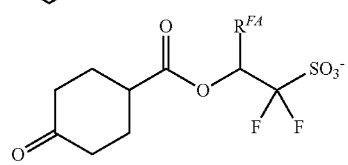
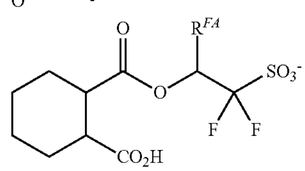
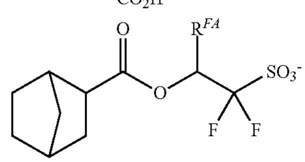
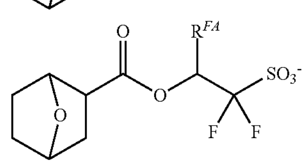
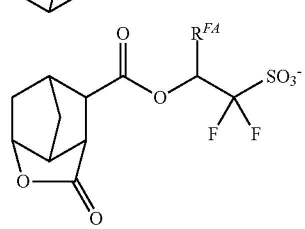

-continued
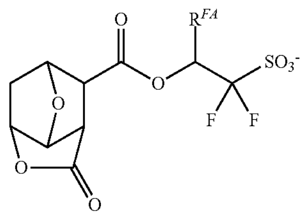
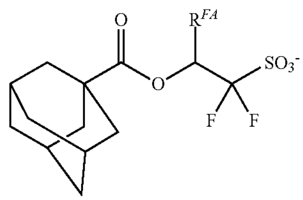
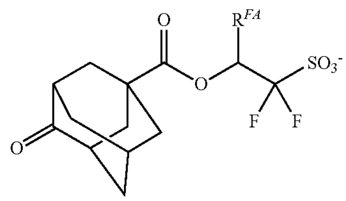
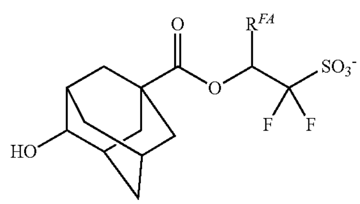
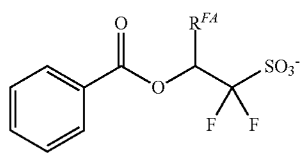
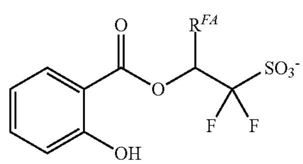
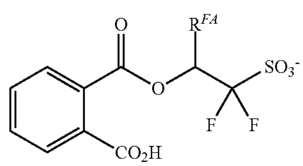
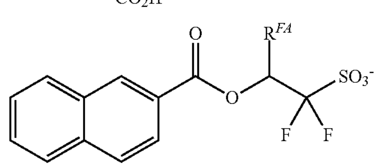
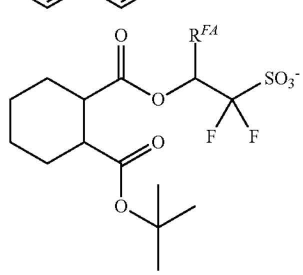
-continued
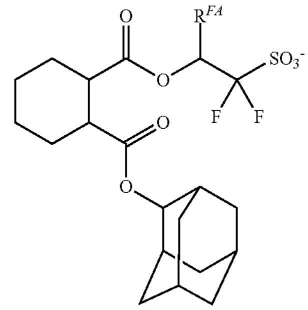
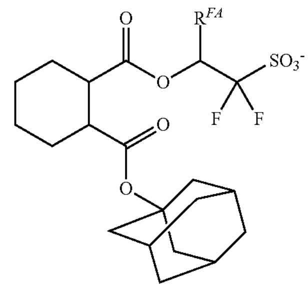
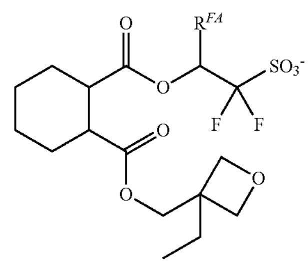
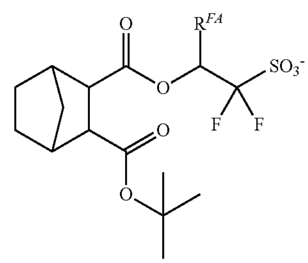
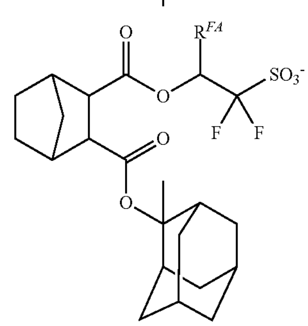
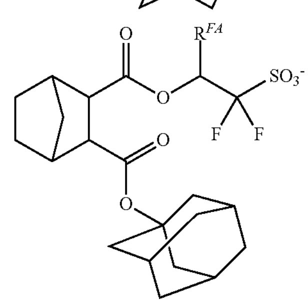

-continued
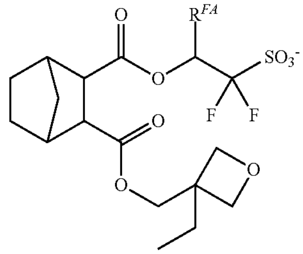
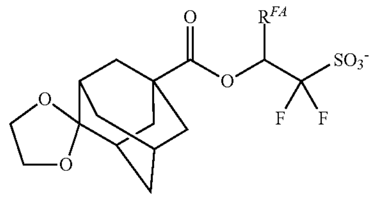
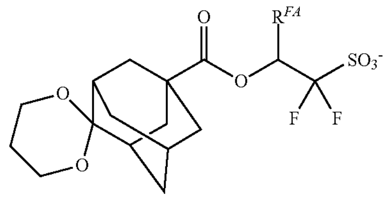
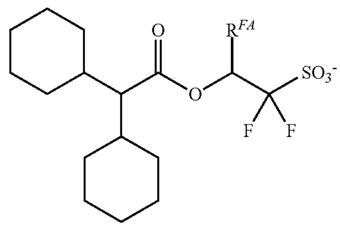
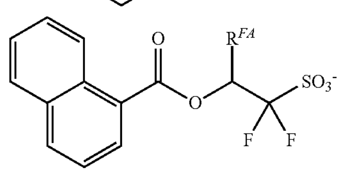
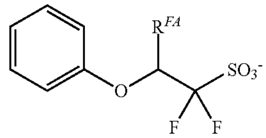
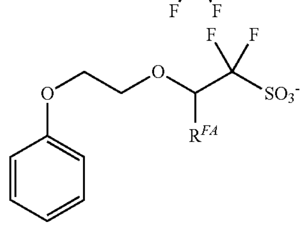
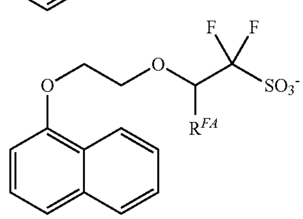
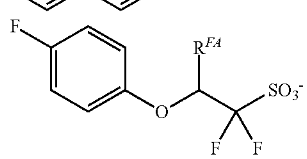
-continued
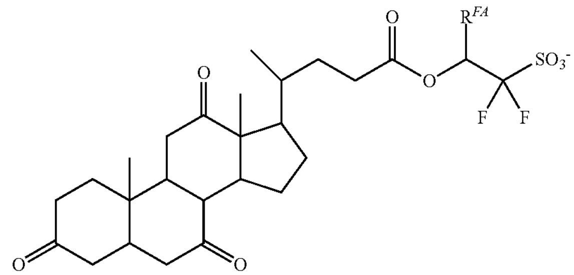
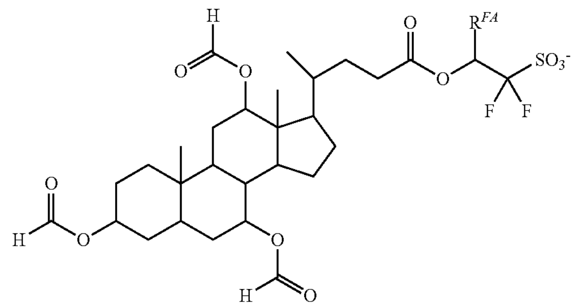
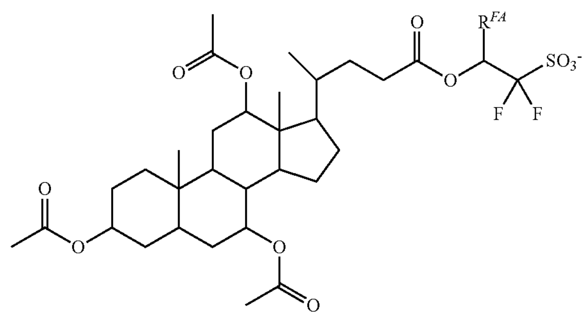
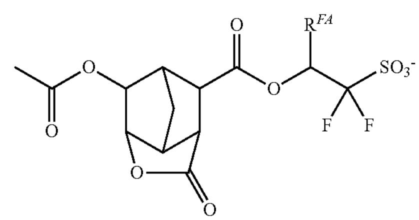
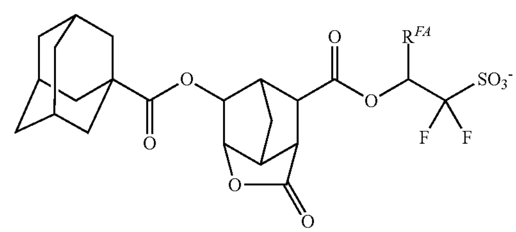
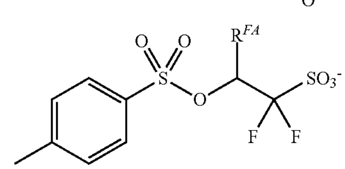
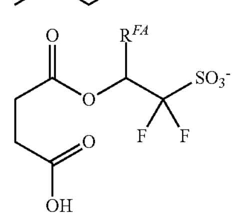
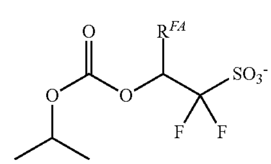

-continued
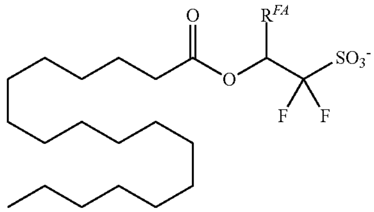
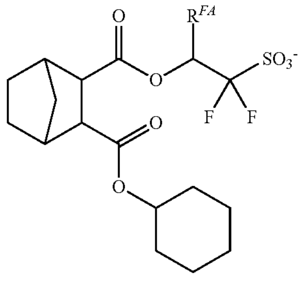
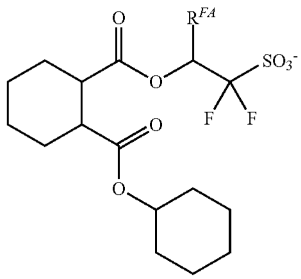
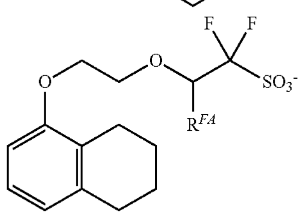
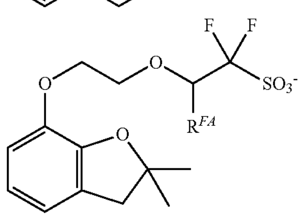
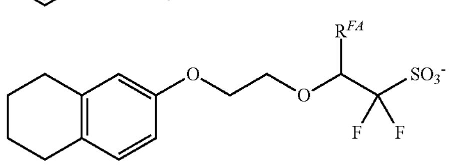
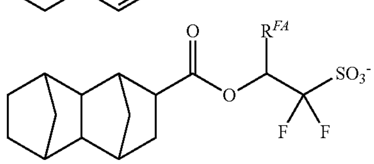
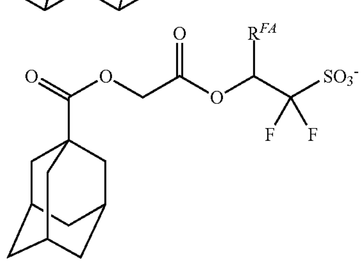
-continued
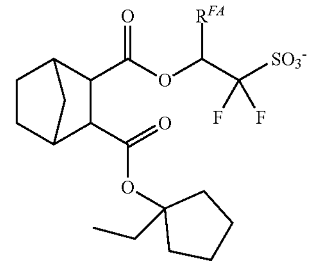
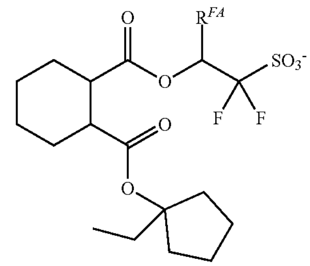
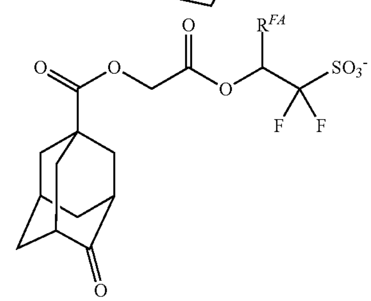
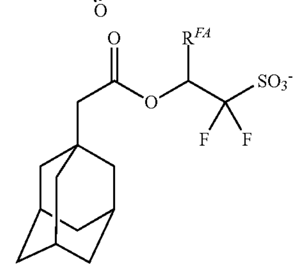
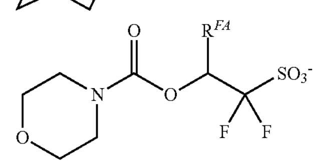
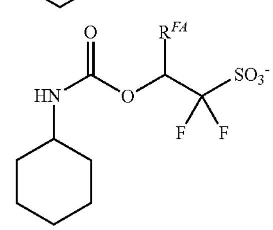
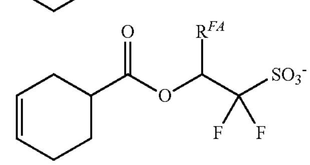
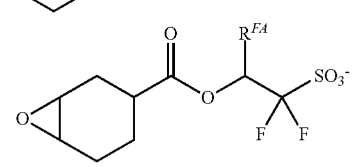

-continued
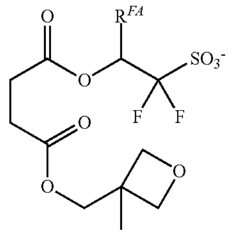
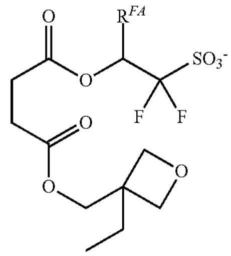
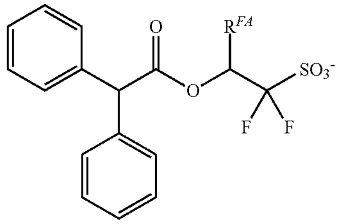
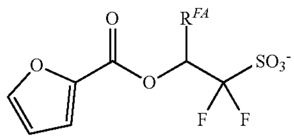
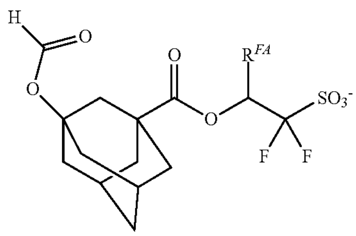
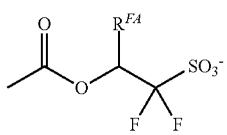
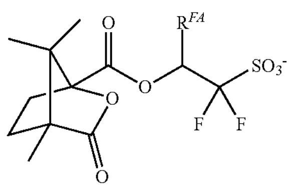
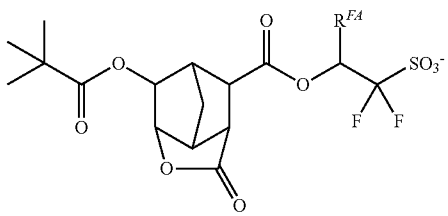
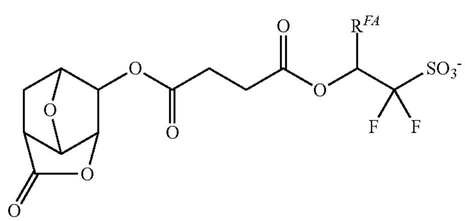
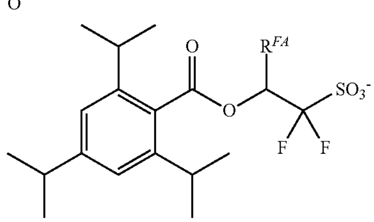
-continued
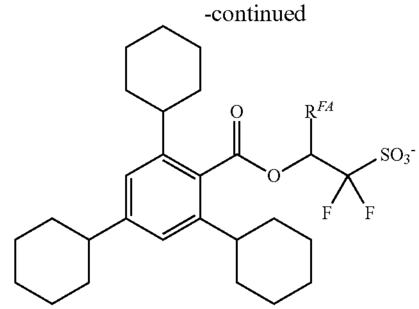
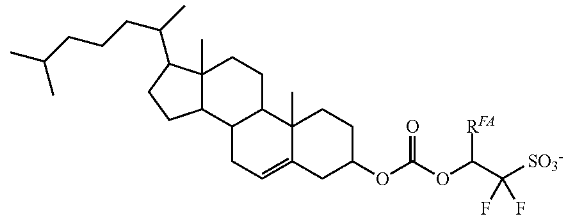
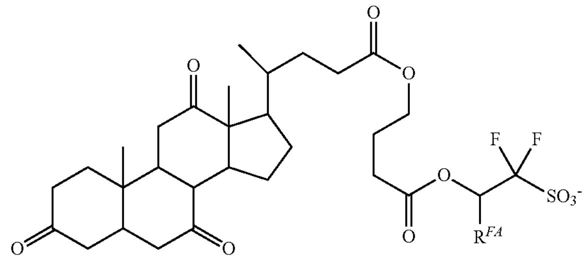
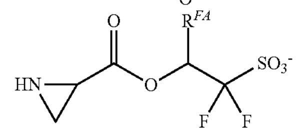
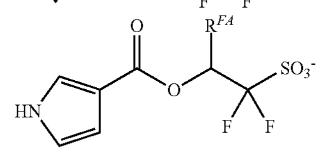
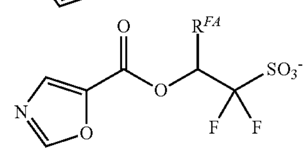
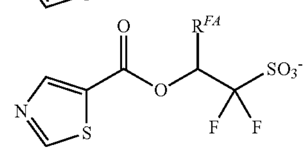
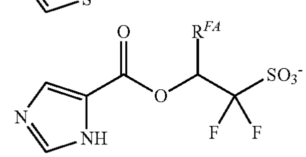
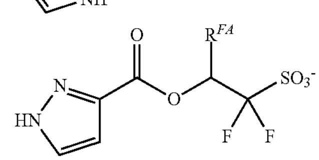
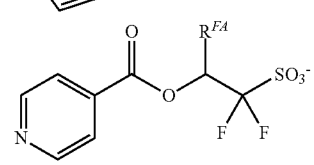

-continued
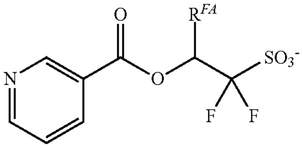
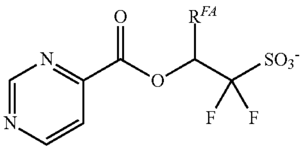
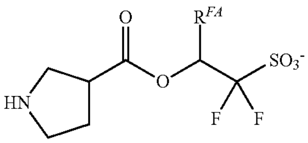
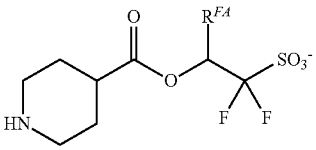
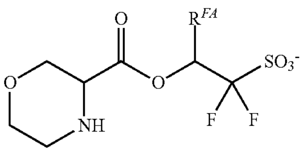
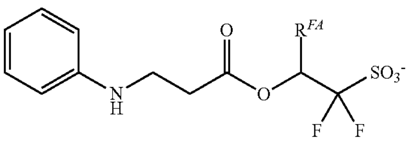
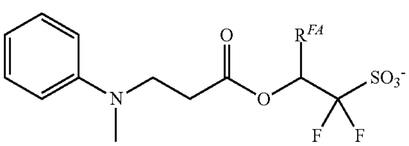
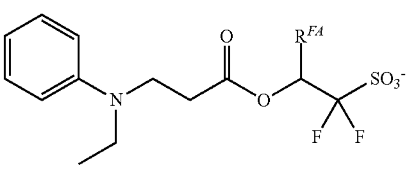
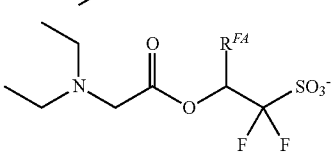
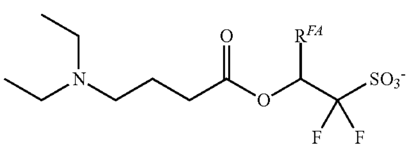
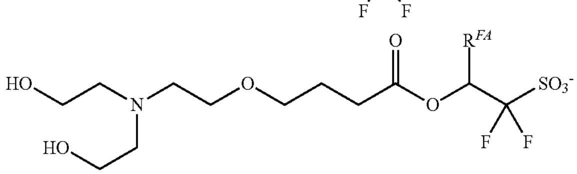
-continued
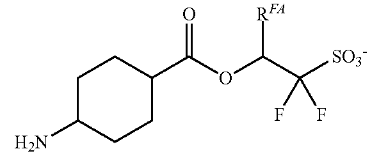
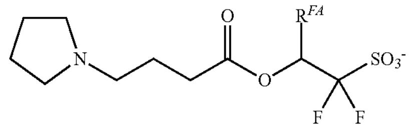
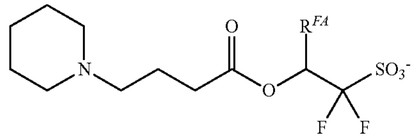
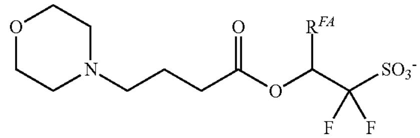
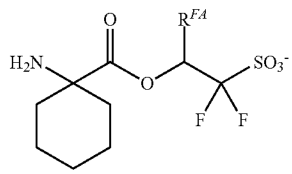
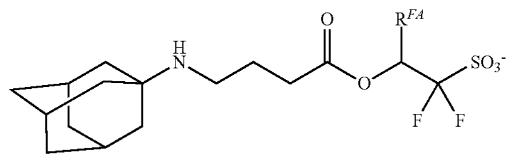
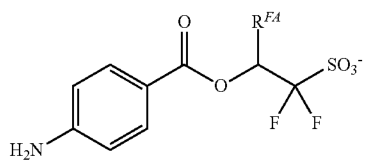
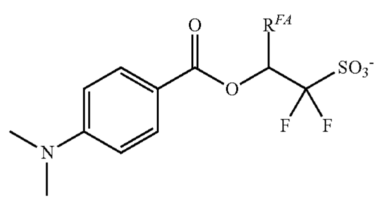
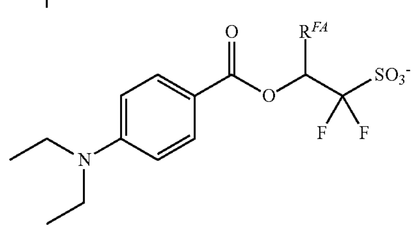
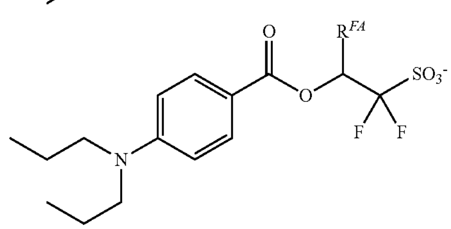

-continued
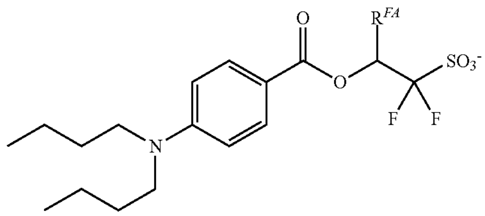
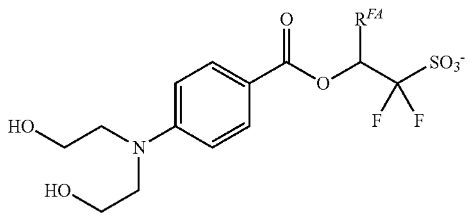
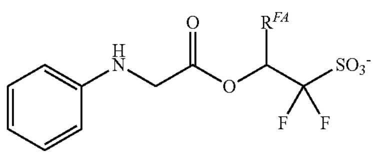
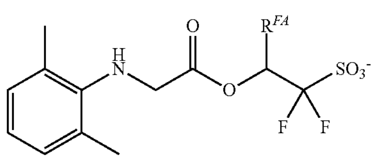
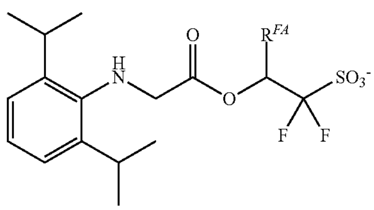
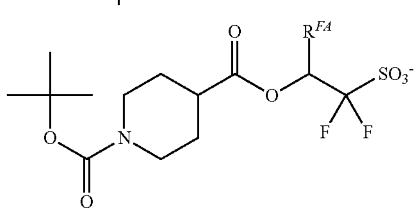
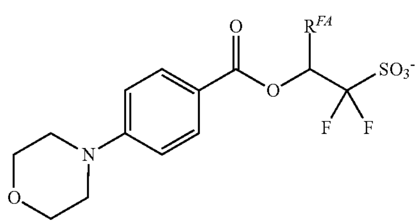
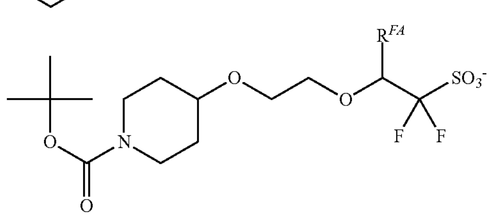
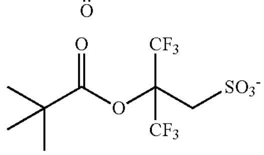
-continued
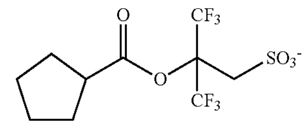
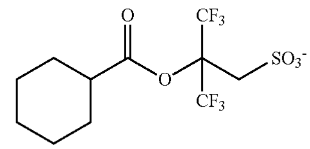
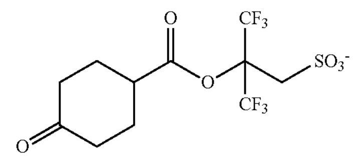
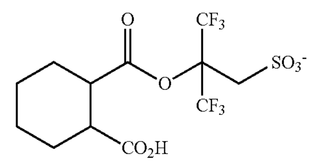
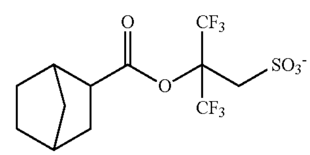
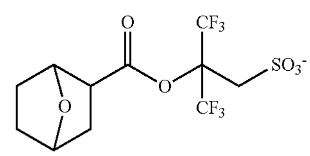
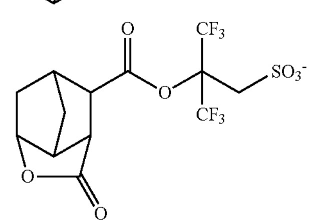
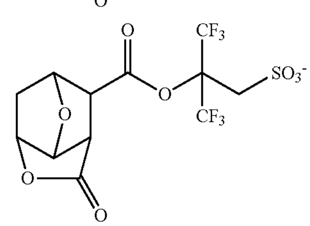
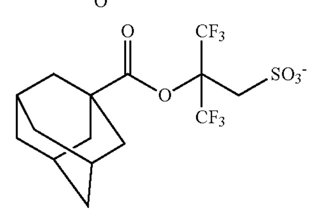
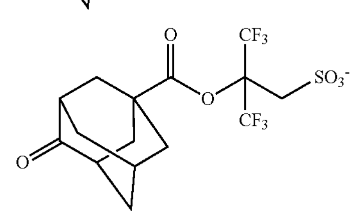

-continued
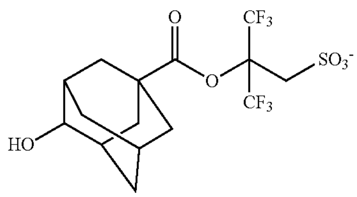
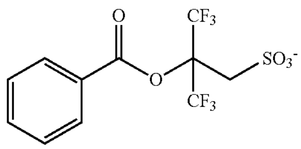
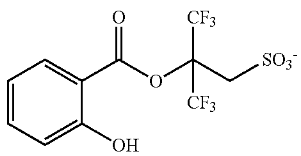
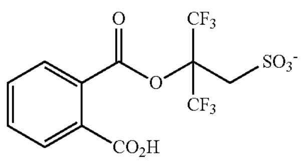
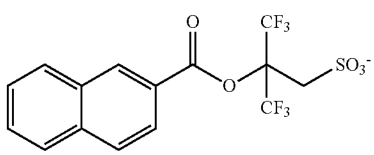
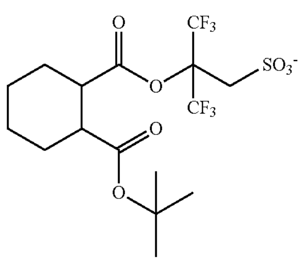
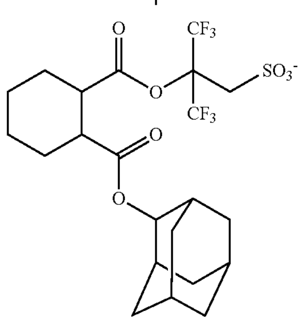
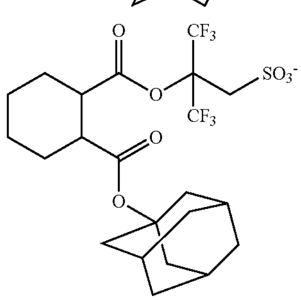
-continued
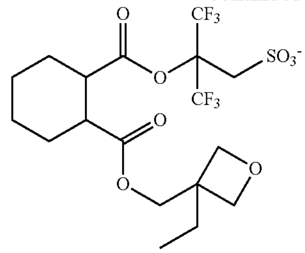
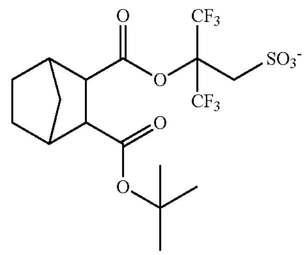
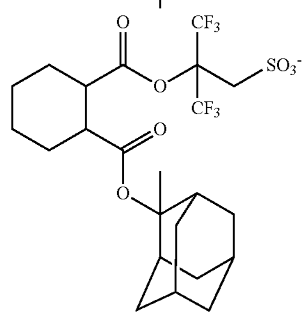
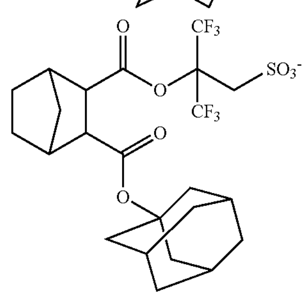
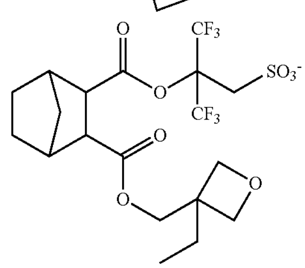
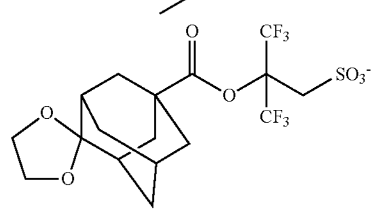
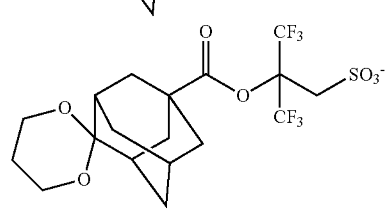

-continued
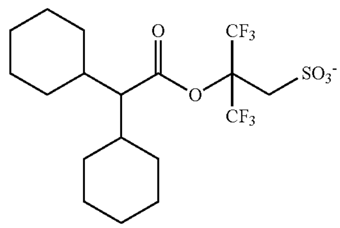
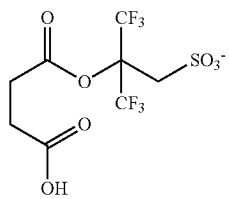
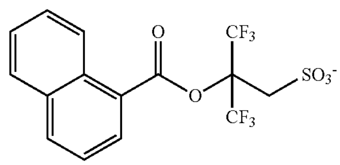
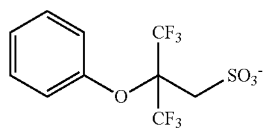
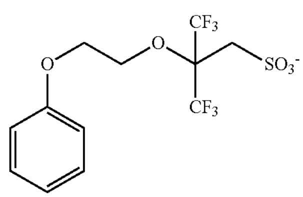
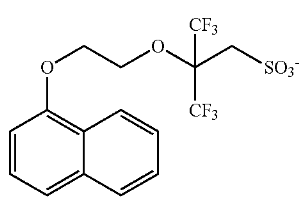
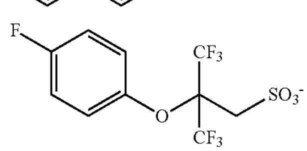
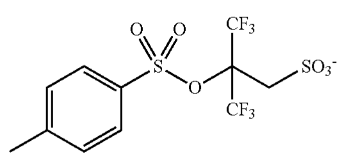
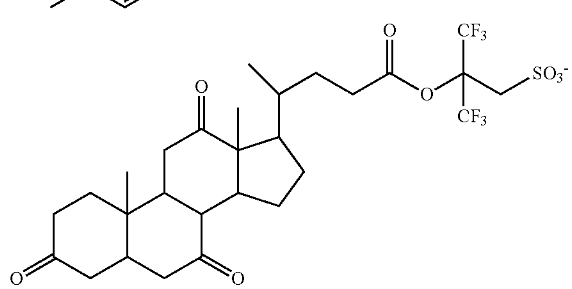
-continued
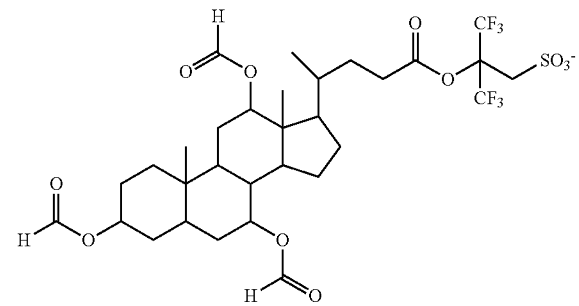
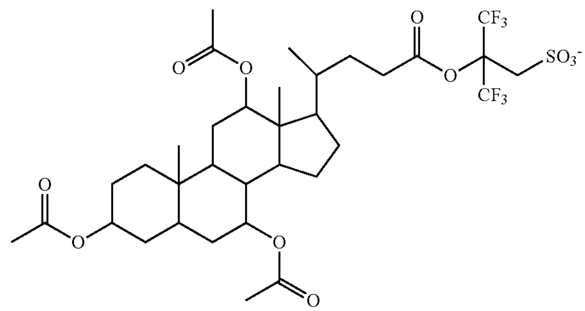
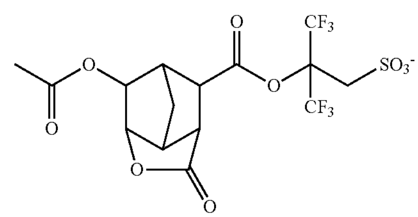
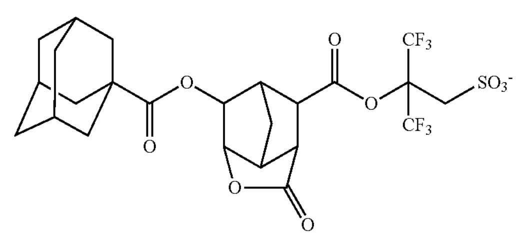
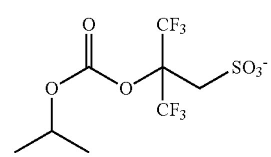
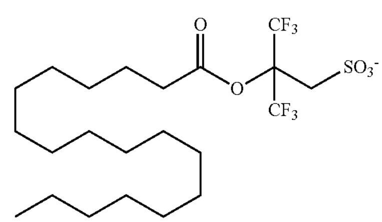
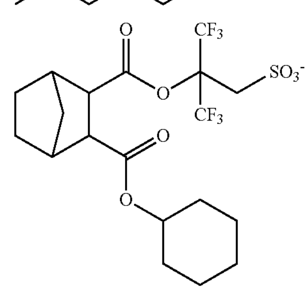

-continued
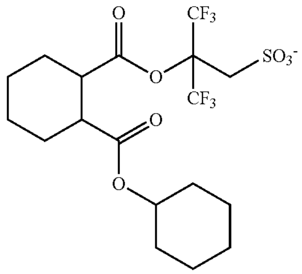
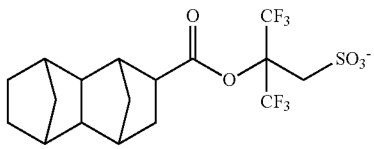
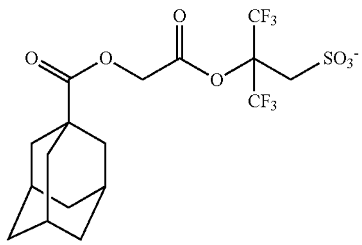
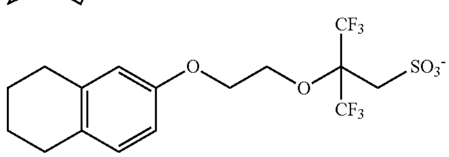
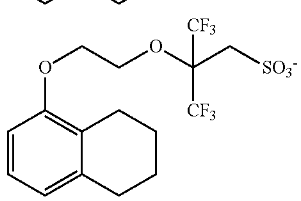
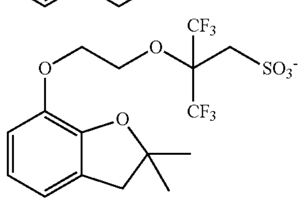
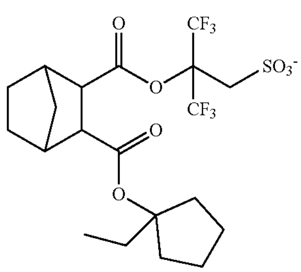
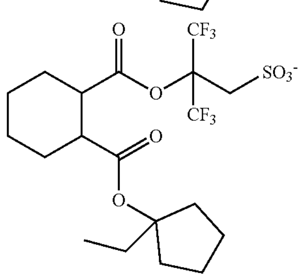
-continued
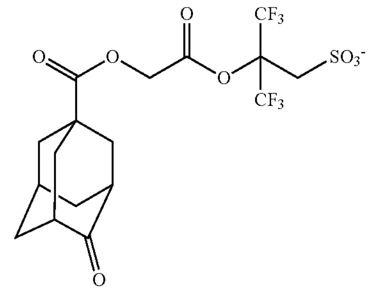
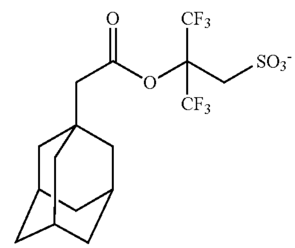
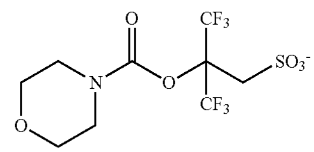
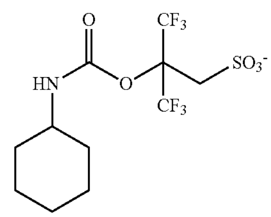
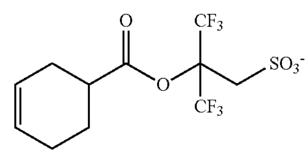
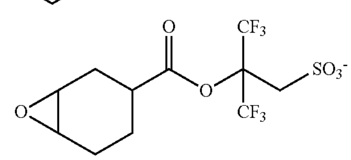
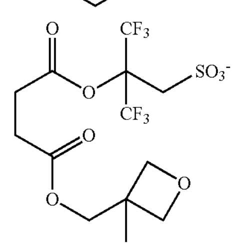
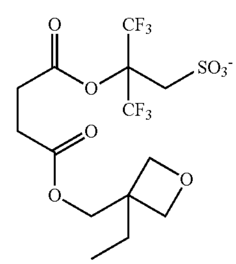
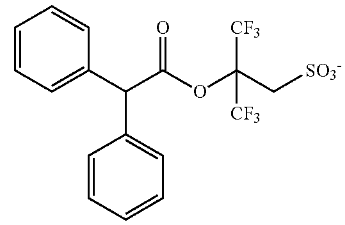

-continued
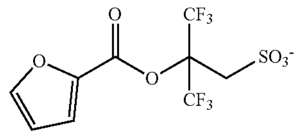
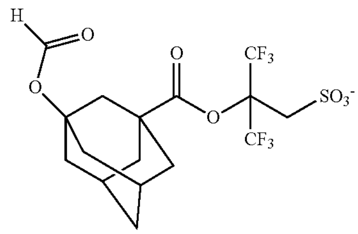
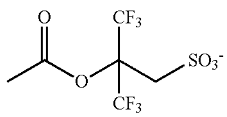
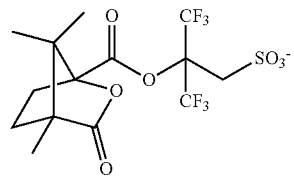
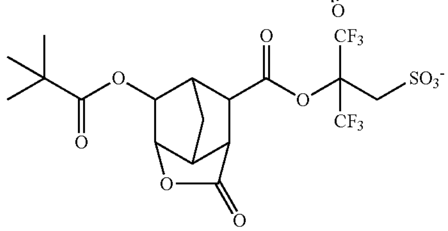
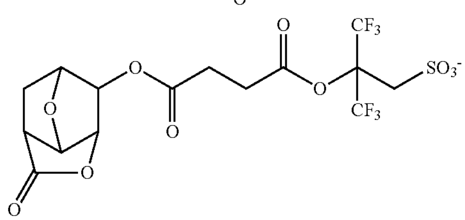
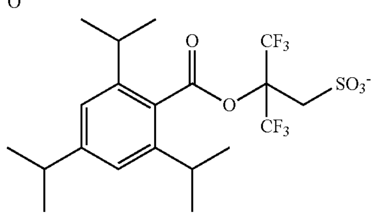
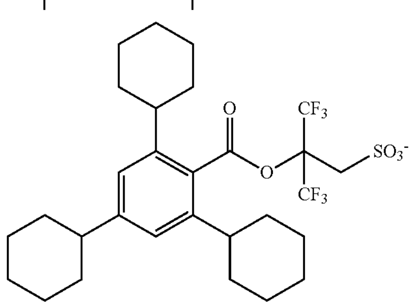
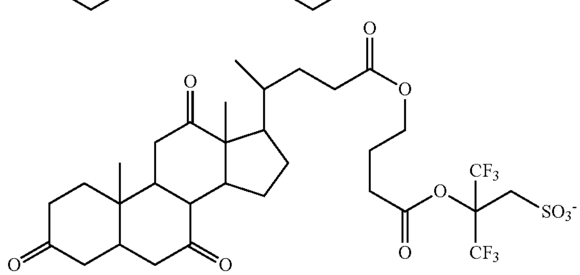
-continued
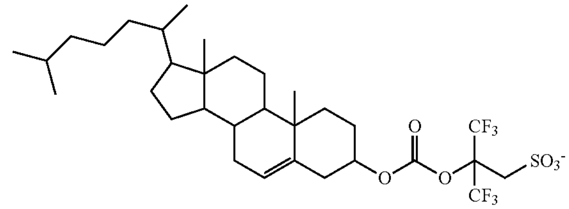
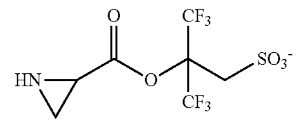
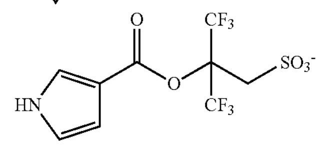
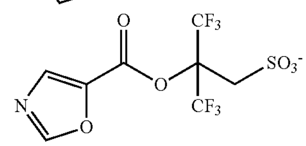
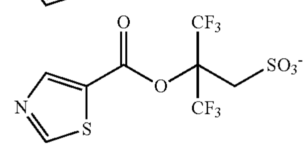
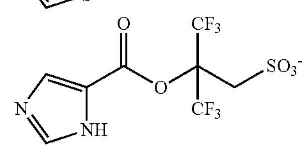
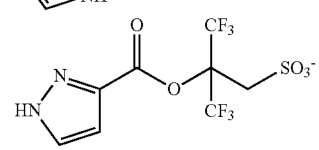
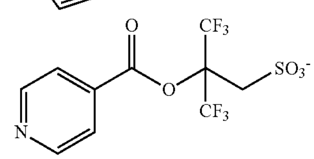
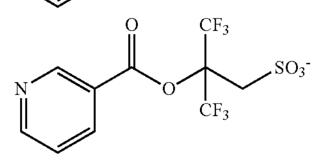
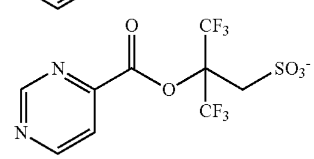
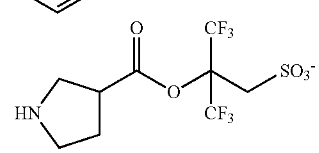
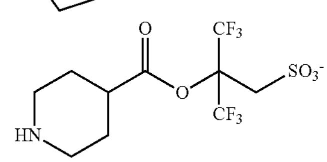

-continued
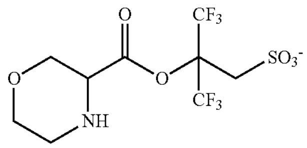
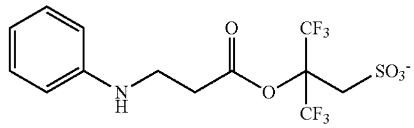
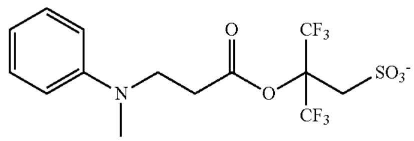
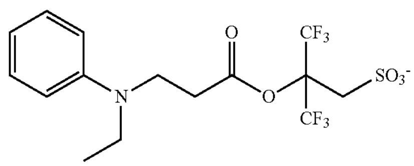
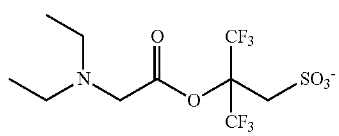
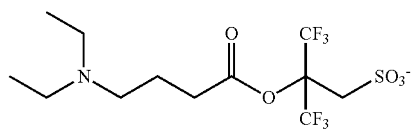
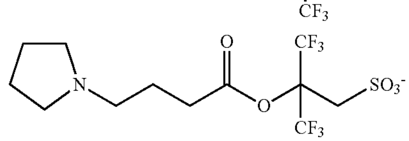
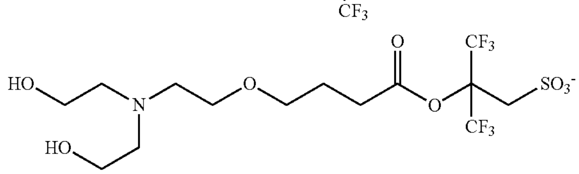
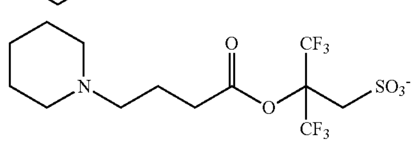
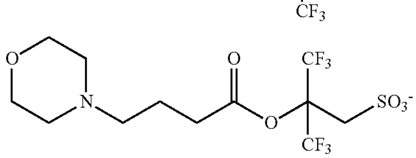
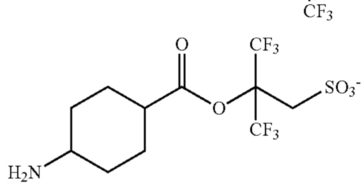
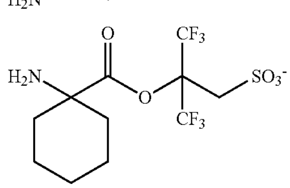
-continued
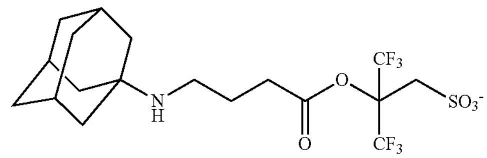
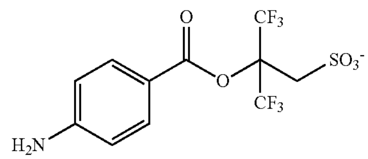
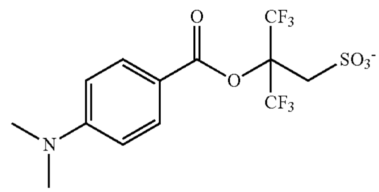
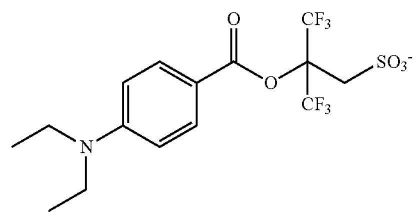
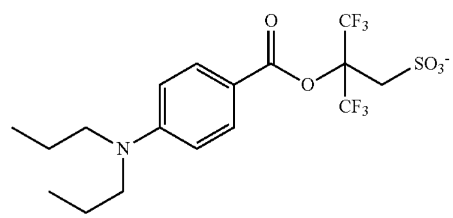
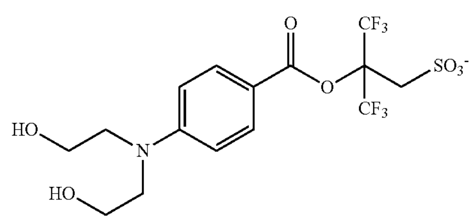
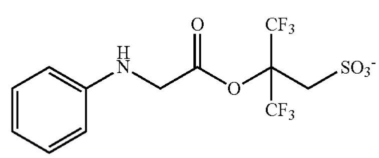
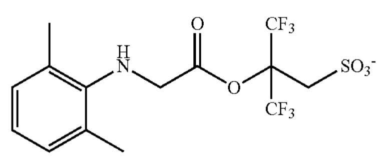
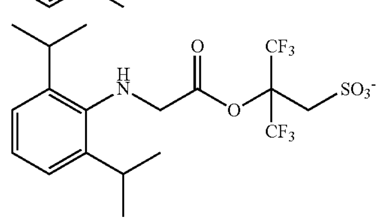

-continued
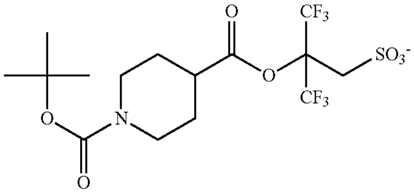
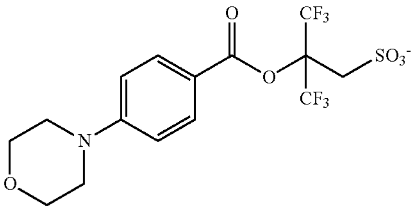
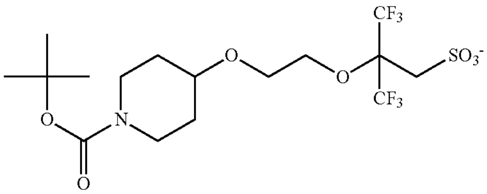
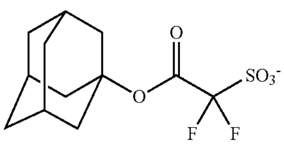
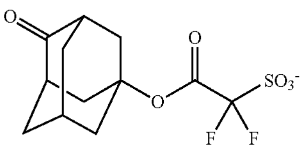
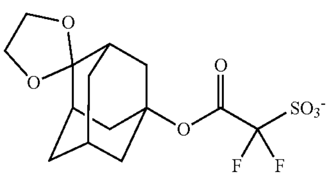
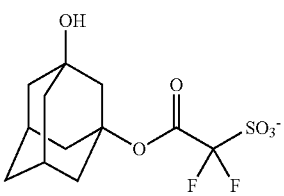
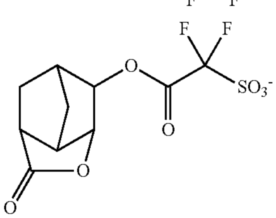
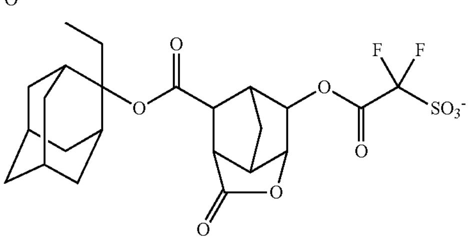
-continued
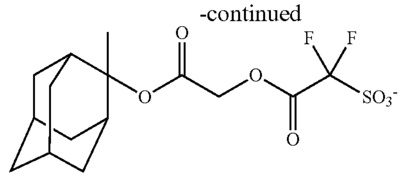
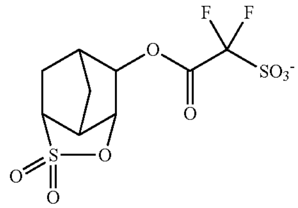
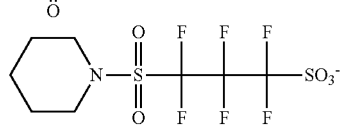
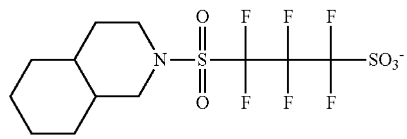
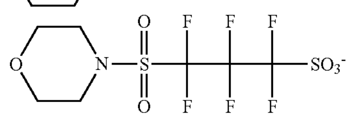
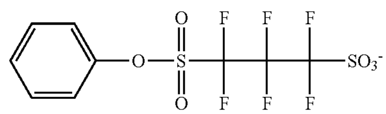
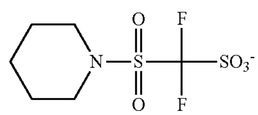
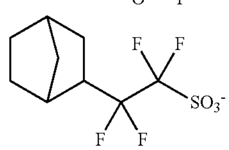
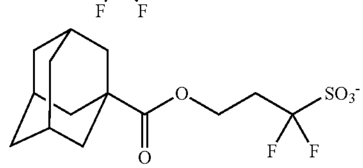
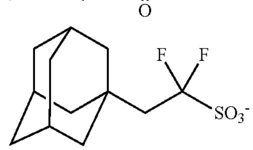
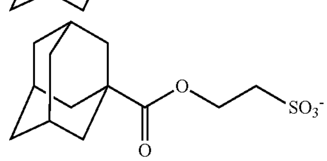
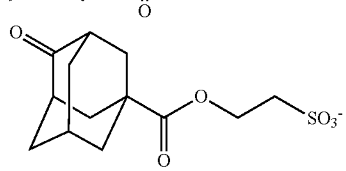
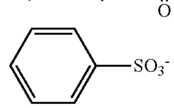
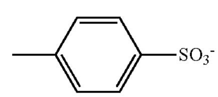

-continued

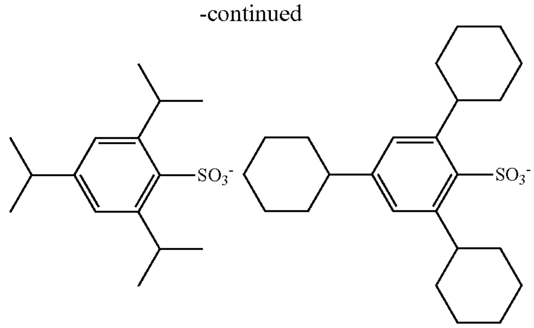

The compound having formula (1a) is typically selected from combinations of cations with anions, both exemplified above.

The compound having formula (1a) may be synthesized from fused ring sulfide (1a-1) and iodonium salt (1a-2) according to Bull. Chem. Soc. Jpn., 1988, 61, 1181, as shown by the following Scheme A.

Scheme A

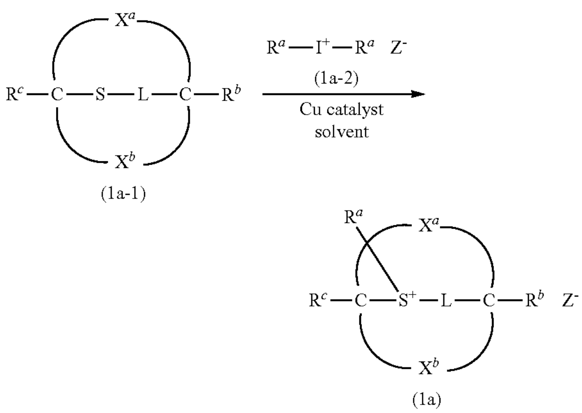

Herein $R^a$, $R^b$, $R^c$, L, $X^a$, $X^b$, and $Z^-$ are as defined above.

With this method, a sulfoniumn salt may be readily synthesized by reacting a symmetric iodonium salt with a fused ring sulfide in the presence of a copper catalyst. Examples of the copper catalyst used herein include mono and di-valent copper salts, such as copper chloride, copper bromide, copper iodide, copper acetate, copper benzoate, copper thiophenecarboxylate, copper trifluoroacetate, copper tosylate, copper trifluoromethanesulfonate, copper tetrafluoroborate, copper hexafluorophosphate, and copper hexafluoroantimonate. From the standpoints of reactivity and solubility, copper acetate and copper benzoate are preferred.

The reaction is performed typically in a solvent, preferably a solvent having a boiling point of at least 100° C. under atmospheric pressure. Suitable solvents include n-butanol, n-pentanol, toluene, xylene, chlorobenzene, dichlorobenzene, anisole, α,α,α-benzotrifluoride, dioxane, cyclopentyl methyl ether, diethylene glycol dimethyl ether, N,N'-dimethylformamide, N,N'-dimethylacetamide, N-methylpyrrolidinone, N,N'-dimethylimidazolidinone, N,N'-dimethylpropylene urea, propylene glycol monomethyl ether, propylene glycol monoethyl ether, propylene glycol monomethyl ether acetate, γ-butyrolactone, butyl lactate, dimethyl sulfoxide, and sulfolane. From the standpoints of ease of solvent removal and reactivity, chlorobenzene or anisole is preferably used.

In the practice of reaction, preferably fused ring sulfide (1a-1) is used in excess relative to iodonium salt (1a-2). Preferably from the standpoint of production yield, 1.05 to 2 equivalents of fused ring sulfide (1a-1) is used. The copper catalyst is preferably used in an amount of 0.01 to 50 mol % based on the iodonium salt. More preferably from the standpoints of yield and residual metal content, 0.01 to 5 mol % of the copper catalyst is used. The reaction temperature is preferably at least 80° C. Preferably from the standpoint of yield, the temperature is less than 150° C.

Resist Composition

Another embodiment of the invention is a chemically amplified resist composition comprising (A) the photoacid generator, (B) a base resin, and (C) an organic solvent.

The inventive PAG is characterized in that the sulfonium cation has a fused ring structure and the sulfur atom in the sulfonium cation adjoins at least one bridgehead. The resist composition comprising the inventive PAG is good in uniform dispersion of the PAG. As a result, improvements in resist properties, especially LWR are achievable. Although the reason is not well understood, it is believed that the compact sulfonium skeleton containing fused ring structure permits the carbon count to be increased without promoting diffusion of the generated acid, leading to better lipophilic property whereby the uniform dispersion of PAG is improved. JP 5629440, JP 5997982 (US 20150168830), and JP-A 2015-107956 (U.S. Pat. No. 9,348,221) describe resist compositions comprising a monocyclic alkyl sulfonium salt or such a sulfonium salt which is partially substituted with a heteroatom-containing group, but they fail to achieve lithography performance comparable to the present invention because these sulfonium salts are inferior in solubility and uniform dispersion.

As compared with prior art PAGs having a triarylsulfonium cation, the inventive PAG has low absorption around wavelength 193 nm, avoiding any geometrical failure of the pattern due to insufficient transmission of laser light in ArF lithography.

As compared with analogous monocyclic sulfonium cations, the inventive PAG has a high sensitivity. Although the reason is not well understood, it is believed that the fused ring sulfonium salt has a substantial ring strain, and especially the inventive PAG having a sulfonium cation adjoining the bridgehead of a fused ring having substantial structural instability due to strain allows ring-opening reaction to take place upon exposure. JP 4543558 describes a resist composition comprising an alkyl sulfonium cation having a monovalent hydrocarbon group at α-position of sulfur atom. This salt has a less ring strain because the monovalent hydrocarbon group does not constitute a fused ring structure, and is thus inferior in sensitivity to the inventive PAG.

Component (A) is preferably used in an amount of 0.1 to 40 parts by weight, more preferably 1 to 20 parts by weight per 100 parts by weight of the base resin as component (B). As long as component (A) is used in the range, the full function of a photoacid generator is exerted and the risk of performance degradation like undissolved residues forming foreign particles is avoided. The inventive PAGs may be used alone or in admixture of two or more.

(B) Base Resin

The base resin used herein as component (B) is preferably a polymer comprising recurring units having the formula (a) and recurring units having the formula (b).

(a)

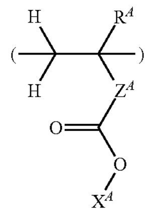

(b)

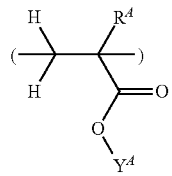

In formulae (a) and (b), $R^A$ is each independently hydrogen, fluorine, methyl or trifluoromethyl. $Z^A$ is a single bond, phenylene group, naphthylene group or (backbone)-C(=O)—O—$Z^B$—, wherein $Z^B$ is a $C_1$-$C_{10}$ alkanediyl group which may contain a hydroxyl radical, ether bond, ester bond or lactone ring, or phenylene group or naphthylene group. $X^A$ is an acid labile group. $Y^A$ is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

The alkanediyl group may be straight, branched or cyclic, and examples thereof include methylene, ethane-1,1-diyl, ethane-1,2-diyl, propane-1,2-diyl, propane-2,2-diyl, propane-1,3-diyl, 2-methylpropane-1,3-diyl, butane-1,3-diyl, butane-2,3-diyl, butane-1,4-diyl, pentane-1,3-diyl, pentane-1,4-diyl, 2,2-dimethylpropane-1,3-diyl, pentane-1,5-diyl, hexane-1,6-diyl, cyclopentane-1,2-diyl, cyclopentane-1,3-diyl, and cyclohexane-1,6-diyl.

Examples of the structure having formula (a) wherein $Z^A$ is a variant are shown below, but not limited thereto. Herein $R^A$ and $X^A$ are as defined above.

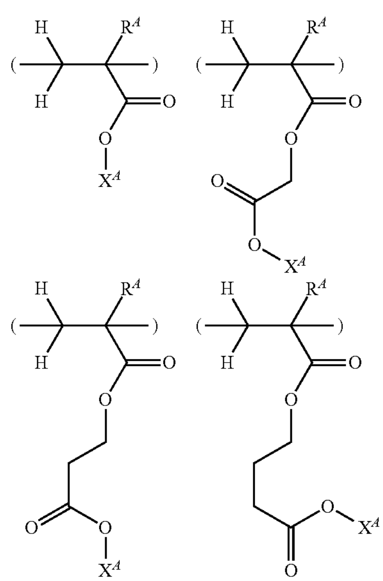

-continued

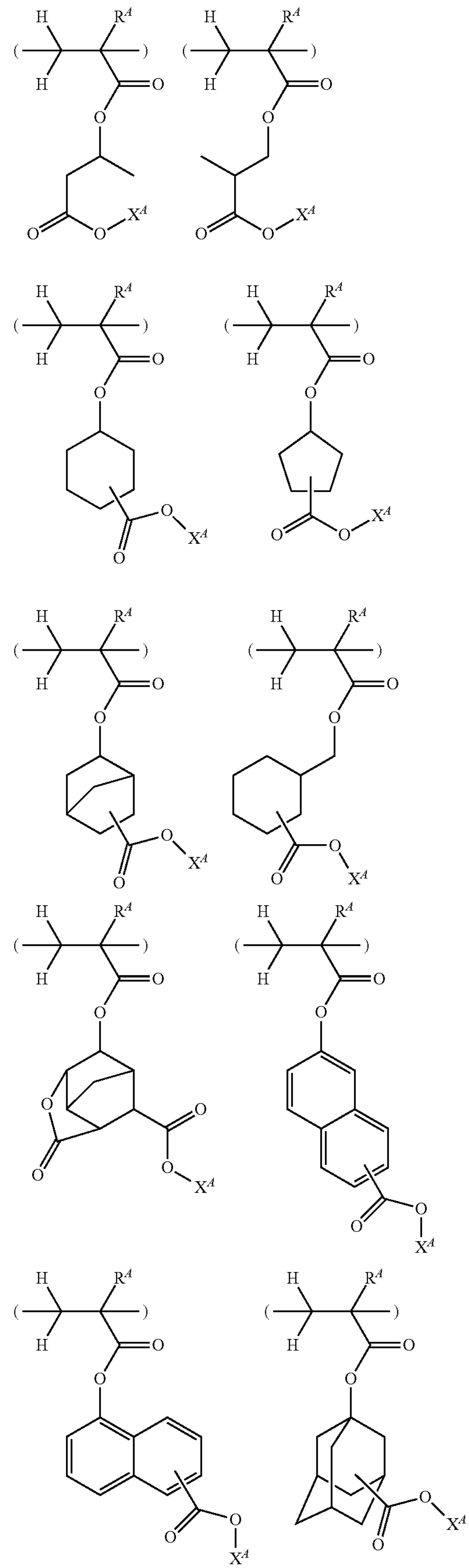

-continued

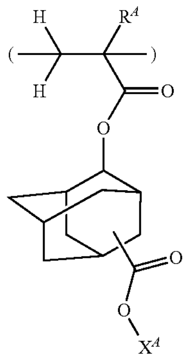

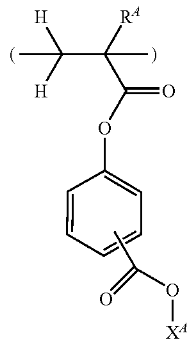

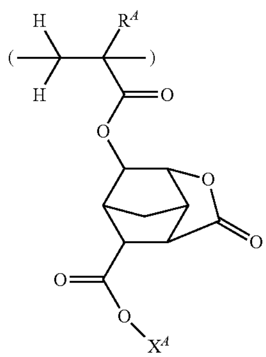

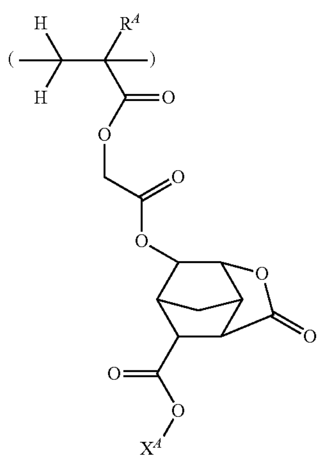

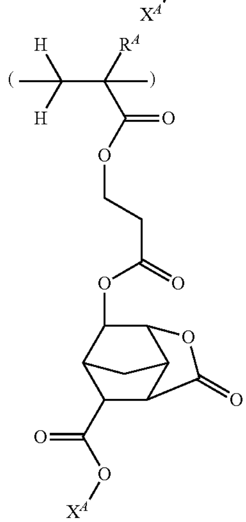

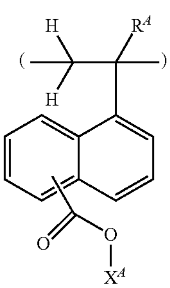

-continued

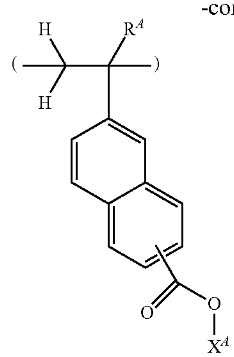

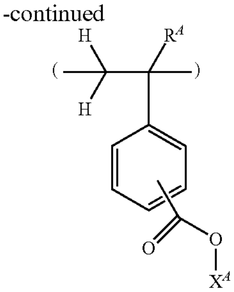

Under the action of acid, a polymer comprising recurring units of formula (a) is decomposed to generate a carboxyl group, turning to be an alkali soluble polymer.

The acid labile group represented by $X^A$ may be selected from a variety of such groups. Examples of the acid labile group include, but are not limited to, groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxo-containing alkyl groups of 4 to 20 carbon atoms.

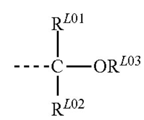

(L1)

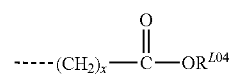

(L2)

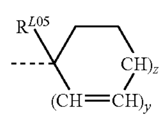

(L3)

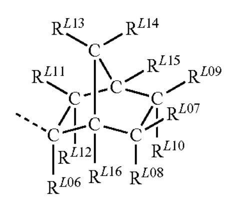

(L4)

In formula (L1), $R^{L01}$ and $R^{L02}$ each are hydrogen or a monovalent saturated aliphatic hydrocarbon group of 1 to 18 carbon atoms, preferably 1 to 10 carbon atoms. The monovalent saturated aliphatic hydrocarbon group may be straight, branched or cyclic. Examples thereof include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl.

$R^{L03}$ is a monovalent hydrocarbon group of 1 to 18 carbon atoms, preferably 1 to 10 carbon atoms, which may contain a heteroatom such as oxygen. The monovalent hydrocarbon group may be straight, branched or cyclic. Examples thereof include monovalent saturated aliphatic hydrocarbon groups, alkyl groups in which some hydrogen is substituted by hydroxyl, alkoxy, oxo, amino, alkylamino or the like, and monovalent saturated aliphatic hydrocarbon groups in which at least one carbon is replaced by a radical containing a heteroatom such as oxygen. Examples of the monovalent saturated aliphatic hydrocarbon group are as exemplified above for the alkyl group represented by $R^{L01}$ and $R^{L02}$. Illustrative examples of the substituted alkyl group are shown below.

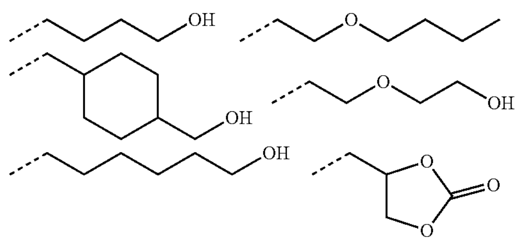

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkanediyl group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1), and x is an integer of 0 to 6.

Exemplary tertiary alkyl groups include tert-butyl, tert-pentyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups include trimethylsilyl, triethylsilyl, and dimethyl-tert-butylsilyl. Exemplary oxo-containing alkyl groups include 3-oxocyclohexyl, 4-methyl-2-oxooxan-4-yl, and 5-methyl-2-oxooxolan-5-yl.

In formula (L3), $R^{L05}$ is a substituted or unsubstituted $C_1$-$C_8$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-pentyl, n-pentyl, n-hexyl, cyclopentyl, and cyclohexyl, and substituted forms of such groups in which some hydrogen is substituted by hydroxyl, alkoxy, carboxyl, alkoxycarbonyl, oxo, amino, alkylamino, cyano, mercapto, alkylthio, sulfo or the like. Examples of the optionally substituted aryl groups include phenyl, methylphenyl, naphthyl, anthryl, phenanthryl, and pyrenyl, and substituted forms of such groups in which some hydrogen is substituted by hydroxyl, alkoxy, carboxyl, alkoxycarbonyl, oxo, amino, alkylamino, cyano, mercapto, alkylthio, sulfo or the like. Letter y is equal to 0 or 1, z is an integer of 0 to 3, and 2y+z is equal to 2 or 3.

In formula (L4), $R^{L06}$ is a substituted or unsubstituted $C_1$-$C_8$ alkyl group or a substituted or unsubstituted $C_6$-$C_{20}$ aryl group. Examples of the alkyl and aryl groups are the same as exemplified for $R^{L05}$ in formula (L3).

$R^{L07}$ to $R^{L16}$ are each independently hydrogen or an optionally substituted $C_1$-$C_{15}$ monovalent hydrocarbon group. Exemplary monovalent hydrocarbon groups include straight, branched or cyclic alkyl groups such as methyl, ethyl, propyl, isopropyl, n-butyl, sec-butyl, tert-butyl, tert-pentyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen is substituted by hydroxyl, alkoxy, carboxyl, alkoxycarbonyl, oxo, amino, alkylamino, cyano, mercapto, alkylthio, sulfo or the like. Alternatively, any two of $R^{L07}$ to $R^{L16}$, taken together, form a ring with the carbon atom to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a $C_1$-$C_{15}$ divalent hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$).

Of the acid labile groups of formula (L1), the straight and branched ones are exemplified by the following groups, but not limited thereto.

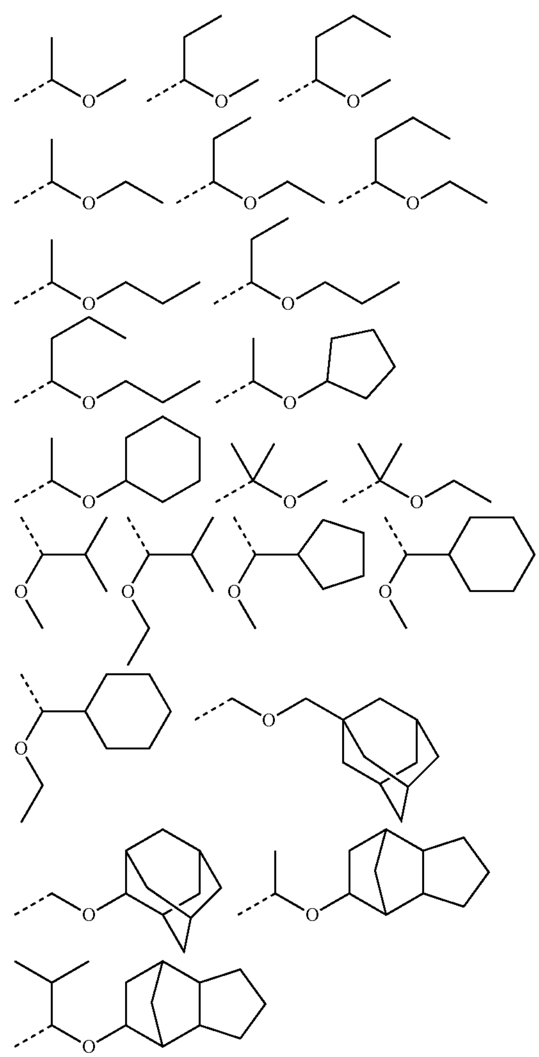

Of the acid labile groups of formula (L1), the cyclic ones are, for example, tetrahydrofuran-2-yl, 2-methyltetrahydrofiuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofnuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4A), groups having the following formulas (L4-1) to (L4-4) are preferred.

(L4-1)

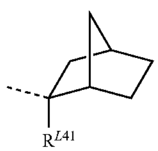

(L4-2)

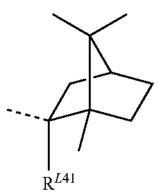

(L4-3)

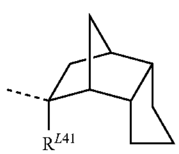

(L4-4)

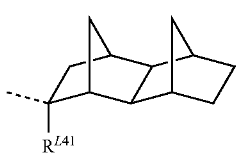

In formulas (L4-1) to (L4-4), the broken line denotes a bonding site and direction. $R^{L41}$ is each independently a monovalent hydrocarbon group, typically a $C_1$-$C_{10}$ alkyl group. The monovalent hydrocarbon group may be straight, branched or cyclic, and examples thereof include methyl, ethyl, propyl, isopropyl, n-butyl, sec-butyl, tert-butyl, tert-pentyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. When $X^A$ is an acid labile group having formula (L4), a plurality of stereoisomers may be included.

For example, the general formula (L4-3) represents one or a mixture of two selected from groups having the following formulas (L4-3-1) and (L4-3-2).

(L4-3-1)

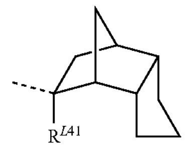

(L4-3-2)

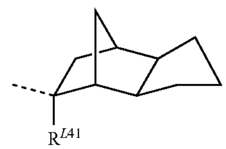

Similarly, the formula (L4-4) represents one or a mixture of two or more selected from groups having the following formulas (L4-4-1) to (L4-4-4).

(L4-4-1)

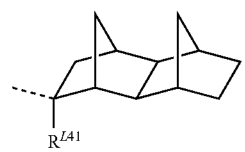

(L4-4-2)

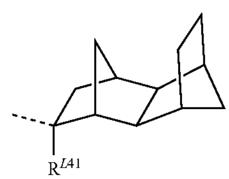

(L4-4-3)

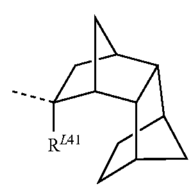

(L4-4-4)

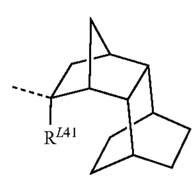

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

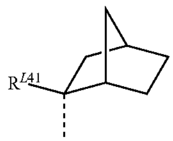

(L4-2-endo)

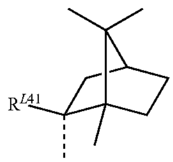

(L4-3-endo)

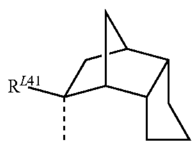

(L4-4-endo)

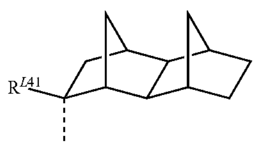

Illustrative examples of the acid labile group of formula (L4) are given below, but not limited thereto.

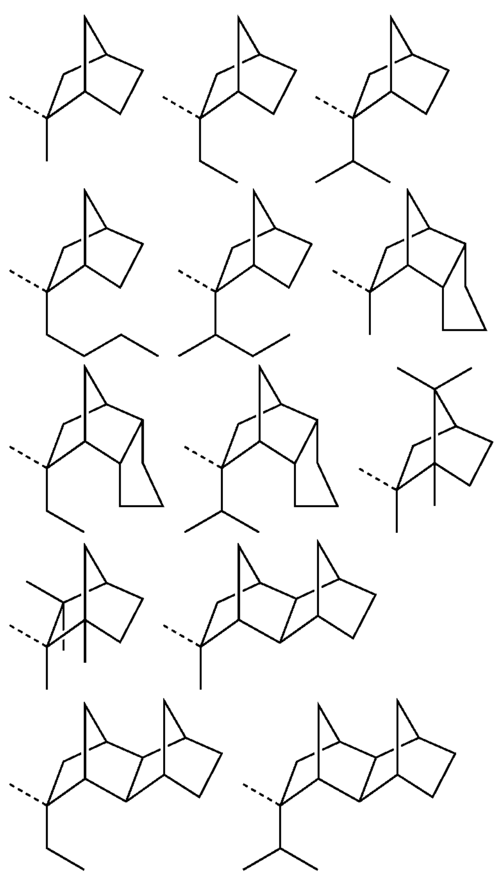

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $X^A$, are as exemplified for $R^{L04}$ in formula (L2).

Illustrative examples of the recurring units of formula (a) are given below, but not limited thereto. $R^A$ is as defined above.

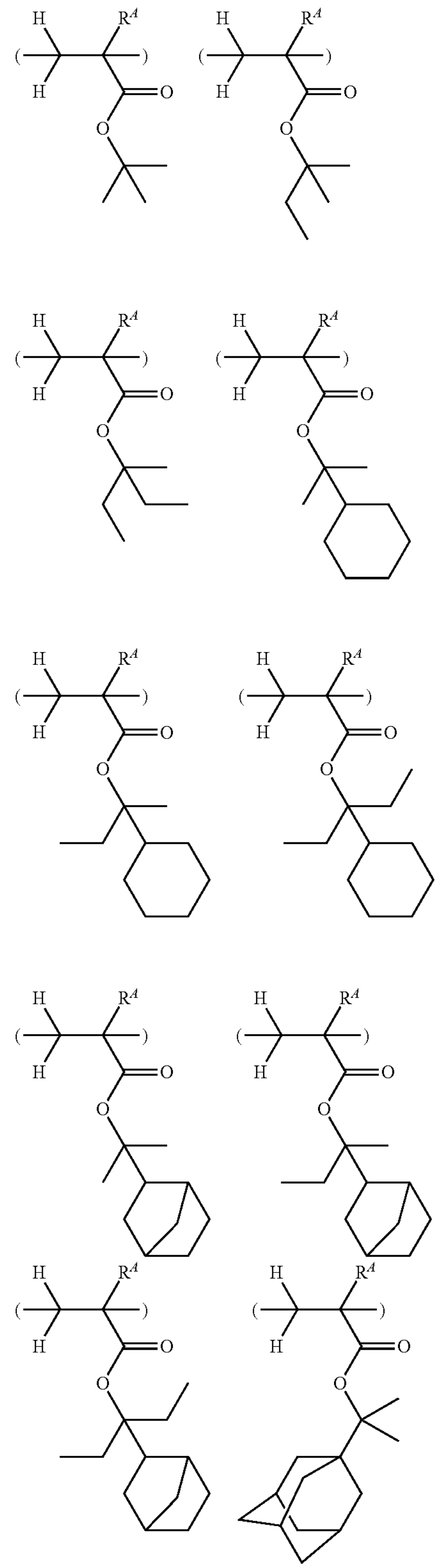

-continued
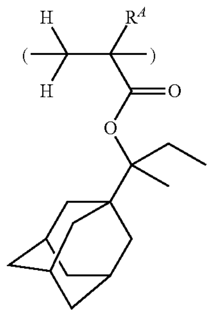
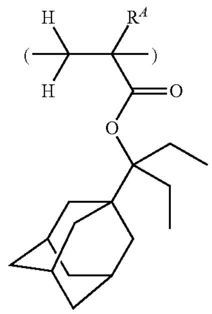
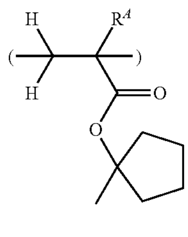
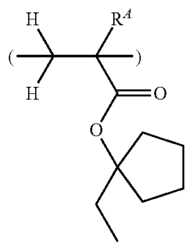
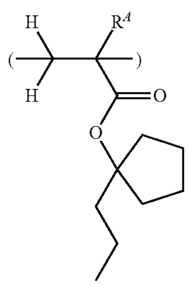
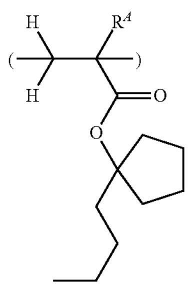
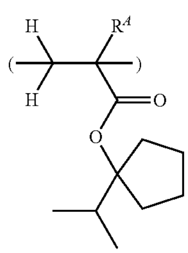
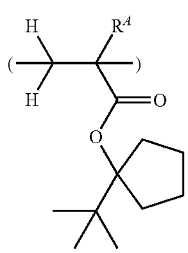
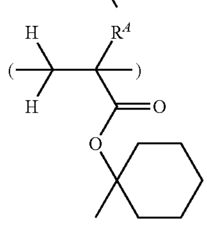
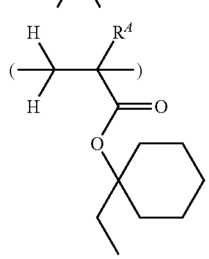
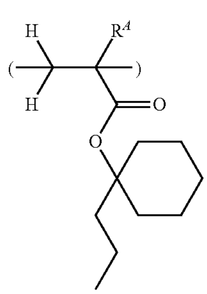
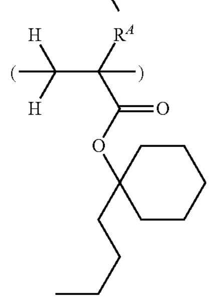
-continued
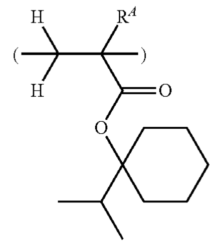
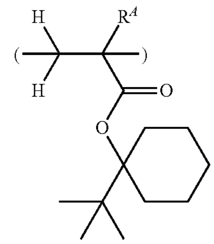
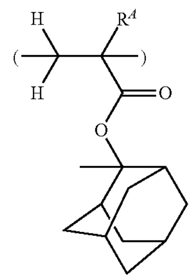
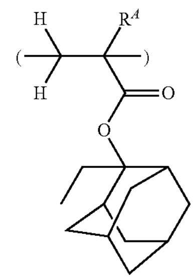
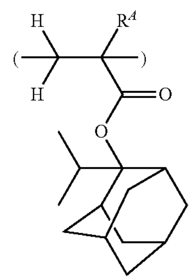
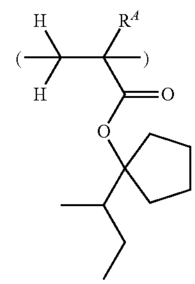
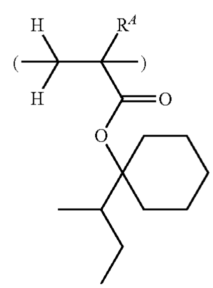
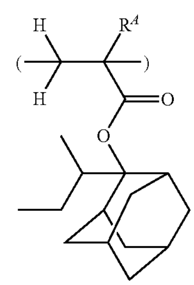
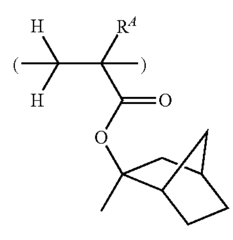
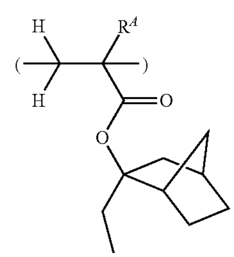
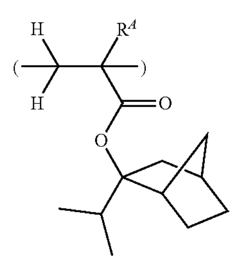
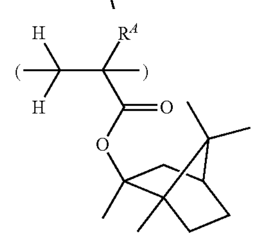

-continued
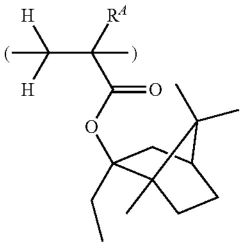
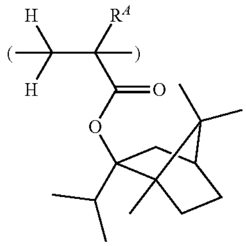
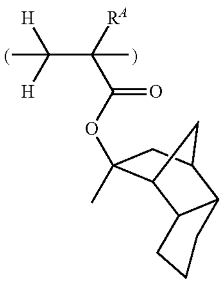
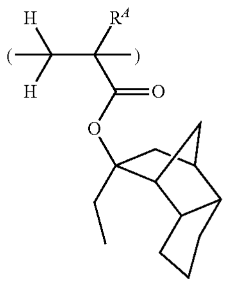
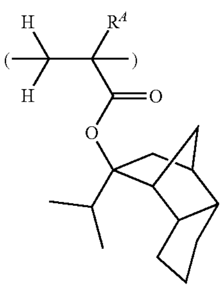
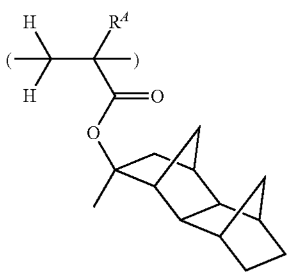
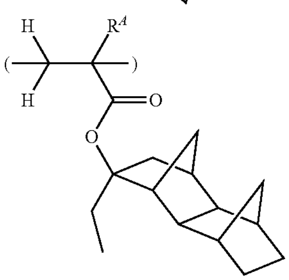
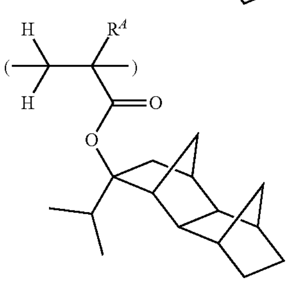
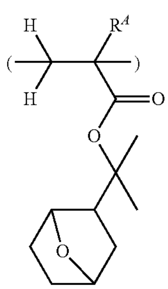
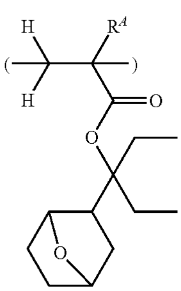
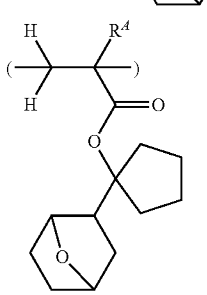
-continued
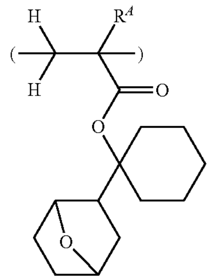
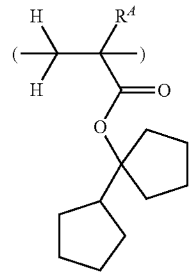
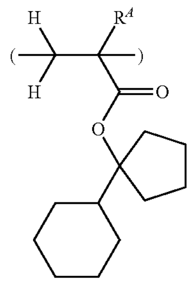
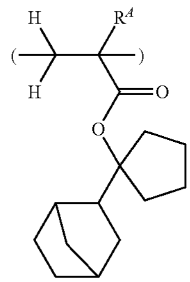
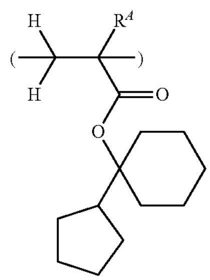
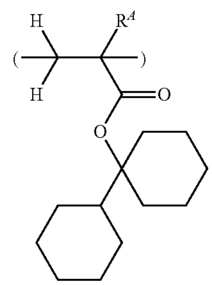
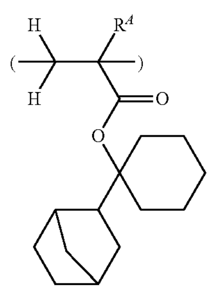
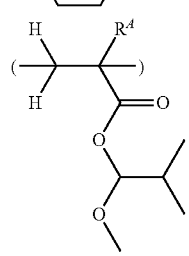
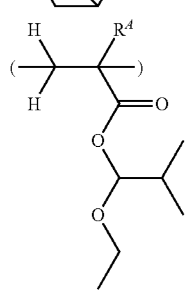
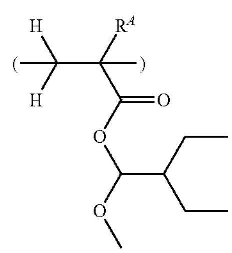
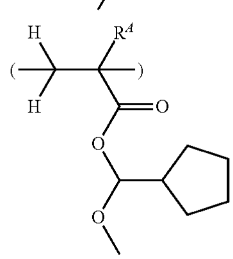
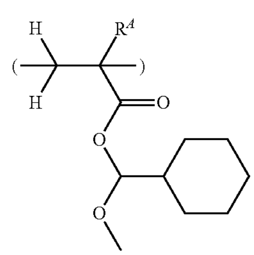

-continued

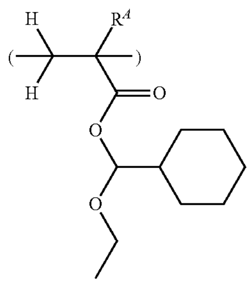

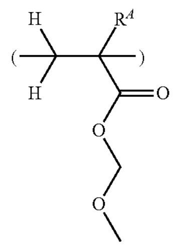

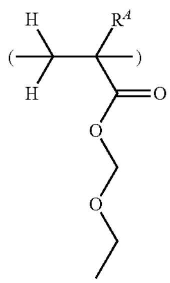

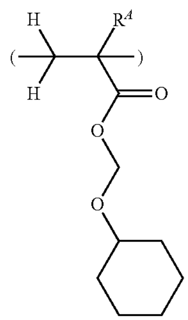

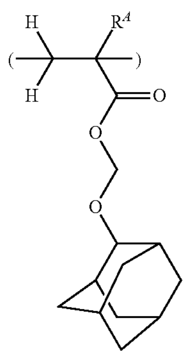

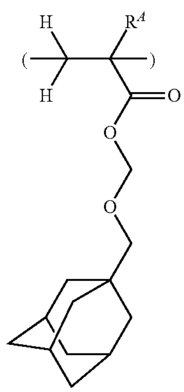

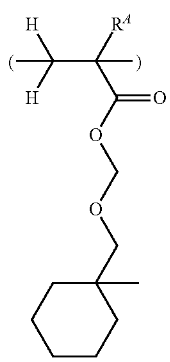

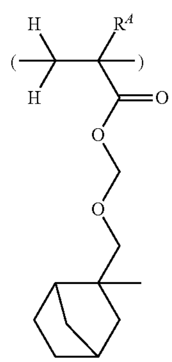

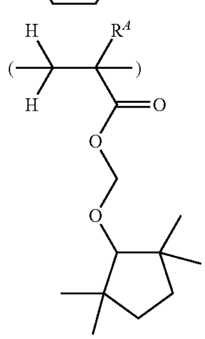

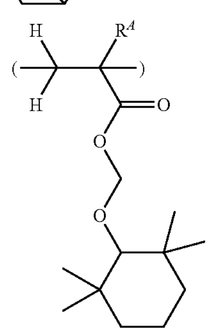

-continued

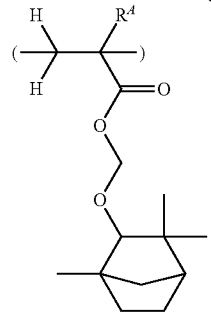

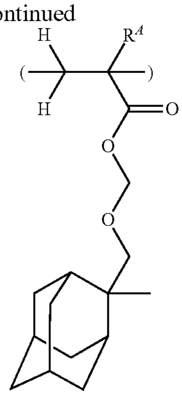

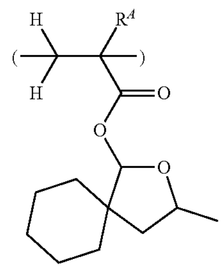

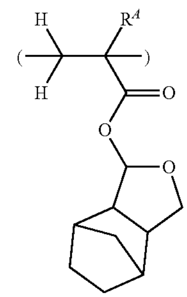

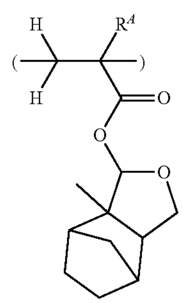

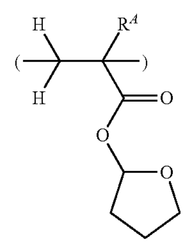

While the foregoing examples correspond to those units wherein $Z^A$ is a single bond, $Z^A$ which is other than a single bond may be combined with similar acid labile groups. Examples of units wherein $Z^A$ is other than a single bond are substantially the same as illustrated above.

Illustrative examples of the recurring units having formula (b) are shown below, but not limited thereto. $R^A$ is as defined above.

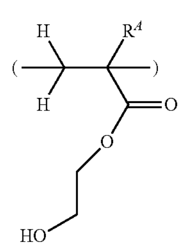

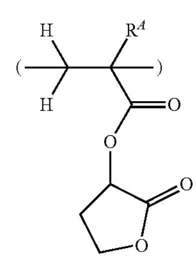

-continued
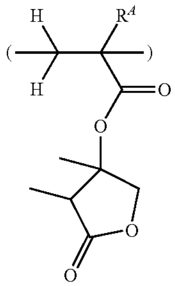
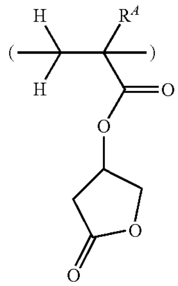
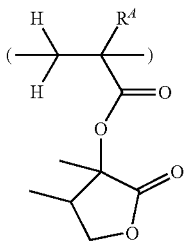
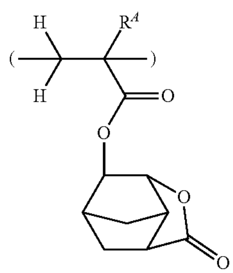
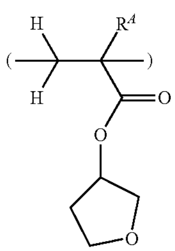
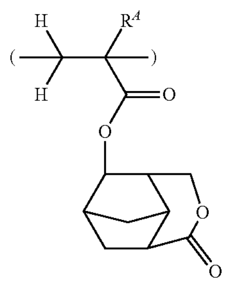
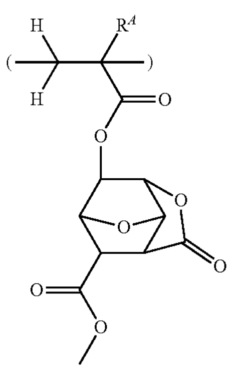
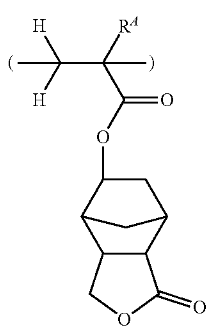
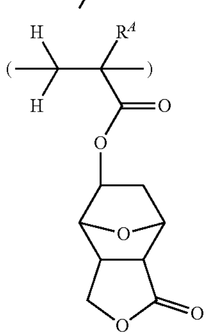
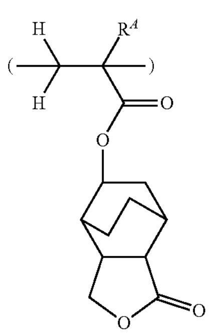
-continued
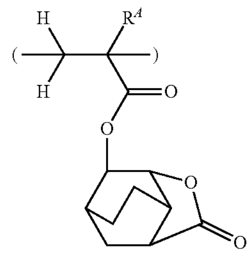
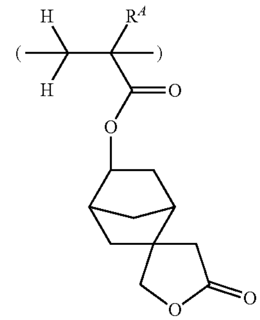
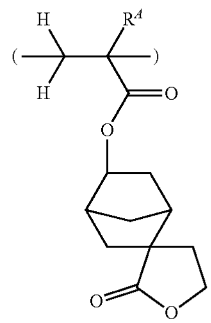
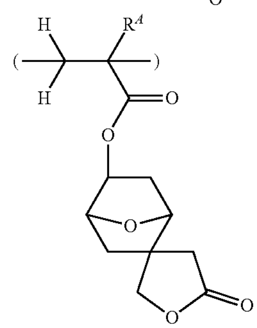
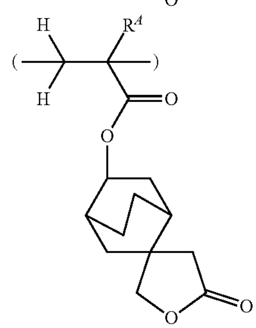
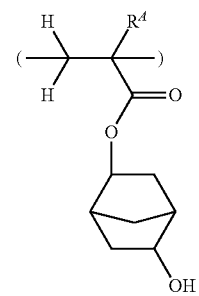
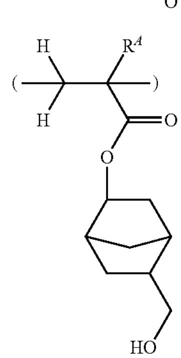
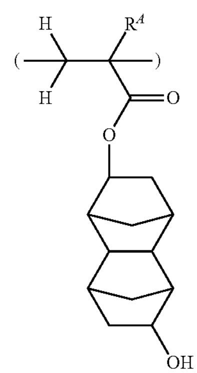
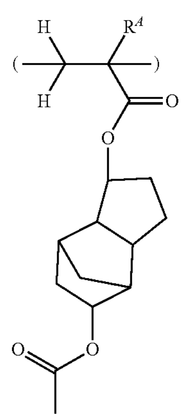
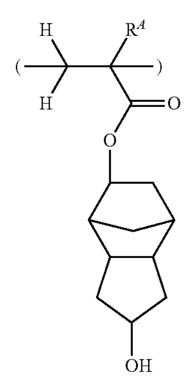

-continued
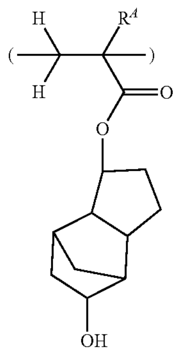
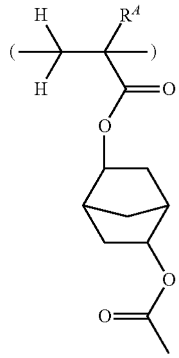
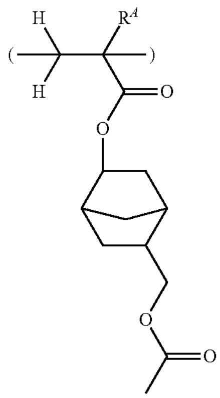
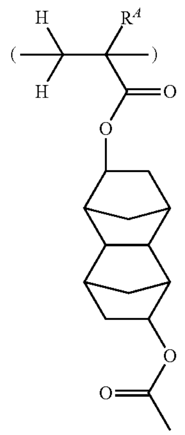
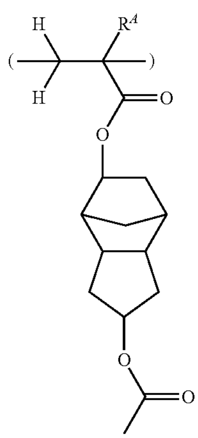
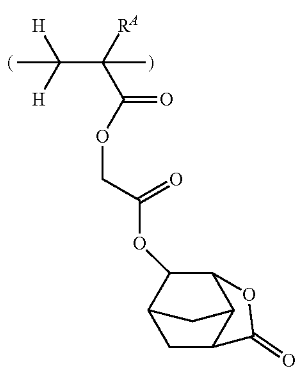
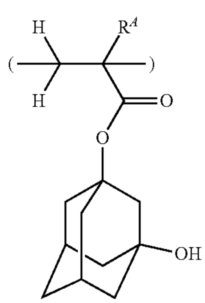
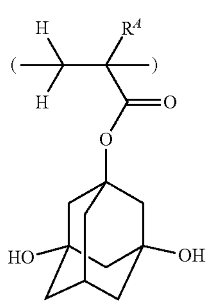
-continued
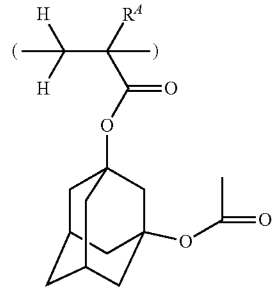
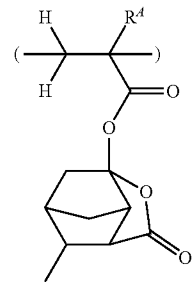
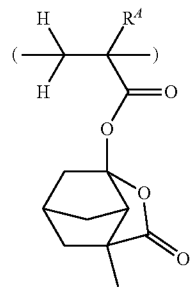
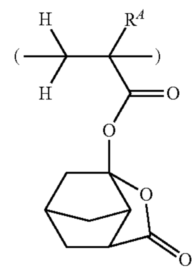
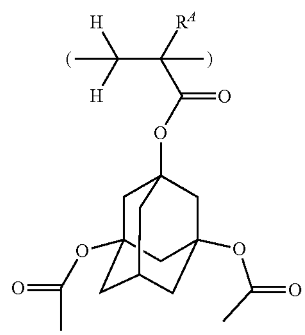
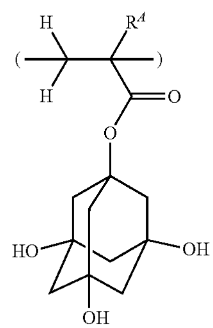
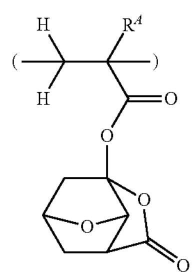
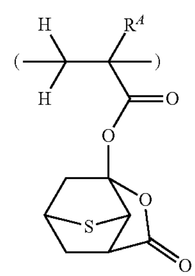
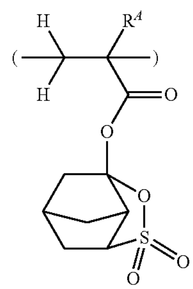
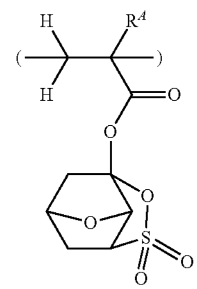

-continued
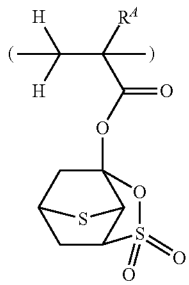
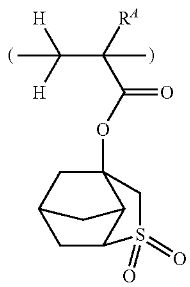
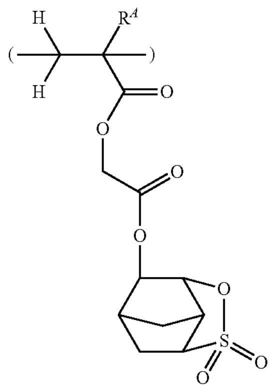
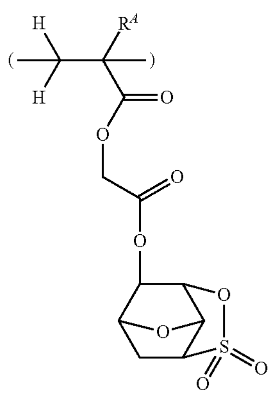
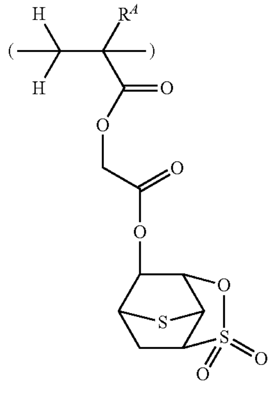
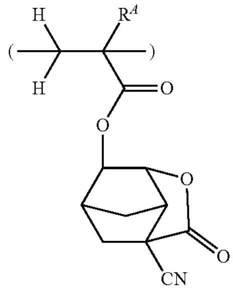
-continued
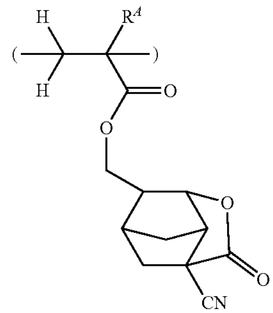
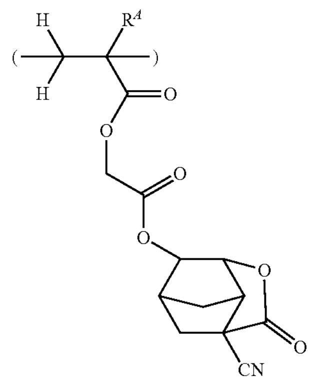
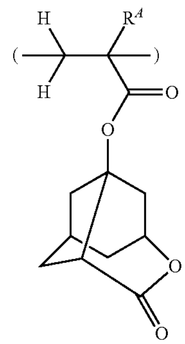
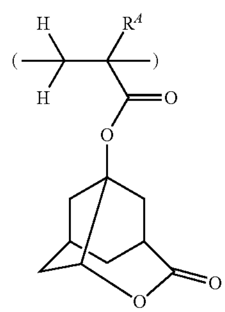
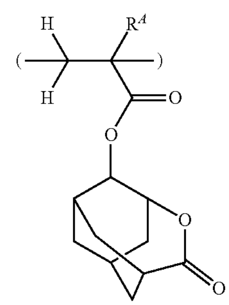
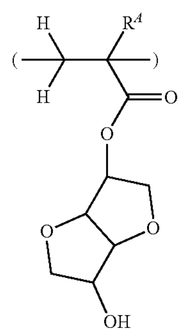
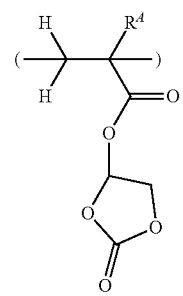
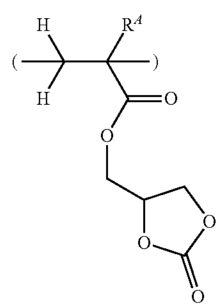
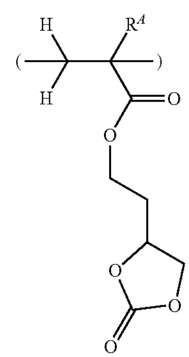

-continued
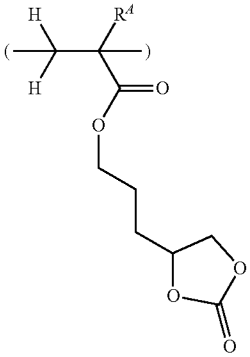
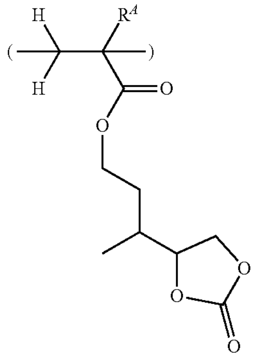
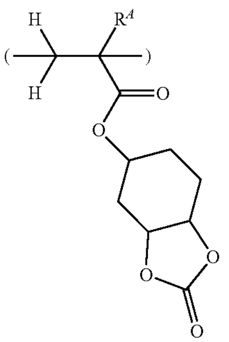
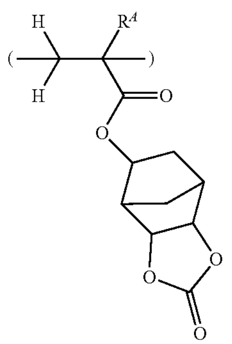
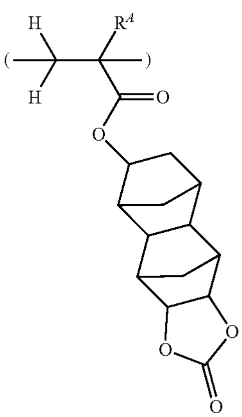
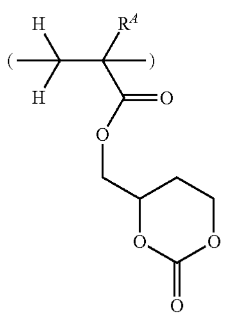
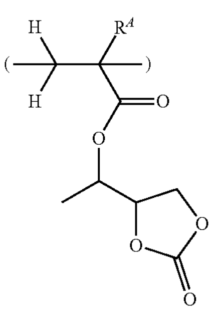
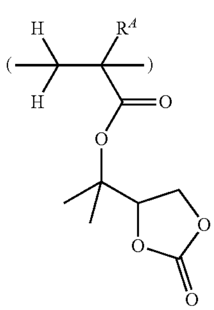
-continued
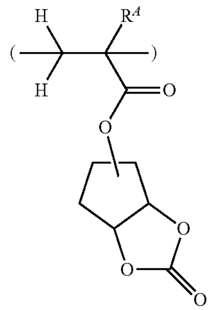
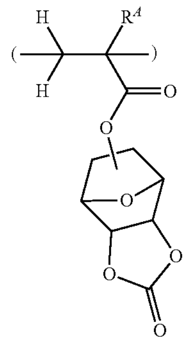
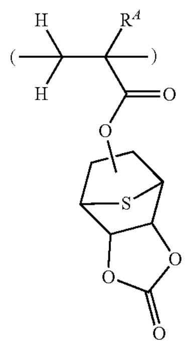
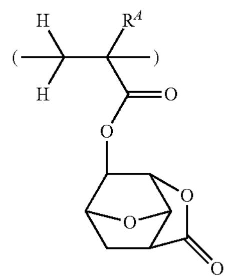
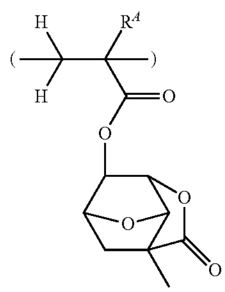
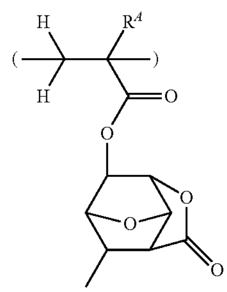
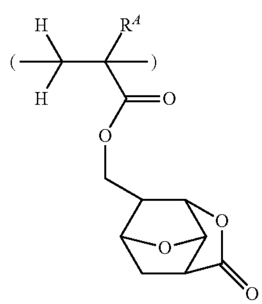
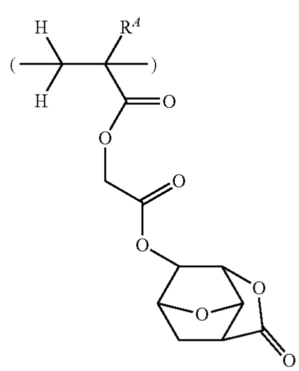
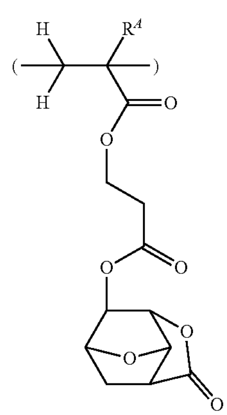

-continued
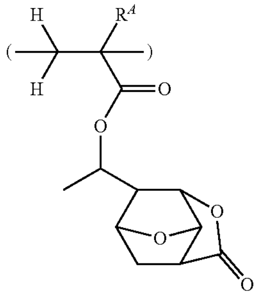
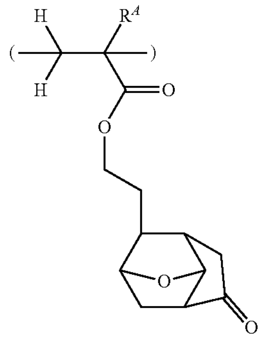
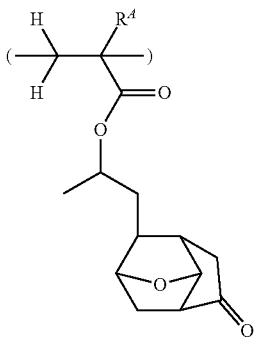
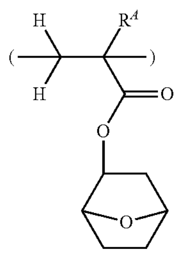
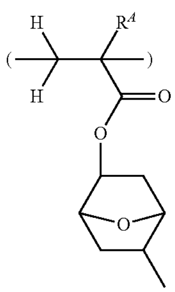
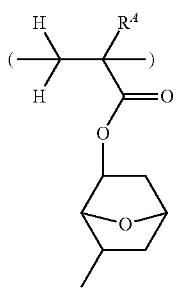
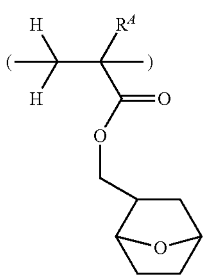
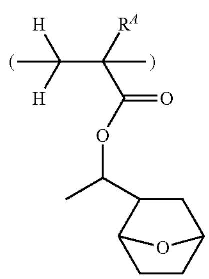
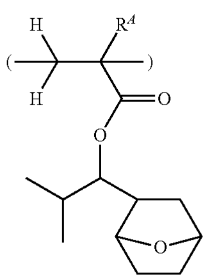
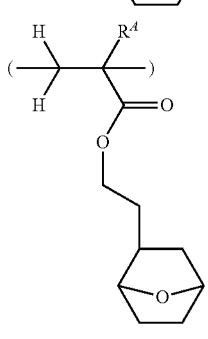
-continued
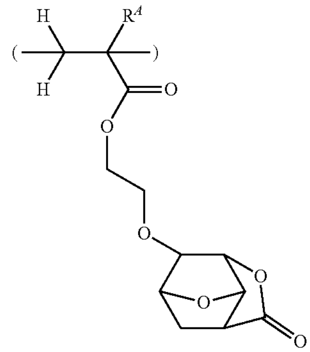
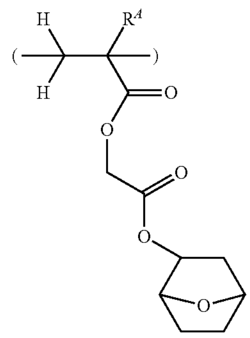
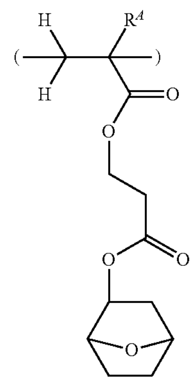
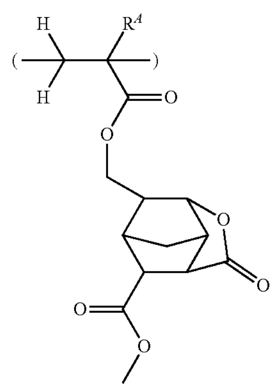
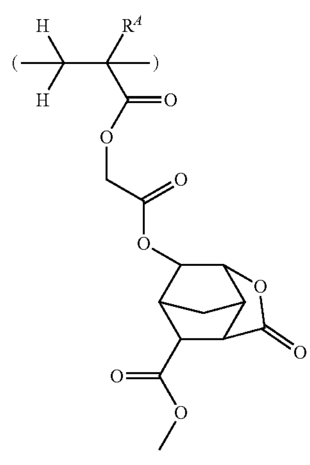

-continued
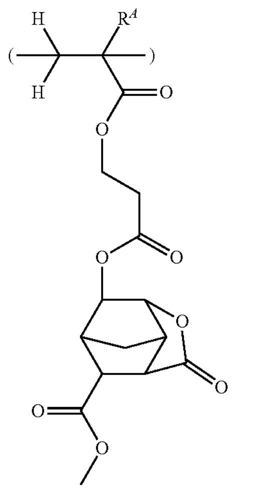
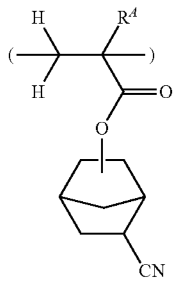
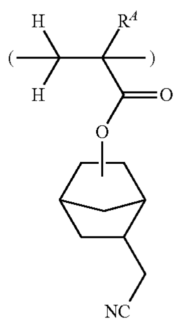
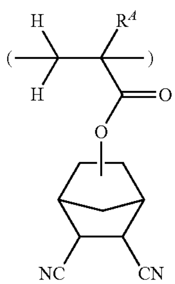
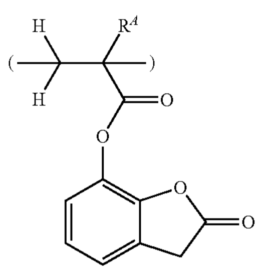
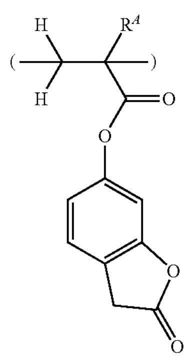
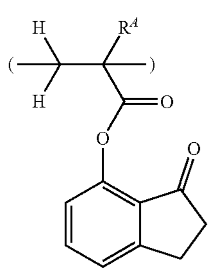
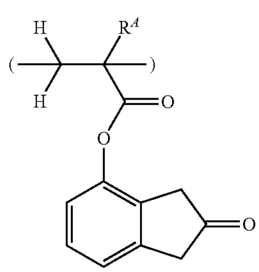
-continued
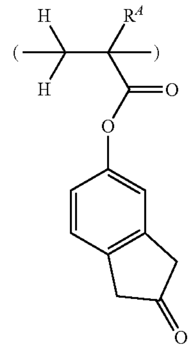
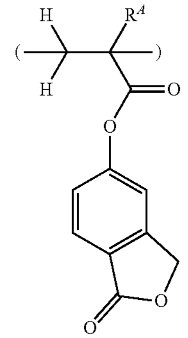
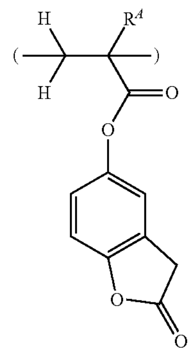
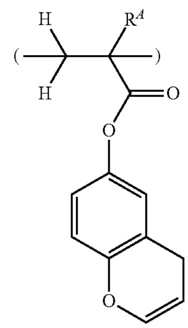
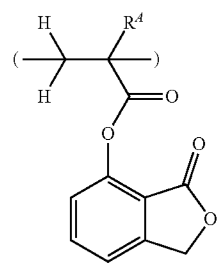
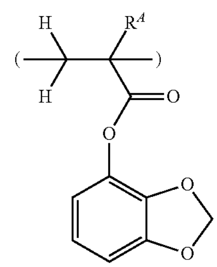
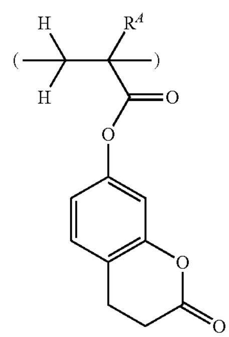
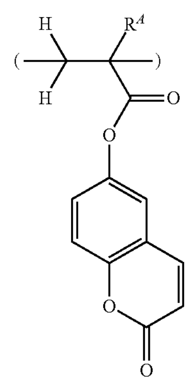
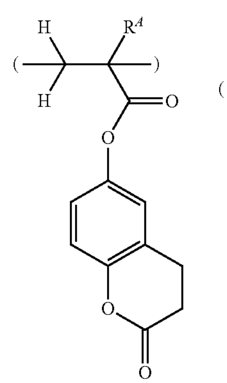
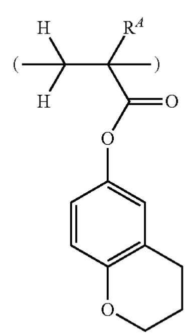

-continued
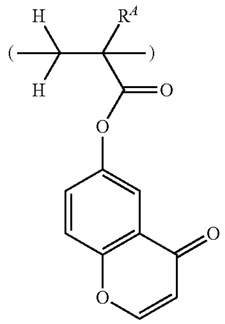
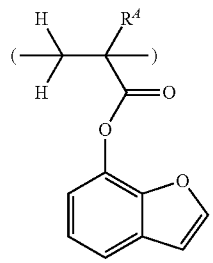
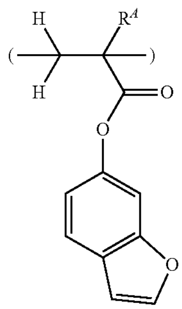
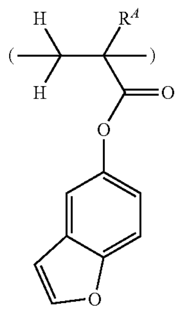
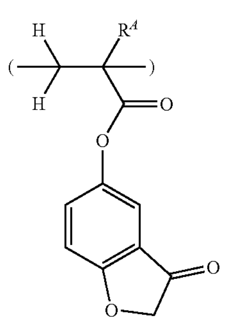
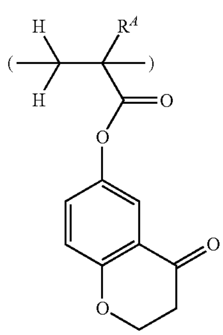
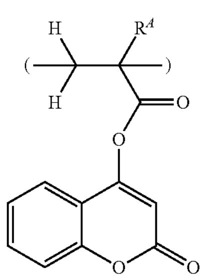
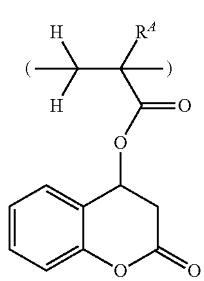
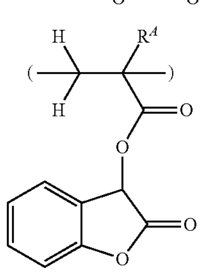
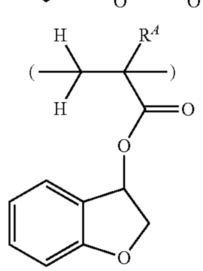
-continued
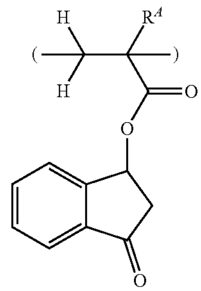
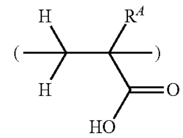
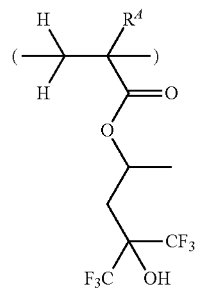
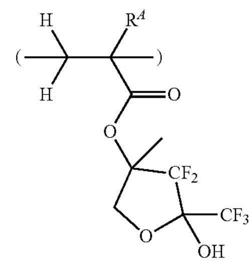
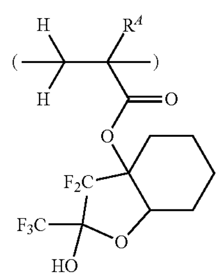
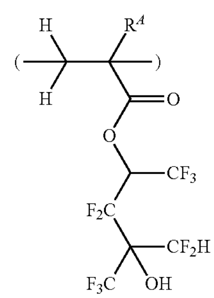
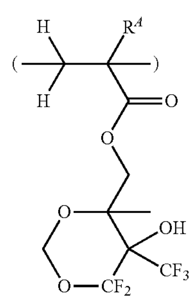
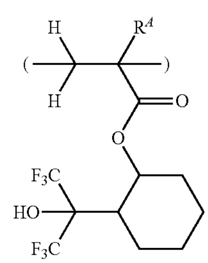
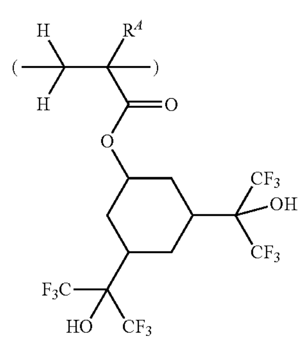

-continued
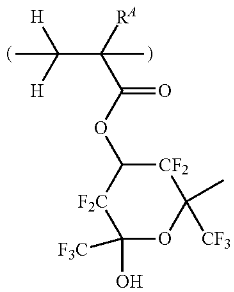
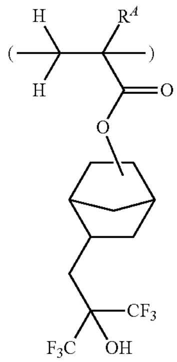
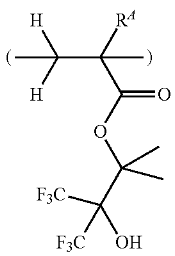
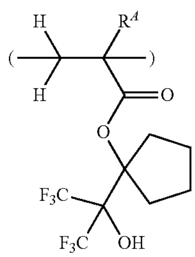
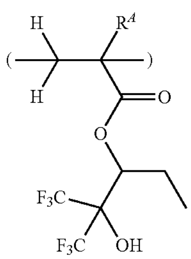
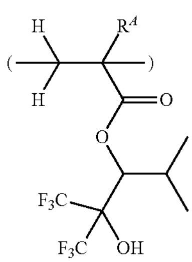
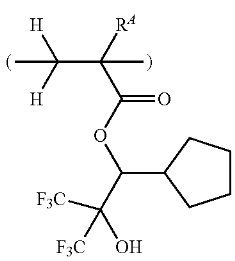
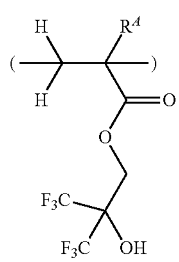
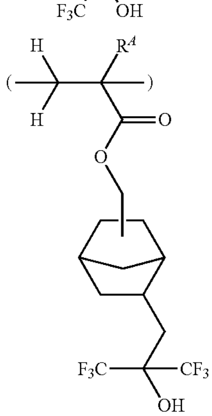
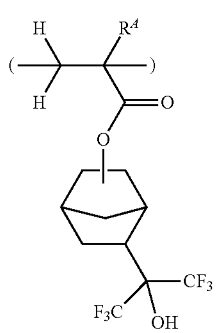
-continued
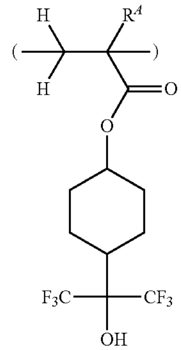
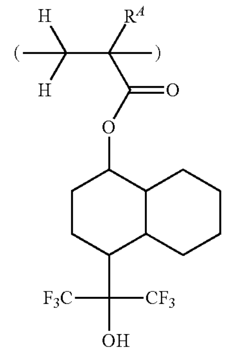
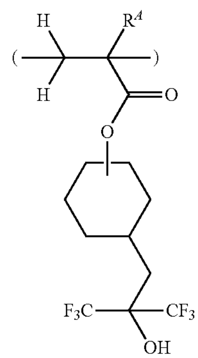
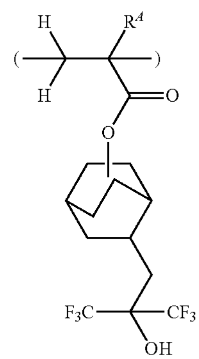
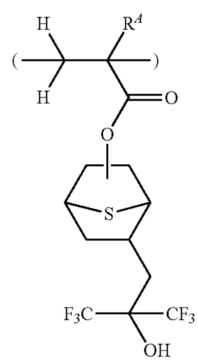
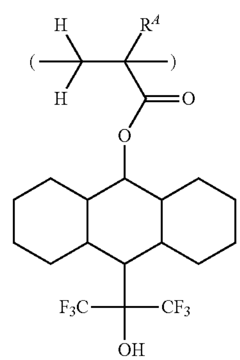
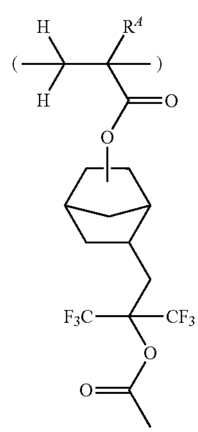
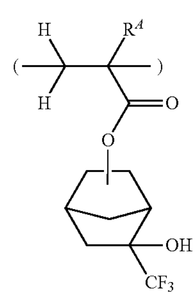

-continued
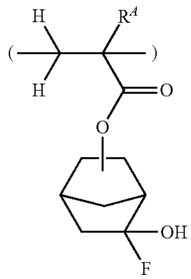
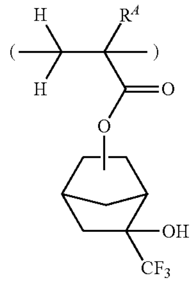
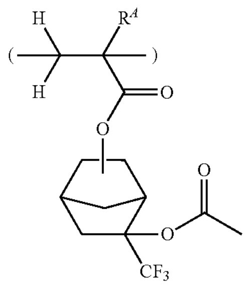
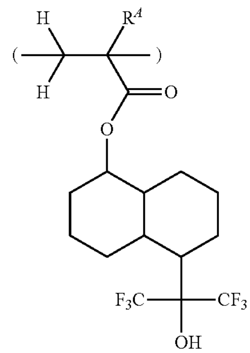
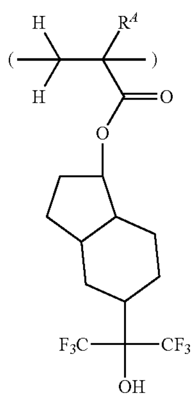
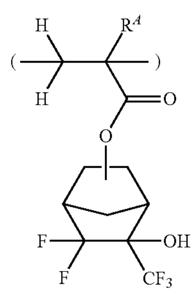
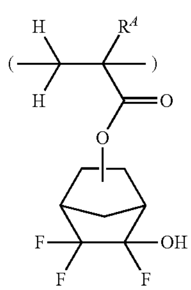
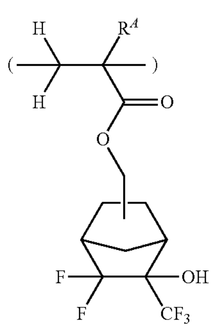
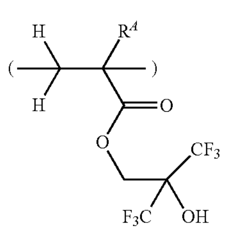
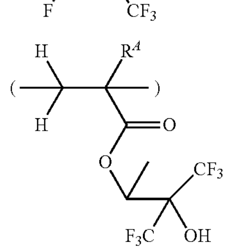
-continued
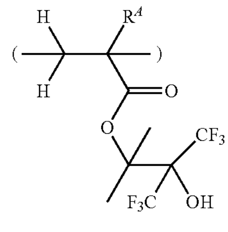
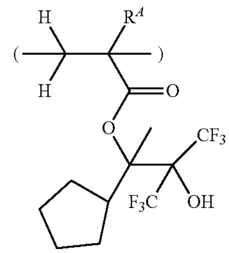
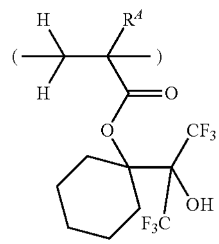
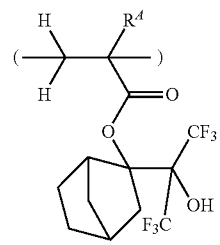
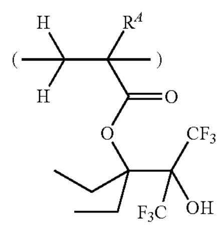
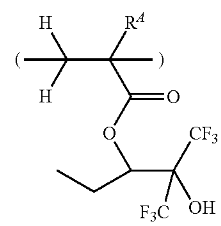
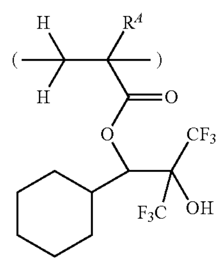
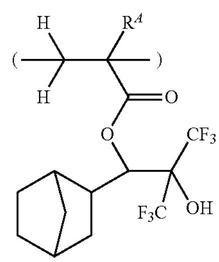
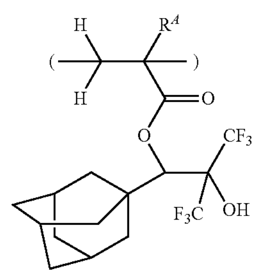
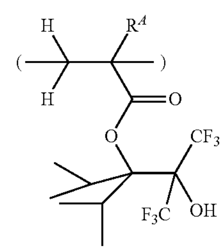
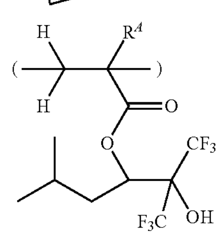
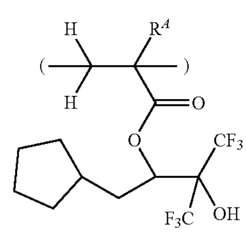
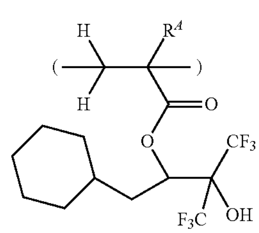
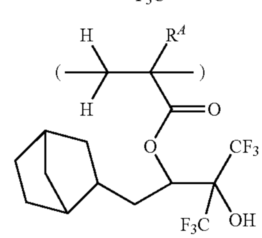

-continued
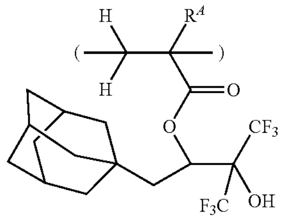
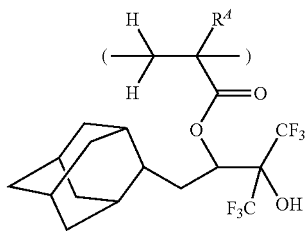
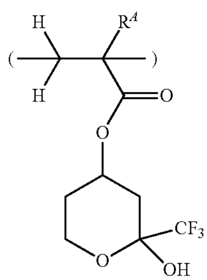
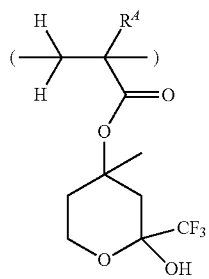
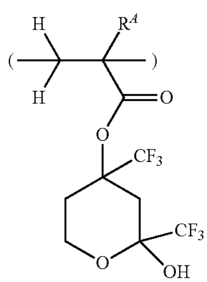
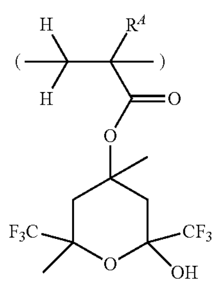
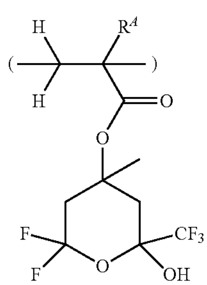
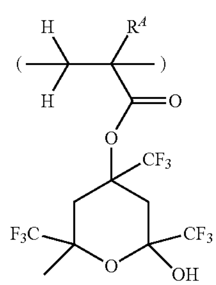
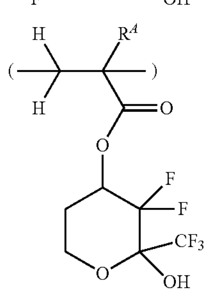
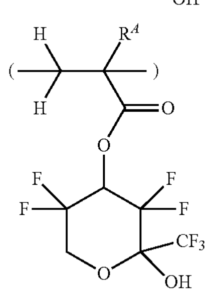
-continued
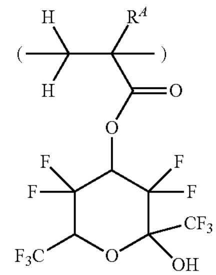
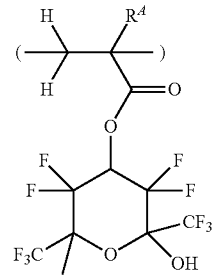
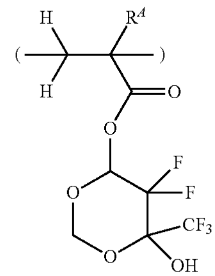
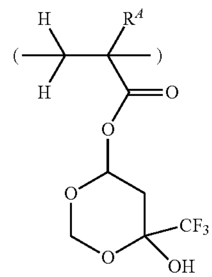
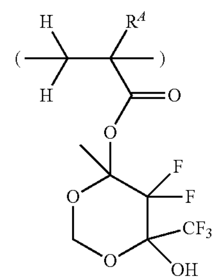
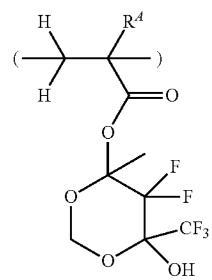
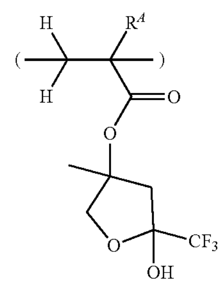
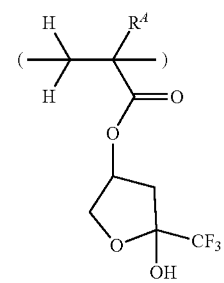
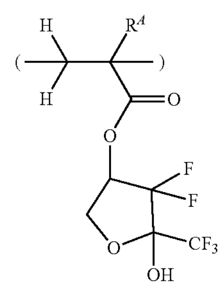
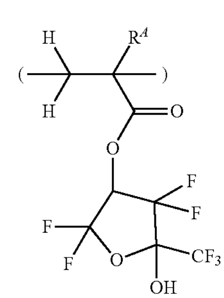
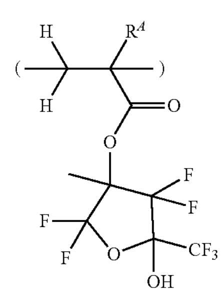
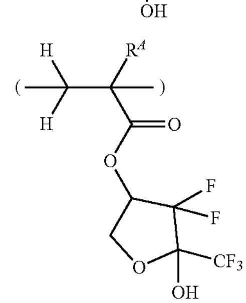

-continued
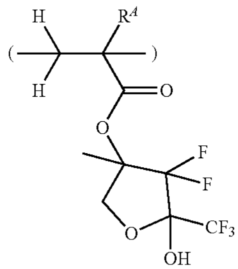
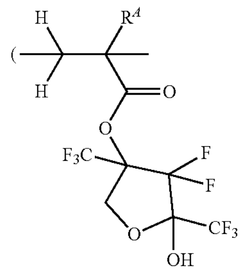
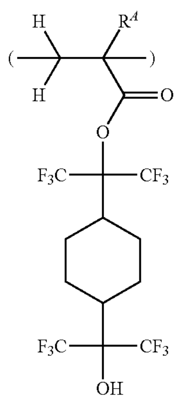
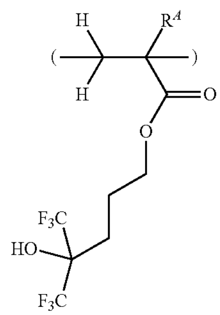
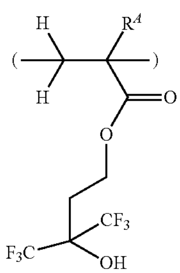
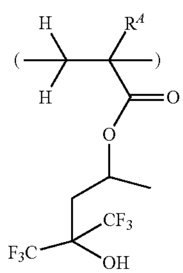
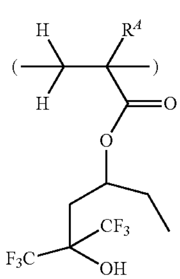
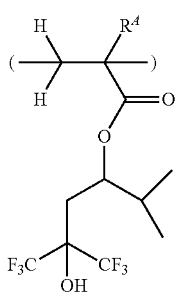
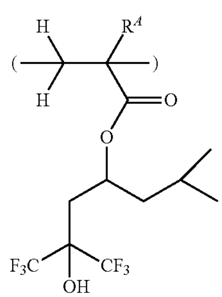
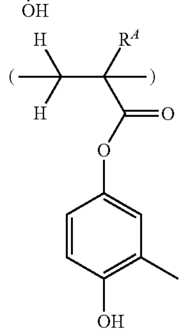
-continued
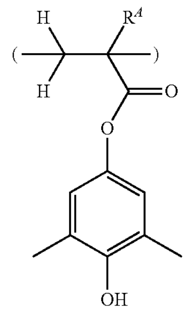
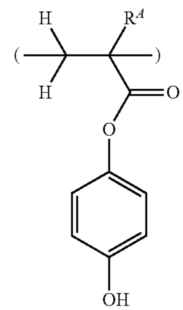
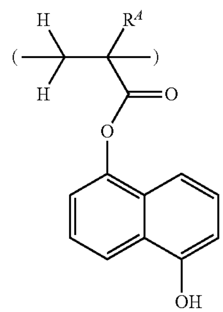
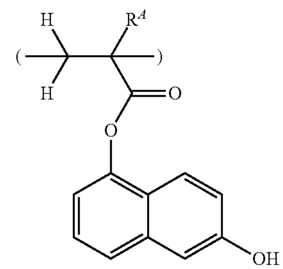
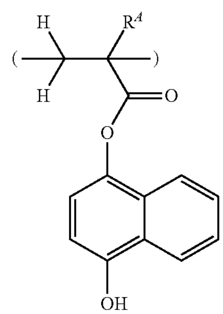
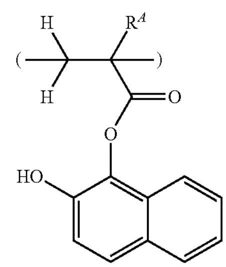
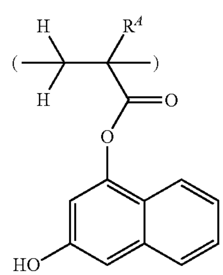
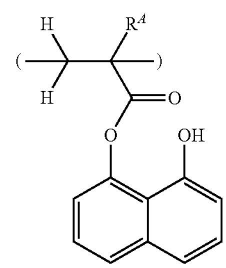
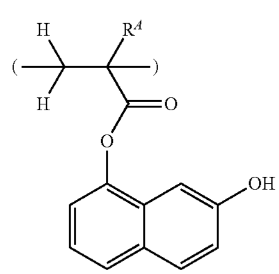

-continued
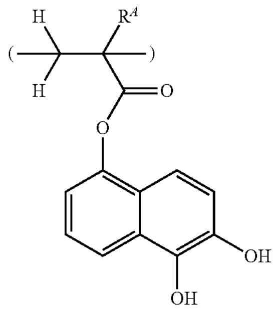
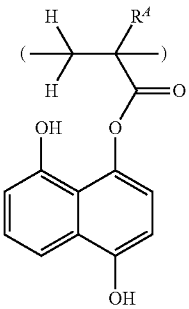
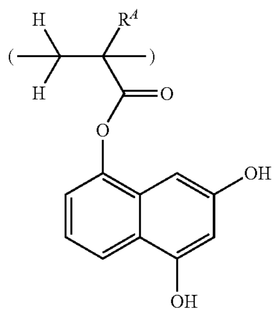
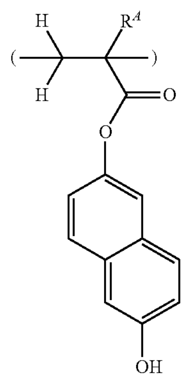
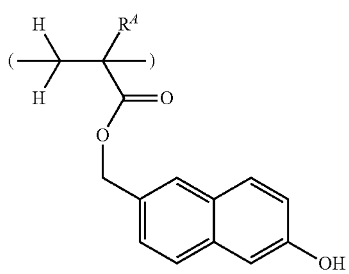
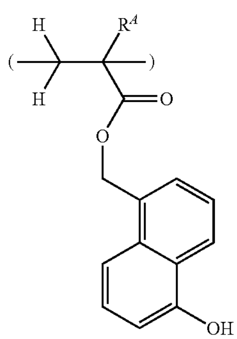
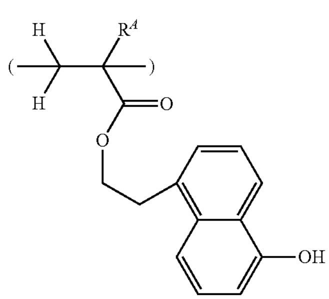
-continued
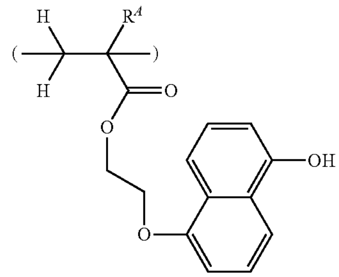
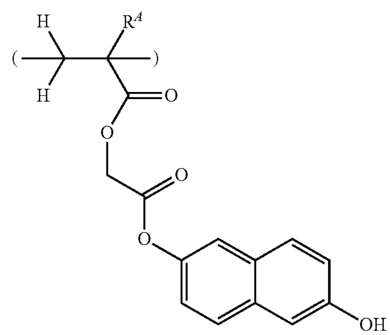
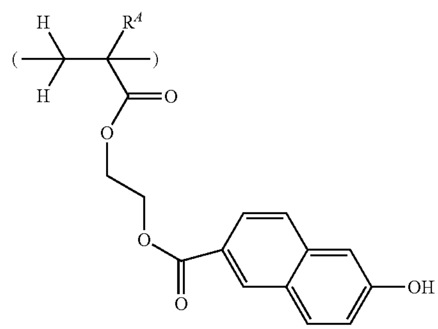
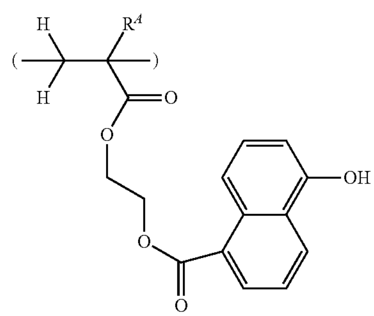
Of the recurring units having formula (b), those units having a lactone ring as the polar group are most preferred.
The base resin may further comprise recurring units having any one of the formulae (c1) to (c5).
(c1)
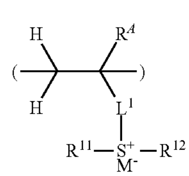

-continued (c2)

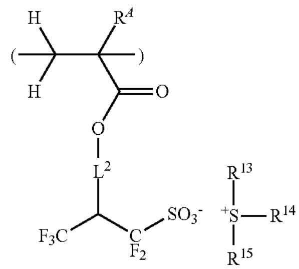

(c3)

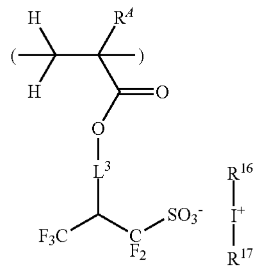

(c4)

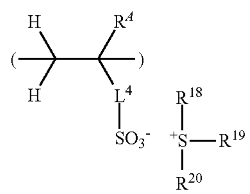

(c5)

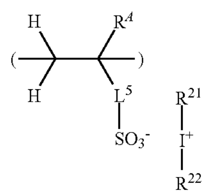

In formulae (c1) to (c5), $R^A$ is as defined above. $R^{11}$ to $R^{22}$ are each independently a $C_1$-$C_{30}$ monovalent hydrocarbon group which may contain a heteroatom. $R^{11}$ and $R^{12}$ may bond together to form a ring with the sulfur atom to which they are attached; $R^{13}$ and $R^{14}$ may bond together to form a ring with the sulfur atom to which they are attached; $R^{18}$ and $R^{19}$ may bond together to form a ring with the sulfur atom to which they are attached.

Examples of the monovalent hydrocarbon group (which may contain a heteroatom) represented by $R^{11}$ to $R^{22}$ are as exemplified above for $R^a$ in formula (1a). $R^{11}$ to $R^{22}$ are preferably aryl groups in which hydrogen may be substituted by a heteroatom-containing radical.

In formula (c1), $L^1$ is a single bond, phenylene group, —C(═O)-$L^{11}$-$L^{12}$- or —O-$L^{12}$-, wherein $L^{11}$ is —O— or —NH—, and $L^{12}$ is a $C_1$-$C_6$ divalent aliphatic hydrocarbon group which may contain a carbonyl, ester bond, ether bond or hydroxyl radical, or a phenylene group.

In formulae (c2) and (c3), $L^2$ and $L^3$ are each independently a single bond or -$L^{21}$-C(═O)—O—, wherein $L^{21}$ is a $C_1$-$C_{20}$ divalent hydrocarbon group which may contain a heteroatom.

In formulae (c4) and (c5), $L^4$ and $L^5$ are each independently a single bond, methylene group, ethylene group, phenylene group, fluorinated phenylene group, —C(═O)-$L^{31}$-$L^{32}$ or —O-$L^{32}$-, wherein $L^{31}$ is —O— or —NH—, and $L^{32}$ is a $C_1$-$C_6$ divalent aliphatic hydrocarbon group which may contain a carbonyl, ester bond, ether bond or hydroxyl radical, or a phenylene group.

The divalent aliphatic hydrocarbon group represented by $L^{12}$ or $L^{32}$ may be straight, 1 to branched or cyclic. Examples include straight, branched or cyclic divalent saturated aliphatic hydrocarbon groups such as methylene, ethane-1,1-diyl, ethane-1,2-diyl, propane-1,2-diyl, propane-2,2-diyl, propane-1,3-diyl, 2-methylpropane-1,3-diyl, butane-1,3-diyl, butane-2,3-diyl, butane-1,4-diyl, pentane-1,3-diyl, pentane-1,4-diyl, 2,2-dimethylpropane-1,3-diyl, pentane-1,5-diyl, hexane-1,6-diyl, cyclopentane-1,2-diyl, cyclopentane-1,3-diyl, and cyclohexane-1,6-diyl; and straight, branched or cyclic divalent unsaturated aliphatic hydrocarbon groups such as ethene-1,2-diyl, 1-propene-1,3-diyl, 2-butene-1,4-diyl, 1-methyl-1-butene-1,4-diyl, and 2-cyclohexene-1,4-diyl.

The divalent hydrocarbon group (which may contain a heteroatom) represented by $L^{21}$ may be straight, branched or cyclic, and examples thereof are shown below, but not limited thereto.

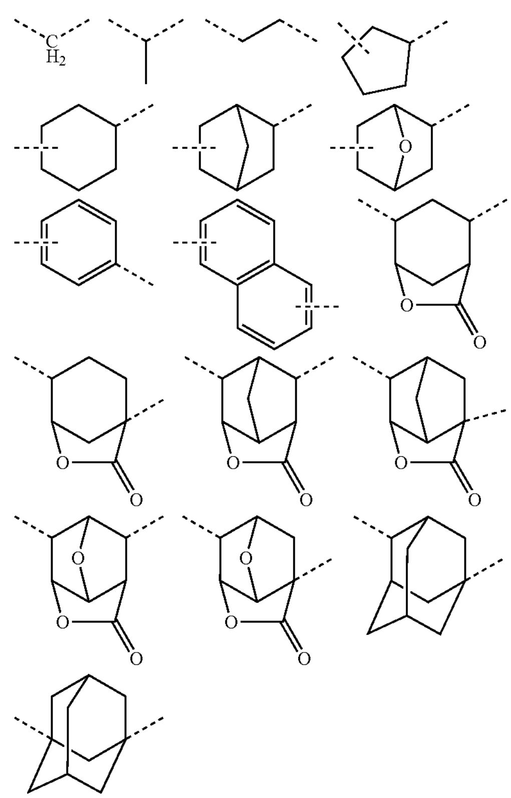

When $R^{11}$ and $R^{12}$ bond together to form a ring with the sulfur atom to which they are attached, or any two of $R^{13}$, $R^{14}$ and $R^{15}$ bond together to form a ring with the sulfur atom to which they are attached, examples of the ring are shown below, but not limited thereto.

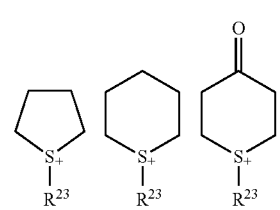

-continued
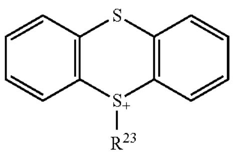
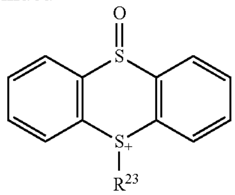
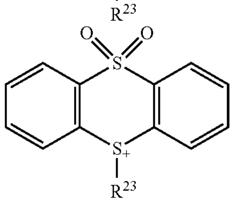
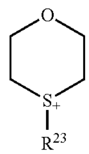
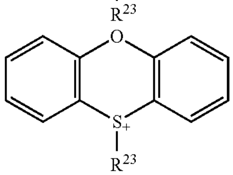
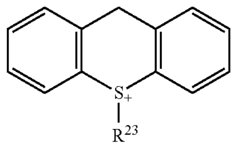
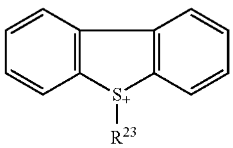
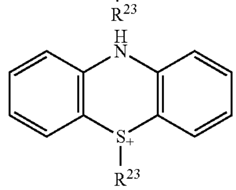
Herein $R^{23}$ is a $C_1$-$C_{30}$ monovalent hydrocarbon group which may contain a heteroatom, examples of which are as exemplified above for $R^{11}$ to $R^{22}$ in formulae (c1) to (c5).
Examples of the sulfonium cation in formulae (c2) and (c4) are shown below, but not limited thereto.
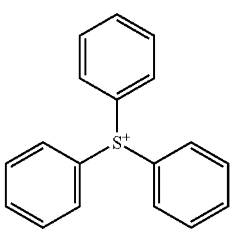
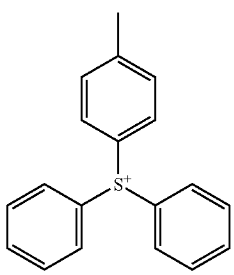
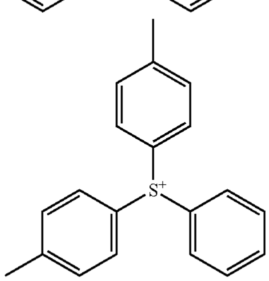
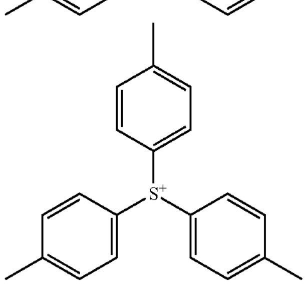
-continued
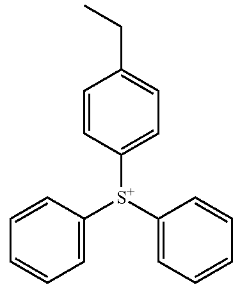
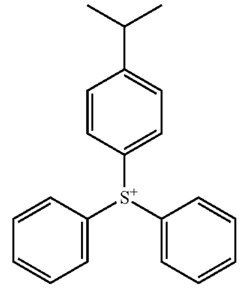
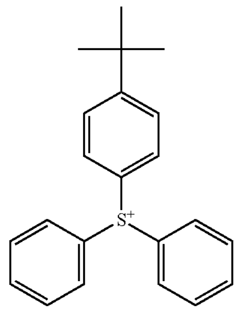
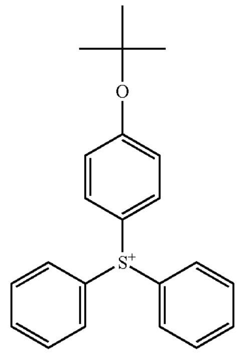
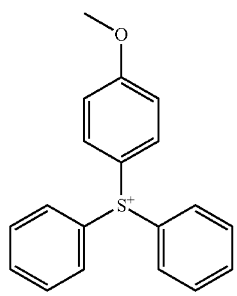
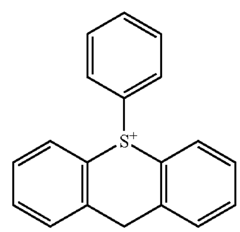
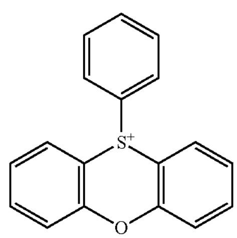
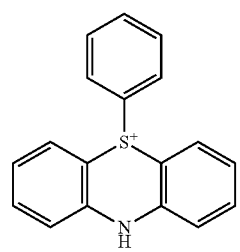
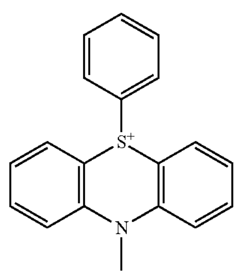
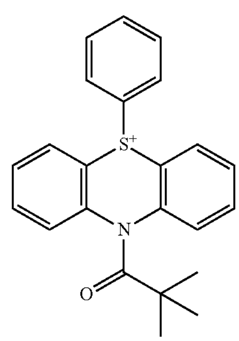

-continued
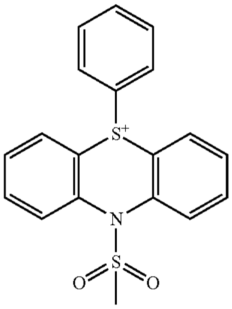
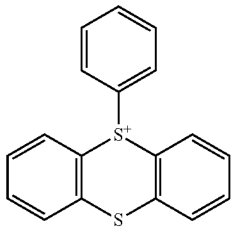
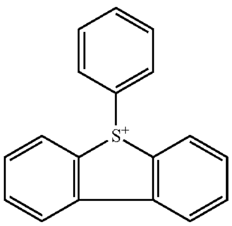
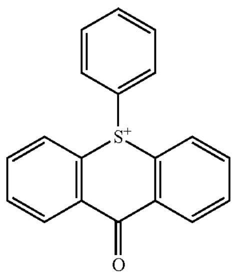
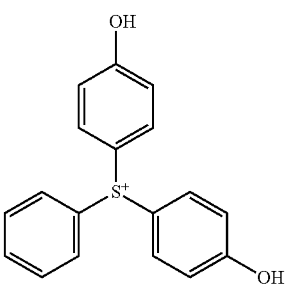
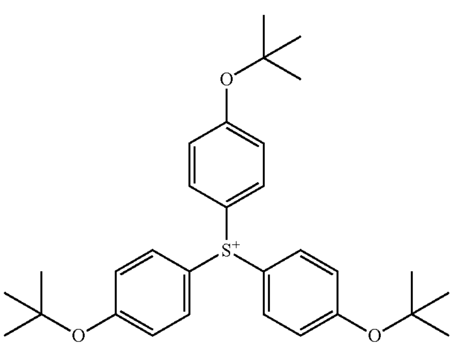
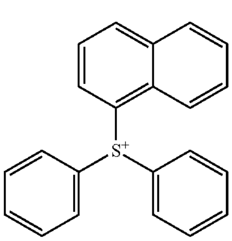
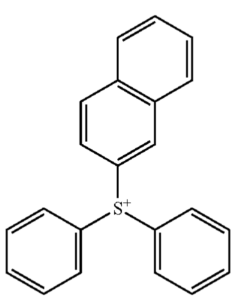
-continued
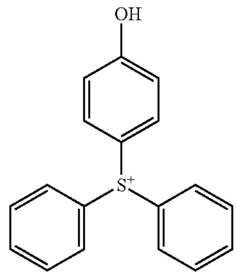
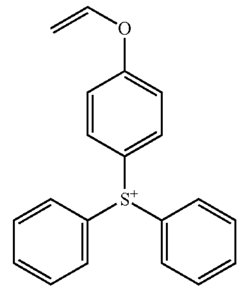
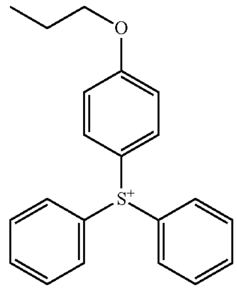
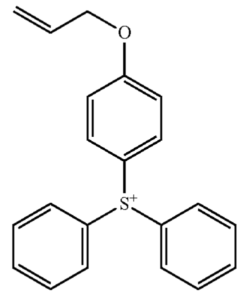
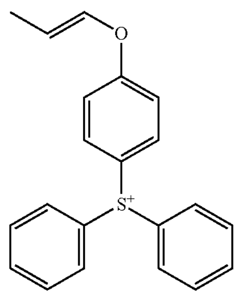
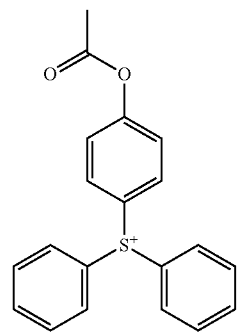
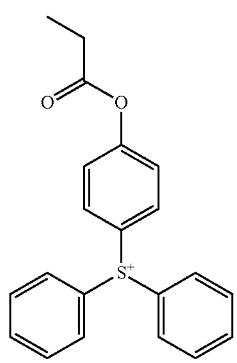
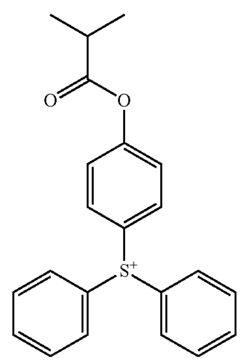
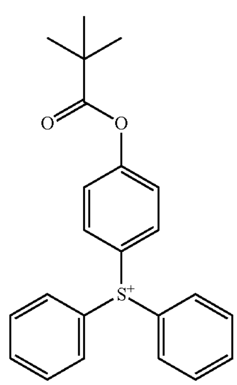
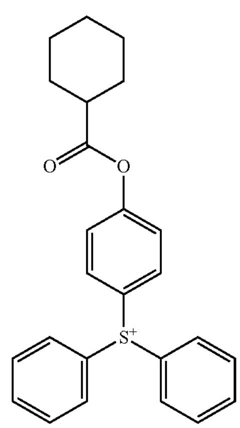

-continued
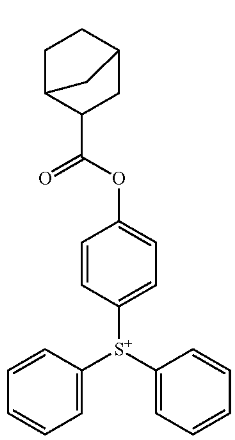
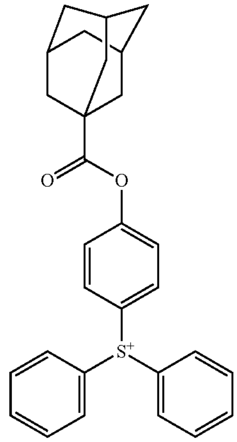
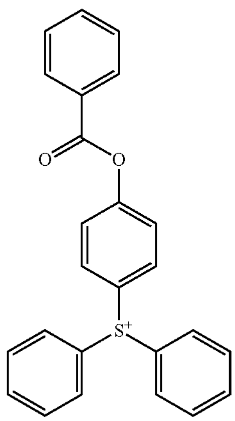
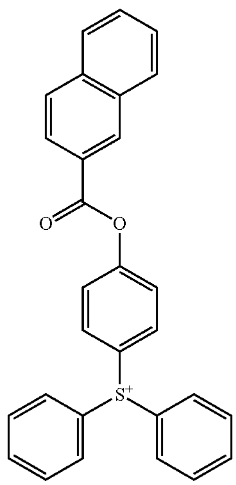
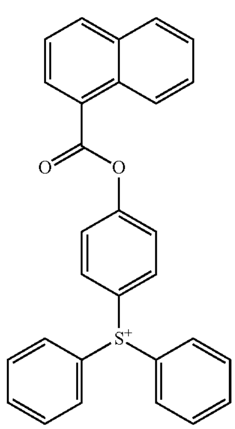
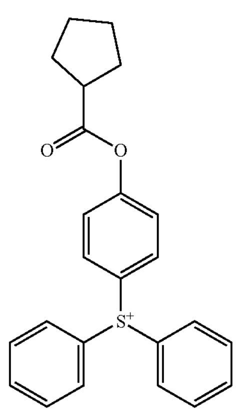
-continued
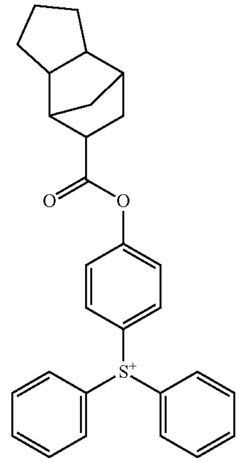
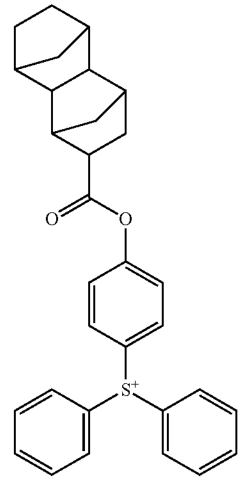
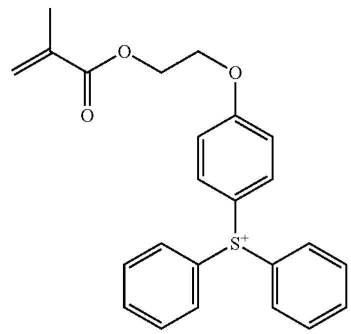
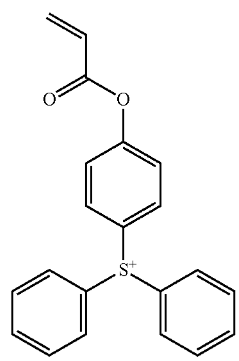
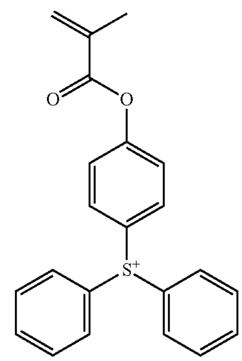
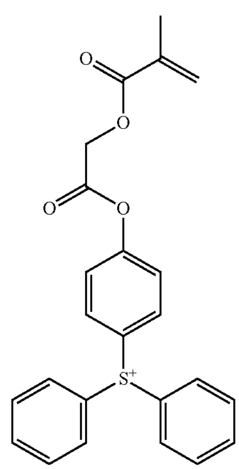

-continued
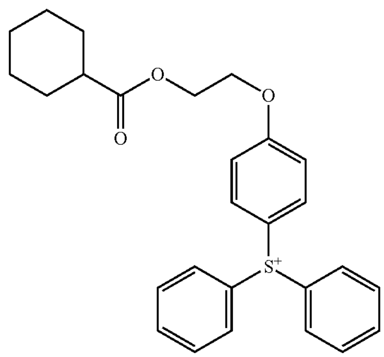
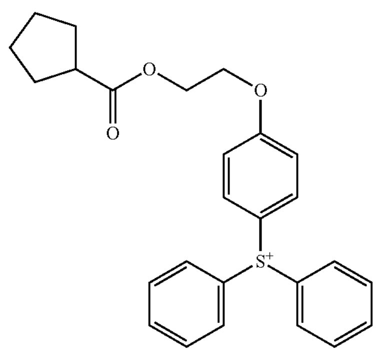
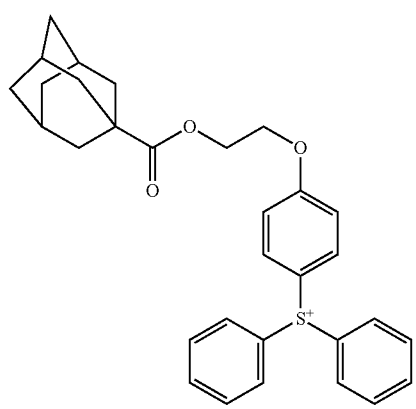
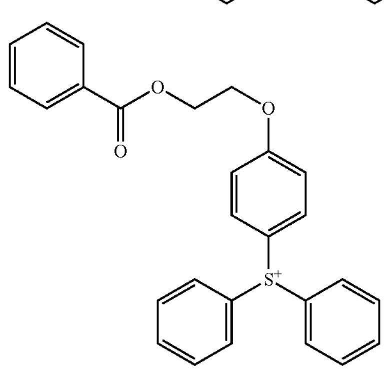
-continued
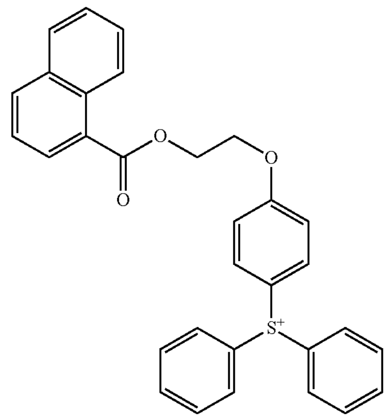
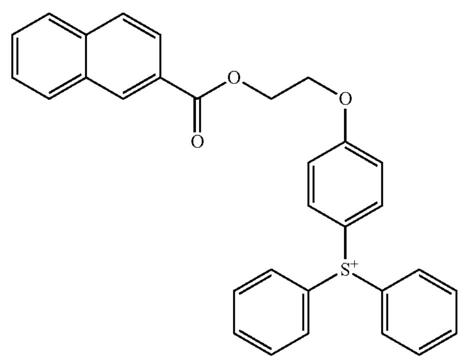
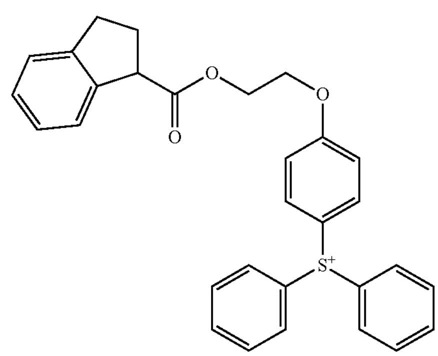
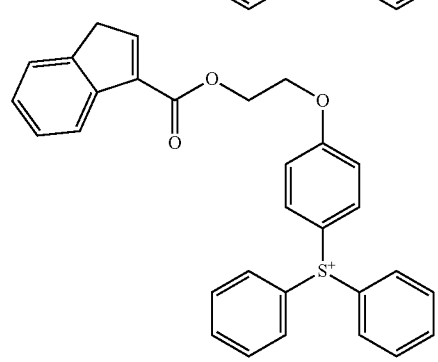

-continued
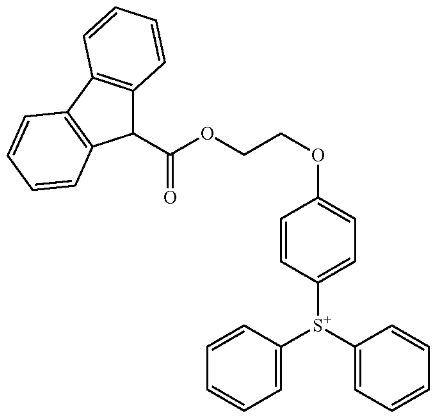
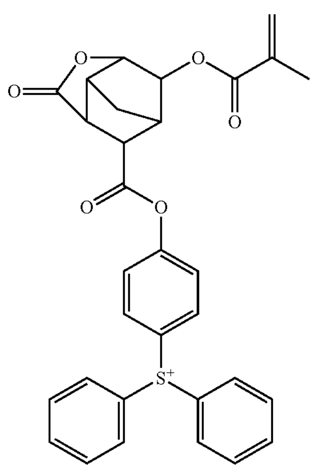
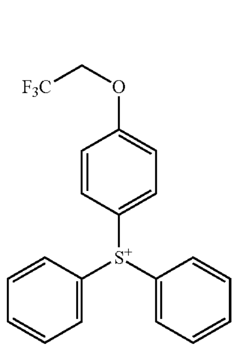
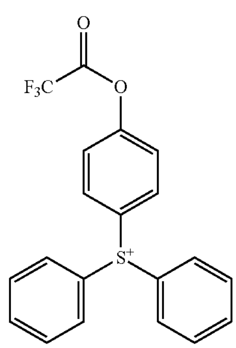
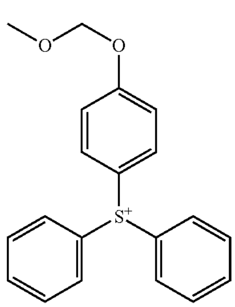
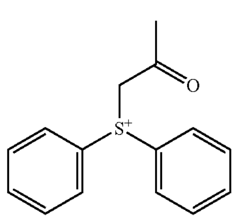
-continued
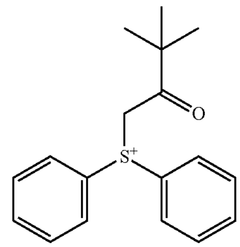
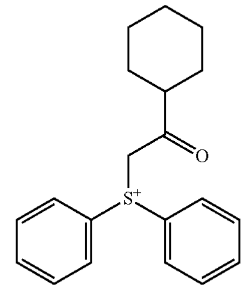
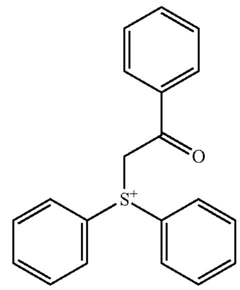
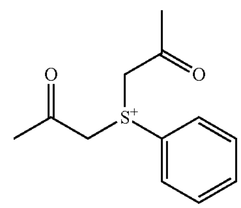
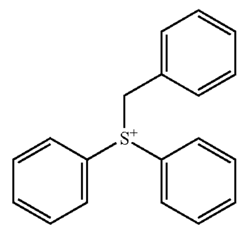
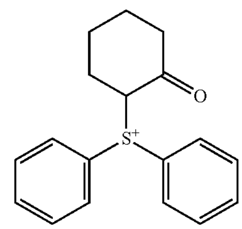
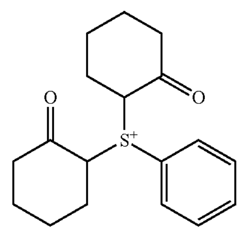
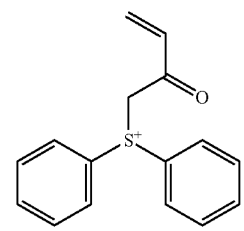
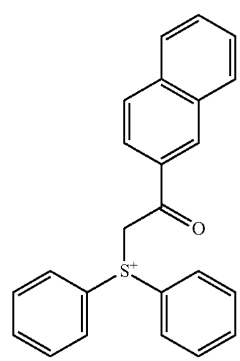
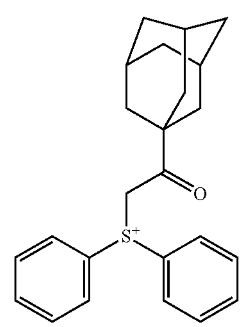
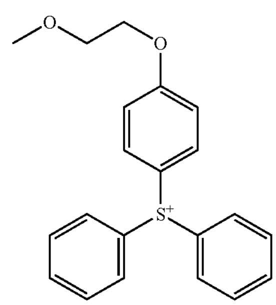

-continued
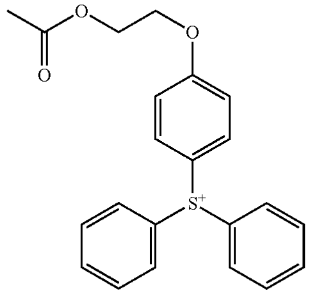
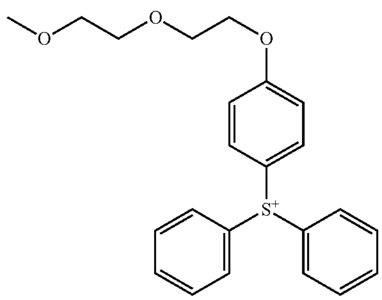
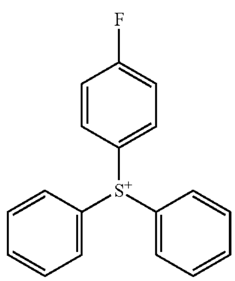
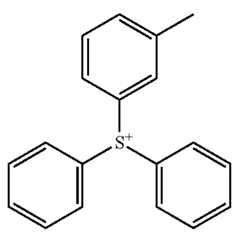
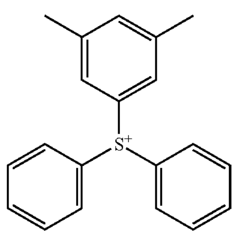
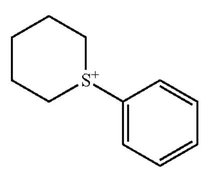
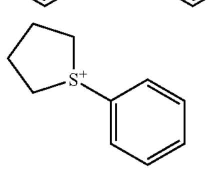
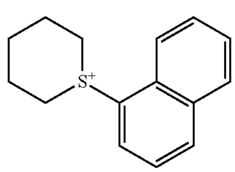
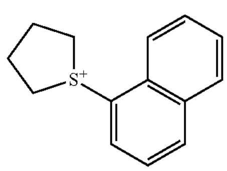
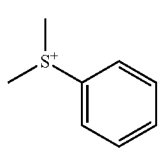
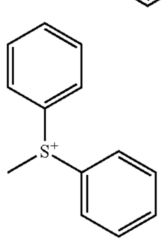
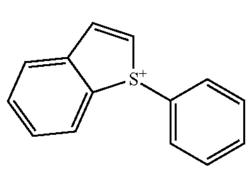
-continued
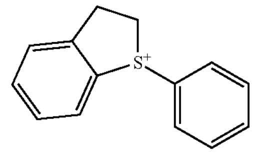
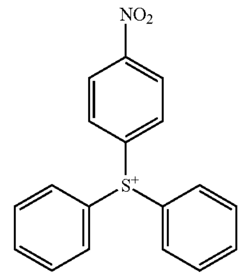
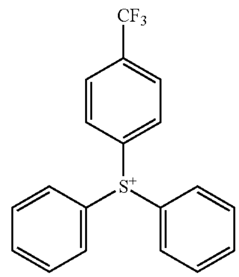
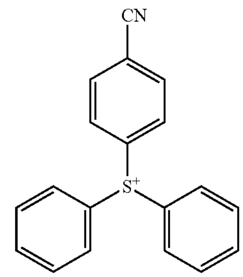
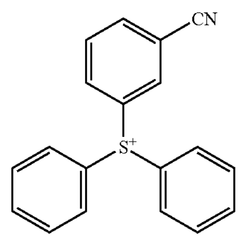
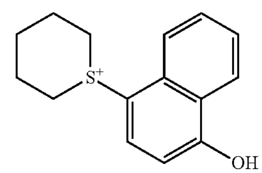
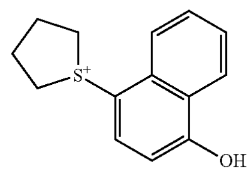
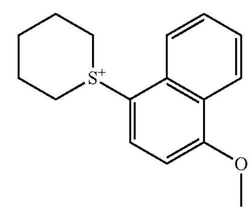
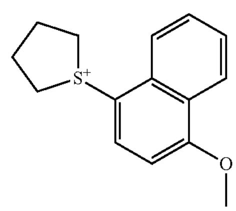
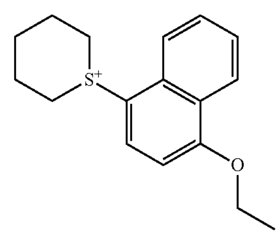
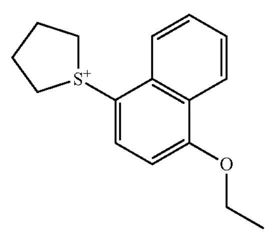
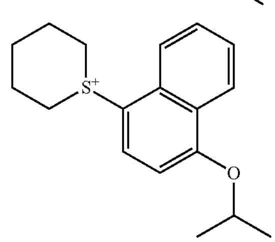

-continued
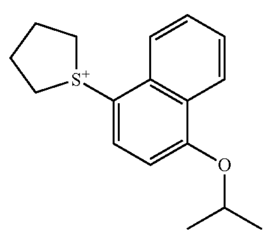
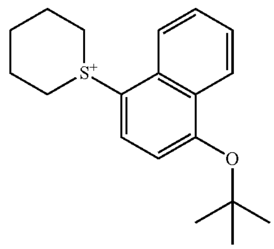
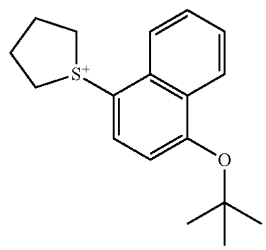
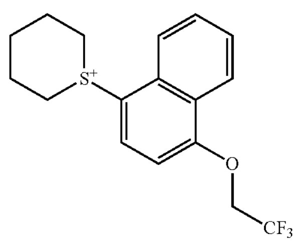
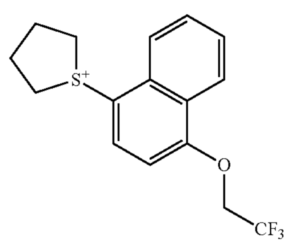
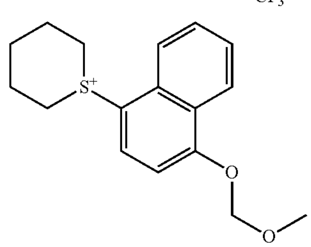
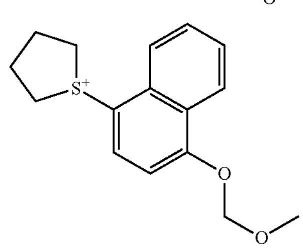
-continued
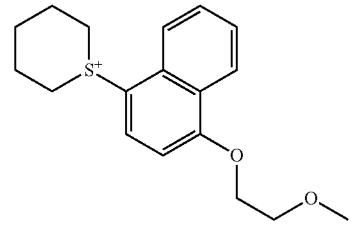
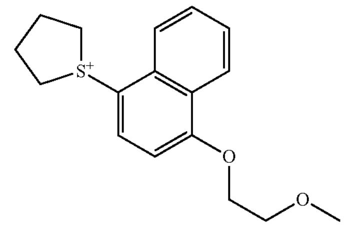
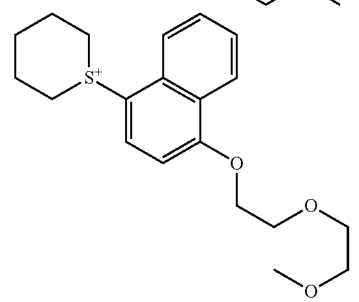
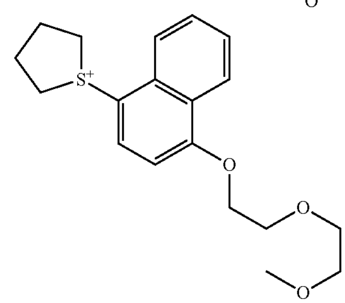
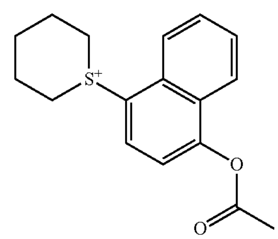
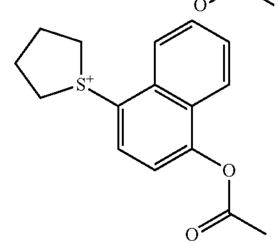
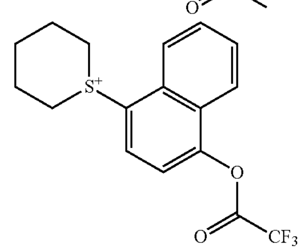

-continued
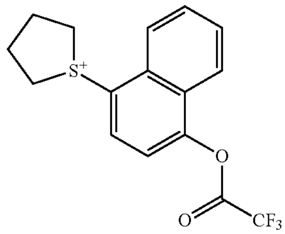
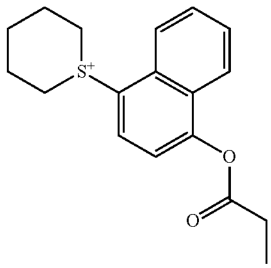
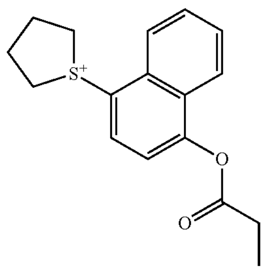
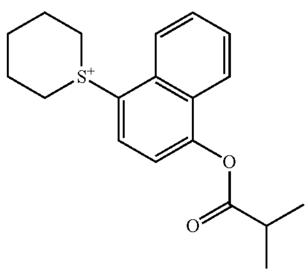
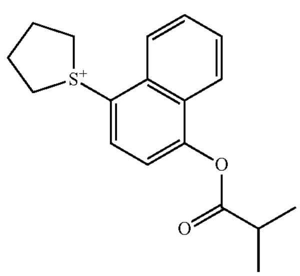
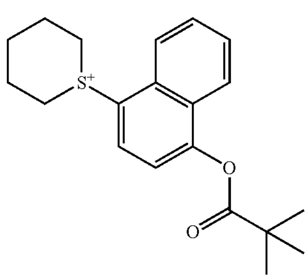
-continued
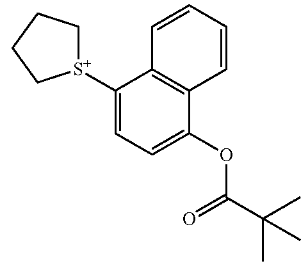
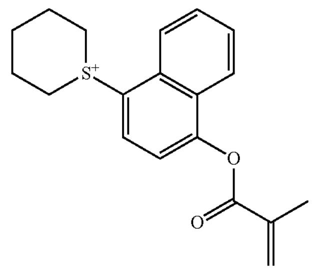
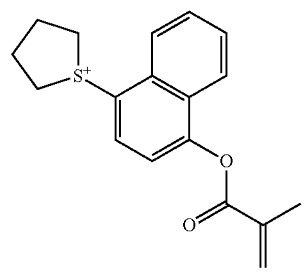
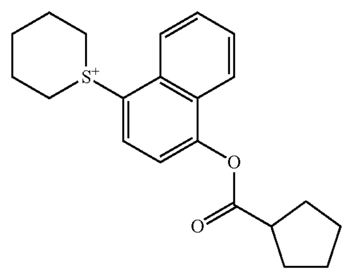
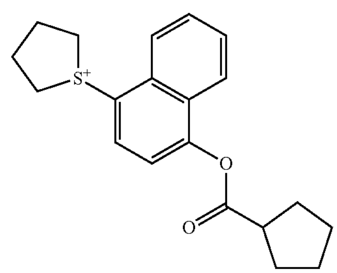
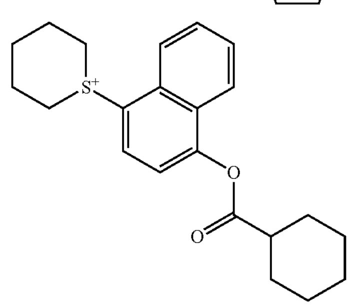

-continued
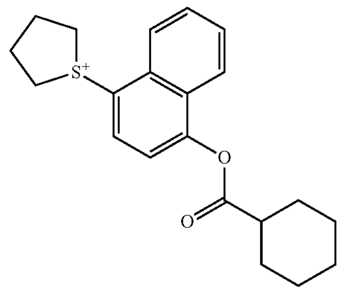
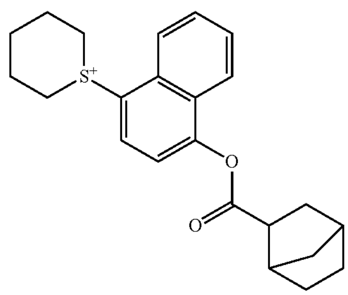
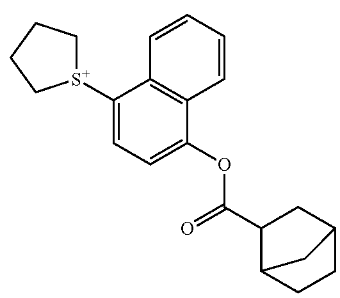
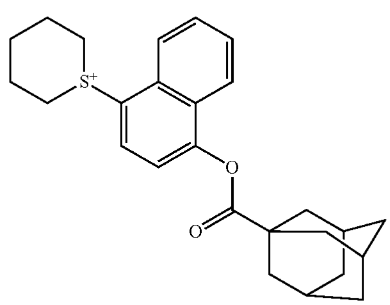
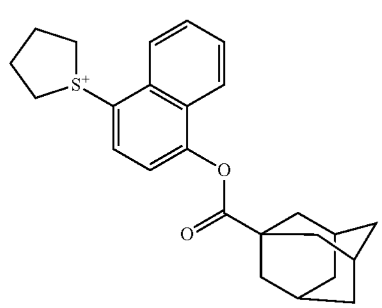
-continued
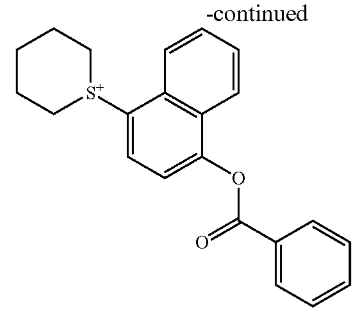
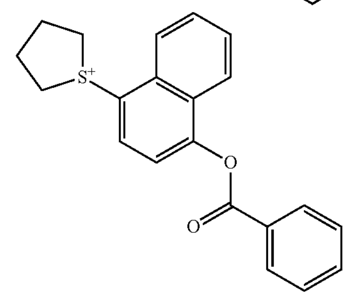
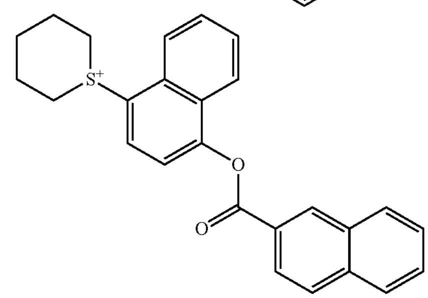
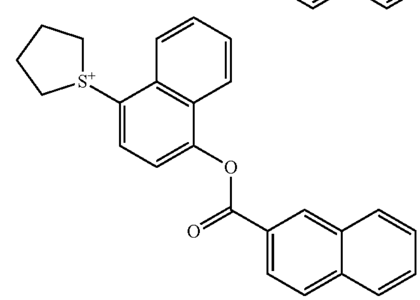
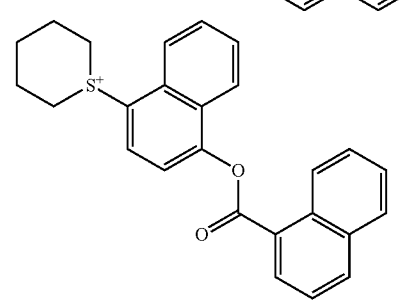
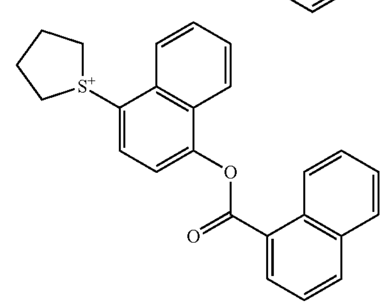

-continued
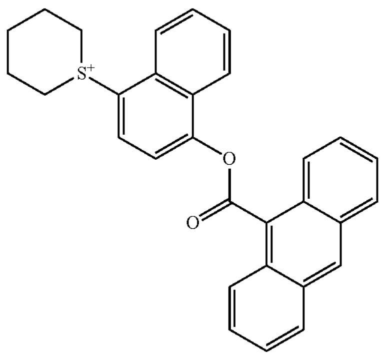
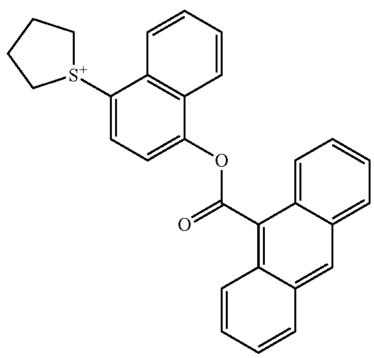
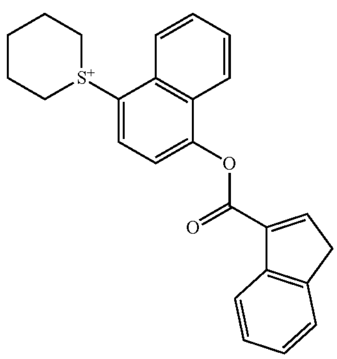
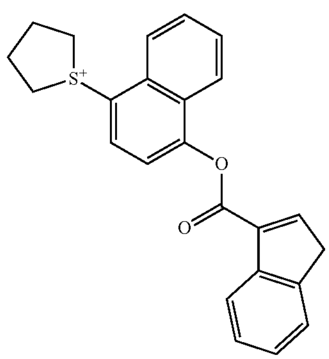
-continued
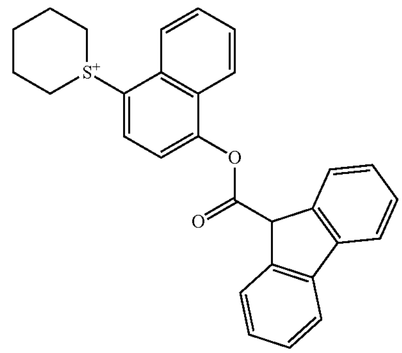
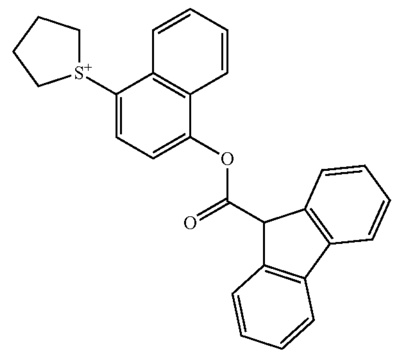
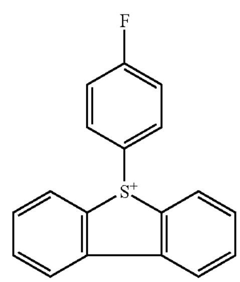
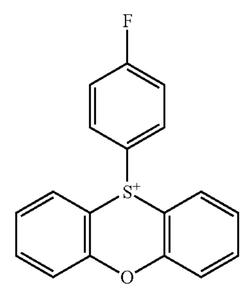
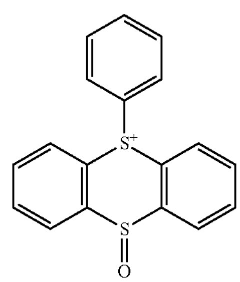
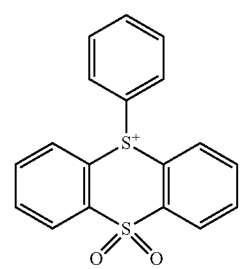
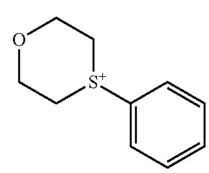
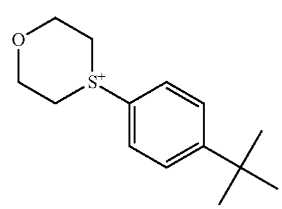
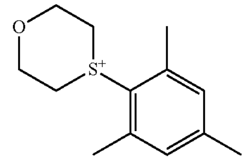
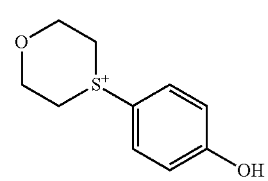

-continued
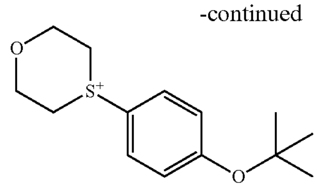
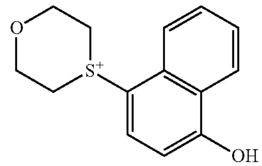
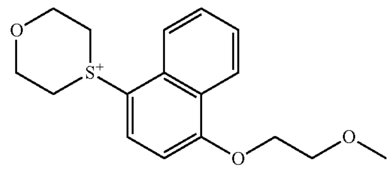
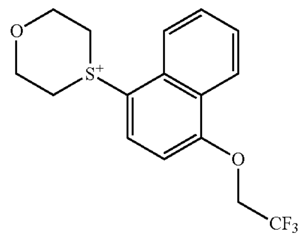
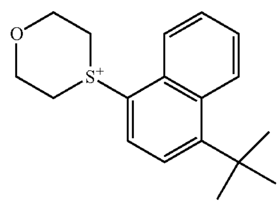
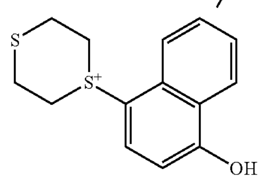
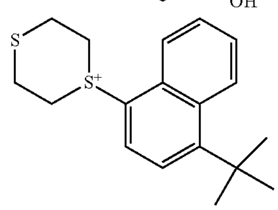
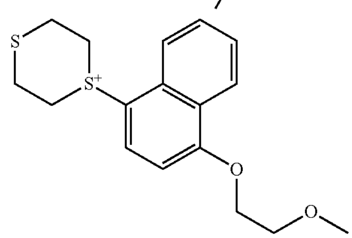
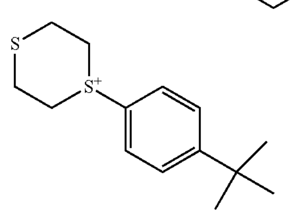
-continued
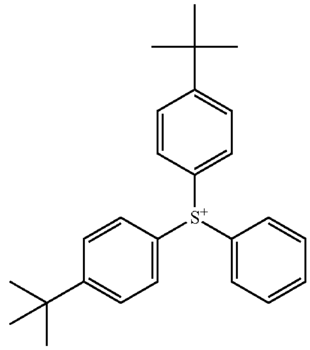
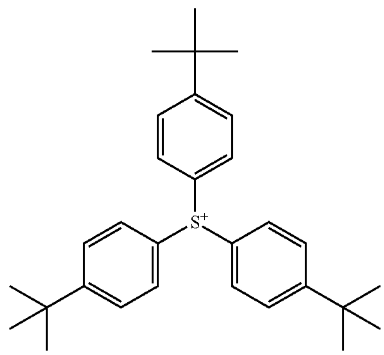
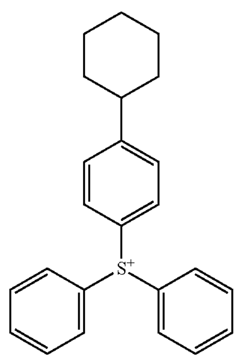
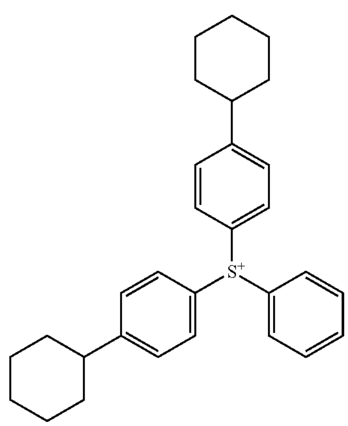

-continued
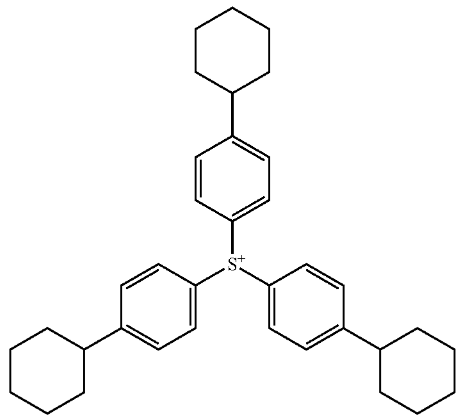
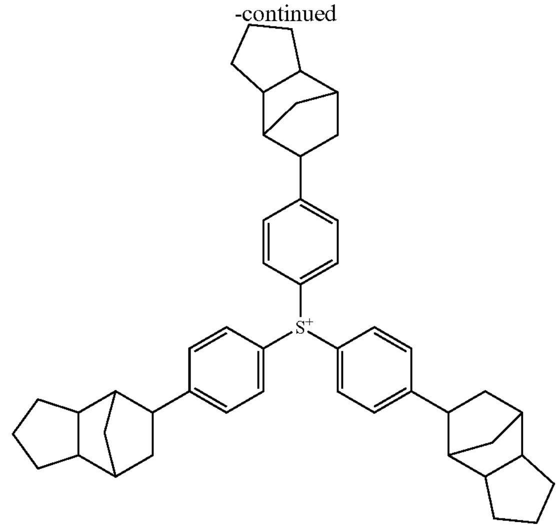
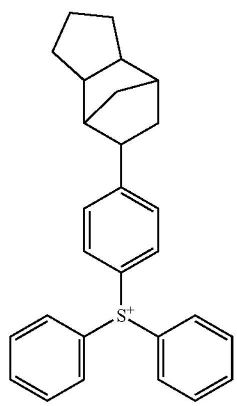
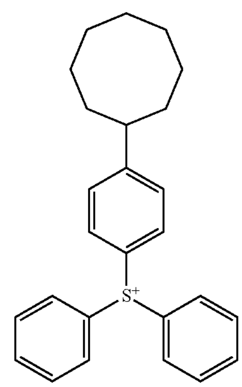
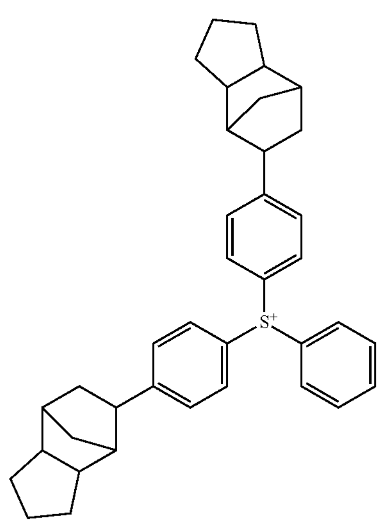
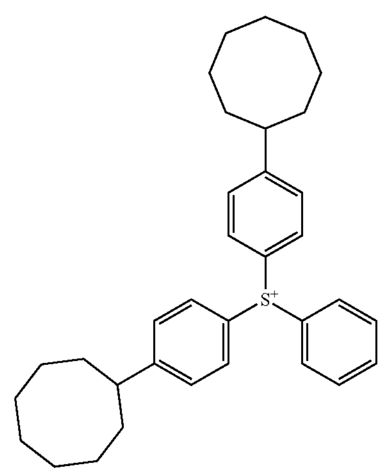

-continued
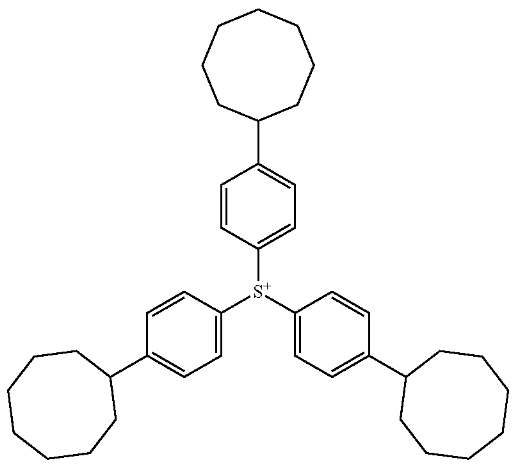
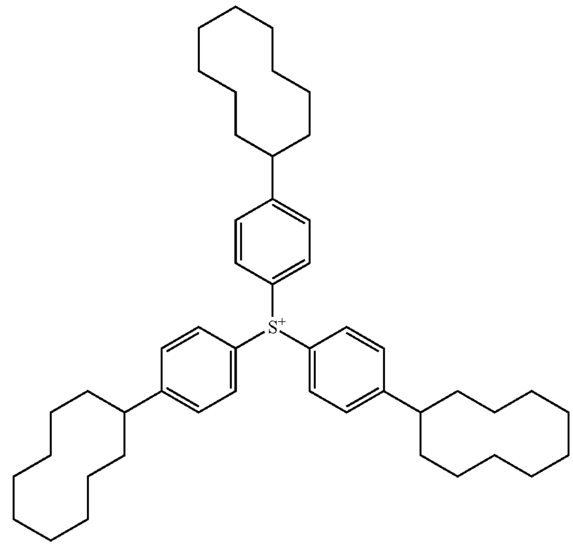
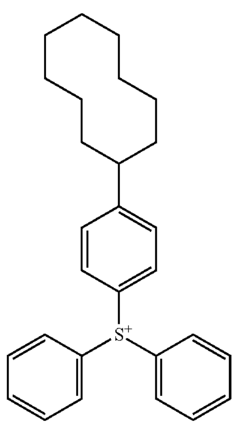
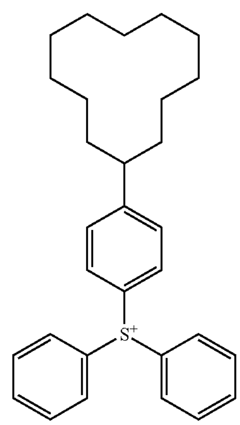
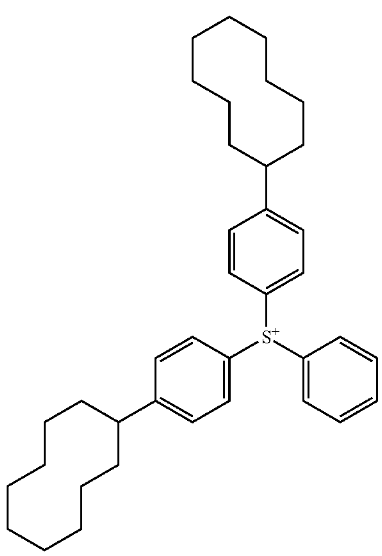
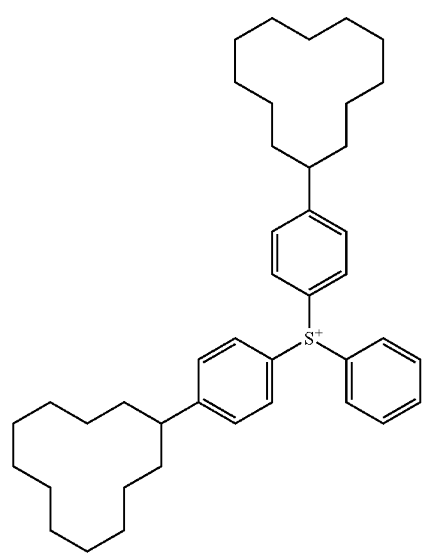

-continued
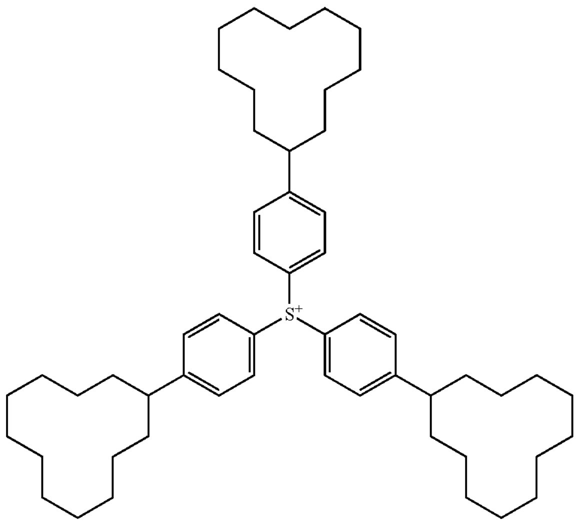
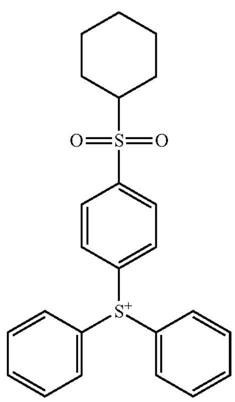
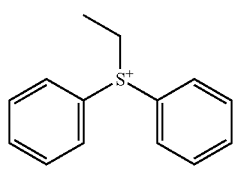
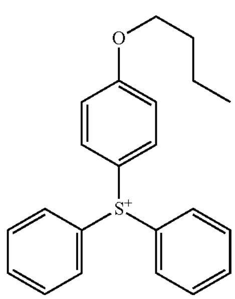
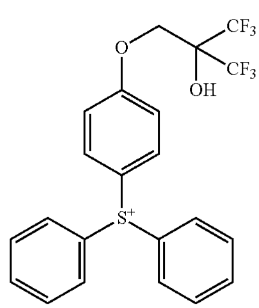
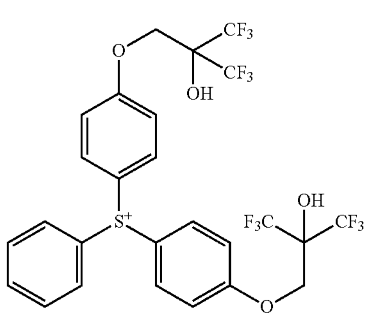
-continued
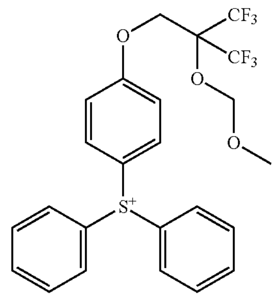
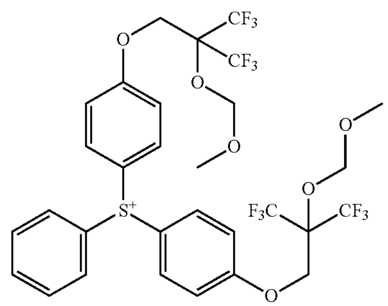
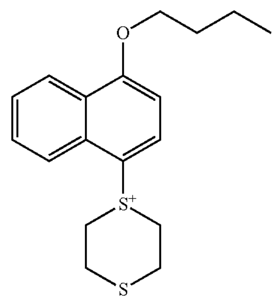
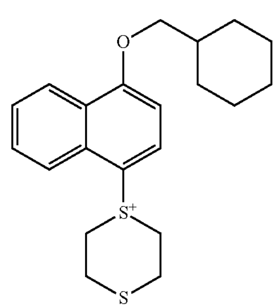
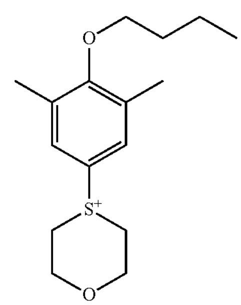
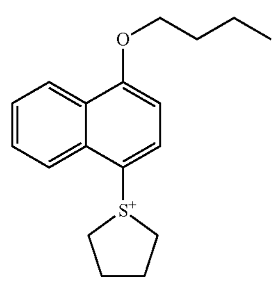
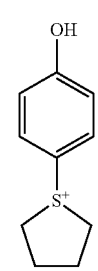
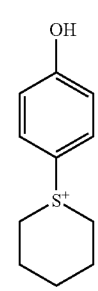

-continued

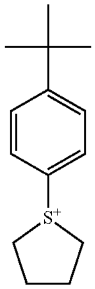

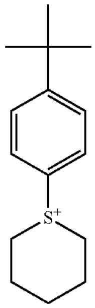

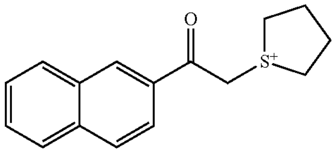

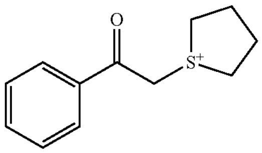

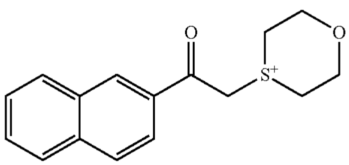

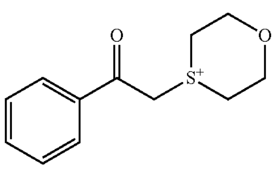

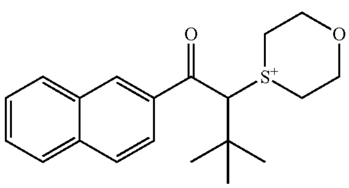

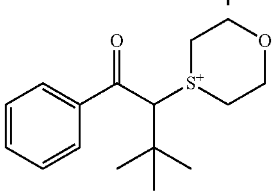

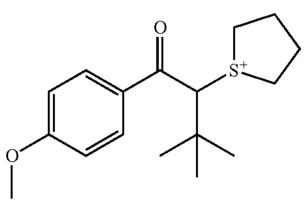

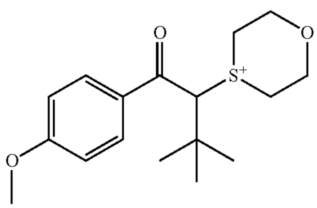

-continued

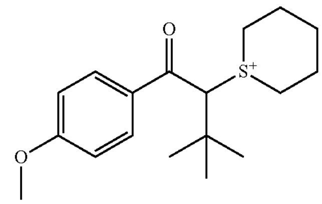

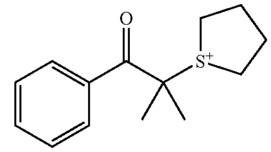

Examples of the iodonium cation in formulae (c3) and (c5) are shown below, but not limited thereto.

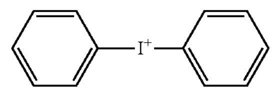

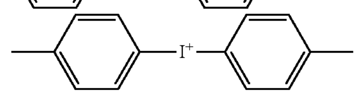

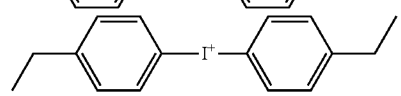

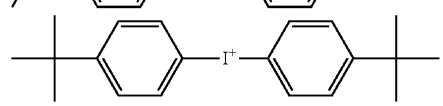

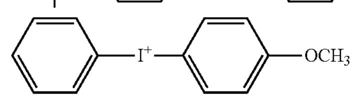

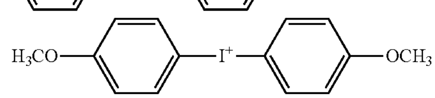

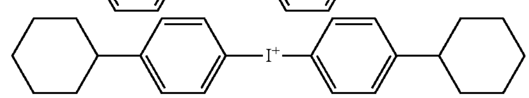

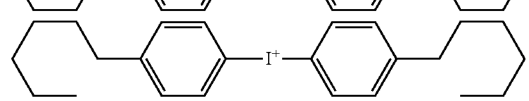

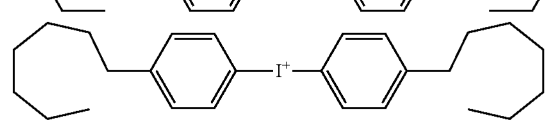

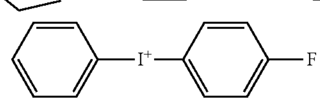

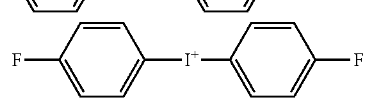

The polymer may further comprise recurring units of a structure having a hydroxyl group protected with an acid labile group. These recurring units are not particularly limited as long as the unit includes one or more structures having a hydroxyl group protected with an acid labile group such that the acid labile group is eliminated to generate the hydroxyl group under the action of acid. Recurring units having the formula (d1) are preferred.

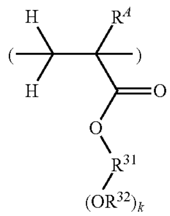
(d1)
In formula (d1), $R^A$ is as defined above. $R^{31}$ is a $C_1$-$C_{20}$ (k+1)-valent hydrocarbon group which may contain a heteroatom. $R^{32}$ is an acid labile group, and k is an integer of 1 to 4.
Examples of the recurring units having formula (d1) are shown below, but not limited thereto. Herein $R^A$ and $R^{32}$ are as defined above.
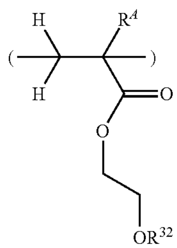
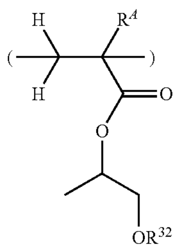
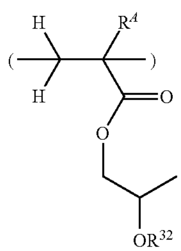
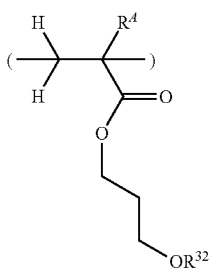
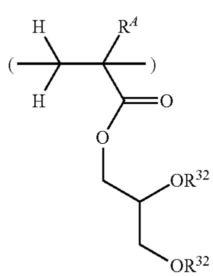
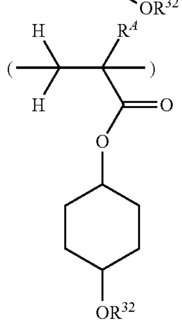
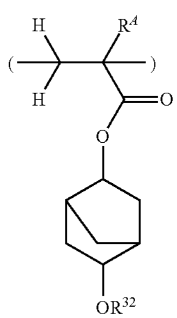
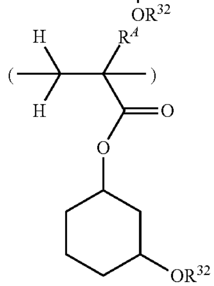
-continued
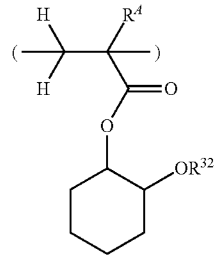
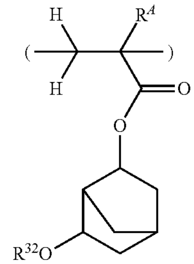
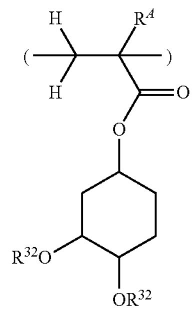
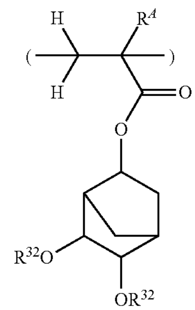
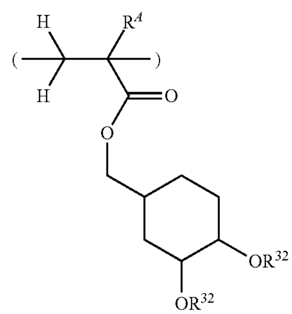
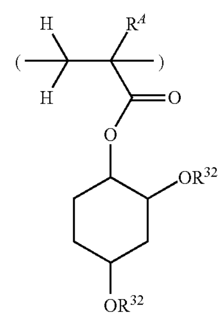
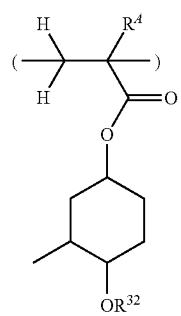
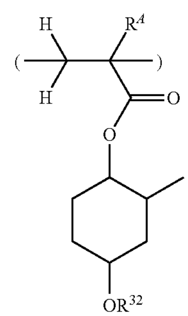
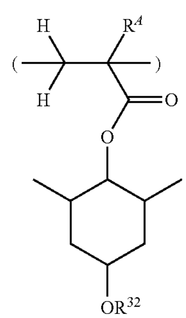
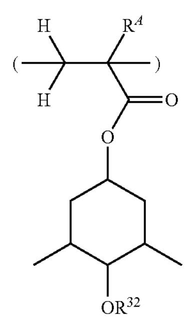

-continued
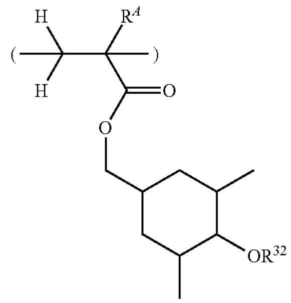
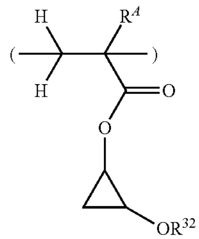
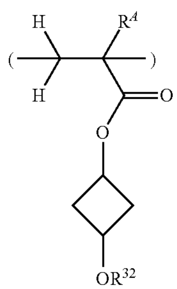
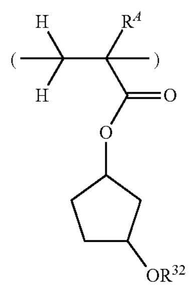
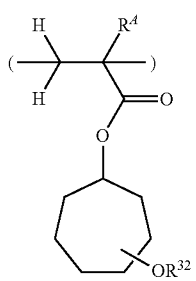
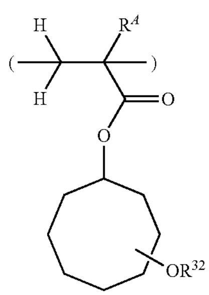
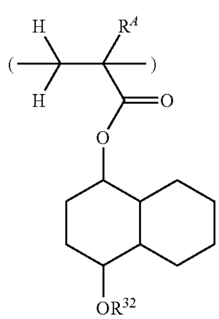
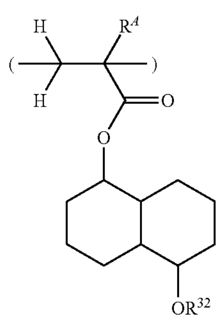
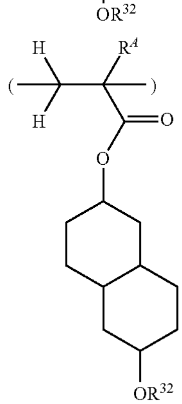
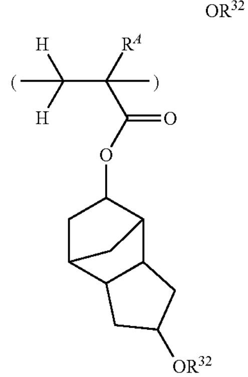
-continued
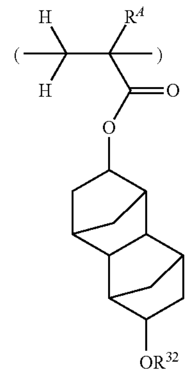
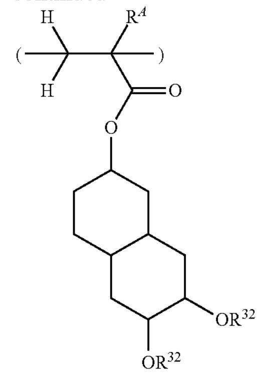
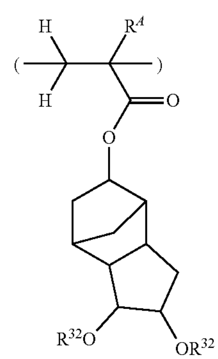
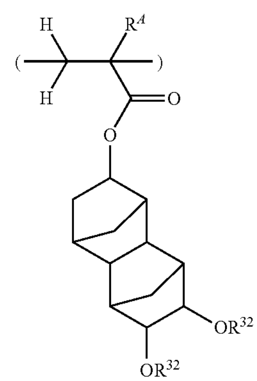
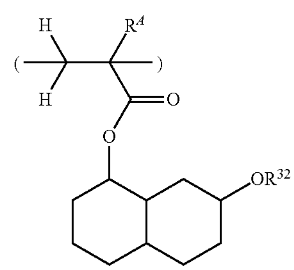
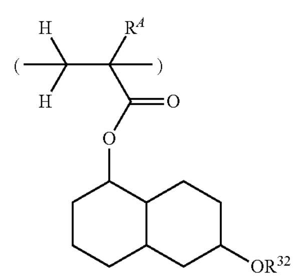
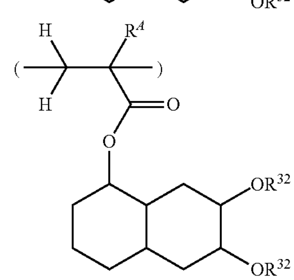
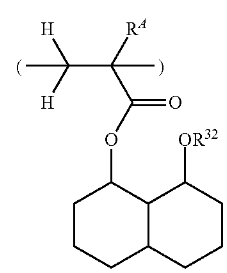

-continued
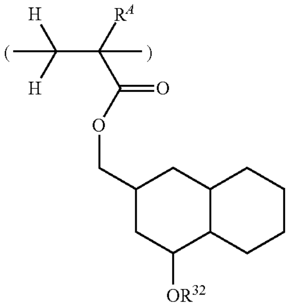
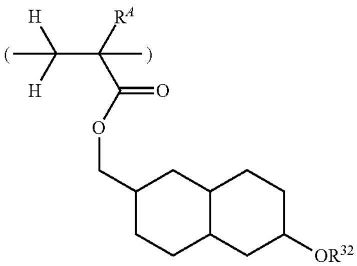
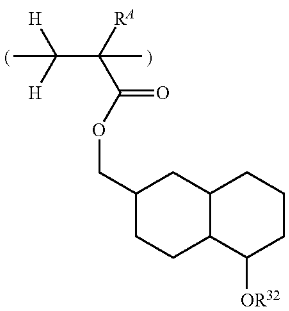
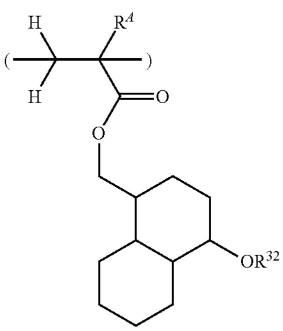
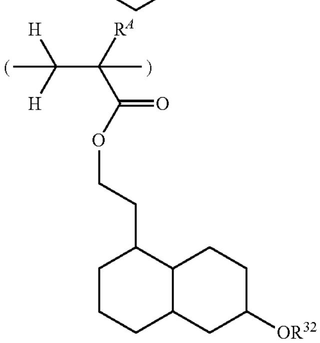
-continued
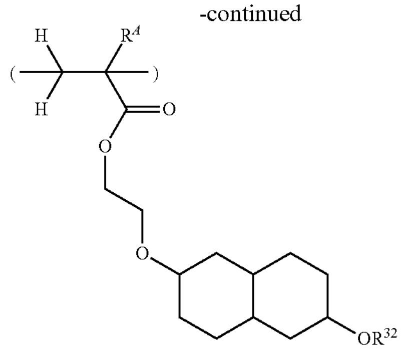
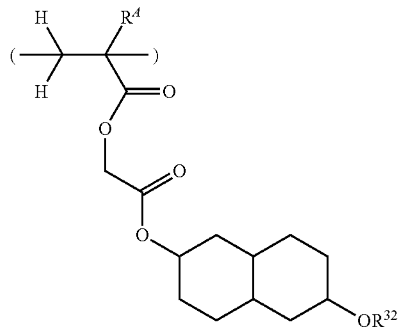
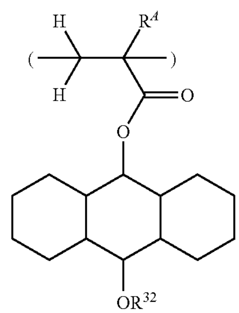
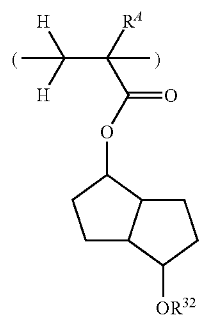
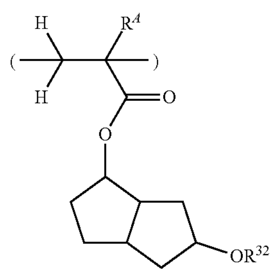
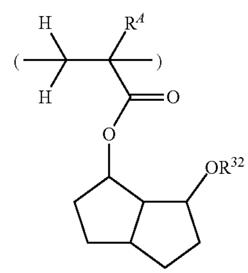
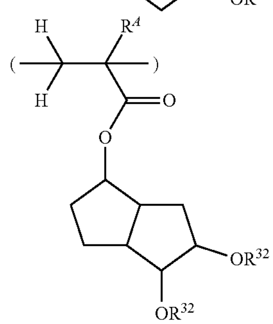
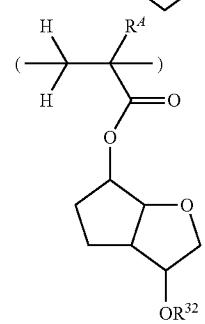

-continued
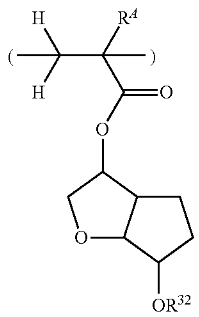
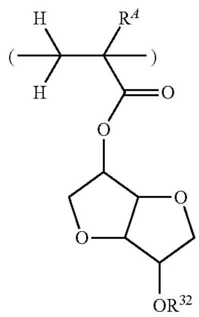
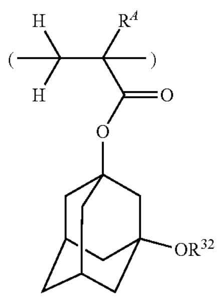
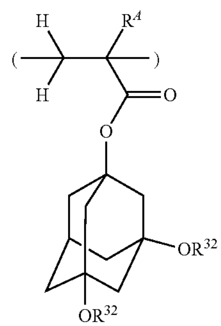
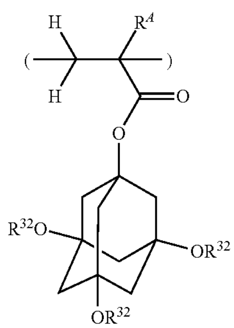
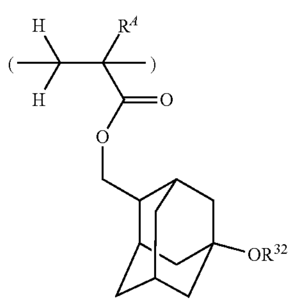
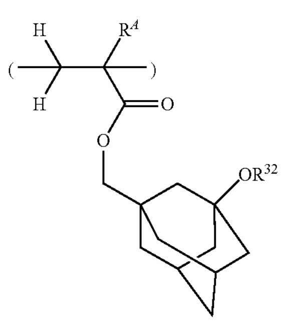
-continued
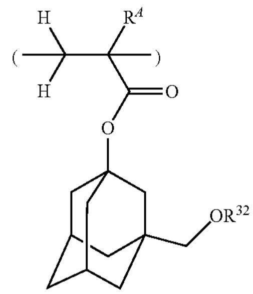
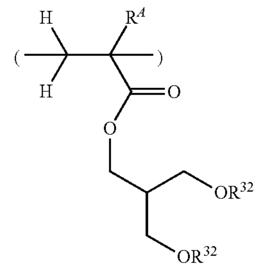
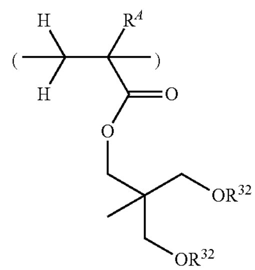
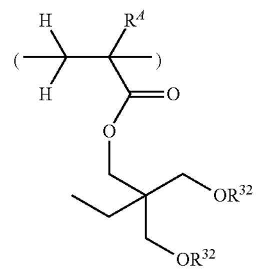
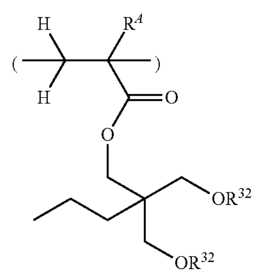
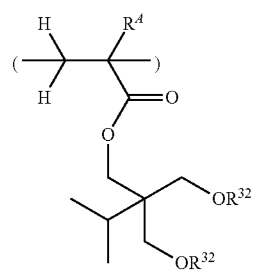
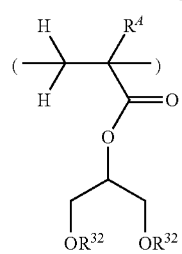
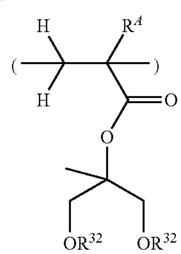
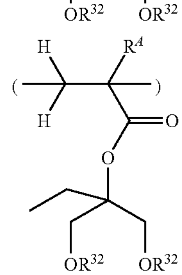
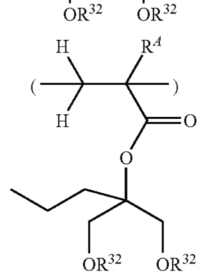
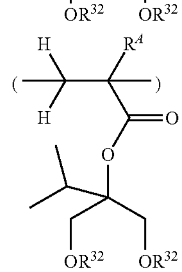
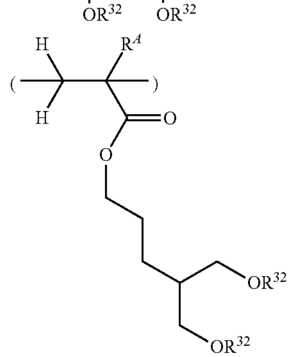

-continued

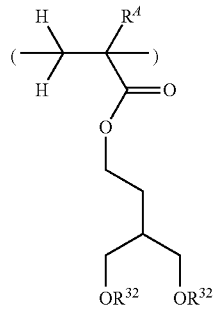

The acid labile group $R^{32}$ in formula (d1) is not particularly limited as long as it is deprotected to generate a hydroxyl group under the action of acid. Typical acid labile groups are groups of acetal or ketal structure and alkoxycarbonyl groups. Their examples are shown below, but not limited thereto.

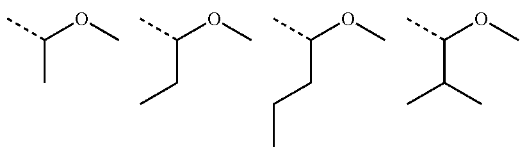

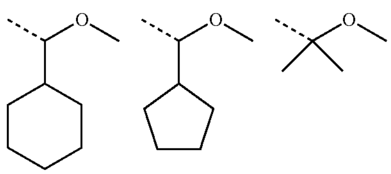

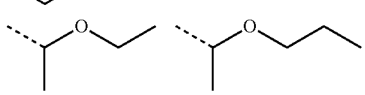

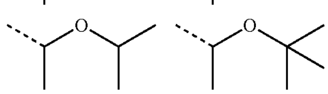

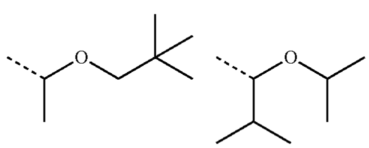

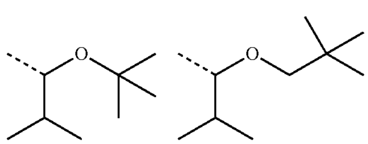

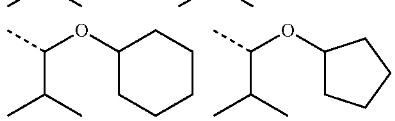

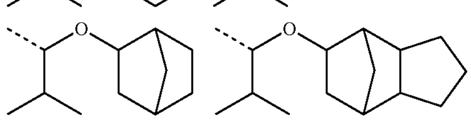

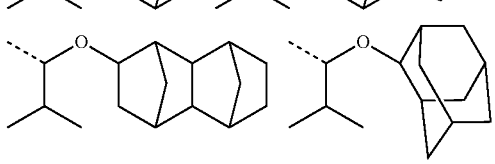

-continued

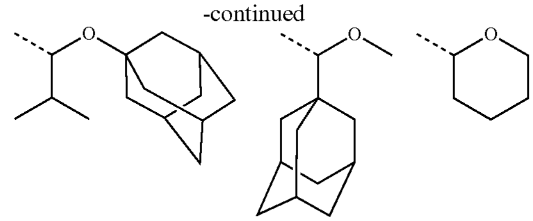

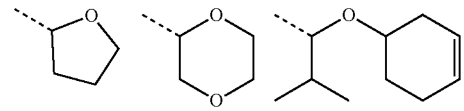

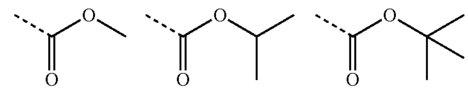

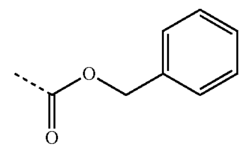

Of the acid labile groups $R^{32}$, alkoxymethyl groups having the formula (d2) are preferred.

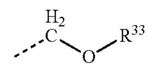

(d2)

Herein $R^{33}$ is a $C_1$-$C_{15}$ monovalent hydrocarbon group, which may be straight, branched or cyclic.

Examples of the acid labile group having formula (d2) are shown below, but not limited thereto.

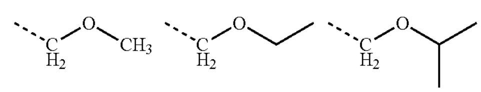

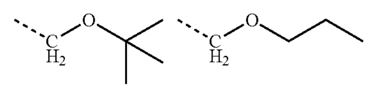

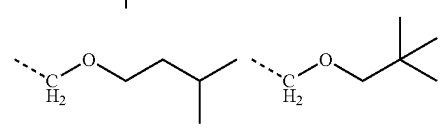

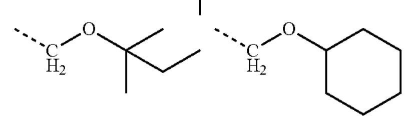

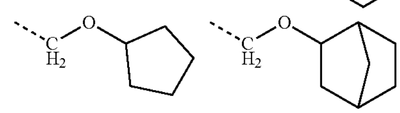

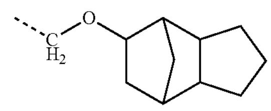

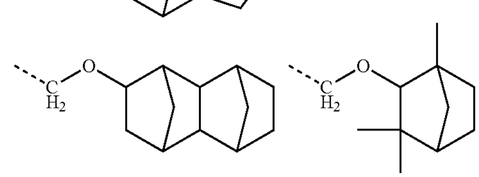

-continued
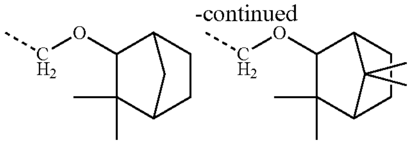
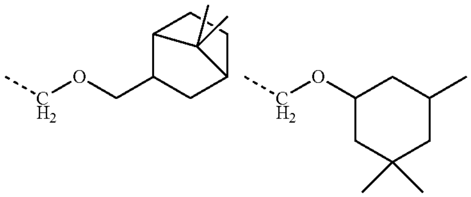
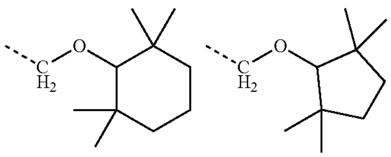
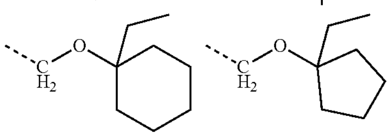
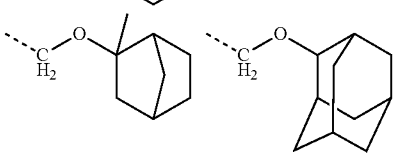
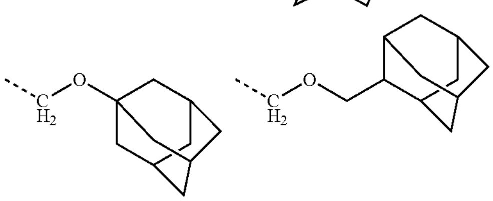
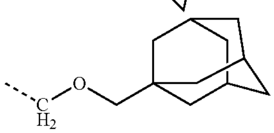
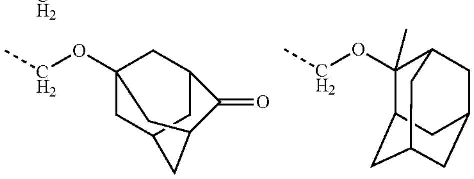
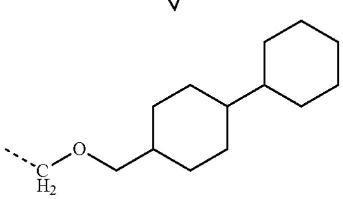
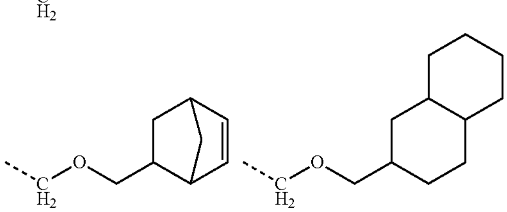
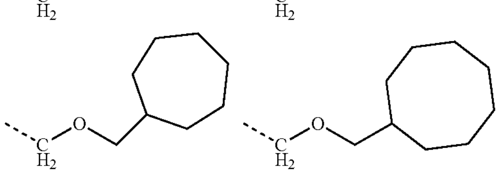
-continued
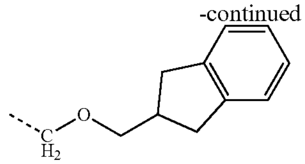
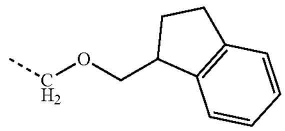
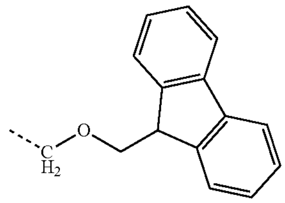
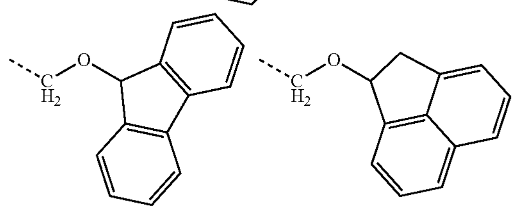
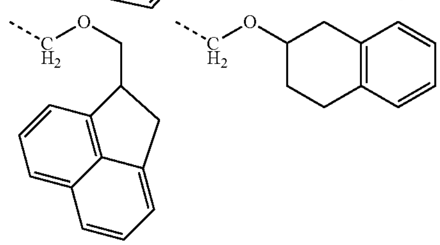
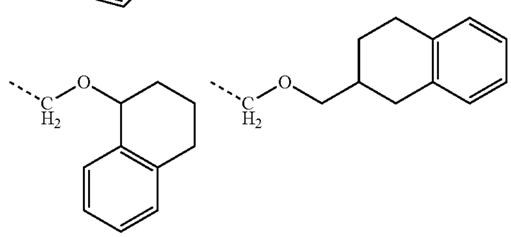
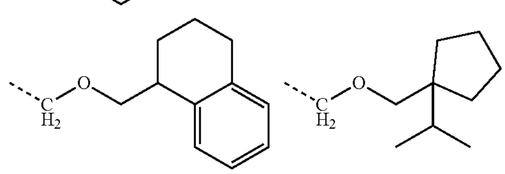
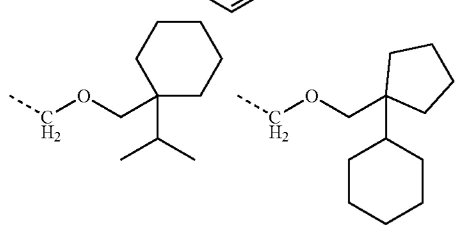
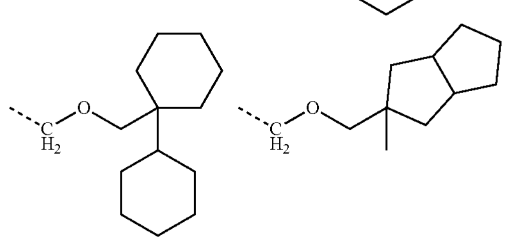

-continued

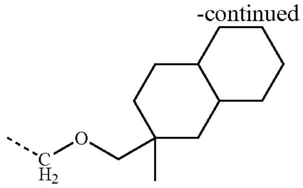
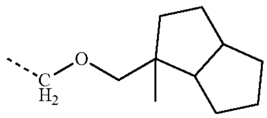
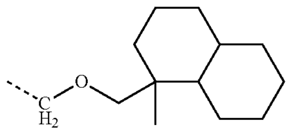
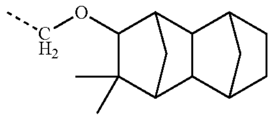
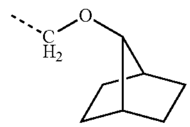
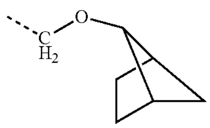
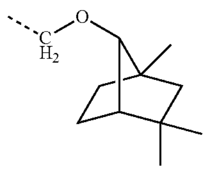
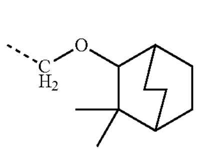
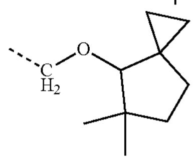
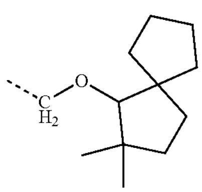
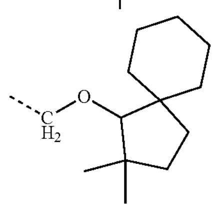
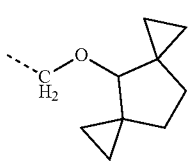
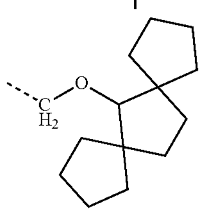
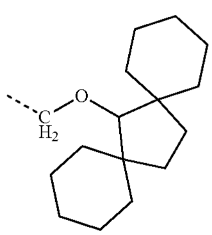

In addition to the foregoing units, the polymer may further comprise recurring units derived from other monomers, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[6.2.1.$1^{3,6}$.$0^{2,7}$]dodecene derivatives, and unsaturated acid anhydrides such as itaconic anhydride.

The polymer preferably has a weight average molecular weight (Mw) of 1,000 to 500,000, and more preferably 3,000 to 100,000, as measured versus polystyrene standards by gel permeation chromatography (GPC) using tetrahydrofuran (THF) as solvent. The above range of Mw ensures satisfactory etch resistance and eliminates the risk of resolution being reduced due to difficulty to gain a dissolution rate difference before and after exposure.

The general method of synthesizing the polymer is, for example, by dissolving one or more unsaturated bond-bearing monomers in an organic solvent, adding a radical initiator, and heating for polymerization. Examples of the organic solvent which can be used for polymerization include toluene, benzene, THF, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C. The reaction time is preferably 2 to 100 hours, more preferably 5 to 20 hours. The acid labile group that has been incorporated in the monomer may be kept as such, or polymerization may be followed by protection or partial protection.

While the polymer comprises recurring units derived from monomers, the molar fractions of respective units preferably fall in the following range (mol %), but are not limited thereto:

(I) 1 to 60 mol %, more preferably 5 to 50 mol %, even more preferably 10 to 50 mol % of recurring units of at least one type having formula (a), (II) 40 to 99 mol %, more preferably 50 to 95 mol %, even more preferably 50 to 90 mol % of recurring units of at least one type having formula (b), and optionally, (III) 0 to 30 mol %, more preferably 0 to 20 mol %, and even more preferably 0 to 10 mol % of recurring units of at least one type selected from formulae (c1) to (c5), and optionally, (IV) 0 to 80 mol %, more preferably 0 to 70 mol %, and even more preferably 0 to 50 mol % of recurring units of at least one type derived from another monomer(s).

The polymers may be used as the base resin (B) alone or in a combination of two or more polymers which are different in compositional ratio, Mw and/or molecular weight distribution.

In addition to the foregoing polymer, the base resin (B) may contain a hydrogenated ROMP polymer as described in JP-A 2003-066612.

(C) Organic Solvent

Any organic solvent may be used as long as the foregoing components and other additives are soluble therein. Examples of the organic solvent are described in JP-A 2008-111103, paragraphs [0144]-[0145] (U.S. Pat. No. 7,537,880). Specifically, exemplary solvents include ketones such as cyclohexanone and methyl-2-n-pentyl ketone; alcohols such as 3-methoxybutanol, 3-methyl-3-methoxybutanol, 1-methoxy-2-propanol, 1-ethoxy-2-propanol and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 7,000 parts, more preferably 400 to 5,000 parts by weight per 100 parts by weight of the base resin (B).

If desired, the resist composition of the invention may further contain:

(D) a second photoacid generator other than the compound having formula (1a), (E) a quencher, (F) a surfactant which is insoluble or substantially insoluble in water and soluble in alkaline developer, and/or a surfactant which is insoluble or substantially insoluble in water and alkaline developer, and (G) other additives.

(D) Second PAG

The inventive resist composition may further comprise a second PAG other than the compound having formula (1a). The second PAG is preferably a sulfonium salt having the formula (2a) or a iodonium salt having the formula (2b).

(2a)

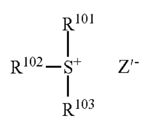

(2b)

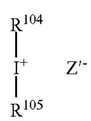

In formulae (2a) and (2b), $R^{101}$ to $R^{105}$ are each independently a $C_1$-$C_{30}$ monovalent hydrocarbon group which may contain a heteroatom, examples of which are as exemplified above for $R^a$ in formula (1a).

In formulae (2a) and (2b), $Z'^-$ is an anion having the formula (1A), (1B), (1C) or (1D).

Examples of the sulfonium cation in formula (2a) are as exemplified above for the sulfonium cation in formulae (c2) and (c4). Examples of the iodonium cation in formula (2b) are as exemplified above for the iodonium cation in formulae (c3) and (c5).

An appropriate amount of the second PAG (D) added is 0 to 40 parts by weight, and when used, 0.1 to 40 parts, more preferably 0.1 to 20 parts by weight per 100 parts by weight of the base resin (B). An amount in the range ensures good resolution and eliminates the problem of foreign particles after resist development or during separation. The second PAG may be used alone or in admixture.

(E) Quencher

The quencher (E) may be added to the resist composition. As used herein, the "quencher" refers to a compound capable of suppressing the rate of diffusion when the acid generated by the PAG diffuses within the resist film. Suitable quenchers include primary, secondary and tertiary amine compounds, specifically amine compounds having a hydroxyl group, ether bond, ester bond, lactone ring, cyano group or sulfonate bond, as described in JP-A 2008-111103, paragraphs [0146]-[0164] (U.S. Pat. No. 7,537,880), and basic compounds such as primary or secondary amine compounds having a carbamate group, as described in JP 3790649.

Other examples of the quencher include an onium salt of sulfonic acid which is not fluorinated at α-position as represented by the formula (3a), and an onium salt of carboxylic acid as represented by the formula (3b).

(3a)

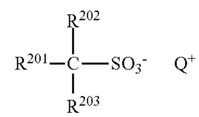

(3b)

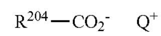

In formula (3a), $R^{201}$ is hydrogen, halogen exclusive of fluorine, or a $C_1$-$C_{40}$ monovalent hydrocarbon group which may contain a heteroatom. $R^{202}$ and $R^{203}$ are each independently hydrogen, halogen exclusive of fluorine, or a $C_1$-$C_{40}$ monovalent hydrocarbon group which may contain a heteroatom exclusive of fluorine. Any two of $R^{201}$, $R^{202}$ and $R^{203}$ may bond together to form a ring with the carbon atom to which they are attached. In formula (3b), $R^{204}$ is a $C_1$-$C_{40}$ monovalent hydrocarbon group which may contain a heteroatom. In formulae (3a) and (3b), $Q^+$ is an onium cation. The monovalent hydrocarbon group which may contain a heteroatom may be straight, branched or cyclic, and examples thereof are as exemplified above for $R^e$ in formula (1A').

The onium salt of sulfonic acid which is not fluorinated at α-position is described in U.S. Pat. No. 8,795,942 (JP-A 2008-158339). The PAGs capable of generating sulfonic acid which is not fluorinated at α-position are exemplified in JP-A 2010-155824, paragraphs [0019]-[0036] and JP-A 2010-215608, paragraphs [0047]-[0082]. The onium salts of carboxylic acid are described in JP 3991462.

The anion in formula (3a) or (3b) is a conjugated base of weak acid. As used herein, the weak acid indicates an acidity insufficient to deprotect an acid labile group from an acid labile group-containing unit in the base resin. The onium salt having formula (3a) or (3b) functions as a quencher when used in combination with an onium salt type photoacid generator having a conjugated base of a strong acid, typically a sulfonic acid which is fluorinated at α-position as the counter anion.

In a system using a mixture of an onium salt capable of generating a strong acid (e.g., α-position fluorinated sulfonic acid) and an onium salt capable of generating a weak acid (e.g., α-position non-fluorinated sulfonic acid or carboxylic acid), if the strong acid generated from the photoacid generator upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

In particular, since sulfonium salts and iodonium salts of an α-position non-fluorinated sulfonic acid and a carboxylic acid are photo-decomposable, those portions receiving a high light intensity are reduced in quenching capability and increased in the concentration of an α-position fluorinated sulfonic acid, imide acid, or methide acid. This enables to form a pattern having an improved contrast in exposed area, further improved depth of focus (DOF) and satisfactory dimensional control.

If a photoacid generator capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, since an onium salt of sulfonic acid cannot be used as the quencher, an onium salt of carboxylic acid is preferably used alone as the quencher.

Of the onium salts of α-position non-fluorinated sulfonic acid and carboxylic acid, sulfonium salts of sulfonic acid having the following formula (3a') and sulfonium salts of carboxylic acid having the following formula (3b') are preferred.

(3a')

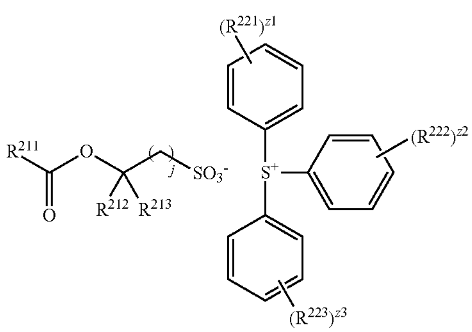

(3b')

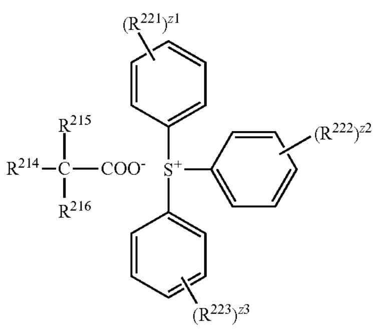

In formula (3a'), $R^{211}$ is a $C_1$-$C_{38}$ monovalent hydrocarbon group which may contain a heteroatom. $R^{212}$ and $R^{213}$ are each independently hydrogen or trifluoromethyl. In formula (3b'), $R^{214}$ and $R^{215}$ are each independently hydrogen, fluorine or trifluoromethyl. $R^{216}$ is hydrogen, hydroxyl, a $C_1$-$C_{35}$ monovalent hydrocarbon group which may contain a heteroatom, or a substituted or unsubstituted $C_6$-$C_{30}$ aryl group. In formulae (3a') and (3b'), $R^{221}$, $R^{222}$ and $R^{223}$ are each independently a $C_1$-$C_{20}$ monovalent hydrocarbon group which may contain a heteroatom. Any two of $R^{221}$, $R^{222}$ and $R^3$ may bond together to form a ring with the atom to which they are attached and intervening atoms. The subscript j is an integer of 1 to 3, $z^1$, $z^2$ and $z^3$ are each independently an integer of 0 to 5. The monovalent hydrocarbon group which may contain a heteroatom may be straight, branched or cyclic and examples thereof are as exemplified above for $R^e$ in formula (1A').

Also an onium salt having a nitrogen-containing substituent group may be used as the quencher. This compound functions as a quencher in the unexposed region, but as a so-called photo-degradable base in the exposed region because it loses the quencher function in the exposed region due to neutralization thereof with the acid generated by itself. Using a photo-degradable base, the contrast between exposed and unexposed regions can be further enhanced. With respect to the photo-degradable base, reference may be made to JP-A 2009-109595 and 2012-046501, for example.

An appropriate amount of the quencher (E), when used, is preferably 0.001 to 12 parts, more preferably 0.01 to 8 parts by weight per 100 parts by weight of the base resin (B). The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate. The quencher (E) may be used alone or in admixture of two or more.

(F) Surfactant

The resist composition may further comprise (F) a surfactant which is insoluble or substantially insoluble in water and soluble in alkaline developer, and/or a surfactant which is insoluble or substantially insoluble in water and alkaline developer. For the surfactant which can be added to the resist composition, reference should be made to those compounds described in JP-A 2010-215608 and JP-A 2011-016746.

While many examples of the surfactant which is insoluble or substantially insoluble in water and alkaline developer are described in the patent documents cited herein, preferred examples are fluorochemical surfactants FC-4430 (3M), Surflon® S-381, KH-20 and KH-30 (AGC Seimi Chemical Co., Ltd.). Partially fluorinated oxetane ring-opened polymers having the formula (surf-1) are also useful.

(surf-1)

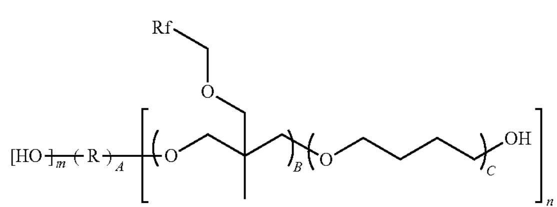

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent aliphatic groups include ethylene, 1,4-butylene, 1,2-propylene, 2,2-dimethyl-1,3-propylene and 1,5-pentylene. Exemplary tri- and tetra-valent groups are shown below.

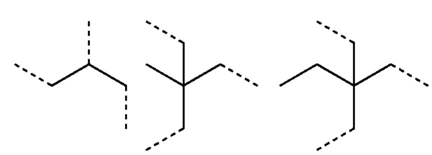

-continued

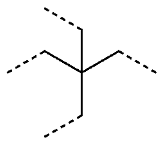

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the formula (surf-1) does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water sliding.

Suitable polymeric surfactants include those containing recurring units of at least one type selected from the formulae (4-1) to (4-7).

(4-1)

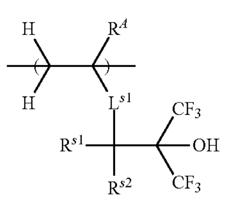

(4-2)

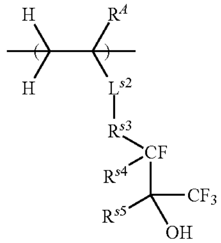

-continued (4-3)

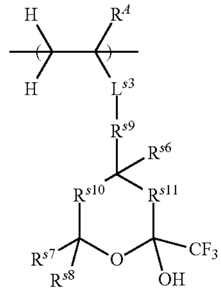

(4-4)

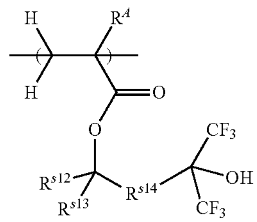

(4-5)

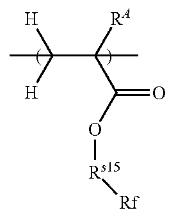

(4-6)

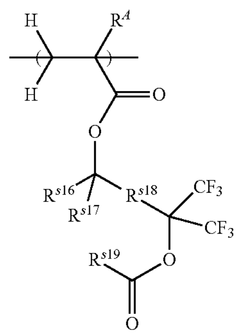

(4-7)

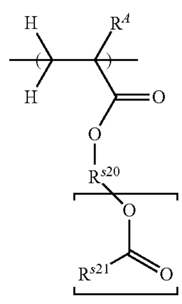

In formulae (4-1) to (4-7), $R^A$ is as defined above.

In formula (4-1), $R^{s1}$ and $R^{s2}$ are each independently hydrogen or a $C_1$-$C_{20}$ alkyl or fluoroalkyl group. $R^{s1}$ and $R^{s2}$ may bond together to form a ring with the carbon atom to which they are attached, and in this event, a combination of $R^{s1}$ and $R^{s2}$ is a $C_2$-$C_{20}$ alkanediyl or fluorinated alkanediyl group.

In formula (4-2), $R^{s3}$ is a $C_1$-$C_6$ alkanediyl group in which one or more or even all hydrogen atoms may be substituted by fluorine atoms. $R^{s4}$ is hydrogen or fluorine. $R^{s3}$ and $R^{s4}$ may bond together to form a non-aromatic ring of 3 to 10 carbon atoms in total with the carbon atom to which they are attached. $R^{s5}$ is a straight or branched $C_1$-$C_{10}$ alkyl group in which at least one hydrogen atom is substituted by a fluorine atom. Alternatively, $R^{s3}$ and $R^{s5}$ may bond together to form a non-aromatic ring with the carbon atoms to which they are attached. In this event, $R^3$, $R^5$ and the carbon atoms to which they are attached together represent a trivalent organic group of 3 to 12 carbon atoms in total.

In formula (4-3), $R^{s6}$, $R^{s7}$ and $R^{s8}$ are each independently hydrogen, fluorine, methyl or trifluoromethyl. $R^{s9}$ is a single bond or a $C_1$-$C_4$ alkanediyl group. $R^{s10}$ and $R^{s11}$ are each independently a single bond, —O— or —$CR^{s22}R^{s23}$— wherein $R^{s22}$ and $R^{s23}$ are each independently hydrogen, fluorine, methyl or trifluoromethyl.

In formula (4-4), $R^{s12}$ and $R^{s13}$ are each independently hydrogen or a $C_1$-$C_{20}$ alkyl or fluoroalkyl group. $R^{s12}$ and $R^{s13}$ may bond together to form a ring with the carbon atom to which they are attached, and in this event, a combination of $R^{s12}$ and $R^{s13}$ is a $C_2$-$C_{20}$ alkanediyl or fluorinated alkanediyl group. $R^{s14}$ is a straight or branched $C_1$-$C_4$ alkanediyl group. Alternatively, $R^{s12}$ or $R^{s13}$ and $R^{s14}$ may bond together to form a non-aromatic ring of 3 to 6 carbon atoms with the carbon atom to which they are attached In formula (4-5), $R^{s15}$ is 1,2-ethylene, 1,3-propylene or 1,4-butylene. Rf is a linear perfluoroalkyl group of 3 to 6 carbon atoms, typically 3H-perfluoropropyl, 4H-perfluorobutyl, 5H-perfluoropentyl or 6H-perfluorohexyl.

In formulae (4-1) to (4-3), $L^{s1}$ to $L^3$ are each independently —C(O)—O—, —O—, or —C(═O)-$L^{s4}$-C(═O)—O—, wherein $L^{s4}$ is a $C_1$-$C_{10}$ alkanediyl group.

In formula (4-6), $R^{s16}$ and $R^{s17}$ are each independently hydrogen or a $C_1$-$C_{15}$ alkyl group. $R^{s16}$ and $R^{s17}$ may bond together to form a ring with the carbon atom to which they are attached. $R^{s18}$ is a single bond or a $C_1$-$C_{15}$ alkanediyl group. $R^{s19}$ is a $C_1$-$C_{20}$ alkyl or fluoroalkyl group which may contain an ether bond or carbonyl radical.

In formula (4-7), $R^{s20}$ is a $C_1$-$C_{15}$ (n+1)-valent hydrocarbon or fluorinated hydrocarbon group, n is an integer of 1 to 3, $R^a2$ is a $C_1$-$C_{10}$ monovalent fluorinated hydrocarbon group.

The foregoing alkyl, fluoroalkyl, alkanediyl, fluorinated alkanediyl, (n+1)-valent hydrocarbon or fluorinated hydrocarbon, and monovalent fluorinated hydrocarbon groups may be straight, branched or cyclic.

Examples of the recurring units having formulae (4-1) to (4-7) are shown below, but not limited thereto. Herein $R^A$ is as defined above.

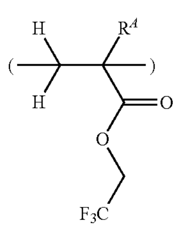

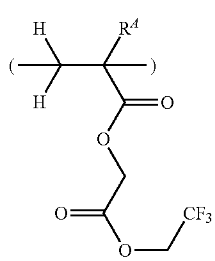

-continued

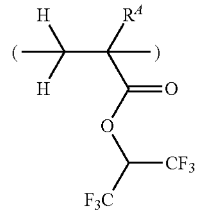

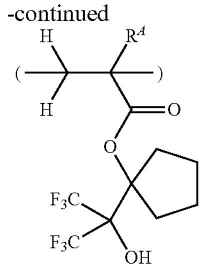

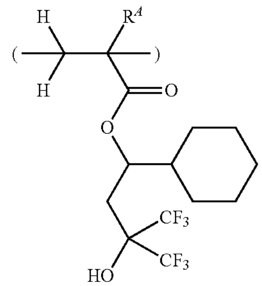

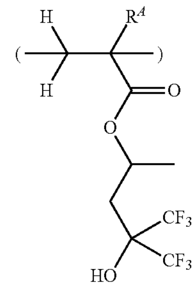

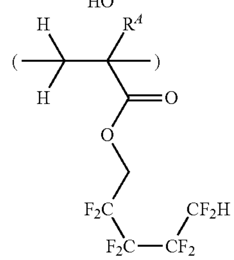

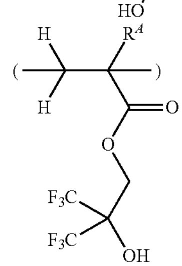

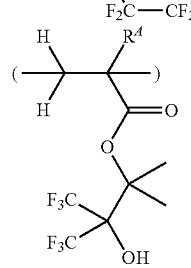

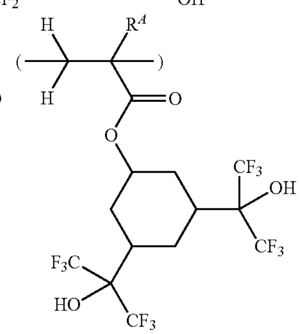

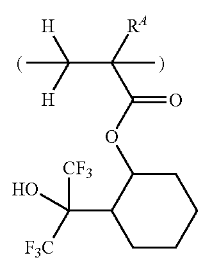

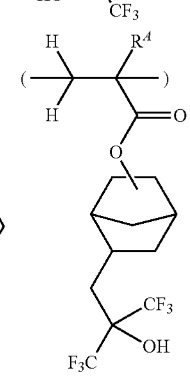

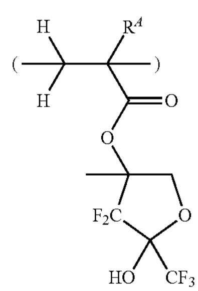

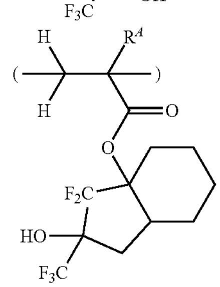

-continued
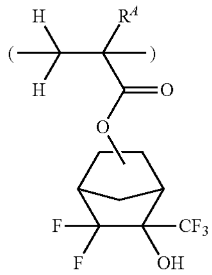
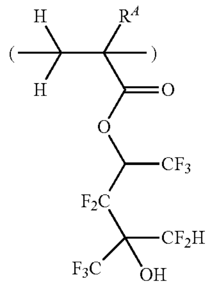
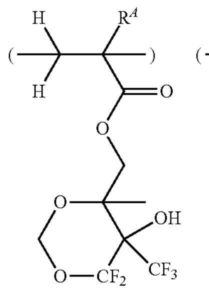
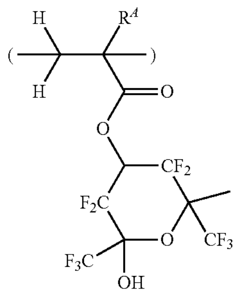
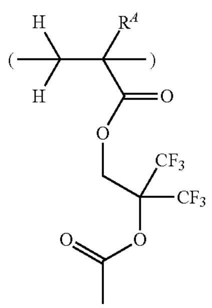
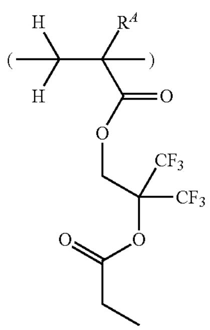
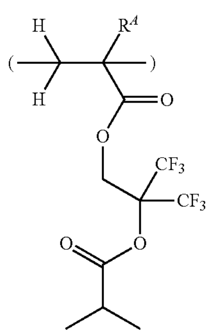
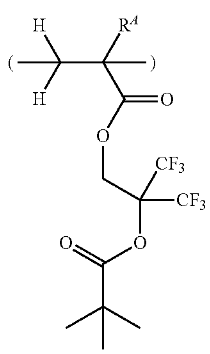
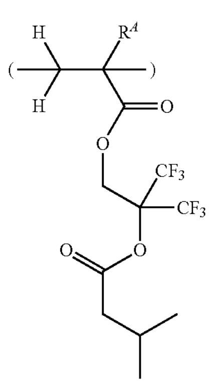
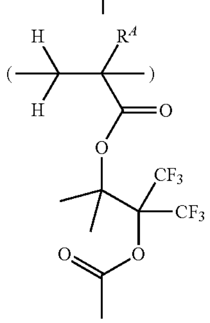
-continued
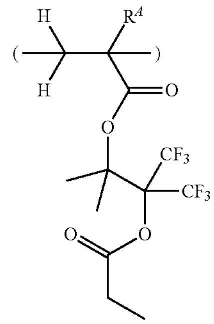
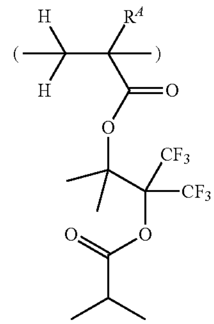
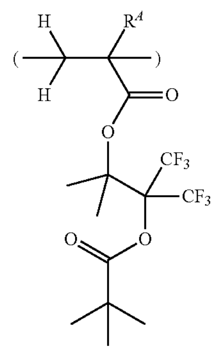
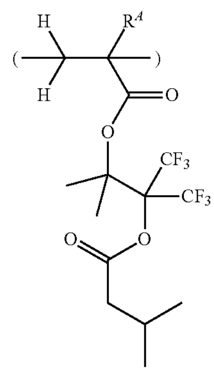
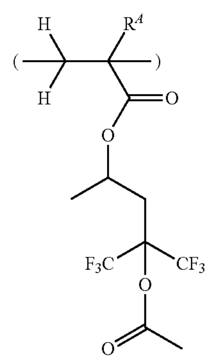
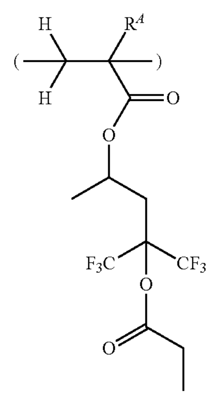
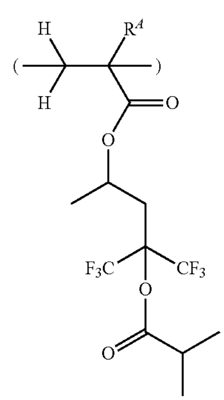
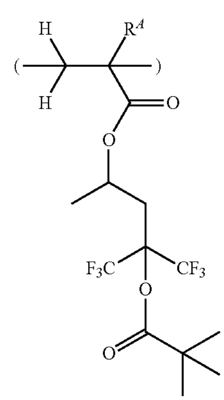

-continued
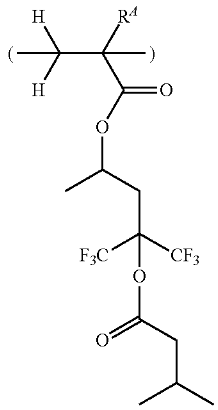
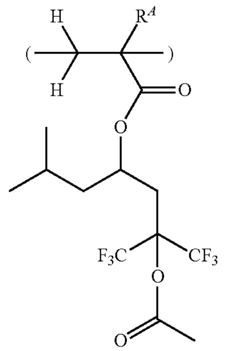
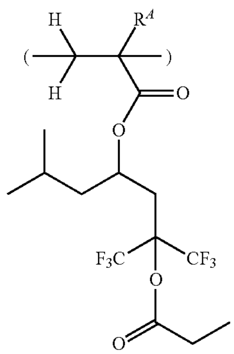
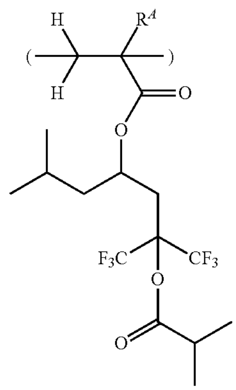
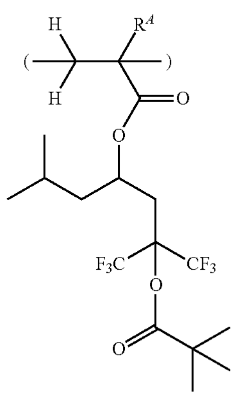
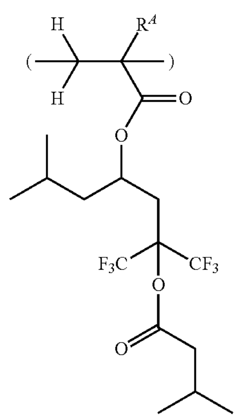
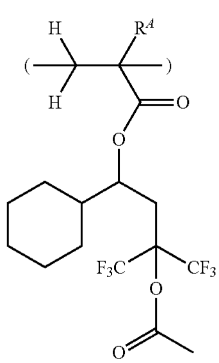
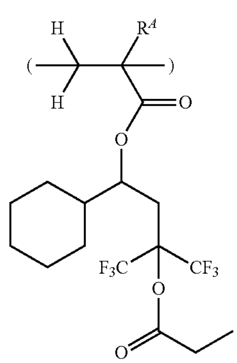
-continued
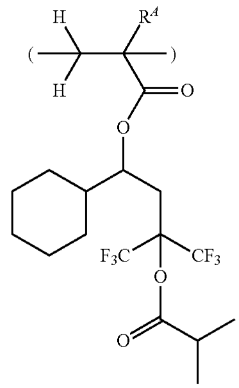
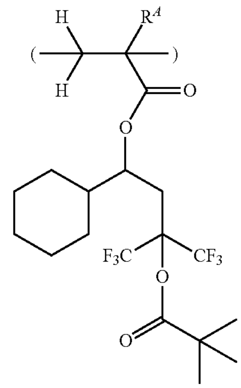
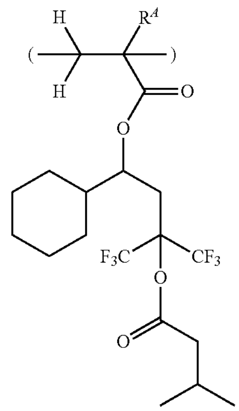
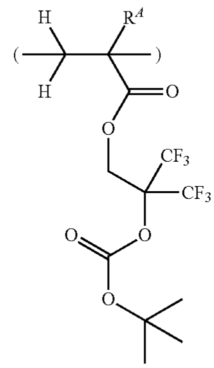
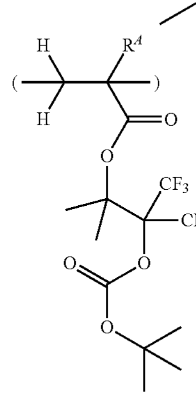
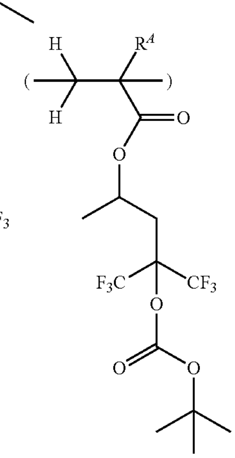
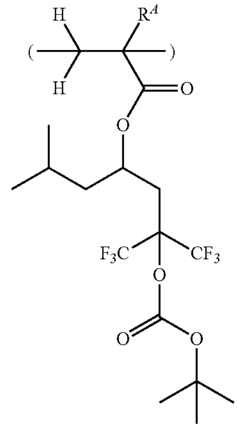
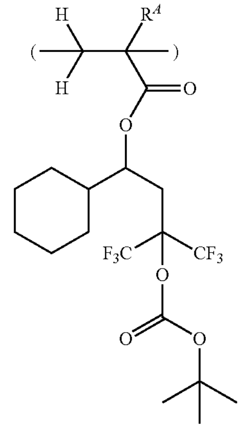

-continued
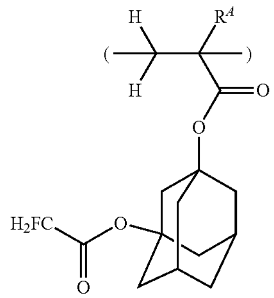
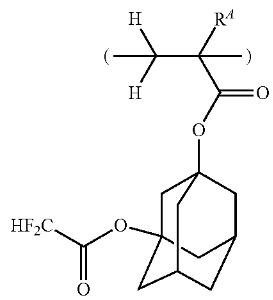
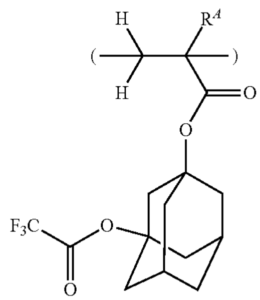
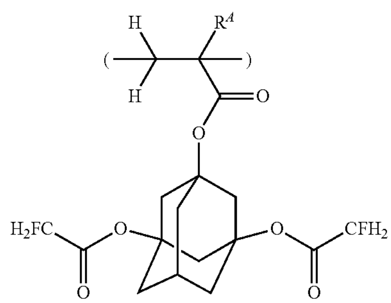
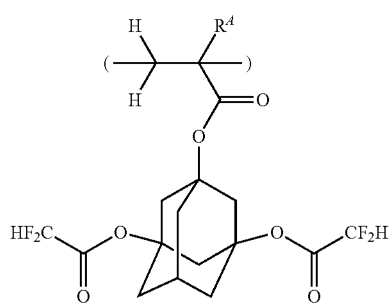
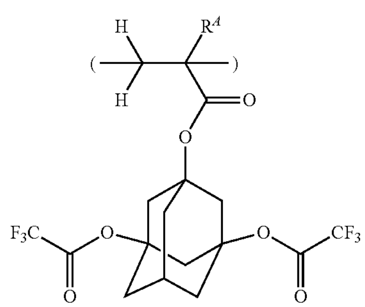
-continued
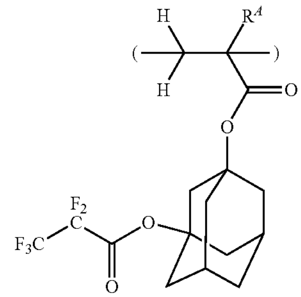
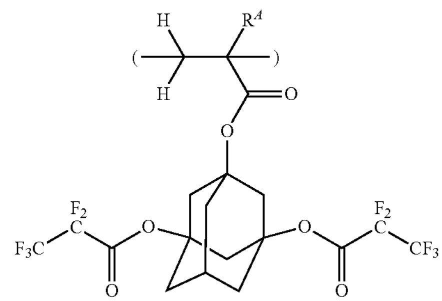
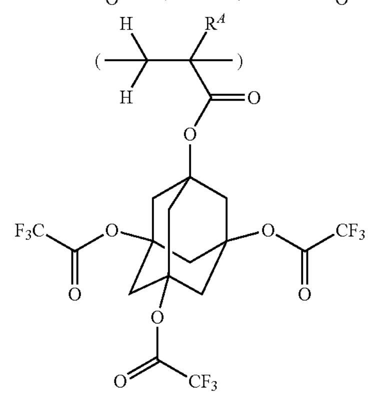
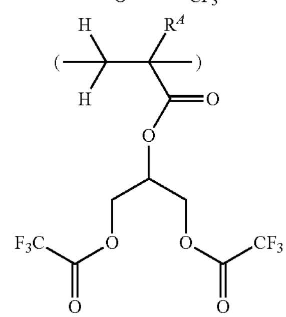
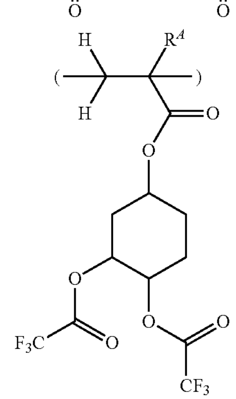
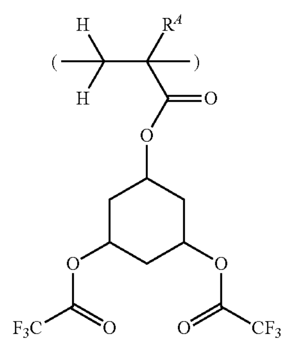

-continued

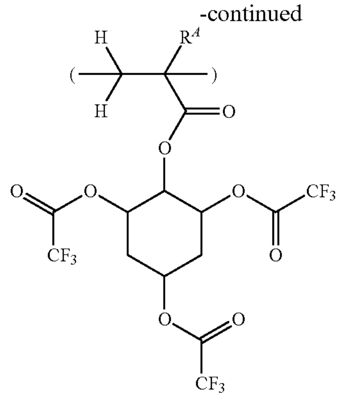

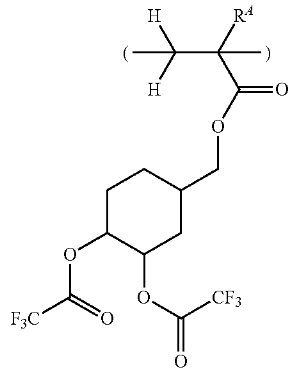

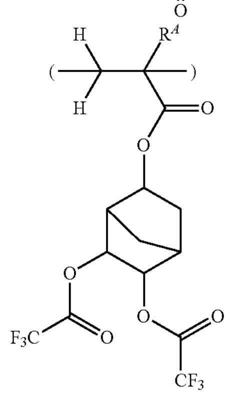

For the polymeric surfactant, reference may be made to JP-A 2008-122932, 2010-134012, 2010-107695, 2009-276363, 2009-192784, 2009-191151, 2009-098638, 2010-250105, and 2011-042789.

The polymeric surfactant preferably has a Mw of 1,000 to 50,000, more preferably 2,000 to 20,000 as measured by GPC versus polystyrene standards. A surfactant with a Mw in the range may be effective for surface modification and cause no development defects.

Component (F) is preferably formulated in an amount of 0.001 to 20 parts, and more preferably 0.01 to 10 parts by weight per 100 parts by weight of the base resin (B). The surfactants may be used alone or in admixture.

(G) Other Components

The resist composition may further contain other components, for example, a compound which is decomposed with an acid to generate another acid (i.e., acid amplifier compound), an organic acid derivative, a fluorinated alcohol, and a compound having a Mw of up to 3,000 which changes its solubility in developer under the action of an acid (i.e., dissolution inhibitor). For the acid amplifier, reference should be made to JP-A 2009-269953 and 2010-215608. For the organic acid derivative, fluorinated alcohol, and dissolution inhibitor, reference should be made to JP-A 2009-269953 and JP-A 2010-215608.

In the resist composition, an appropriate amount of the acid amplifier compound is 0 to 5 parts, and especially 0 to 3 parts by weight, an appropriate amount of the organic acid derivative or fluorinated alcohol is 0 to 5 parts, and especially 0 to 1 part by weight, an appropriate amount of the dissolution inhibitor is 0 to 20 parts, and especially 0 to 15 parts by weight, all per 100 parts by weight of the base resin (B).

Process

A further embodiment of the invention is a pattern forming process using the resist composition defined above. A pattern may be formed from the resist composition using any well-known lithography process. The preferred process includes at least the steps of forming a resist film on a substrate, exposing it to high-energy radiation, and developing it in a developer.

First the resist composition is applied onto a substrate for integrated circuitry fabrication (e.g., Si, $SiO_2$, SiN, SiON, TiN, WSi, BPSG, SOG, organic antireflective film, etc.) or a substrate for mask circuitry fabrication (e.g., Cr, CrO, CrON, $MoSi_2$, $SiO_2$, etc.) by a suitable coating technique such as spin coating. The coating is prebaked on a hot plate at a temperature of 60 to 150° C. for 1 to 10 minutes, preferably at 80 to 140° C. for 1 to 5 minutes. The resulting resist film is generally 0.05 to 2 μm thick.

Through a photomask having a desired pattern disposed over the substrate, the resist film is then exposed to high-energy radiation such as KrF excimer laser, ArF excimer laser or EUV in an exposure dose preferably in the range of 1 to 200 $mJ/cm^2$, more preferably 10 to 100 $mJ/cm^2$. Alternatively, pattern formation may be performed by writing with EB in a dose of 1 to 300 $\mu C/cm^2$, more preferably 10 to 200 $\mu C/cm^2$. Light exposure may be done by a conventional lithography process or in some cases, by an immersion lithography process of providing liquid impregnation, typically interposing a liquid having a refractive index of at least 1.0 between the projection lens and the resist film. The liquid is typically water, and in this case, a protective film which is insoluble in water may be formed on the resist film.

The resist film is then baked (PEB) on a hot plate at 60 to 150° C. for 1 to 5 minutes, and preferably at 80 to 140° C. for 1 to 3 minutes. Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate.

While the water-insoluble protective film which is used in the immersion lithography serves to prevent any components from being leached out of the resist film and to improve water sliding on the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

Also, a double patterning process may be used for pattern formation. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution is often used as the developer. The negative tone development technique wherein the unexposed region is developed and dissolved in an organic solvent is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, phenyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples and Comparative Examples are given below by way of illustration and not by way of limitation. All parts are by weight (pbw). For all polymers, Mw and Mn are determined by GPC versus polystyrene standards using THF solvent. THF stands for tetrahydrofuran, and MIBK for methyl isobutyl ketone. Analytic instruments are as shown below.

IR: NICOLET iS5 by Thermo Fisher Scientific Inc.

$^1$H-NMR: ECA-500 by JEOL Ltd.

$^{19}$F-NMR: ECA-500 by JEOL Ltd.

MALDI-TOF-MS: S3000 by JEOL Ltd.

[1] Synthesis of PAG

Photoacid generators within the scope of the invention were synthesized by the following procedure.

Synthesis Example 1-1

Synthesis of Intermediate 1

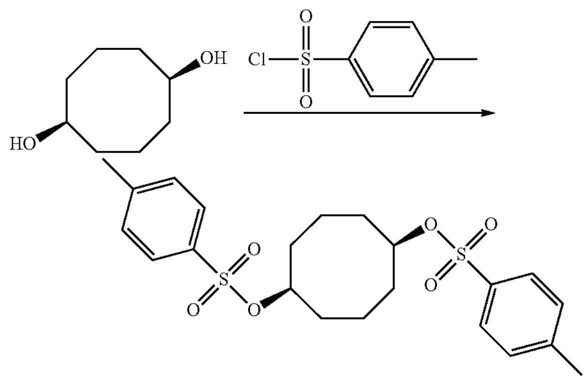

Intermediate 1

Under ice cooling, 12 g of p-toluenesulfonic acid chloride was added to a mixture of 5.0 g of cis-1,5-cyclooctane diol and 50 g of pyridine. The mixture was stirred at room temperature for 2 days. Thereafter, 100 g of ice was added to the mixture for cooling, which was poured into 44 g of conc. hydrochloric acid to quench the reaction. The solution was extracted with methylene chloride. The organic layer was washed with water and a saturated sodium hydrogencarbonate aqueous solution, and concentrated under reduced pressure. To the concentrate, methyl isobutyl ether was added. The solution was concentrated under reduced pressure again, obtaining 11.1 g of Intermediate 1 (yield 71%). Intermediate 1 was used in the next reaction without purification.

Synthesis Example 1-2

Synthesis of Intermediate 2

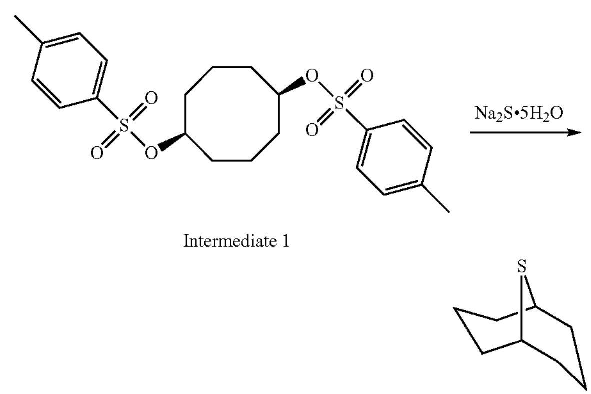

Intermediate 2

In 230 g of dimethyl sulfoxide was dissolved 12.6 g of Intermediate 1. Sodium sulfide pentahydrate, 9.4 g, was added to the solution, which was stirred at room temperature for one week Water was added to the reaction solution, which was extracted with hexane. The organic layer was washed with water and dilute hydrochloric acid. The organic layer was concentrated under reduced pressure, obtaining 3.7 g of Intermediate 2 (yield 94%). Intermediate 2 was used in the next reaction without purification.

Synthesis Example 1-3

Synthesis of Intermediate 3

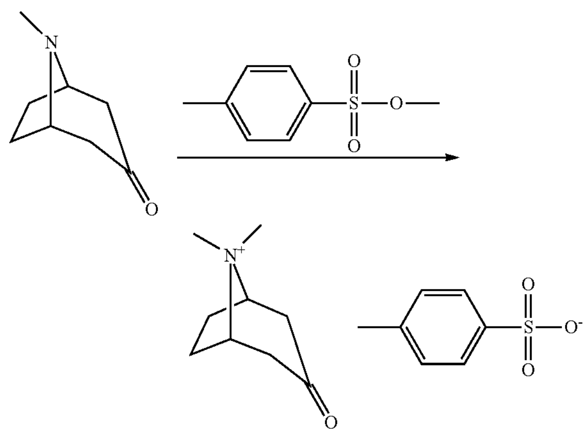

Intermediate 3

To a mixture of 600 g of tropinone and 5 kg of THF, 1.2 kg of methyl p-toluenesulfonate was added dropwise under reflux. The solution was aged under reflux conditions for 24 hours, and then ice cooled. With stirring, 1.5 kg of diisopropyl ether was added. The resulting suspension was filtered. The solid was washed with diisopropyl ether and vacuum dried, obtaining 1.4 kg of Intermediate 3 (yield 99%).

Synthesis Example 1-4

Synthesis of Intermediate 4

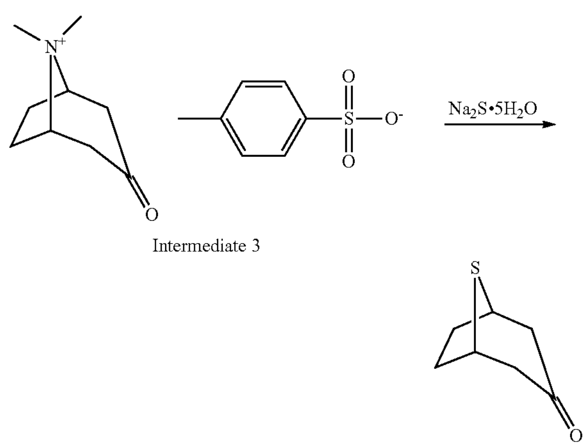

Intermediate 4

To a mixture of 1,392 g of Intermediate 3 and 2.8 kg of water which was kept at 45° C., 755 g of sodium sulfide pentahydrate was added. The solution was aged for 1 hour, then ice cooled, and extracted with ethyl acetate. The organic layer was washed with water and dilute hydrochloric acid, after which the solvent was distilled off under reduced pressure. The crude product was recrystallized from ethyl acetate/hexane, obtaining 400 g of Intermediate 4 (yield 66%).

Synthesis Example 1-5

Synthesis of Intermediate 5

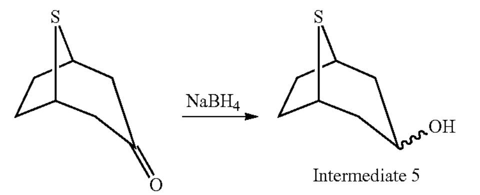

Intermediate 5

Intermediate 4

Under ice cooling, 40 g of water was added to a suspension of 100 g of sodium borohydride in 500 g of THF. Thereafter, a solution of 250 g of Intermediate 4 in 200 g of THF was added dropwise. The solution was aged for 13 hours. After ice cooling, 500 g of 20 wt % hydrochloric acid was added to the solution, which was stirred for 30 minutes. Further, 100 g of 25 wt % sodium hydroxide aqueous solution was added to the solution, from which the water layer was extracted with ethyl acetate. The organic layer was sequentially washed with water, dilute hydrochloric acid and saturated sodium hydrogencarbonate aqueous solution, and concentrated under reduced pressure, obtaining 216 g of Intermediate 5 (yield 85%). Intermediate 5 was used in the next reaction without purification.

Synthesis Example 1-6

Synthesis of Intermediate 6

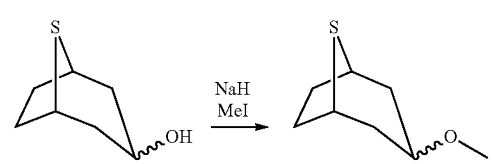

Intermediate 5 Intermediate 6

Under ice cooling, a solution of 2.2 g of Intermediate 5 in 5 g of THF was added dropwise to a suspension of 720 mg of sodium hydride in 10 g of THF, followed by 30 minutes of stirring. A mixture of 2.3 g of methyl iodide and 5 g of THF was added dropwise to the solution, which was warmed to room temperature and aged for 13 hours. The reaction solution was ice cooled, combined with 2 g of methanol, and stirred at room temperature for 2 hours. The solvent was distilled off under reduced pressure. The concentrate was dissolved in ethyl acetate and washed with water. The solvent was distilled off under reduced pressure again, obtaining 2.2 g of Intermediate 6 (yield 91%). Intermediate 6 was used in the next reaction without purification.

Synthesis Example 1-7

Synthesis of Intermediate 7

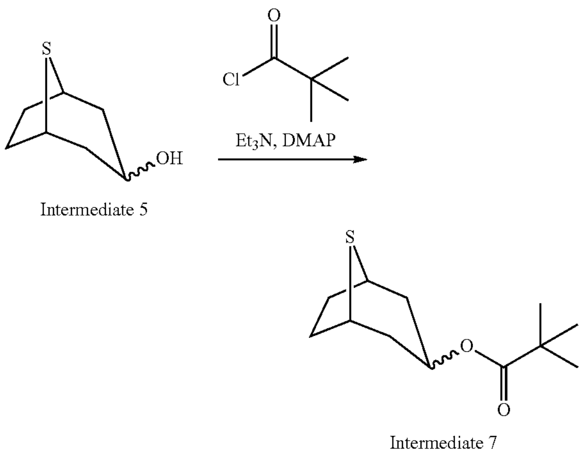

Under ice cooling, 3.0 g of pivaloyl chloride was added dropwise to a mixture of 3.0 g of Intermediate 5, 6.3 g of triethylamine, 254 mg of N,N-dimethylaminopyridine, and 70 g of dichloromethane. The solution was warmed to room temperature and aged for 16 hours. Thereafter, 30 g of a saturated sodium hydrogencarbonate solution was added to the solution, which was stirred. The organic layer was separated, and washed with dilute hydrochloric acid and water. The solvent was distilled off under reduced pressure, obtaining 4.7 g of Intermediate 7 (yield 98%). Intermediate 7 was used in the next reaction without purification.

Synthesis Example 1-8

Synthesis of Intermediate 8

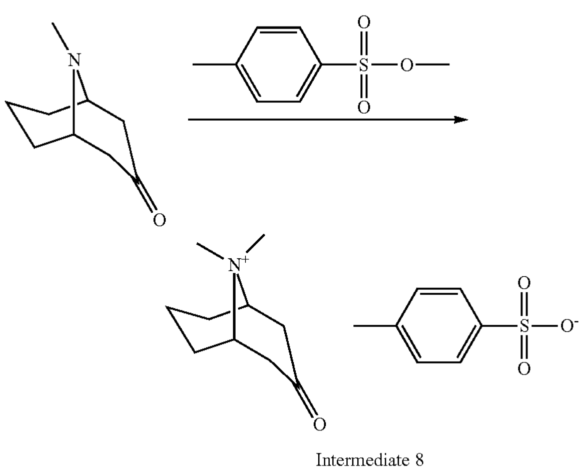

Synthesis was performed by the same procedure as in Synthesis Example 1-3 aside from using 20 g of pseudopelletierine instead of 600 g of tropinone and using 37 g of methyl p-toluenesulfonate. There was obtained 37 g of Intermediate 8 (yield 82%).

Synthesis Example 1-9

Synthesis of Intermediate 9

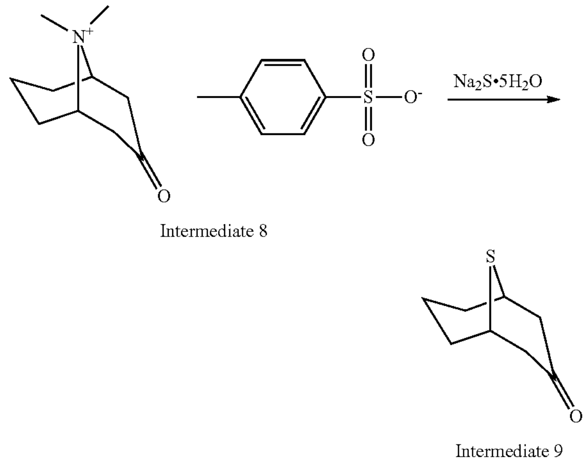

Synthesis was performed by the same procedure as in Synthesis Example 1-4 aside from using 10 g of Intermediate 8 instead of Intermediate 3 and using 7.4 g of sodium sulfide pentahydrate. There was obtained 3.2 g of Intermediate 9 (yield 70%).

Synthesis Example 1-10

Synthesis of Intermediate 10

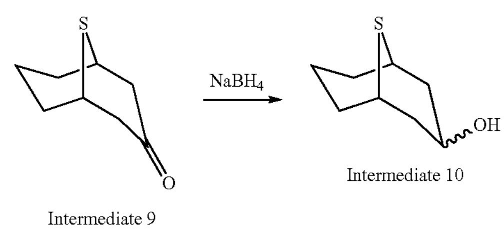 [SMILES: O=C1CC2CCCC(C1)S2 ; "NaBH4" ; OC1CC2CCCC(C1)S2]

Synthesis was performed by the same procedure as in Synthesis Example 1-5 aside from using 8.7 g of Intermediate 9 instead of Intermediate 4 and using 3.2 g of sodium borohydride. There was obtained 8.7 g of Intermediate 10 (yield 98%). Intermediate 10 was used in the next reaction without purification.

Synthesis Example 1-11

Synthesis of Intermediate 11

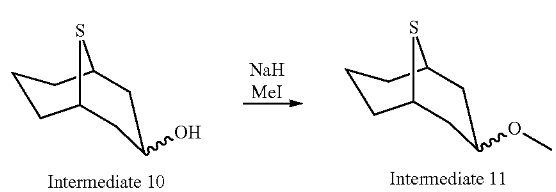

Synthesis was performed by the same procedure as in Synthesis Example 1-6 aside from using 3.0 g of Intermediate 10 instead of Intermediate 5 and using 912 mg of sodium hydride and 3.0 g of methyl iodide. There was obtained 3.2 g of Intermediate 11 (yield 96%). Intermediate 11 was used in the next reaction without purification.

Synthesis Example 1-12

Synthesis of Intermediate 12

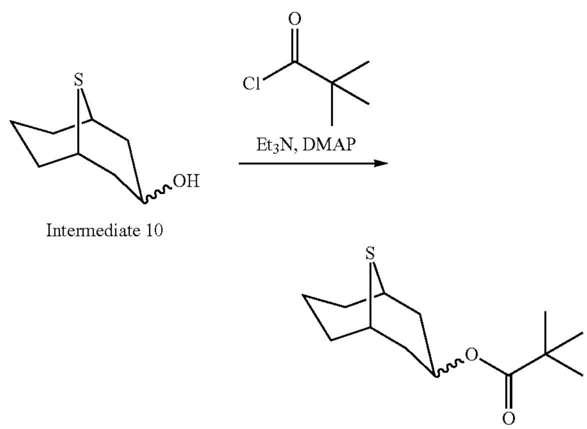

Intermediate 12

Synthesis was performed by the same procedure as in Synthesis Example 1-7 aside from using 3.0 g of Intermediate 10 instead of Intermediate 5 and using 2.8 g of pivaloyl chloride, 5.8 g of triethylamine, and 232 mg of N,N-dimethylaminopyridine. There was obtained 4.4 g of Intermediate 12 (yield 94%). Intermediate 12 was used in the next reaction without purification.

Example 1-1

Synthesis of PAG-1

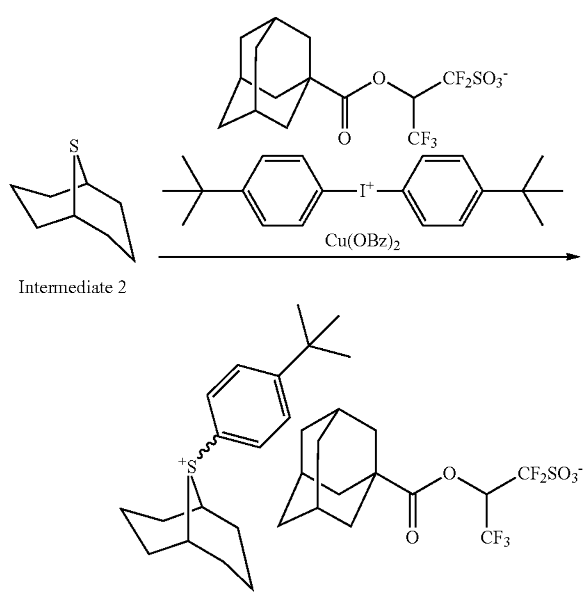

PAG-1

A mixture of 3.9 g of bis(4-tert-butylphenyl)iodonium 2-(adamantane-1-carbonyloxy)-1,1,3,3,3-pentafluoropropane-1-sulfonate, 782 mg of Intermediate 2, 76 mg of copper(II) benzoate, and 20 g of chlorobenzene was stirred at 100° C. for 1 hour. The solution was concentrated by distilling off chlorobenzene under reduced pressure. The concentrate was recrystallized from MIBK/diisopropyl ether, obtaining 2.2 g of PAG-1 (yield 67%).

Figure 2:
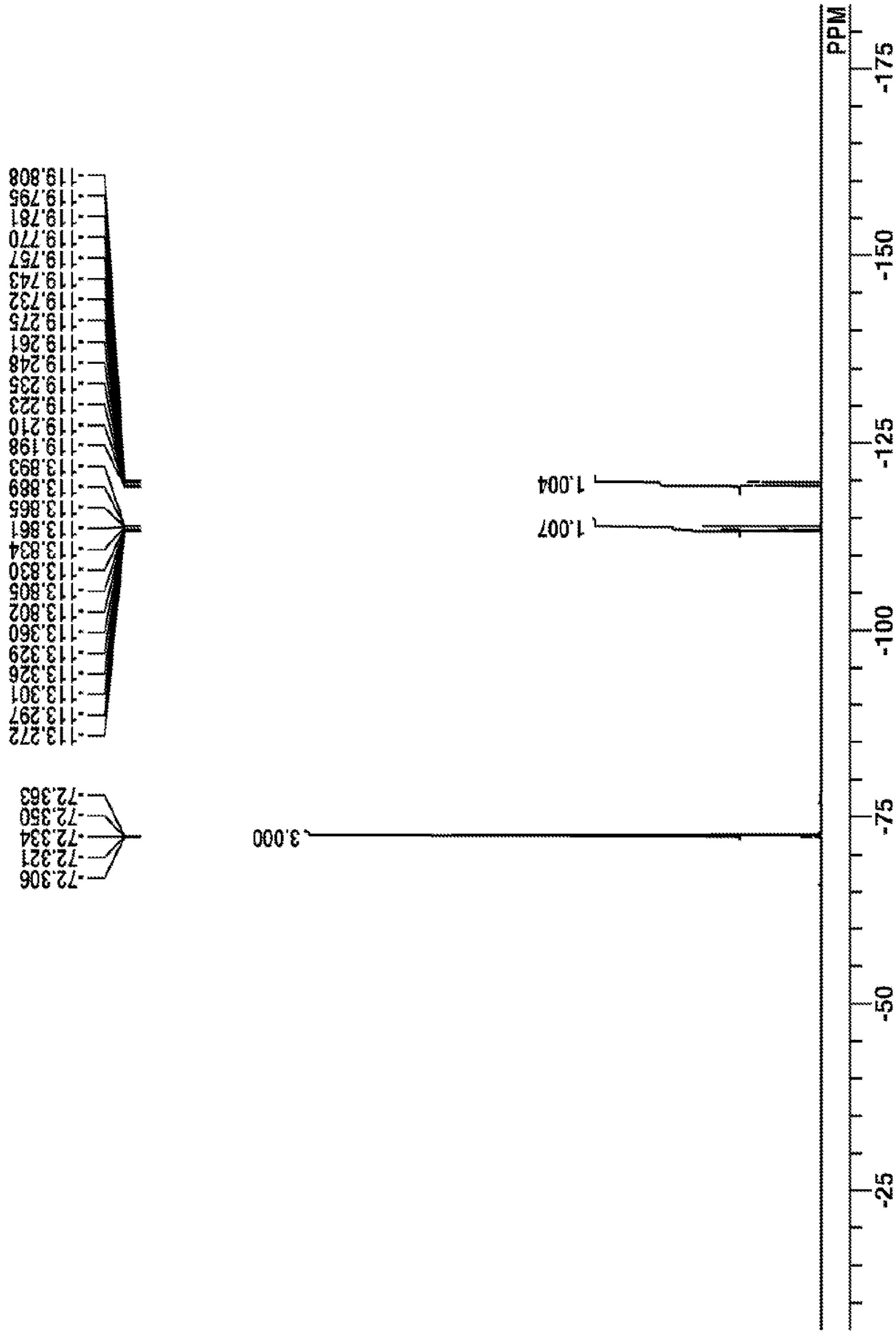
FIG. 2 is a diagram showing the $^{19}$F-NMR/DMSO-$d_6$ spectrum of PAG-1 in Example 1-1.

PAG-1 was analyzed by spectroscopy. The NMR spectra, 1H-NMR and $1^{9}$F-NMR in DMSO-$d_6$ are shown in FIGS. 1 and 2. On $^{1}$H-NMR analysis, minor amounts of residual solvents (water, diisopropyl ether) were observed.

IR (D-ATR): ν=2955, 2915, 2856, 1755, 1497, 1477, 1453, 1375, 1346, 1329, 1267, 1240, 1215, 1183, 1164, 1115, 1103, 1087, 1079, 1051, 1035, 1011 $cm^{-1}$

MALDI-TOF-MS: Positive $M^+$ 275 (corresponding to $C_{18}H_{27}$—$S^+$)

Negative $M^-$ 391 (corresponding to $C_{14}H_{18}F_5O_2$—$SO_3^-$)

Example 1-2

Synthesis of PAG-2

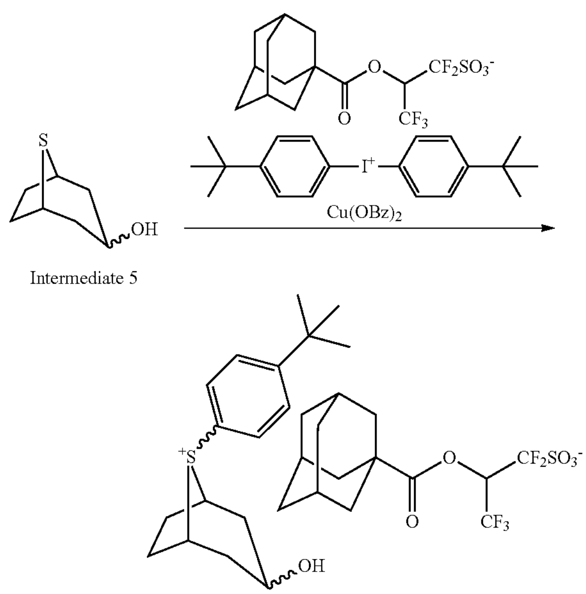

PAG-2

A mixture of 3.9 g of bis(4-tert-butylphenyl)iodonium 2-(adamantane-1-carbonyloxy)-1,1,3,3,3-pentafluoropropane-1-sulfonate, 865 mg of Intermediate 5, 76 mg of copper(II) benzoate, and 20 g of chlorobenzene was stirred at 120° C. for 1 hour. The solution was concentrated by distilling off chlorobenzene under reduced pressure. The concentrate was recrystallized from methylene chloride/diisopropyl ether, obtaining 2.3 g of PAG-2 (yield 70%).

Figure 3:
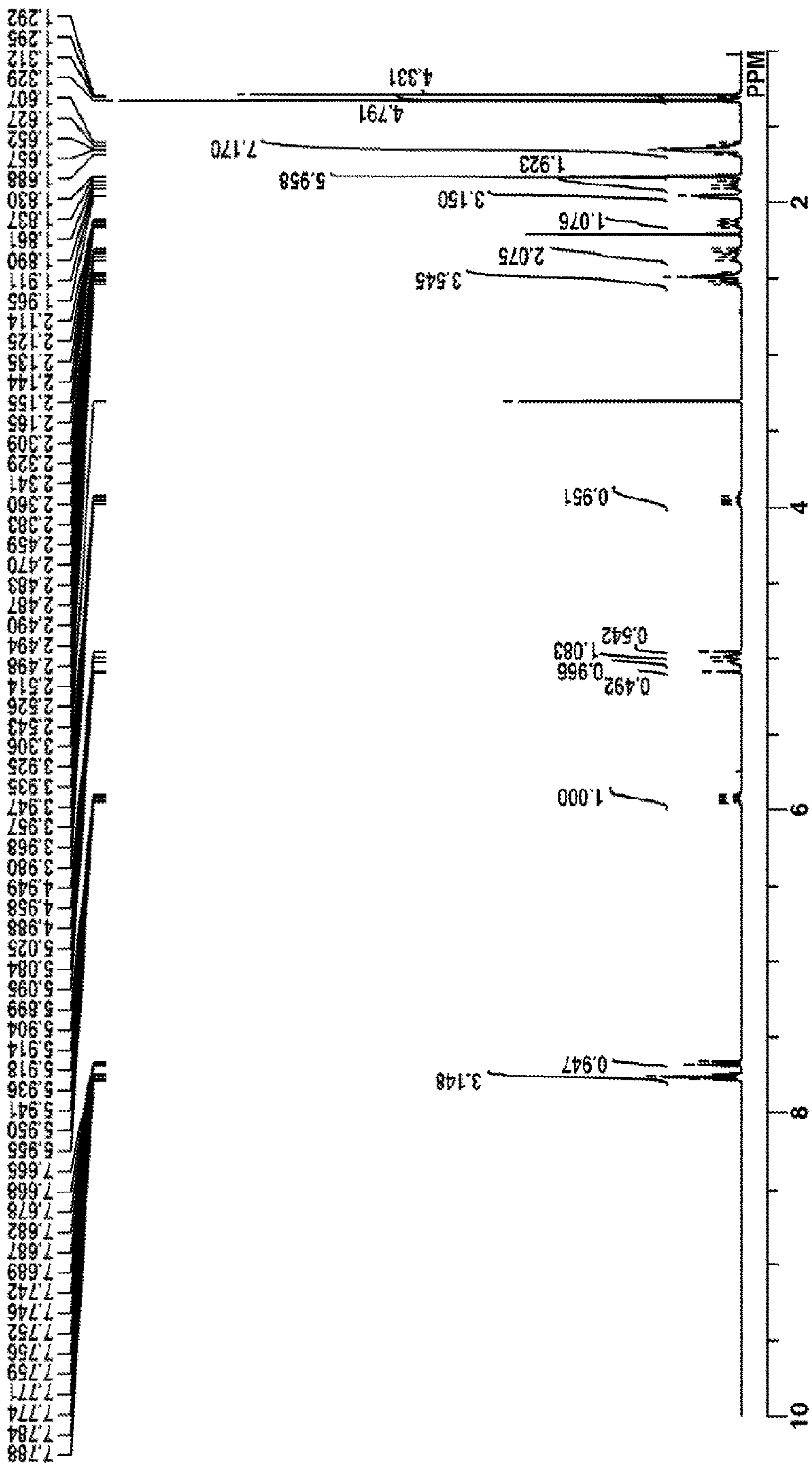
FIGS. 3 and 4 are diagrams showing the $^1$H-NMR/DMSO-$d_6$ and $^{19}$F-NMR/DMSO-$d_6$ spectra of PAG-2 in Example 1-2, respectively.
Figure 4:
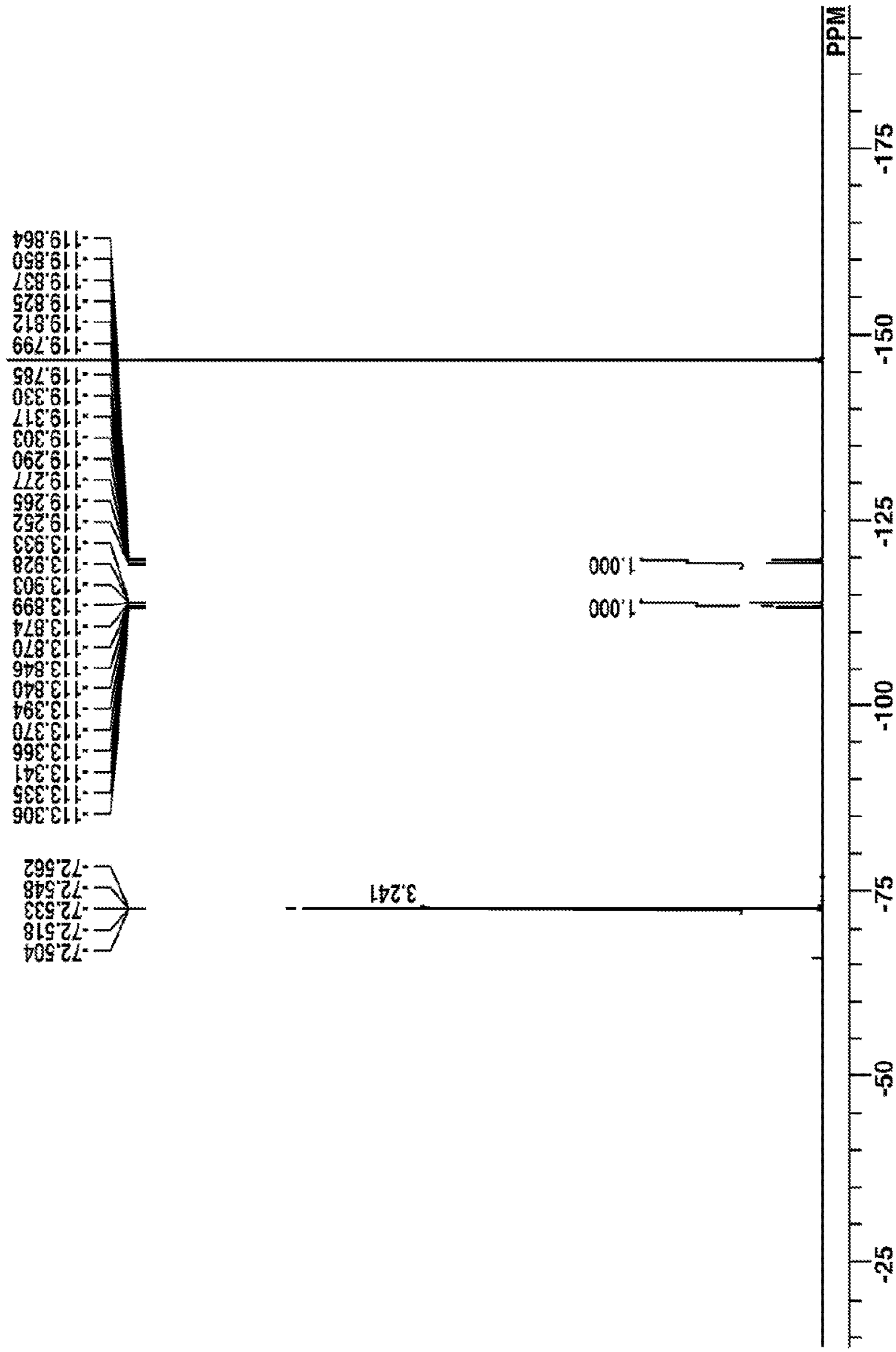

PAG-2 (diastereomer mixture) was analyzed by spectroscopy. The NMR spectra, $^{1}$H-NMR and $^{19}$F-NMR in DMSO-$d_6$ are shown in FIGS. 3 and 4. On $^{1}$H-NMR and $^{19}$F-NMR analysis, the internal standard (p-tetrafluoroxylene) was observed. On $^{1}$H-NMR analysis, minor amounts of residual solvents (water, diisopropyl ether) were observed.

IR (D-ATR): ν=3459, 2972, 2935, 2910, 2857, 1759, 1590, 1494, 1452, 1400, 1369, 1331, 1265, 1248, 1238, 1229, 1215, 1183, 1166, 1123, 1102, 1090, 1051, 1034, 1009 $cm^{-1}$

MALDI-TOF-MS: Positive $M^+$277 (corresponding to $C_{17}H_{25}O$—$S^{+)}$

Negative M 391 (corresponding to $C_{14}H_{18}F_5O_2$—$SO_3^-$)

Example 1-3

Synthesis of PAG-3

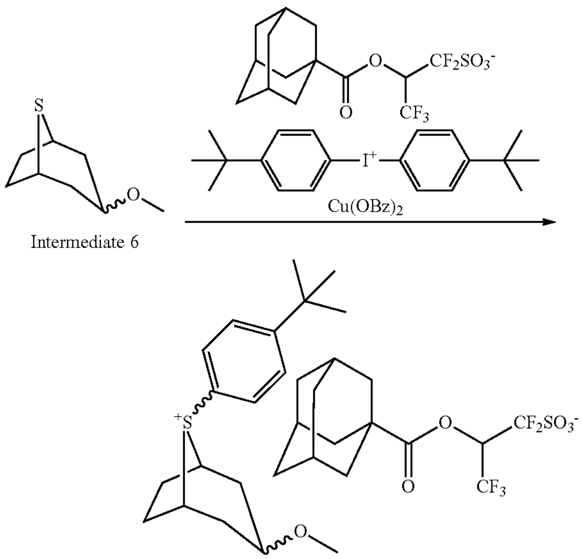

Intermediate 6

PAG-3

A mixture of 3.9 g of bis(4-tert-butylphenyl)iodonium 2-(adamantane-1-carbonyloxy)-1,1,3,3,3-pentafluoropropane-1-sulfonate, 950 mg of Intermediate 6, 76 mg of copper(II) benzoate, and 20 g of chlorobenzene was stirred at 100° C. for 1 hour. The solution was concentrated by distilling off chlorobenzene under reduced pressure. The concentrate was recrystallized from MIBK/diisopropyl ether, obtaining 2.3 g of PAG-3 (yield 66%).

Figure 5:
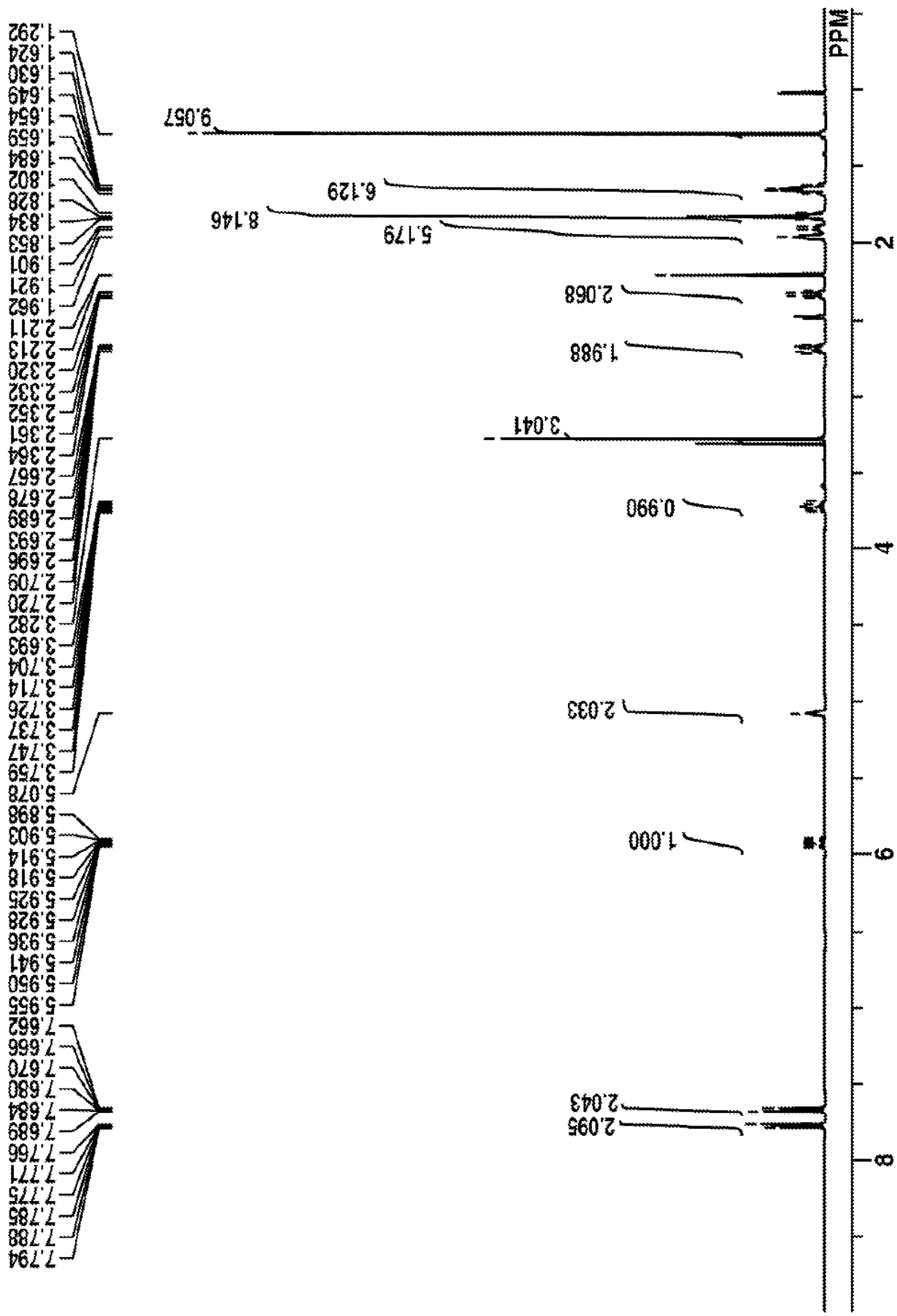
FIGS. 5 and 6 are diagrams showing the $^1$H-NMR/DMSO-$d_6$ and $^{19}$F-NMR/DMSO-$d_6$ spectra of PAG-3 in Example 1-3, respectively.
Figure 6:
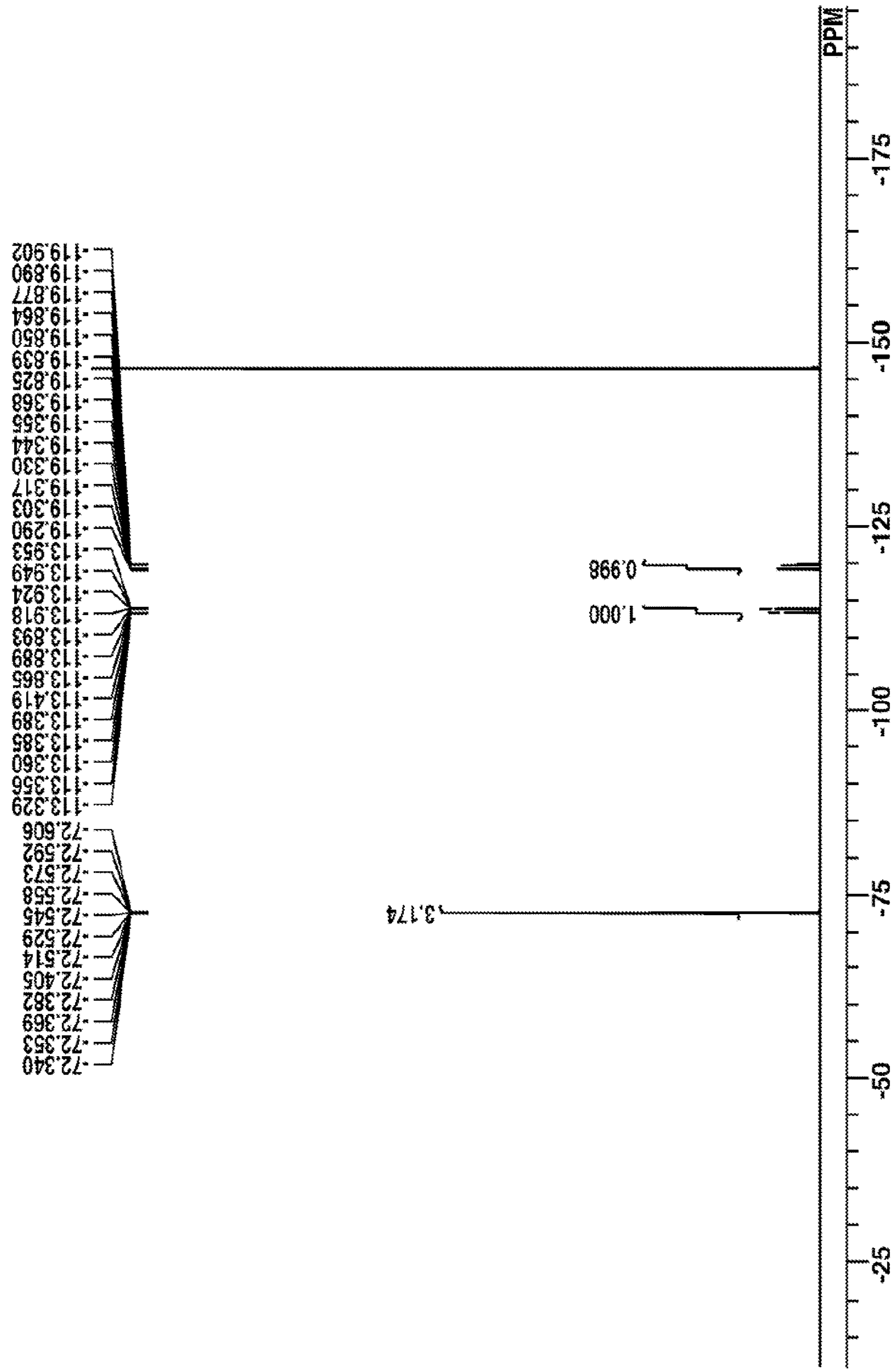

PAG-3 was analyzed by spectroscopy. The NMR spectra, $^{1}$H-NMR and $^{19}$F-NMR in DMSO-$d_6$ are shown in FIGS. 5 and 6. On $^{1}$H-NMR and $^{19}$F-NMR analysis, the internal standard (p-tetrafluoroxylene) was observed. On $^{1}$H-NMR analysis, minor amounts of residual solvents (water, diisopropyl ether) were observed.

IR (D-ATR): ν=2908, 2857, 1752, 1592, 1497, 1452, 1377, 1346, 1330, 1245, 1218, 1182, 1166, 1103, 1089, 1051, 1028, 1010 $cm^{-1}$

MALDI-TOF-MS: Positive $M^{+}$291 (corresponding to $C_{18}H_{27}O—S^{+}$)

Negative $M^{-}$ 391 (corresponding to $C_{14}H_{18}F_5O_2—SO_3^{-}$)

Example 1-4

Synthesis of PAG-4

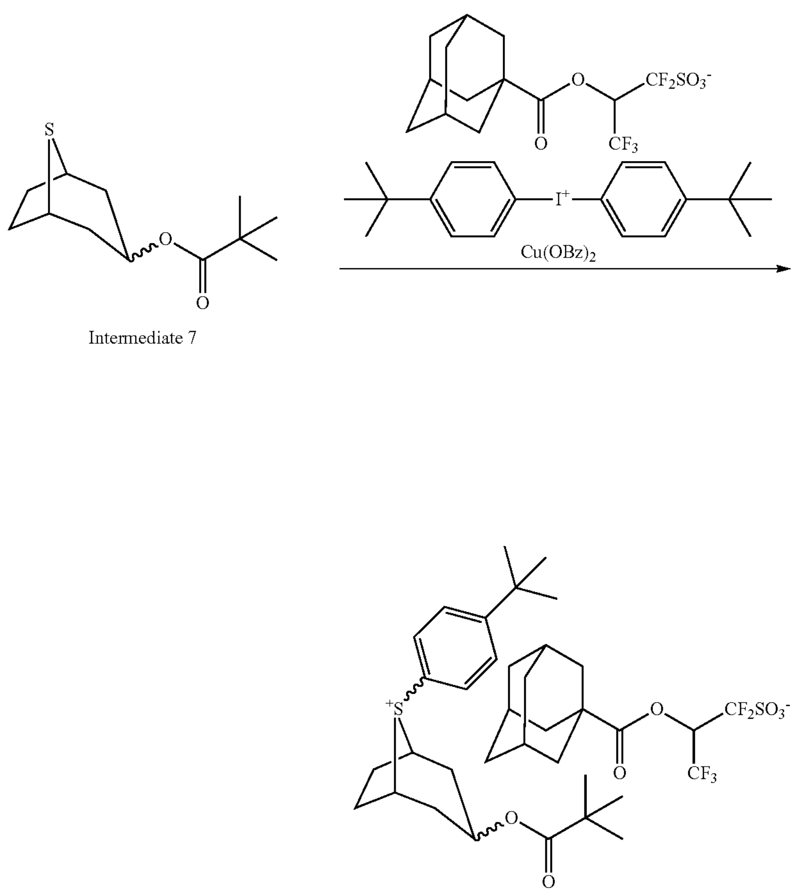

Intermediate 7

PAG-4

A mixture of 3.9 g of bis(4-tert-butylphenyl)iodonium 2-(adamantane-1-carbonyloxy)-1,1,3,3,3-pentafluoropropane-1-sulfonate, 1.4 g of Intermediate 7, 76 mg of copper (II) benzoate, and 20 g of chlorobenzene was stirred at 100° C. for 1 hour. The solution was concentrated by distilling off chlorobenzene under reduced pressure. The concentrate was recrystallized from MIBK/hexane, obtaining 2.8 g of PAG-4 (yield 75%).

Figure 7:
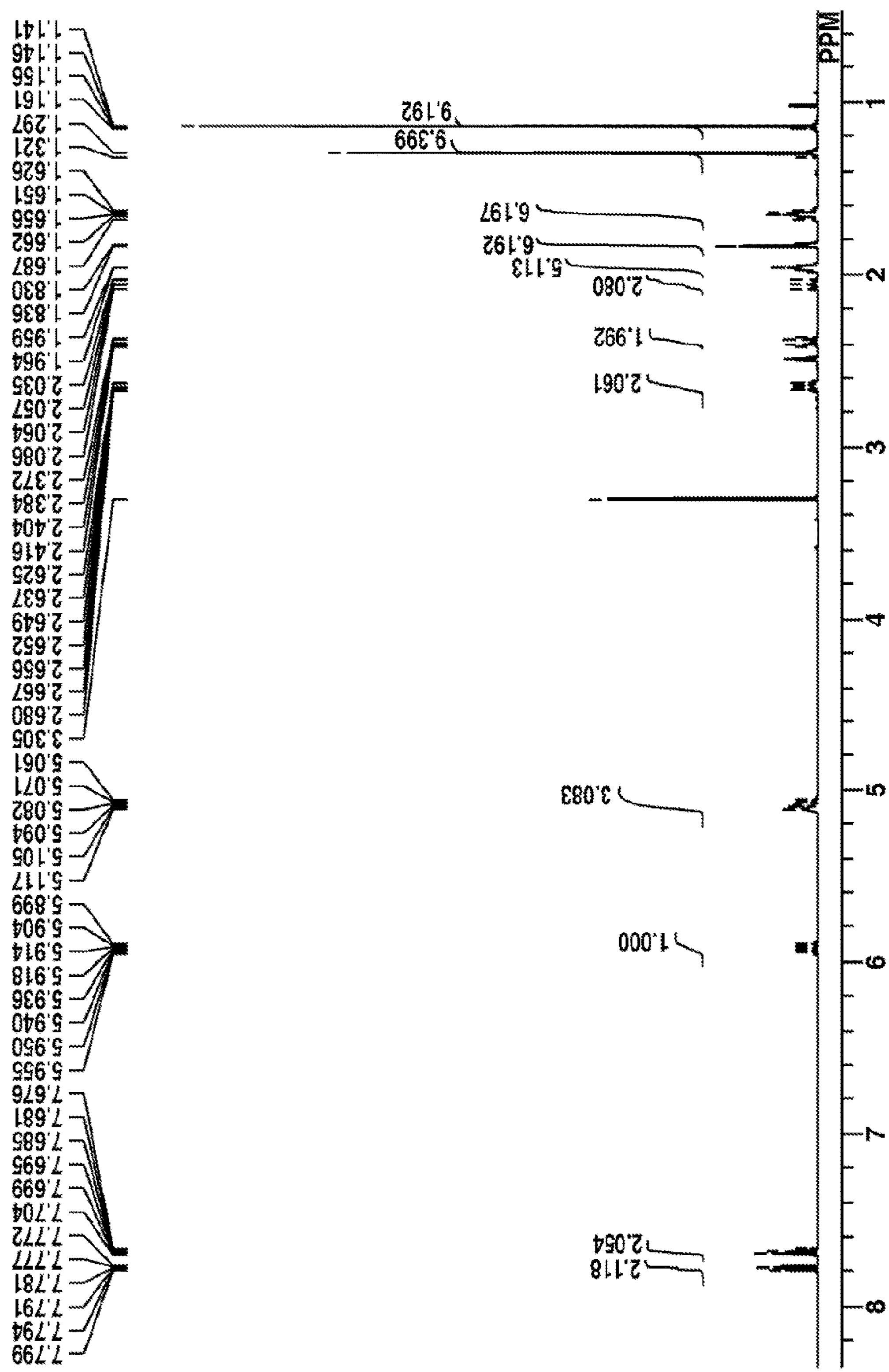
FIGS. 7 and 8 are diagrams showing the $^1$H-NMR/DMSO-$d_6$ and $^{19}$F-NMR/DMSO-$d_6$ spectra of PAG-4 in Example 1-4, respectively.
Figure 8:
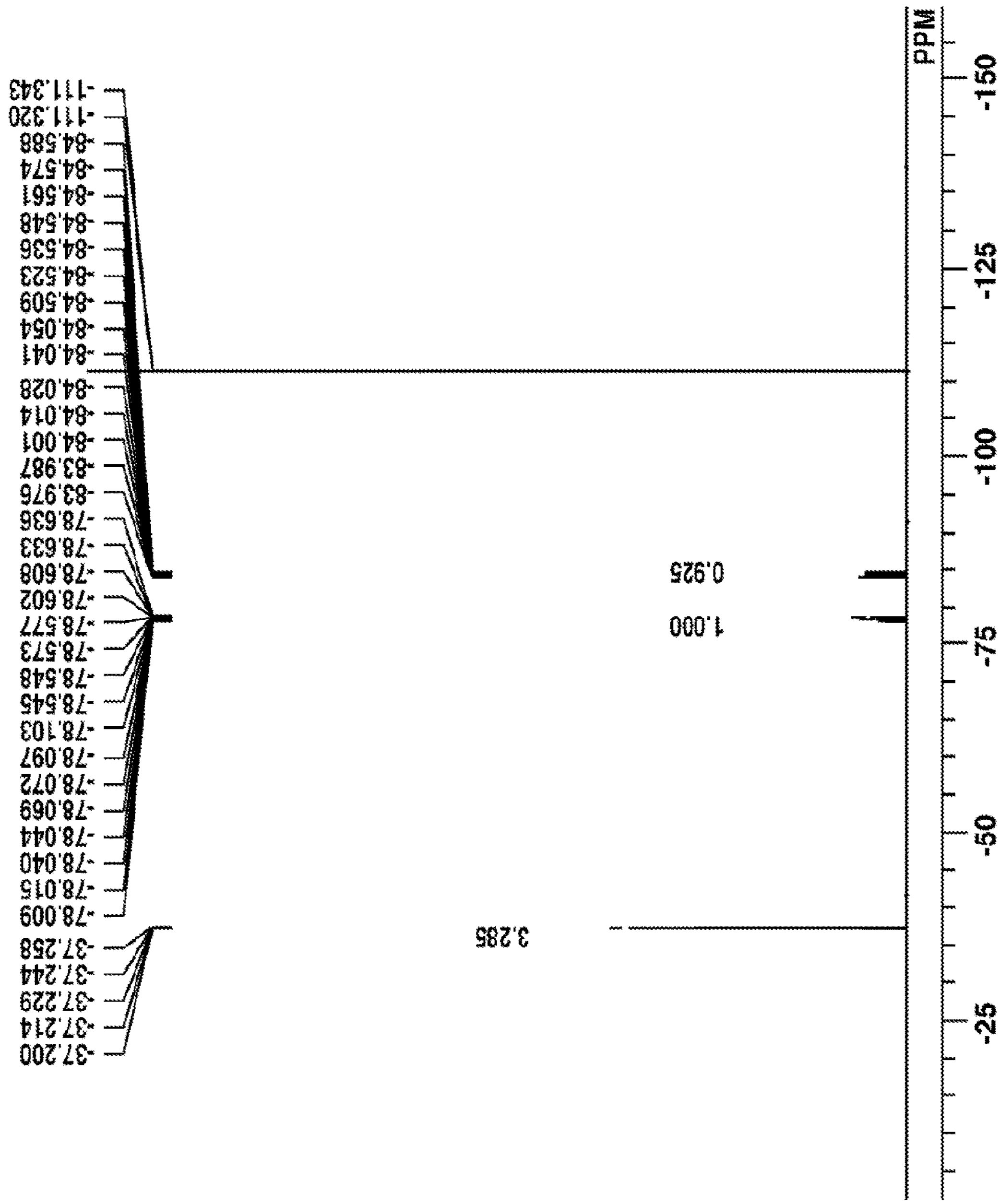

PAG-4 was analyzed by spectroscopy. The NMR spectra, $^1$H-NMR and $^{19}$F-NMR in DMSO-$d_6$ are shown in FIGS. 7 and 8. On $^1$H-NMR analysis, a minor amount of residual solvent (water) was observed.

IR (D-ATR): ν=2967, 2910, 2856, 1752, 1734, 1593, 1498, 1480, 1453, 1366, 1332, 1269, 1252, 1221, 1183, 1163, 1149, 1105, 1082, 1040, 1025, 1010 $cm^{-1}$

MALDI-TOF-MS: Positive $M^+$361 (corresponding to $C_{22}H_{33}O_2$—$S^{+)}$

Negative $M^-$ 391 (corresponding to $C_{14}H_{18}F_5O_2$—$SO_3^-$)

Example 1-5

Synthesis of PAG-5

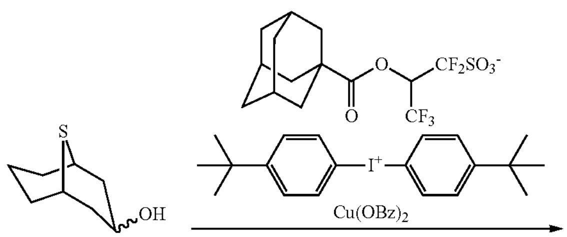

Intermediate 10

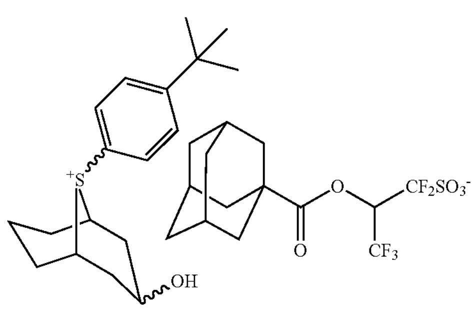

PAG-5

A mixture of 3.9 g of bis(4-tert-butylphenyl)iodonium 2-(adamantane-1-carbonyloxy)-1,1,3,3,3-pentafluoropropane-1-sulfonate, 950 mg of Intermediate 10, 76 mg of copper(II) benzoate, and 20 g of chlorobenzene was stirred at 120° C. for 1 hour. The solution was concentrated by distilling off chlorobenzene under reduced pressure. The concentrate was recrystallized from MIBK/diisopropyl ether, obtaining 2.4 g of PAG-5 (yield 71%).

Figure 9:
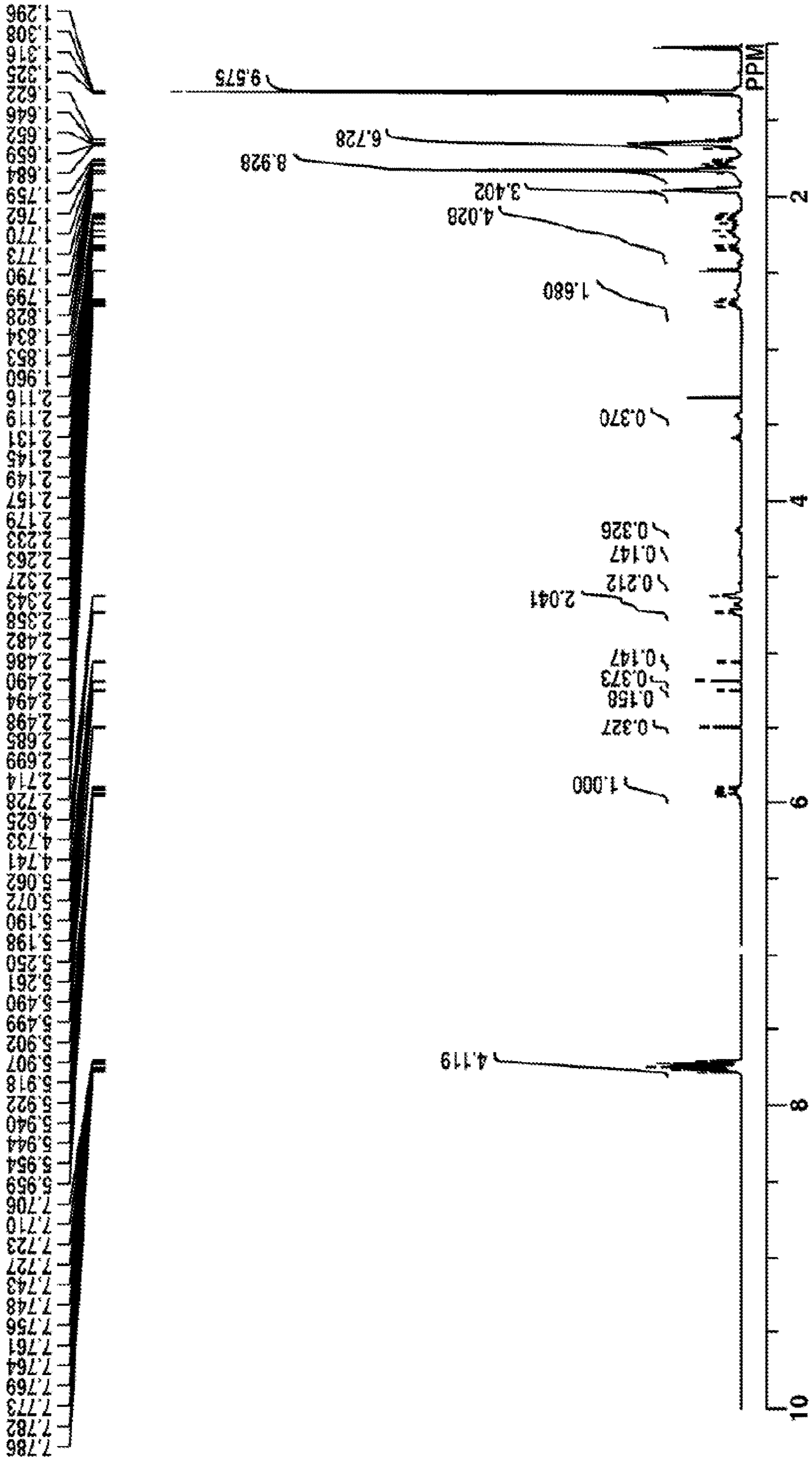
FIGS. 9 and 10 are diagrams showing the $^1$H-NMR/DMSO-$d_6$ and $^{19}$F-NMR/DMSO-$d_6$ spectra of PAG-5 in Example 1-5, respectively.
Figure 10:
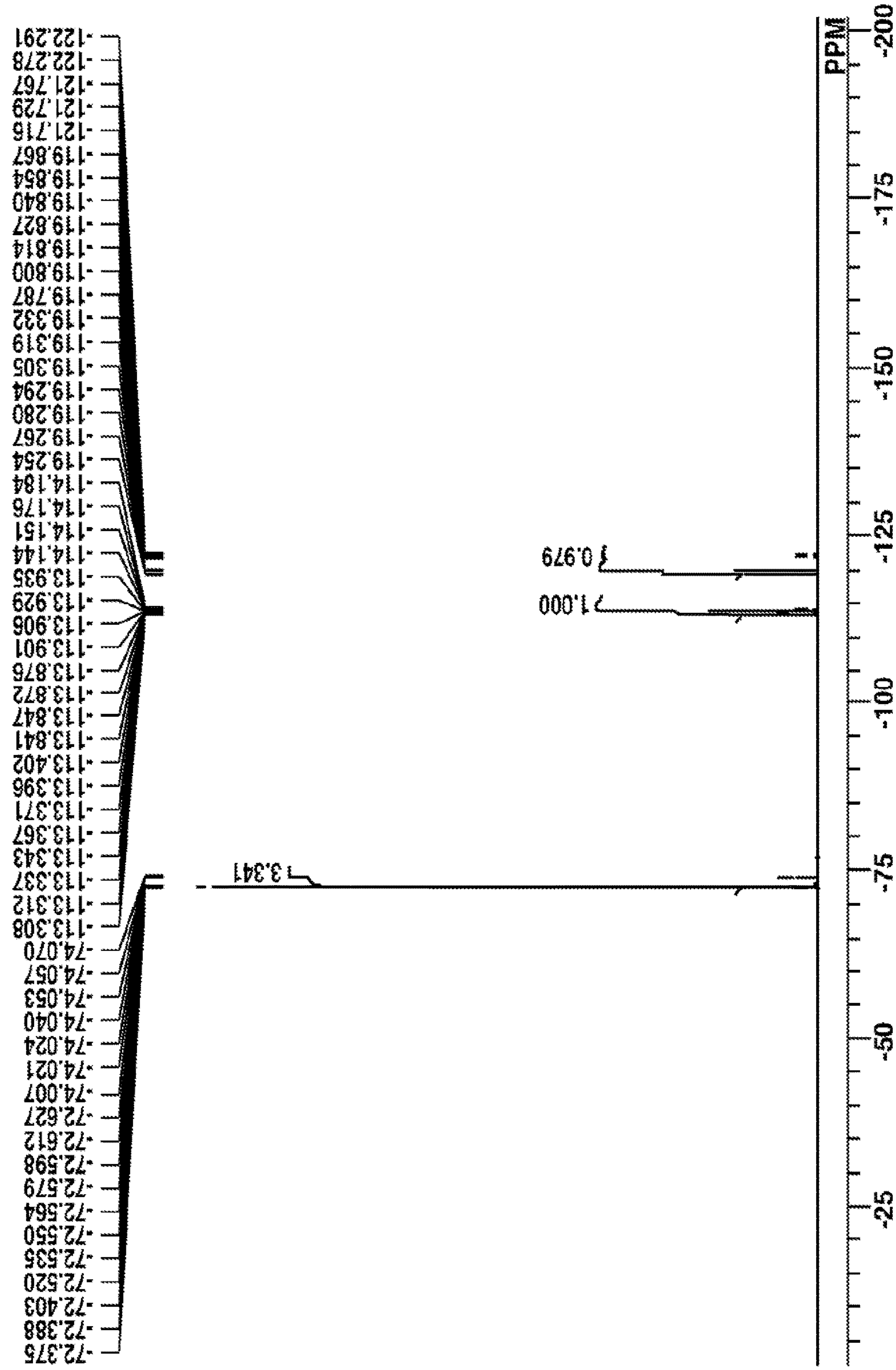

PAG-5 was analyzed by spectroscopy. The NMR spectra, $^1$H-NMR and $^{19}$F-NMR in DMSO-$d_6$ are shown in FIGS. 9 and 10. On $^1$H-NMR analysis, a minor amount of residual solvent (water) was observed.

IR (D-ATR): ν=3454, 3063, 2969, 2935, 2911, 2857, 1759, 1590, 1493, 1453, 1403, 1369, 1332, 1263, 1240, 1215, 1183, 1166, 1102, 1090, 1076, 1035, 1009 $cm^{-1}$

MALDI-TOF-MS: Positive M+291 (corresponding to $C_{18}H_{27}O$—$S^+$)

Negative $M^-$ 391 (corresponding to $C_{14}H_{18}F_5O_2$—$SO_3^-$)

Example 1-6

Synthesis of PAG-6

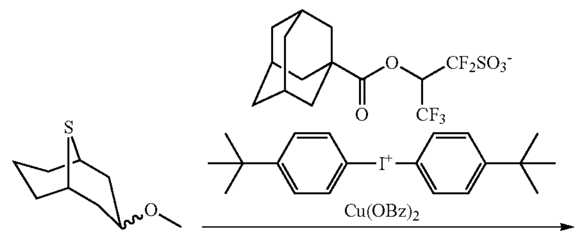

Intermediate 11

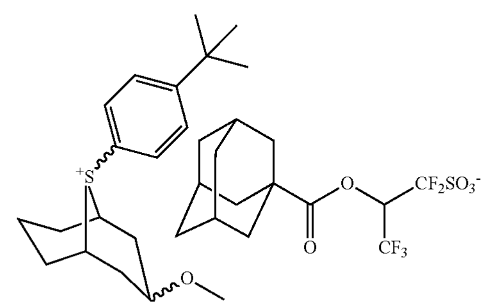

PAG-6

A mixture of 3.9 g of bis(4-tert-butylphenyl)iodonium 2-(adamantane-1-carbonyloxy)-1,1,3,3,3-pentafluoropropane-1-sulfonate, 1.0 g of Intermediate 11, 76 mg of copper (II) benzoate, and 20 g of chlorobenzene was stirred at 100° C. for 1 hour. The solution was concentrated by distilling off chlorobenzene under reduced pressure. The concentrate was recrystallized from MIBK/diisopropyl ether, obtaining 1.1 g of PAG-6 (yield 32%).

Figure 11:
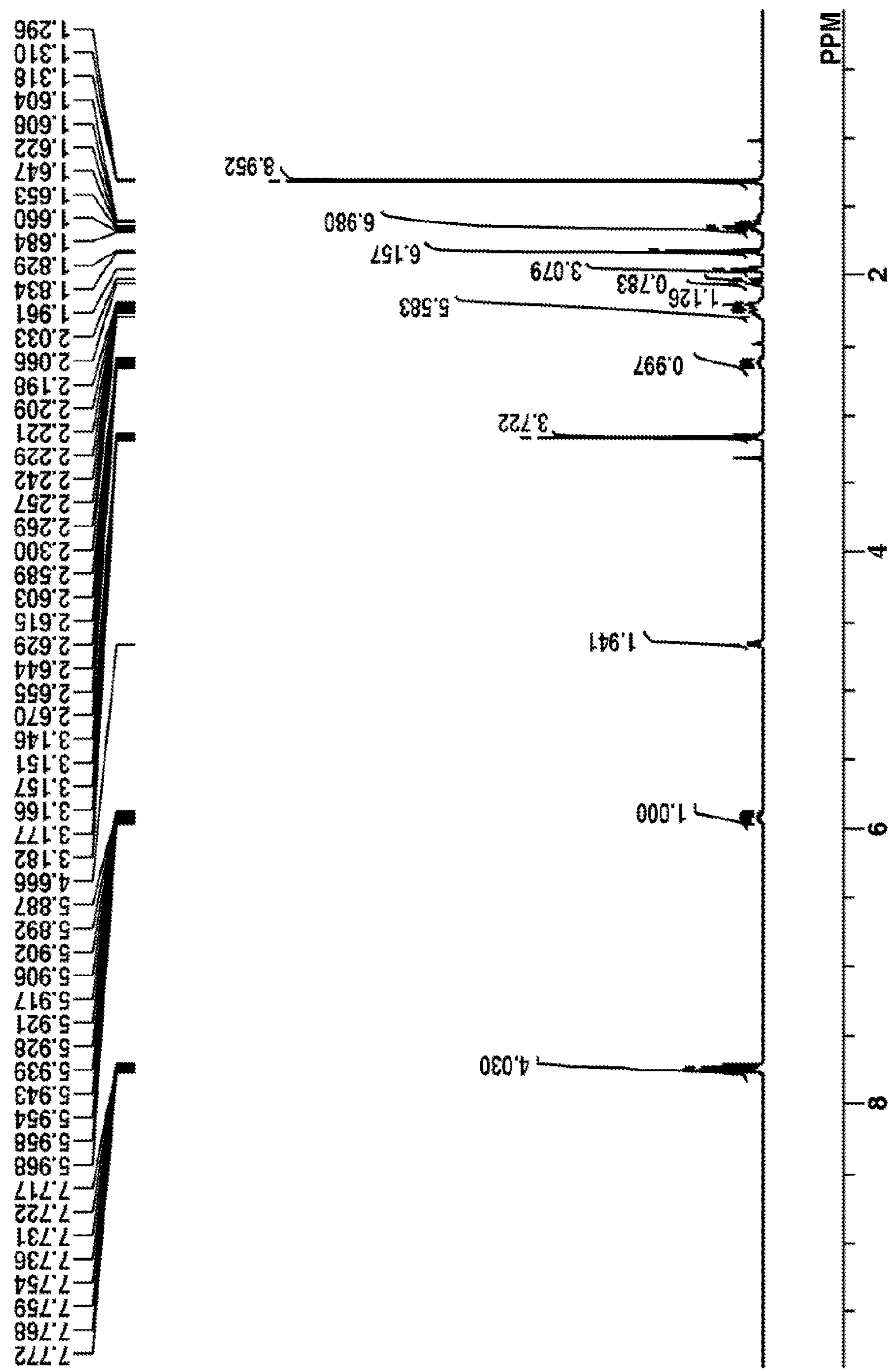
FIGS. 11 and 12 are diagrams showing the $^1$H-NMR/DMSO-$d_6$ and $^{19}$F-NMR/DMSO-$d_6$ spectra of PAG-6 in Example 1-6, respectively.
Figure 12:
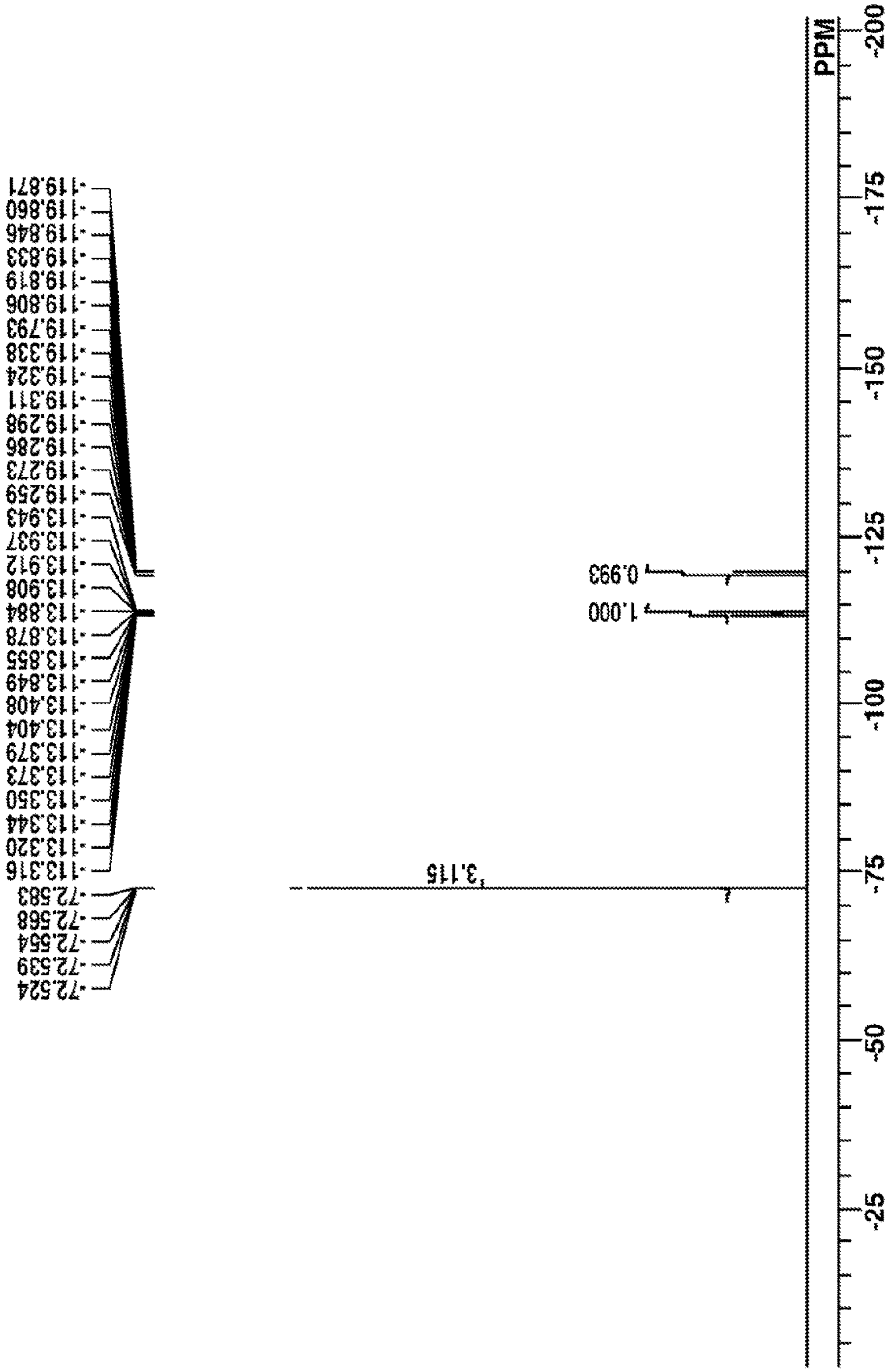

PAG-6 was analyzed by spectroscopy. The NMR spectra, $^1$H-NMR and $^{19}$F-NMR in DMSO-$d_6$ are shown in FIGS. 11 and 12. On $^1$H-NMR analysis, a minor amount of residual solvent (water) were observed.

IR (D-ATR): ν=2962, 2912, 2855, 1755, 1595, 1502, 1453, 1417, 1372, 1332, 1263, 1247, 1215, 1185, 1166, 1105, 1090, 1077, 1036 $cm^{-1}$

MALDI-TOF-MS: Positive $M^+$305 (corresponding to $C_{19}H_{29}O$—$S^+$)

Negative $M^-$ 391 (corresponding to $C_{14}H_{18}F_5O_2$—$SO_3^-$)

Example 1-7

Synthesis of PAG-7

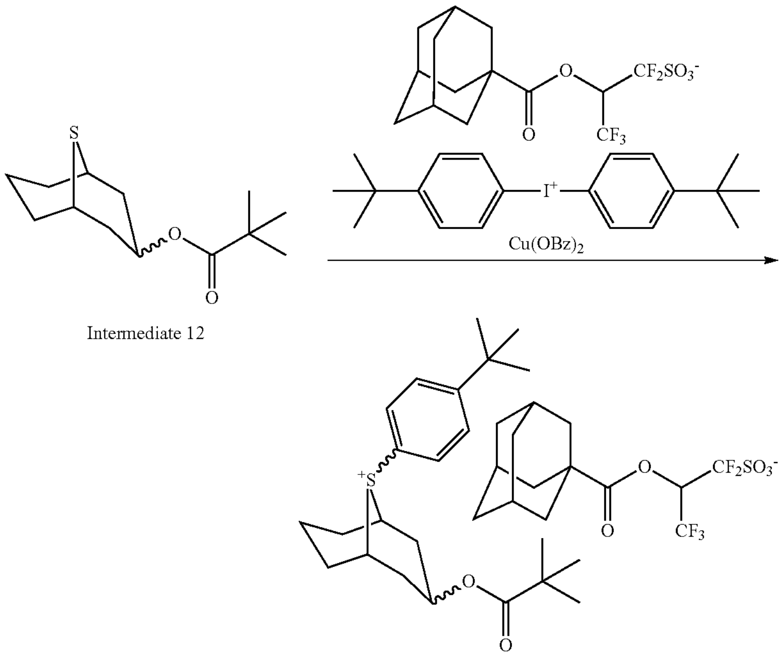

Intermediate 12

PAG-7

A mixture of 3.9 g of bis(4-tert-butylphenyl)iodonium 2-(adamantane-1-carbonyloxy)-1,1,3,3,3-pentafluoropropane-1-sulfonate, 1.5 g of Intermediate 12, 76 mg of copper (II) benzoate, and 20 g of chlorobenzene was stirred at 100° C. for 1 hour. The solution was concentrated by distilling off chlorobenzene under reduced pressure. The concentrate was recrystallized from MIBK/diisopropyl ether, obtaining 1.3 g of PAG-7 (yield 34%).

Figure 13:
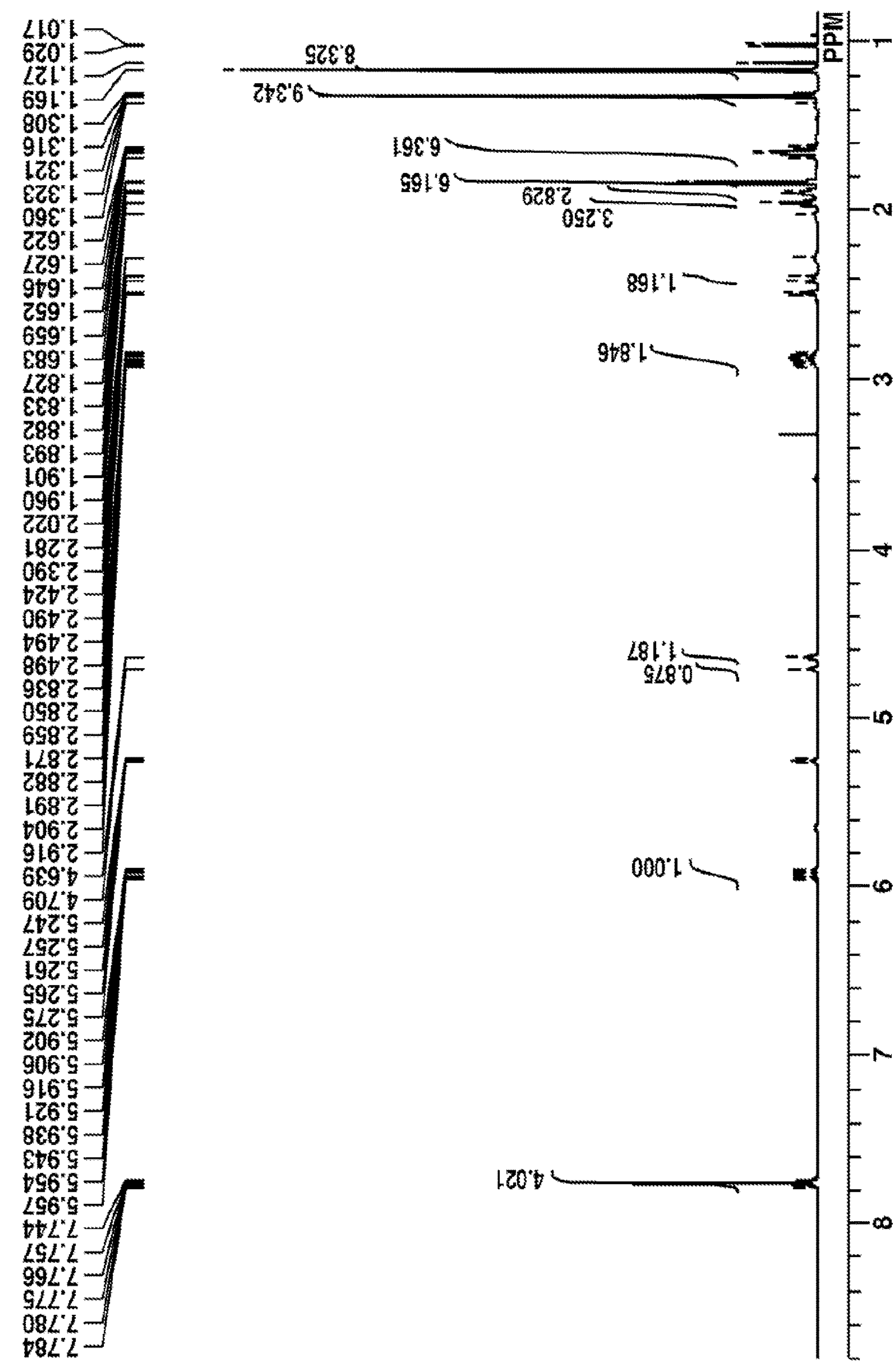
FIGS. 13 and 14 are diagrams showing the $^1$H-NMR/DMSO-$d_6$ and $^{19}$F-NMR/DMSO-$d_6$ spectra of PAG-7 in Example 1-7, respectively.
Figure 14:
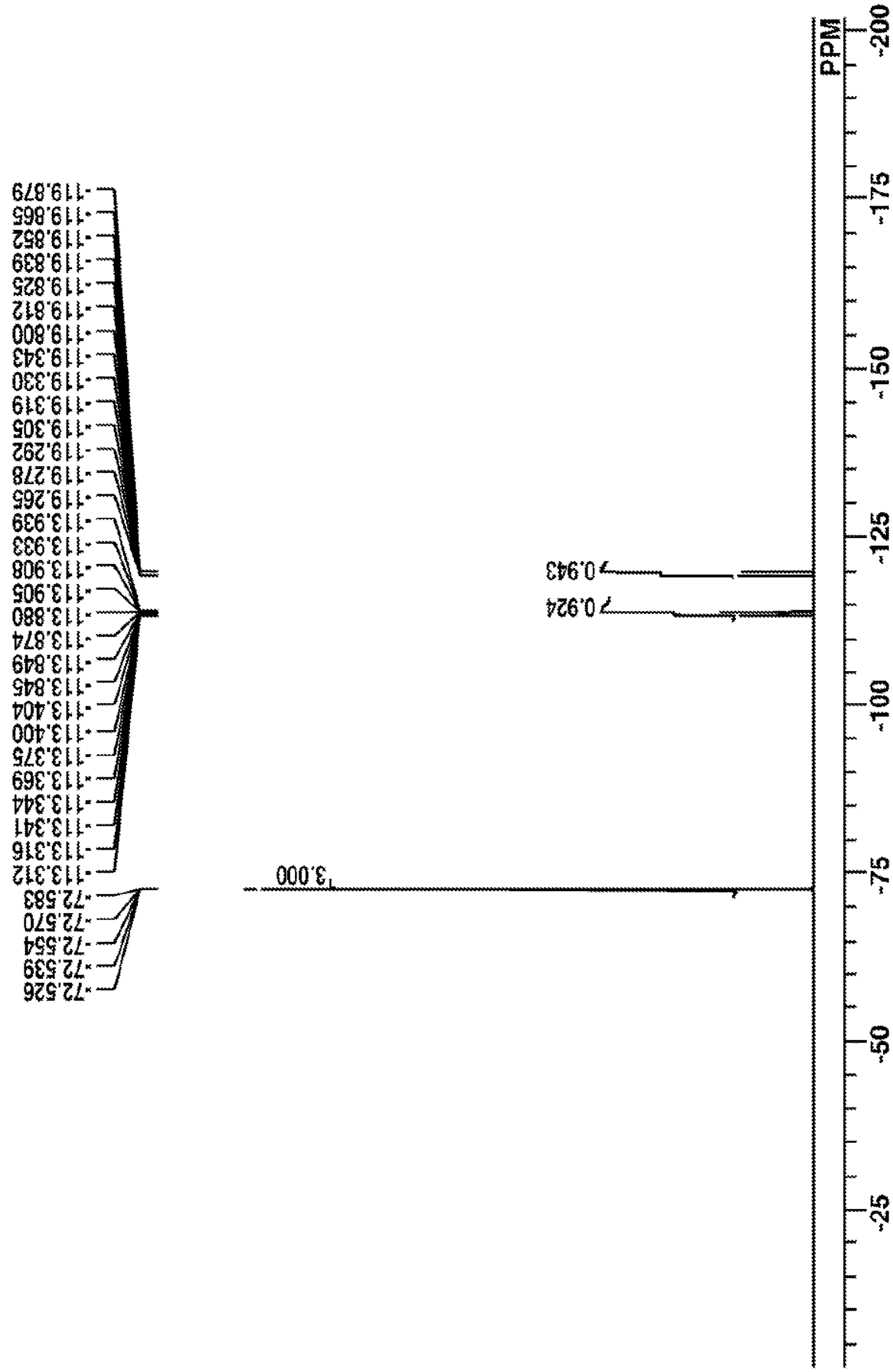

PAG-7 was analyzed by spectroscopy. The NMR spectra, $^{1}$H-NMR and $^{19}$F-NMR in DMSO-$d_6$ are shown in FIGS. 13 and 14. On $^{1}$H-NMR analysis, a minor amount of residual solvent (water) were observed.

IR (D-ATR): ν=2911, 2856, 1753, 1728, 1593, 1499, 1479, 1454, 1398, 1369, 1328, 1278, 1234, 1218, 1185, 1164, 1143, 1105, 1091, 1074, 1051, 1034, 1007 $cm^{-1}$

MALDI-TOF-MS: Positive $M^+$375 (corresponding to $C_{23}H_{35}O_2$—$S^+$)

Negative $M^-$ 391 (corresponding to $C_{14}H_{18}F_5O_2$—$SO_3^-$)

Example 1-8

Synthesis of PAG-8

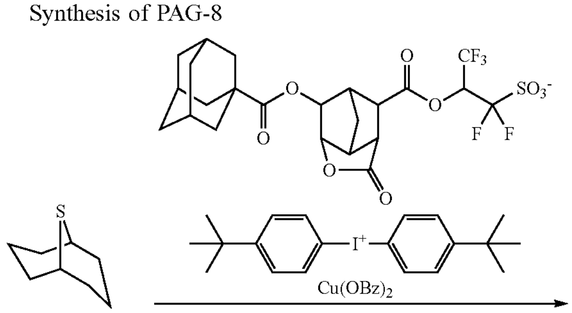

Intermediate 2

-continued

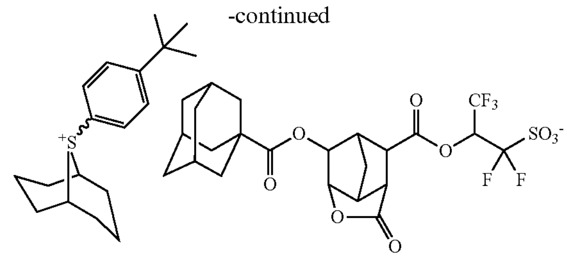

PAG-8

The procedure of Example 1-1 was repeated aside from using bis(4-tert-butylphenyl)iodonium 2-{(6-((adamantane-1-carbonyl)oxy)-2-oxohexahydro-2H-3,5-methanocyclopenta[b]furan-7-carbonyl)oxy}-1,1,3,3,3-pentafluoropropane-1-sulfonate instead of bis(4-tert-butylphenyl)iodonium 2-(adamantane-1-carbonyloxy)-1,1,3,3,3-pentafluoropropane-1-sulfonate. There was obtained 3.6 g of PAG-8 (yield 85%).

Example 1-9

Synthesis of PAG-9

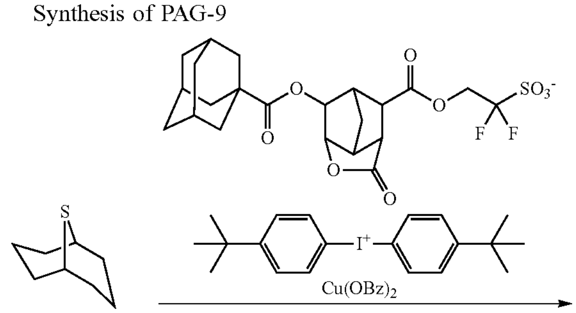

Intermediate 2

-continued

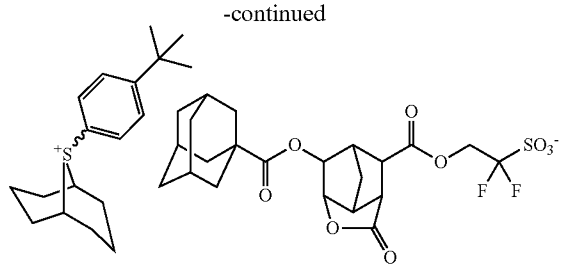

PAG-9

The procedure of Example 1-1 was repeated aside from using bis(4-tert-butylphenyl)iodonium 2-{(6-((adamantane-1-carbonyl)oxy)-2-oxohexahydro-2H-3,5-methanocyclopenta[b]furan-7-carbonyl)oxy}-1,1-difluoroethane-1-sulfonate instead of bis(4-tert-butylphenyl)iodonium 2-(adamantane-1-carbonyloxy)-1,1,3,3,3-pentafluoropropane-1-sulfonate. There was obtained 3.2 g of PAG-9 (yield 81%).

[2] Synthesis of Base Resins

Synthesis Example 2-1

Synthesis of Polymer P-1

A flask in nitrogen atmosphere was charged with 16 g of 1-isopropylcyclopentyl methacrylate, 5 g of 3-hydroxy-1-adamantyl methacrylate, 14 g of 2-oxotetrahydrofiuran-3-yl methacrylate, 6 g of 2-ethyldecahydro-1,4:5,8-dimethanonaphthalen-2-yl methacrylate, 0.47 g of dimethyl 2,2'-azobis (2-methylpropionate) (V-601 by Wako Pure Chemical Industries, Ltd.), 0.40 g of 2-mercaptoethanol, and 56 g of PGMEA to form a 1 to monomer/initiator solution. Another flask in nitrogen atmosphere was charged with 19 g of PGMEA, which was heated at 80° C. with stirring. With stirring, the monomer/initiator solution was added dropwise to the PGMEA over 4 hours. After the completion of dropwise addition, the polymerization solution was continuously stirred for 2 hours while maintaining the temperature of 80° C. The polymerization solution was cooled to room temperature, whereupon it was added dropwise to 640 g of methanol with vigorous stirring. The precipitate was collected by filtration, washed twice with 240 g of methanol, and vacuum dried at 50° C. for 20 hours, obtaining Polymer P-1 in white powder form (amount 34 g, yield 84%). On GPC analysis, the polymer had a Mw of 7,120 and a Mw/Mn of 1.74.

Polymer P-1

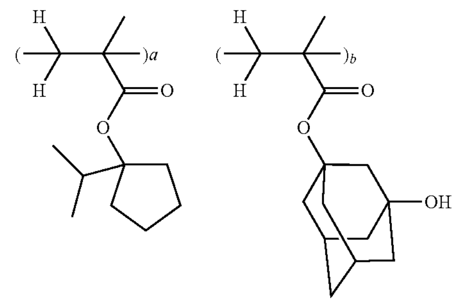

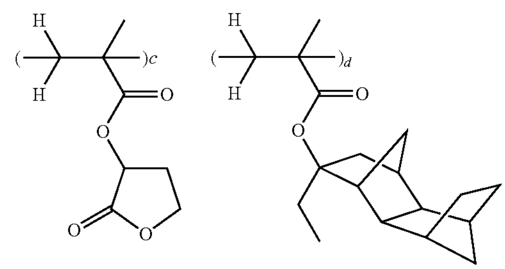

(a = 0.4, b = 0.1
c = 0.4; d = 0.1)

Synthesis Examples 2-2 to 2-9

Synthesis of Polymers P-2 to P-9

Polymers P-2 to P-9 were synthesized by the same procedure as in Synthesis Example 2-1 aside from changing the type and amount of monomers. Table 1 shows the proportion (in molar ratio) of units incorporated in these polymers. Table 2 shows the structure of recurring units.

TABLE 1

| Polymer | Unit 1 (molar ratio) | Unit 2 (molar ratio) | Unit 3 (molar ratio) | Unit 4 (molar ratio) | Units (molar ratio) | Unit 6 (molar ratio) | Mw | Mw/Mn |
|---|---|---|---|---|---|---|---|---|
| P-1 | M-1 (0.4) | M-2 (0.1) | M-3 (0.4) | M-5 (0.1) | — | — | 7,120 | 1.74 |
| P-2 | M-2 (0.1) | M-3 (0.4) | M-4 (0.5) | — | — | — | 7,642 | 1.64 |
| P-3 | M-2 (0.1) | M-3 (0.2) | M-5 (0.1) | M-6 (0.4) | M-7 (0.2) | — | 7,150 | 1.63 |
| P-4 | M-2 (0.1) | M-3 (0.4) | M-4 (0.35) | M-5 (0.15) | — | — | 8,297 | 1.79 |
| P-5 | M-2 (0.1) | M-3 (0.2) | M-4 (0.35) | M-5 (0.15) | M-8 (0.2) | — | 7,770 | 1.73 |
| P-6 | M-1 (0.35) | M-2 (0.1) | M-3 (0.4) | M-5 (0.15) | — | — | 7,915 | 1.80 |
| P-7 | M-2 (0.1) | M-3 (0.2) | M-4 (0.35) | M-5 (0.15) | M-9 (0.2) | — | 7,968 | 1.83 |
| P-8 | M-2 (0.1) | M-4 (0.35) | M-9 (0.4) | M-10 (0.15) | — | — | 8,532 | 1.69 |
| P-9 | M-1 (0.4) | M-2 (0.1) | M-3 (0.2) | M-5 (0.05) | M-8 (0.2) | M-10 (0.05) | 7,555 | 1.72 |

TABLE 2
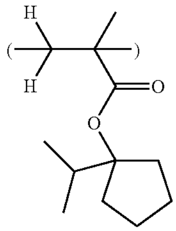
M-1
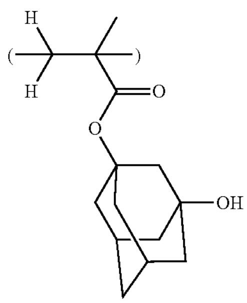
M-2
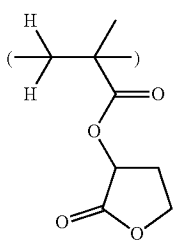
M-3
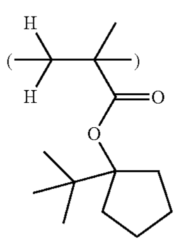
M-4
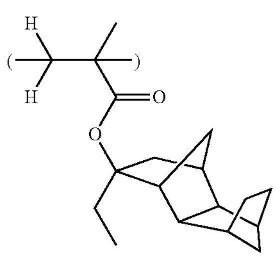
M-5
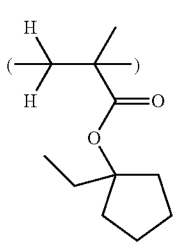
M-6
TABLE 2-continued
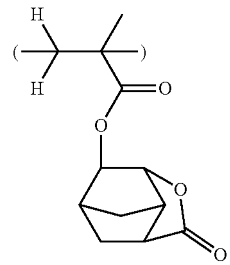
M-7
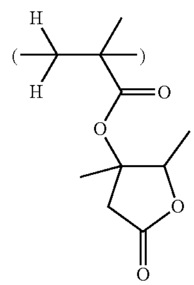
M-8
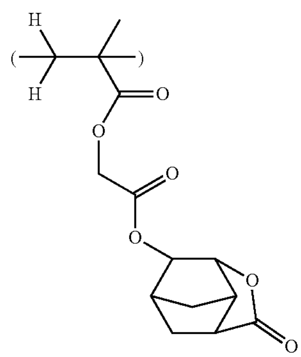
M-9
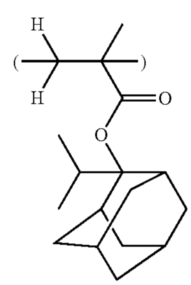
M-10
[3] Preparation of Resist Composition
Examples 2-1 to 2-24 and Comparative Examples 1-1 to 1-5
A resist composition was prepared by dissolving the components in accordance with the formulation of Table 3 and filtering through a Teflon® filter with a pore size of 0.2 μm.

TABLE 3

| | | Resist composition | Resin (pbw) | Photoacid generator (pbw) | Quencher (pbw) | Surfactant (pbw) | Alkali-soluble surfactant (pbw) | Solvent (pbw) |
|---|---|---|---|---|---|---|---|---|
| Example | 2-1 | R-1 | P-1 (80) | PAG-1 (9) | Q-4 (2) | F-1 (0.128) | A-1 (3) | PGMEA (1,876)<br>GBL (336) |
| | 2-2 | R-2 | P-1 (80) | PAG-2 (9) | Q-4 (2) | F-1 (0.128) | A-1 (3) | PGMEA (1,876)<br>GBL (336) |
| | 2-3 | R-3 | P-1 (80) | PAG-3 (9) | Q-4 (2) | F-1 (0.128) | A-1 (3) | PGMEA (1,876)<br>GBL (336) |
| | 2-4 | R-4 | P-1 (80) | PAG-4 (9) | Q-4 (2) | F-1 (0.128) | A-1 (3) | PGMEA (1,876)<br>GBL (336) |
| | 2-5 | R-5 | P-1 (80) | PAG-5 (9) | Q-4 (2) | F-1 (0.128) | A-1 (3) | PGMEA (1,876)<br>GBL (336) |
| | 2-6 | R-6 | P-1 (80) | PAG-6 (9) | Q-4 (2) | F-1 (0.128) | A-1 (3) | PGMEA (1,876)<br>GBL (336) |
| | 2-7 | R-7 | P-1 (80) | PAG-7 (9) | Q-4 (2) | F-1 (0.128) | A-1 (3) | PGMEA (1,876)<br>GBL (336) |
| | 2-8 | R-8 | P-2 (80) | PAG-1 (10) | Q-1 (0.5)<br>Q-2 (3.5) | F-1 (0.128) | A-1 (3) | PGMEA (1,876)<br>GBL (336) |
| | 2-9 | R-9 | P-3 (80) | PAG-8 (10) | Q-3 (3.5) | F-1 (0.128) | A-1 (3) | PGMEA (1,876)<br>GBL (336) |
| | 2-10 | R-10 | P-4 (80) | PAG-9 (10) | Q-4 (3.5) | F-1 (0.128) | A-1 (3) | PGMEA (1,876)<br>GBL (336) |
| | 2-11 | R-11 | P-5 (80) | PAG-9 (10) | Q-4 (3.5) | F-1 (0.128) | A-1 (3) | PGMEA (1,876)<br>GBL (336) |
| | 2-12 | R-12 | P-6 (80) | PAG-9 (10) | Q-4 (3.5) | F-1 (0.128) | A-1 (3) | PGMEA (1,876)<br>GBL (336) |
| | 2-13 | R-13 | P-7 (80) | PAG-9 (10) | Q-4 (3.5) | F-1 (0.128) | A-1 (3) | PGMEA (1,876)<br>GBL (336) |
| | 2-14 | R-14 | P-8 (80) | PAG-1 (10) | Q-4 (3.5) | F-1 (0.128) | A-2 (3) | PGMEA (1,876)<br>GBL (336) |
| | 2-15 | R-15 | P-9 (80) | PAG-9 (10) | Q-4 (3.5) | F-1 (0.128) | A-2 (3) | PGMEA (1,876)<br>GBL (336) |
| | 2-16 | R-16 | P-1 (80) | PAG-1 (10)<br>PAG-12 (8) | Q-6 (5) | F-1 (0.128) | A-3 (3) | PGMEA (1,876)<br>GBL (336) |
| | 2-17 | R-17 | P-3 (80) | PAG-1 (10)<br>PAG-12 (8) | Q-6 (5) | F-1 (0.128) | A-3 (3) | PGMEA (1,876)<br>GBL (336) |
| | 2-18 | R-18 | P-9 (80) | PAG-1 (10)<br>PAG-12 (8) | Q-6 (5) | F-1 (0.128) | A-3 (3) | PGMEA (1,876)<br>GBL (336) |
| | 2-19 | R-19 | P-5 (80) | PAG-1 (10)<br>PAG-10 (3) | Q-4 (3.5) | F-1 (0.128) | A-1 (3) | PGMEA (1,876)<br>GBL (336) |
| | 2-20 | R-20 | P-5 (80) | PAG-8 (10)<br>PAG-10 (3) | Q-1 (0.5)<br>Q-4 (3.5) | F-1 (0.128) | A-1 (3) | PGMEA (1,876)<br>GBL (336) |
| | 2-21 | R-21 | P-5 (80) | PAG-9 (10)<br>PAG-10 (3) | Q-4 (3.5) | F-1 (0.128) | A-1 (3) | PGMEA (1,876)<br>GBL (336) |
| | 2-22 | R-22 | P-8 (80) | PAG-1 (15) | Q-4 (3.5) | F-1 (0.128) | A-1 (3) | PGMEA (1,876)<br>GBL (336) |
| | 2-23 | R-23 | P-8 (80) | PAG-1 (11)<br>PAG-10 (3) | Q-5 (3.5) | F-1 (0.128) | A-1 (3) | PGMEA (1,876)<br>GBL (336) |
| | 2-24 | R-24 | P-8 (80) | PAG-9 (15) | Q-5 (3.5) | F-1 (0.128) | A-2 (3) | PGMEA (1,876)<br>GBL (336) |
| Comparative Example | 1-1 | R-25 | P-1 (80) | PAG-11 (8) | Q-4 (2) | F-1 (0.128) | A-1 (3) | PGMEA (1,876)<br>GBL (336) |
| | 1-2 | R-26 | P-1 (80) | PAG-10 (8) | Q-4 (2) | F-1 (0.128) | A-1 (3) | PGMEA (1,876)<br>GBL (336) |
| | 1-3 | R-27 | P-9 (80) | PAG-11 (10)<br>PAG-12 (8) | Q-6 (5) | F-1 (0.128) | A-3 (3) | PGMEA (1,876)<br>GBL (336) |
| | 1-4 | R-28 | P-1 (80) | PAG-13 (10)<br>PAG-12 (8) | Q-6 (5) | F-1 (0.128) | A-3 (3) | PGMEA (1,876)<br>GBL (336) |
| | 1-5 | R-29 | P-1 (80) | PAG-14 (10)<br>PAG-12 (8) | Q-6 (5) | F-1 (0.128) | A-3 (3) | PGMEA (1,876)<br>GBL (336) |

In Table 3, PGMEA stands for propylene glycol monomethyl ether acetate, and GBL for γ-butyrolactone.

In Table 3, photoacid generators PAG-1 to PAG-9 are as synthesized above. The photoacid generators PAG-10 to PAG-14, quenchers Q-1 to Q-6, surfactant F-1, and alkali-soluble surfactants A-1 to A-3 are identified below.

Photoacid Generators PAG-10 to PAG-14
PAG-10
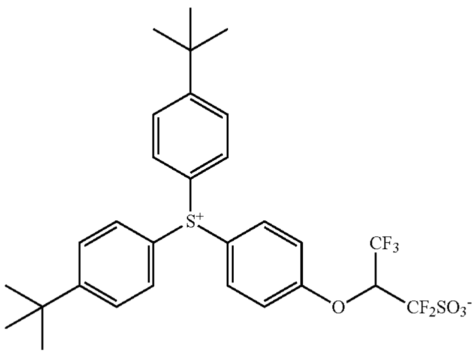
PAG-11
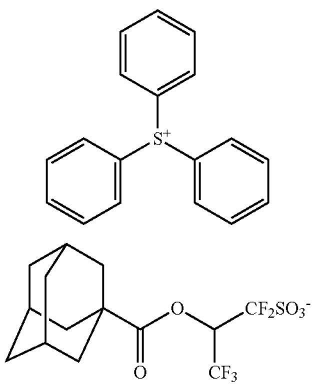
PAG-12
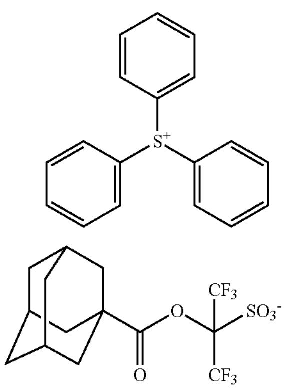
PAG-13
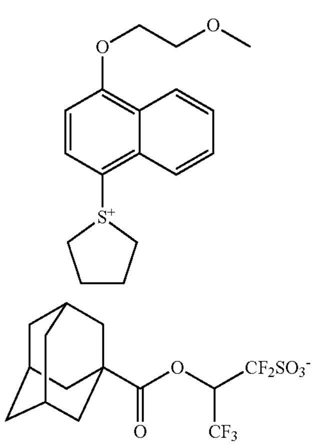
-continued
PAG-14
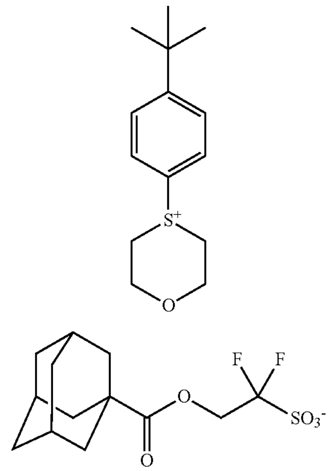
Quenchers Q-1 to Q-6
Q-1
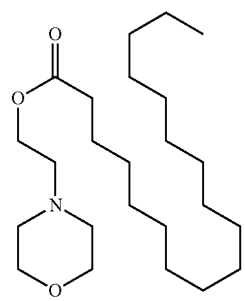
Q-2
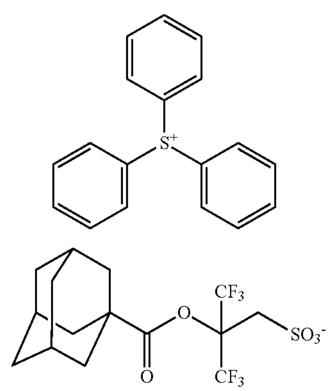
Q-3
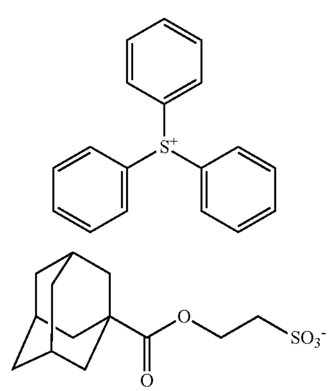

-continued
Q-4
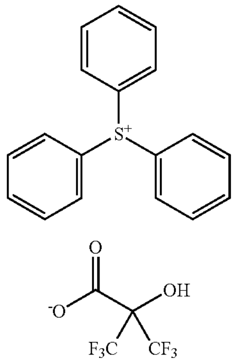
Q-5
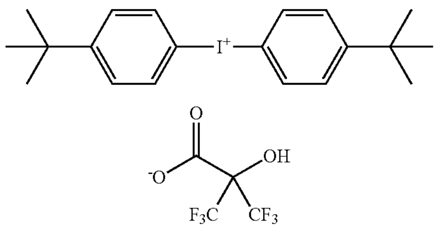
Q-6
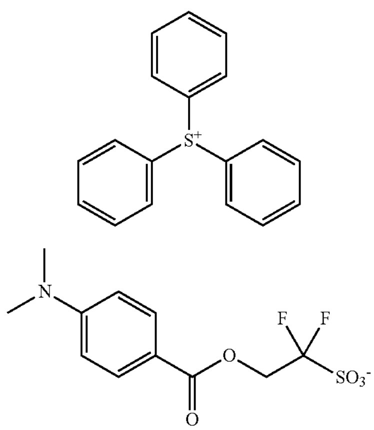
Surfactant F-1
F-1
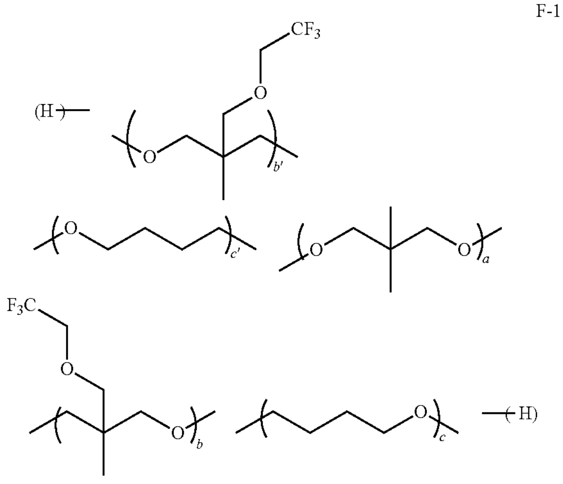
a:(b+b'):(c+c')=1:4-7:0.01-1 (molar ratio)
Mw=1,500
Alkali-Soluble Surfactants A-1 to A-3
These surfactants are polymers having a Mw of 8,000-12,000 and a Mw/Mn of 1.4-1.6.
A-1
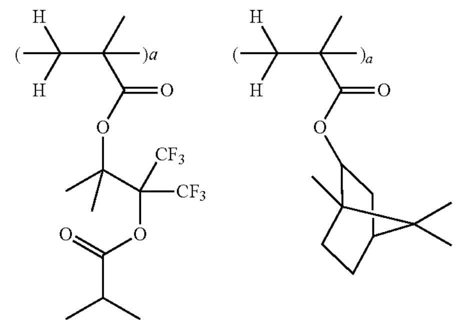
(a = 0.6, b = 0.4)
A-2
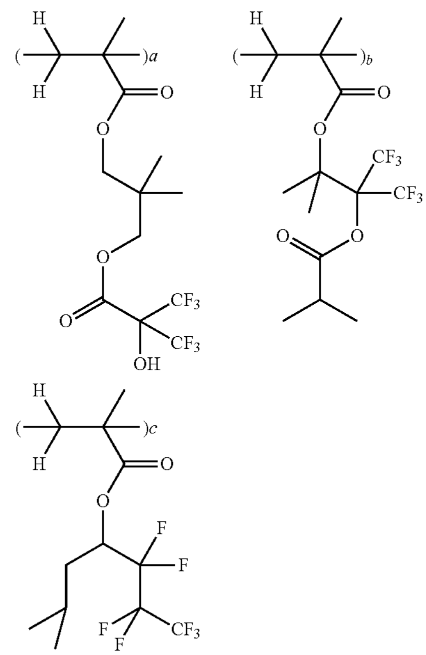
(a = 0.2, b = 0.4, c = 0.4)
A-3
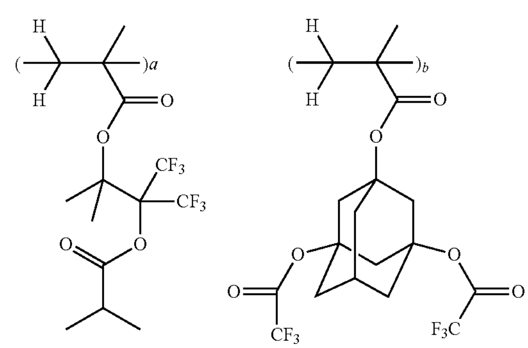
(a = 0.6, b = 0.4)

[4] Evaluation of Resist Composition: ArF Lithography Patterning Test 1

Examples 3-1 to 3-11 and Comparative Examples 2-1 to 2-4

On a silicon substrate, an antireflective coating solution (ARC-29A, Nissan Chemical Industries, Ltd.) was coated and baked at 200° C. for 60 seconds to form an ARC of 95 nm thick. Each of the resist compositions R-1 to R-8, R-16 to R-18, R-25, R-27 to R-29 (in Table 3) was spin coated on the silicon substrate and baked on a hot plate at 100° C. for 60 seconds, forming a resist film of 100 nm thick on the ARC. The wafer was exposed on an ArF excimer laser immersion lithography scanner (NSR—S610C by Nikon Corp., NA 1.30, 1 to dipole illumination) through a Cr mask having a line-and-space pattern with a line width of 40 nm and a pitch of 80 nm (on-wafer size), while varying the exposure dose and focus at a dose pitch of 1 mJ/cm$^2$ and a focus pitch of 0.025 μm. The immersion liquid used herein was water. After exposure, the resist film was baked (PEB) at the temperature shown in Table 4 for 60 seconds. The resist film was puddle developed in a 2.38 wt % tetramethylammonium hydroxide (TMAH) aqueous solution for 30 seconds, rinsed with deionized water and spin dried, forming a positive pattern. The L/S pattern after development was observed under CD-SEM (CG4000 by Hitachi High-Technologies Corp.), whereupon sensitivity, exposure latitude, MEF, LWR, and profile were evaluated by the following methods. The results are shown in Table 4.

Evaluation of Sensitivity

The optimum exposure dose Eop (mJ/cm$^2$) which provided an L/S pattern having a line width of 40 nm and a pitch of 80 nm was determined as an index of sensitivity.

Evaluation of Exposure Latitude (EL)

The exposure dose which provided an L/S pattern with a space width of 40 nm±10% (i.e., 36 nm to 44 nm) in ArF lithography patterning test 1 was determined. EL (%) is calculated from the exposure doses according to the following equation:

$$EL\ (\%)=(|E1-E2|/Eop)\times 100$$

wherein E1 is an optimum exposure dose which provides an L/S pattern with a line width of 36 nm and a pitch of 80 nm, E2 is an optimum exposure dose which provides an US pattern with a line width of 44 urn and a pitch of 80 nm, and Eop is an optimum exposure dose which provides an L/S pattern with a line width of 40 nm and a pitch of 80 nm.

Evaluation of Mask Error Factor (MEF)

An US pattern was formed by exposure in the optimum dose Eop through the mask with the pitch fixed and the line width varied. MEF was calculated from the mask line 1 to width and a variation of the pattern line width according to the following equation:

$$MEF=(\text{pattern line width})/(\text{mask line width})-b$$

wherein b is a constant. A value closer to unity (1) indicates better performance.

Evaluation of Line Width Roughness (LWR)

An US pattern was formed by exposure in the optimum dose Eop. The line width was measured at longitudinally spaced apart 10 points, from which a 3-fold value (3σ) of standard deviation (a) was determined and reported as LWR. A smaller value of 30 indicates a pattern having a lower roughness and more uniform line width.

Evaluation of Profile

A cross section of the US pattern printed at the optimum dose Eop was observed under SEM (S-4800 by Hitachi High Technologies Corp.). A resist film providing a line pattern of substantially rectangular profile is evaluated good. A resist film providing a pattern of rounded profile or T-top profile, i.e., a pattern with overhanging top is evaluated NG.

TABLE 4

| | | Resist composition | PEB temp. (° C.) | Eop (mJ/cm$^2$) | EL (%) | MEF | LWR (nm) | Profile |
|---|---|---|---|---|---|---|---|---|
| Example | 3-1 | R-1 | 95 | 28 | 25 | 2.1 | 2.1 | good |
| | 3-2 | R-2 | 95 | 28 | 23 | 2 | 2.3 | good |
| | 3-3 | R-3 | 95 | 30 | 22 | 1.9 | 2.2 | good |
| | 3-4 | R-4 | 95 | 31 | 24 | 2.2 | 2.2 | good |
| | 3-5 | R-5 | 95 | 33 | 23 | 2.1 | 2.1 | good |
| | 3-6 | R-6 | 95 | 32 | 22 | 2 | 2.3 | good |
| | 3-7 | R-7 | 95 | 31 | 21 | 2.1 | 2.2 | good |
| | 3-8 | R-8 | 100 | 33 | 23 | 2 | 2.1 | good |
| | 3-9 | R-16 | 100 | 30 | 26 | 1.8 | 1.9 | good |
| | 3-10 | R-17 | 100 | 34 | 27 | 1.7 | 1.8 | good |
| | 3-11 | R-18 | 95 | 35 | 27 | 1.9 | 1.9 | good |
| Comparative Example | 2-1 | R-25 | 95 | 31 | 17 | 2.6 | 2.6 | NG (tapered) |
| | 2-2 | R-27 | 95 | 31 | 15 | 2.7 | 2.8 | NG (tapered) |
| | 2-3 | R-28 | 100 | 38 | 20 | 2.1 | 1.9 | good |
| | 2-4 | R-29 | 100 | 39 | 24 | 2 | 2.2 | good |

[5] Evaluation of Resist Composition: ArF Lithography Patterning Test 2

Examples 4-1 to 4-20 and Comparative Examples 3-1 to 3-2

On a substrate, a spin-on carbon film ODL-180 (Shin-Etsu Chemical Co., Ltd.) having a carbon content of 80 wt % was deposited to a thickness of 180 nm and a silicon-containing spin-on hard mask SHB-A940 having a silicon content of 43 wt % was deposited thereon to a thickness of 35 nm. On this substrate for trilayer process, each of the resist compositions R-1 to R-14, R-19 to R-26 was spin coated, then baked on a hot plate at 100° C. for 60 seconds to form a resist film of 100 nm thick.

Using an ArF excimer laser immersion lithography scanner NSR—S610C (Nikon Corp., NA 1.30, σ 0.90/0.72, cross-pole opening 35 deg., cross-pole illumination, azimuthally polarized illumination), exposure was performed through a 6% halftone phase shift mask bearing a contact hole (CH) pattern with a hole size of 45 nm and a pitch of 110 nm (on-wafer size) while varying the dose and focus (dose pitch: 1 mJ/cm$^2$, focus pitch: 0.025 μm). The immersion liquid used herein was water. After the exposure, the wafer was baked (PEB) at the temperature shown in Table 5 for 60 seconds. Thereafter, the resist film was puddle developed in n-butyl acetate for 30 seconds, rinsed with 4-methyl-2-pentanol, and spin dried, obtaining a negative pattern. The CH pattern after development was observed under CD-SEM CG4000 (Hitachi High Technologies Corp.) whereupon sensitivity, MEF, CDU, and DOF were evaluated by the following methods. The results are shown in Table 5.

Evaluation of Sensitivity

The optimum dose Eop (mJ/cm$^2$) which provided a CH pattern with a hole size of 45 nm and a pitch of 110 nm in ArF lithography patterning test 2 was determined as an index of sensitivity. A smaller dose value indicates a higher sensitivity.

Evaluation of Mask Error Factor (MEF)

A CH pattern was formed by exposure at the optimum dose Eop by ArF lithography patterning test 2 with the pitch fixed and the mask size varied. MEF was calculated from the mask size and a variation of the CH pattern size according to the following equation:

$$MEF=(\text{pattern size})/(\text{mask size})-b$$

wherein b is a constant. A value closer to unity (1) indicates better performance.

Evaluation of Critical Dimension Uniformity (CDU)

For the CH pattern formed by exposure at the optimum dose in ArF lithography patterning test 2, the hole size was measured at 10 areas subject to an identical dose of shot (9 contact holes per area), from which a 3-fold value (30) of standard deviation (0) was determined and reported as CDU. A smaller value of 30 indicates a CH pattern having improved CDU.

Evaluation of Depth of Focus (DOP)

As an index of DOP, a range of focus which provided a CH pattern with a size of 45 nm±10% (i.e., 41 to 49 nm) in ArF lithography patterning test 2 was determined. A greater value indicates a wider DOP.

TABLE 5

| | | Resist composition | PEB temp (° C.) | Eop (mJ/cm$^2$) | MEF | CDU (nm) | DOF (nm) |
|---|---|---|---|---|---|---|---|
| Example | 4-1 | R-1 | 90 | 31 | 3.3 | 3.5 | 180 |
| | 4-2 | R-2 | 90 | 30 | 3.4 | 3.3 | 150 |
| | 4-3 | R-3 | 90 | 33 | 3.6 | 3.2 | 190 |
| | 4-4 | R-4 | 90 | 34 | 3.1 | 3.5 | 160 |
| | 4-5 | R-5 | 90 | 29 | 3.1 | 3.1 | 160 |
| | 4-6 | R-6 | 90 | 30 | 3 | 3.5 | 170 |
| | 4-7 | R-7 | 90 | 31 | 3.2 | 3.2 | 180 |
| | 4-8 | R-8 | 90 | 33 | 3.4 | 3.6 | 160 |
| | 4-9 | R-9 | 95 | 32 | 3.3 | 3.1 | 200 |
| | 4-10 | R-10 | 95 | 35 | 3 | 3.7 | 180 |
| | 4-11 | R-11 | 95 | 36 | 2.8 | 3.2 | 190 |
| | 4-12 | R-12 | 95 | 37 | 2.9 | 3.3 | 200 |
| | 4-13 | R-13 | 95 | 36 | 3 | 3.3 | 200 |
| | 4-14 | R-14 | 80 | 45 | 3.2 | 3.3 | 190 |
| | 4-15 | R-19 | 90 | 35 | 3.5 | 3.1 | 200 |
| | 4-16 | R-20 | 90 | 33 | 3.2 | 3.5 | 220 |
| | 4-17 | R-21 | 80 | 31 | 3.3 | 3.5 | 210 |
| | 4-18 | R-22 | 80 | 42 | 3.1 | 3 | 200 |
| | 4-19 | R-23 | 80 | 40 | 2.9 | 3.2 | 220 |
| | 4-20 | R-24 | 80 | 44 | 3 | 3.1 | 230 |
| Comparative | 3-1 | R-25 | 95 | 26 | 3.8 | 4.2 | 90 |
| Example | 3-2 | R-26 | 95 | 28 | 3.9 | 4.3 | 100 |

As is evident from Tables 4 and 5, the resist compositions within the scope of the invention are improved in MEF and LWR without a concomitant drop of sensitivity, suggesting that the resist compositions are useful in the organic solvent development process.

Japanese Patent Application No. 2018-079867 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photoacid generator comprising a compound having the formula (1a):

(1a)

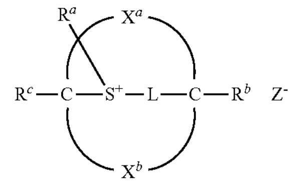

wherein $X^a$ and $X^b$ are each independently a $C_1$-$C_{30}$ divalent hydrocarbon group which may contain a heteroatom, L is a single bond or a $C_1$-$C_{30}$ divalent hydrocarbon group which may contain a heteroatom, $R^a$ is a $C_1$-$C_{30}$ monovalent hydrocarbon group which may contain a heteroatom hydroxyl, nitro, amino, cyano, haloalkyl radical, ether bond, sulfide bond, carbonyl radical, ester bond, amide bond, imino bond, sulfonyl radical, sulfinyl radical, sulfonic acid ester bond, sulfonamide bond, carbonate bond, carbamate bond, or carboxylic anhydride (C(=O)—O—C(=O)—), $R^b$ and $R^c$ are each independently hydrogen or a $C_1$-$C_{30}$ monovalent hydrocarbon group which may contain a heteroatom, $R^b$ and $R^c$ may bond together to form a ring, one or both of $R^b$ and $R^c$ may bond with some carbon atoms or heteroatoms in $X^a$ or $X^b$ to form a ring, and $Z^-$ is an organic anion.

2. The photoacid generator of claim 1 comprising a compound having the formula (1b):

(Ib)

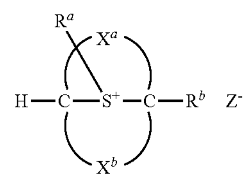

wherein $X^a$, $X^b$, $R^a$, $R^b$, and $Z^-$ are as defined above.

3. The photoacid generator of claim 1 wherein the cation moiety of the compound having formula (1a) is selected from the group consisting of the following formulae:

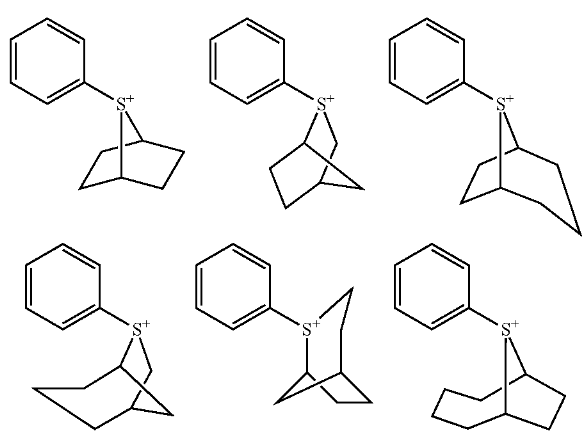

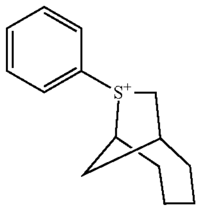
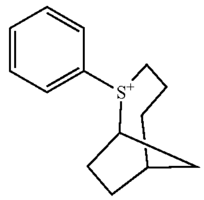
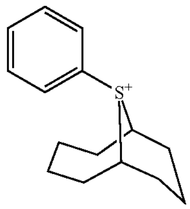
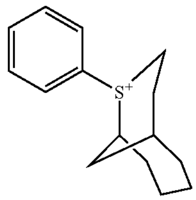
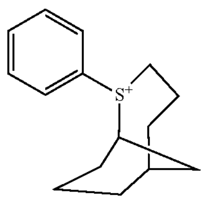
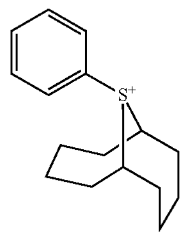
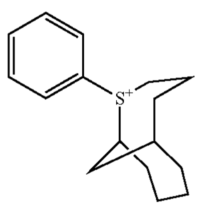
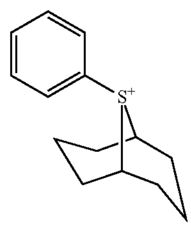
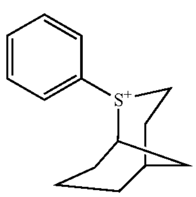
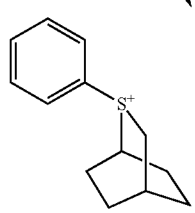
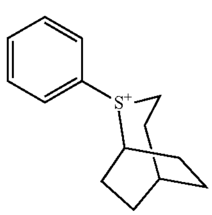
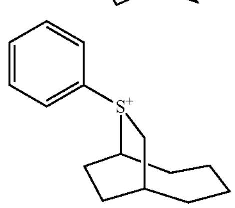
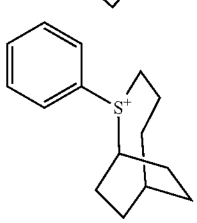
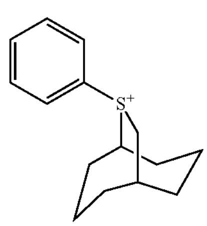
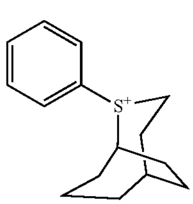
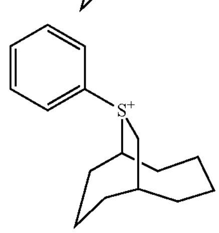
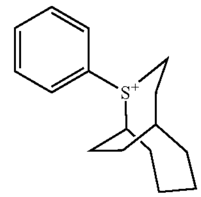
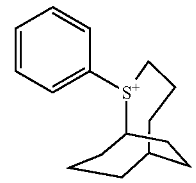
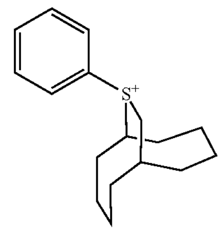
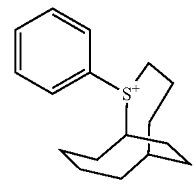
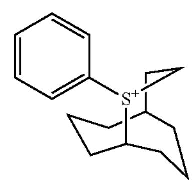
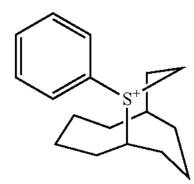
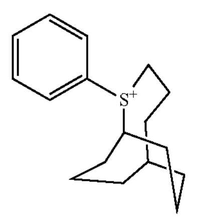
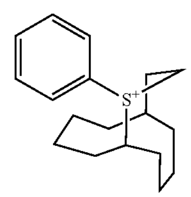
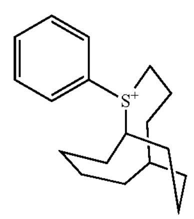
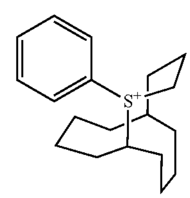
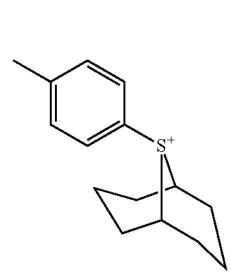
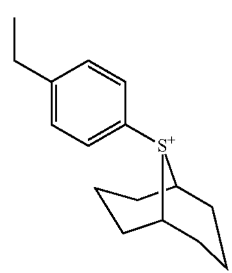
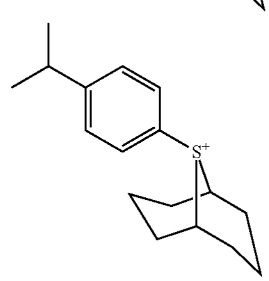
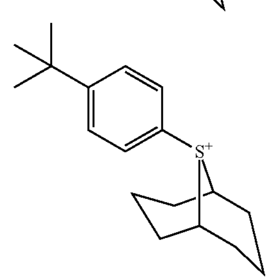

-continued
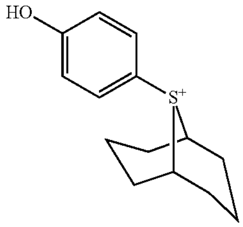
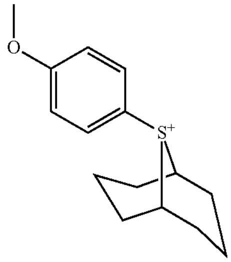
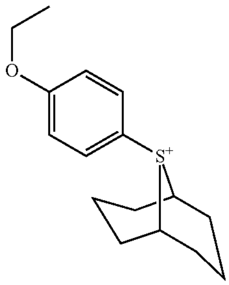
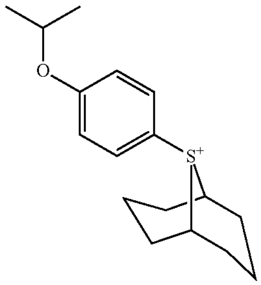
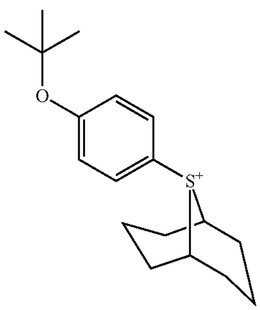
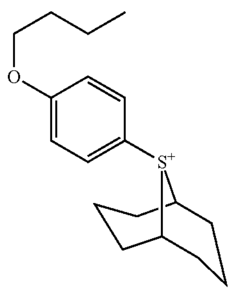
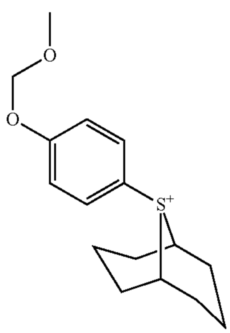
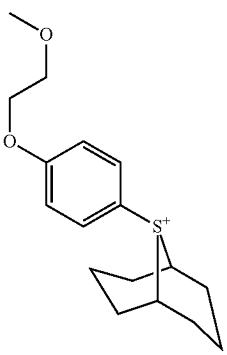
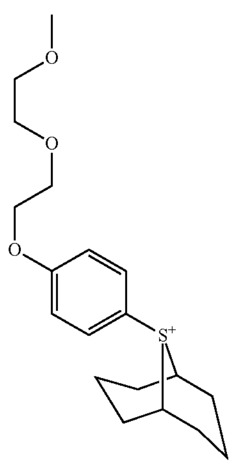
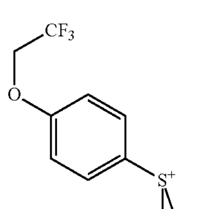
-continued
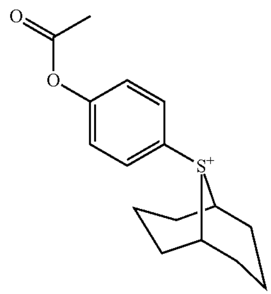
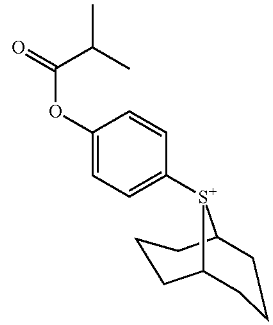
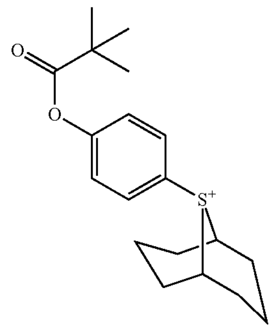
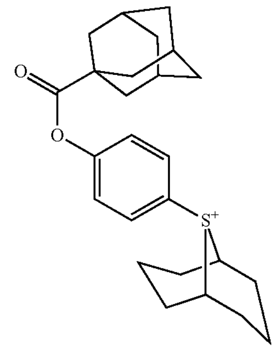
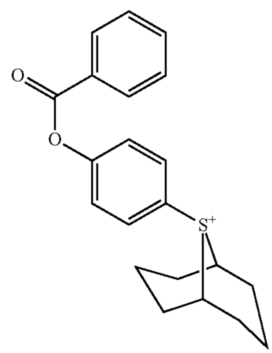
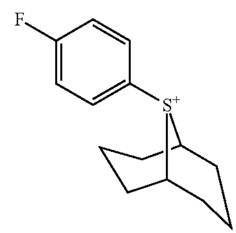
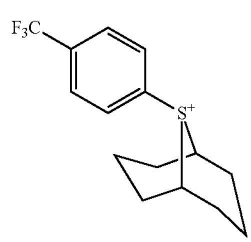
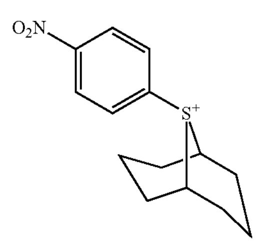
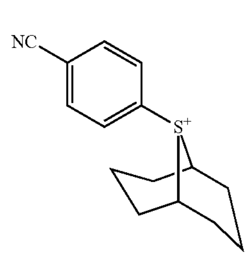
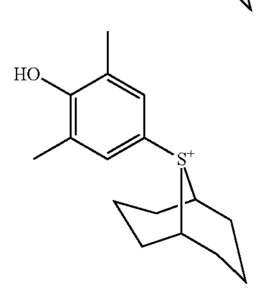

-continued
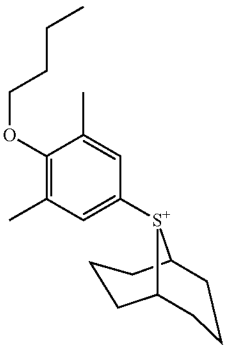
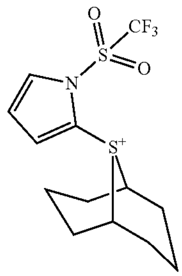
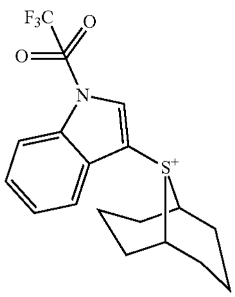
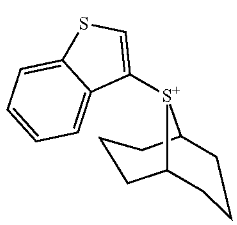
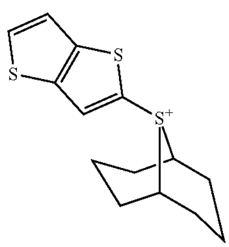
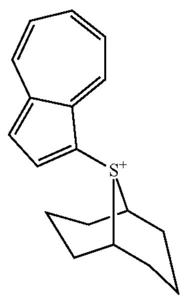
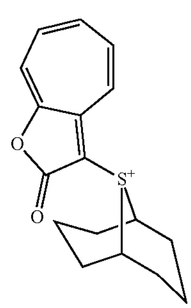
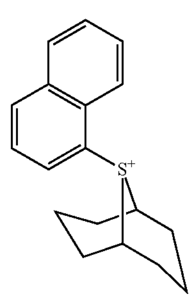
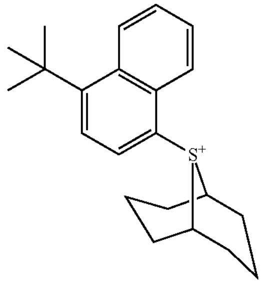
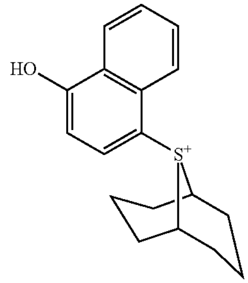
-continued
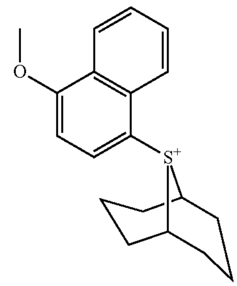
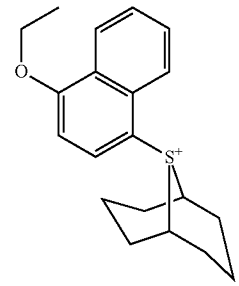
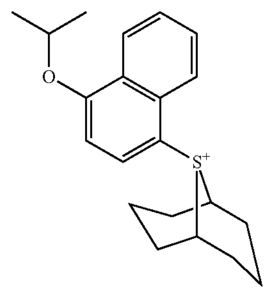
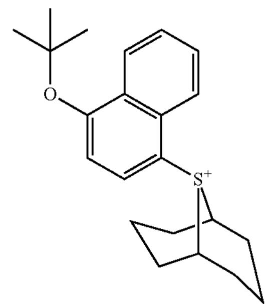
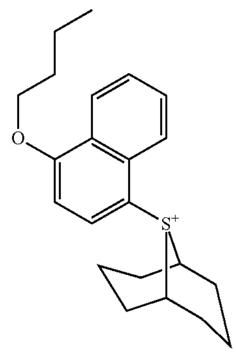
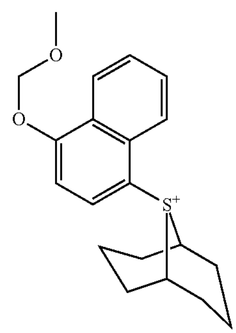
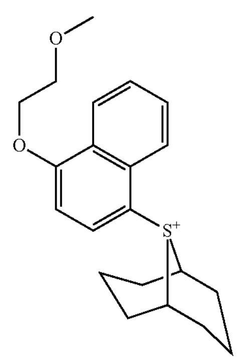
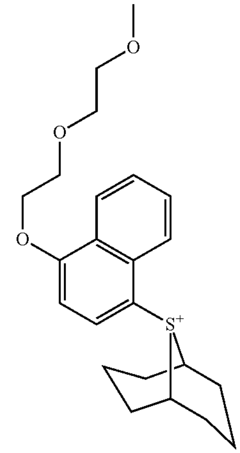
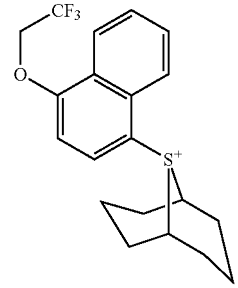
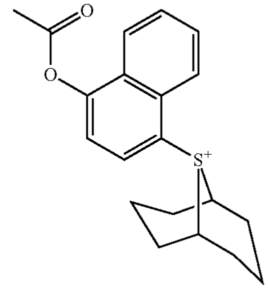

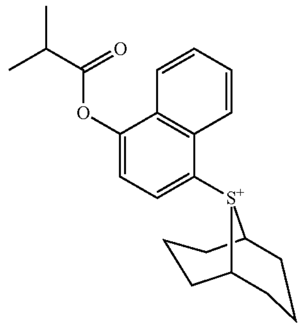
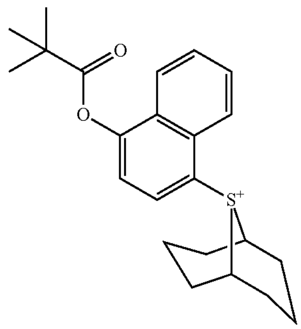
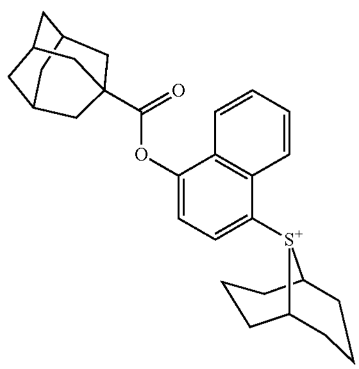
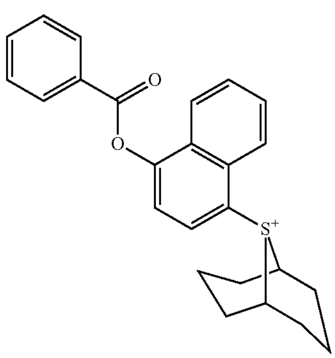
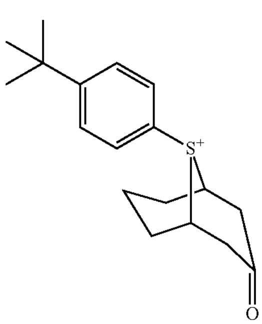
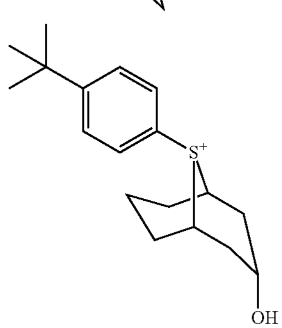
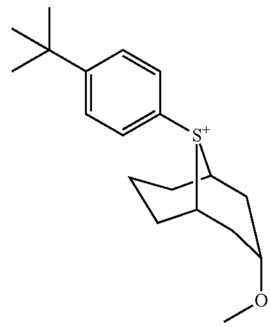
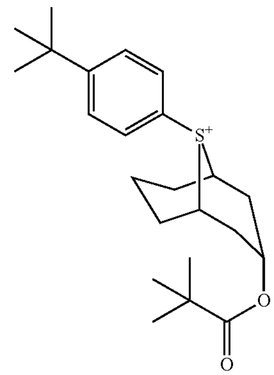
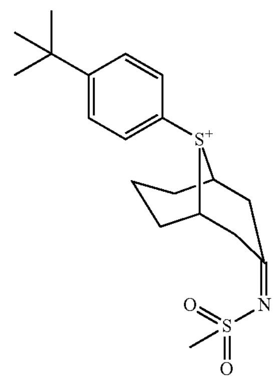
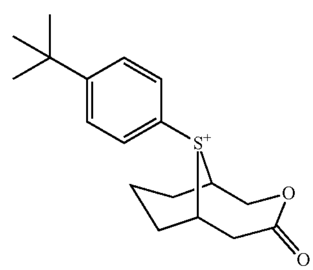
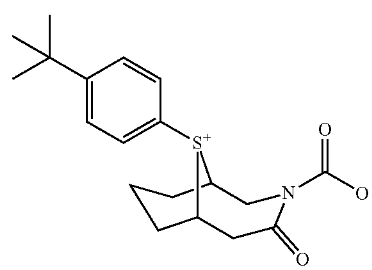
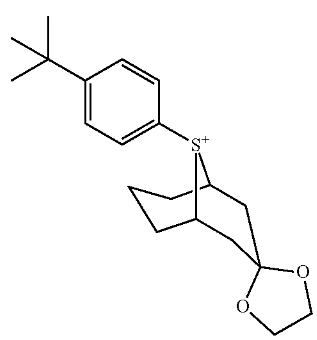

-continued
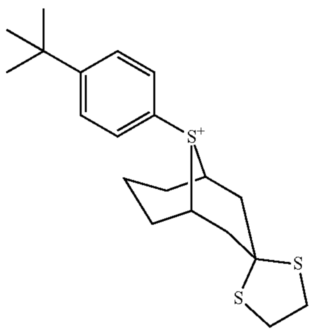
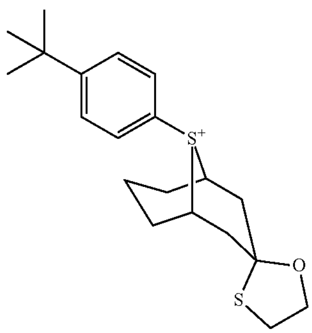
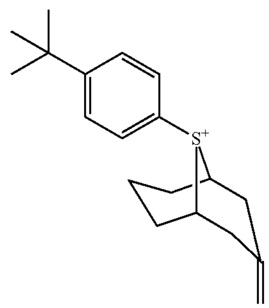
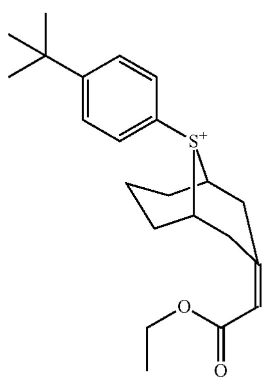
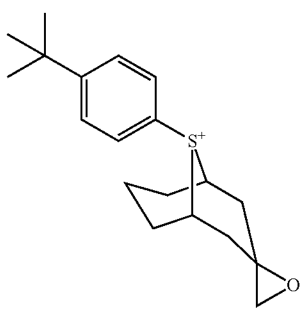
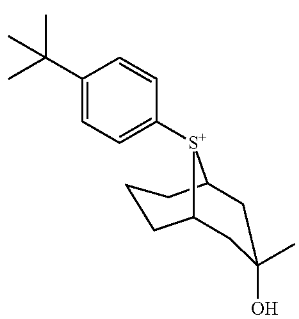
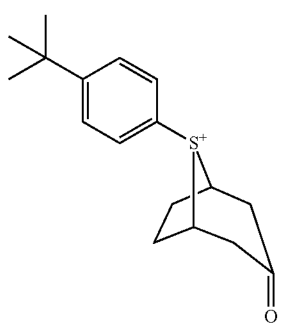
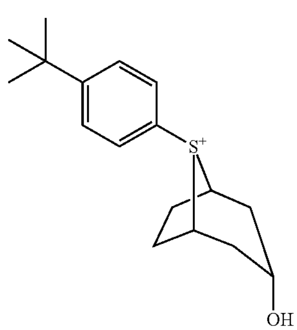
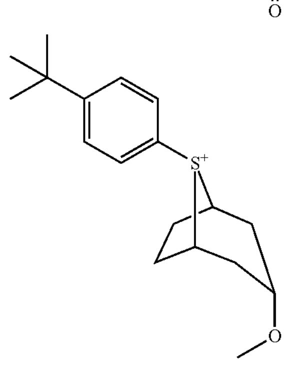
-continued
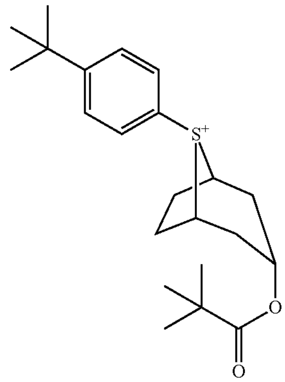
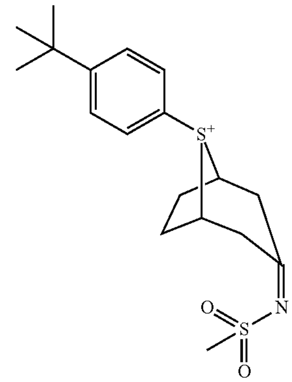
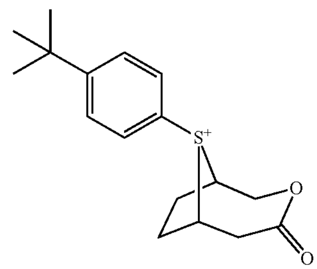
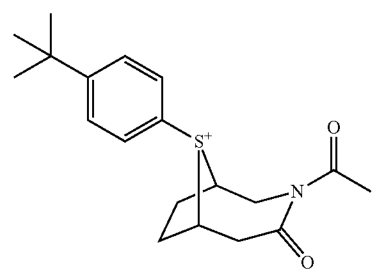
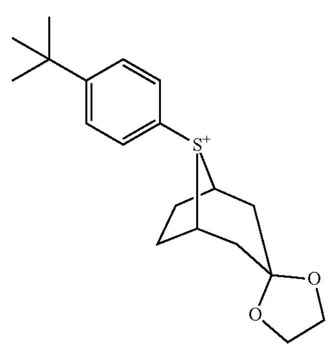
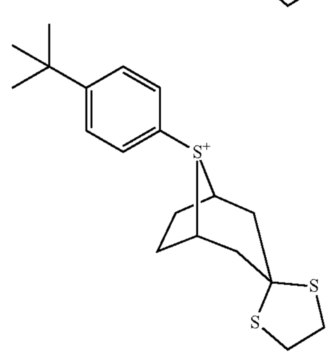

-continued
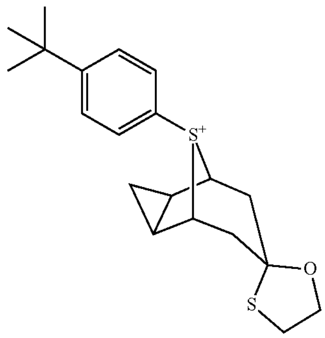
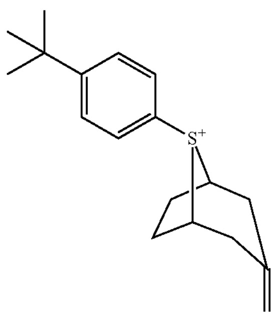
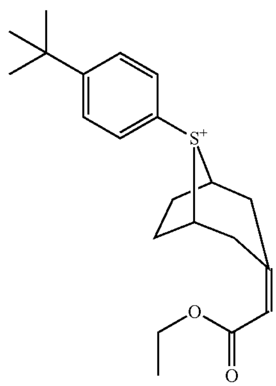
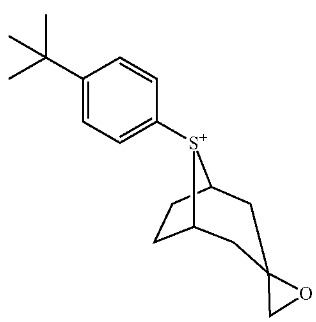
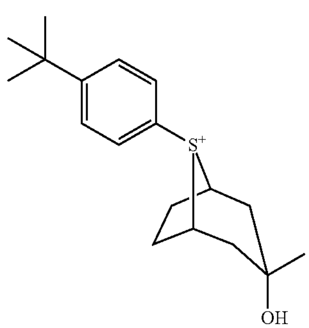
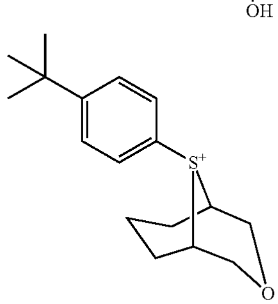
-continued
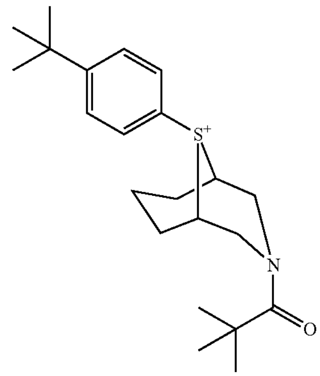
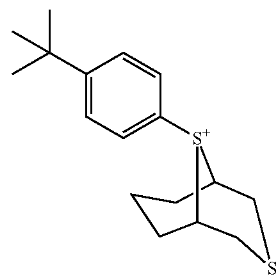
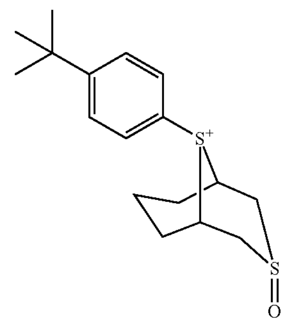
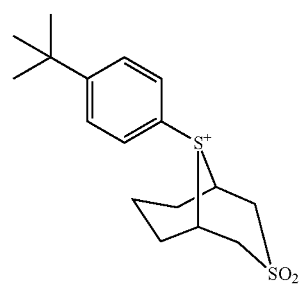
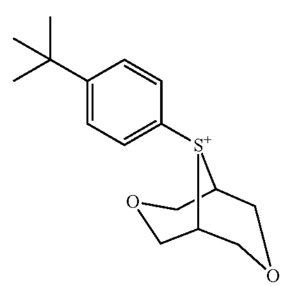
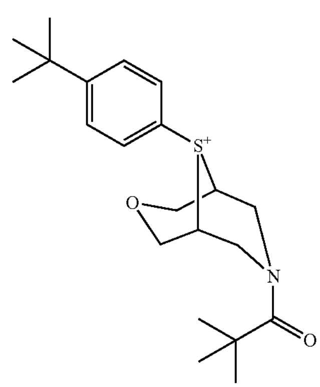

-continued
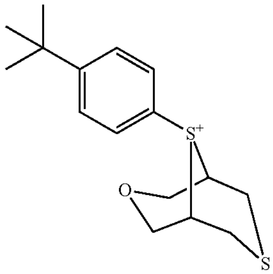
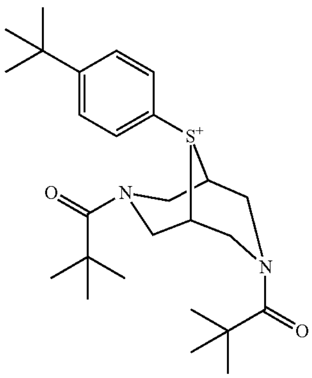
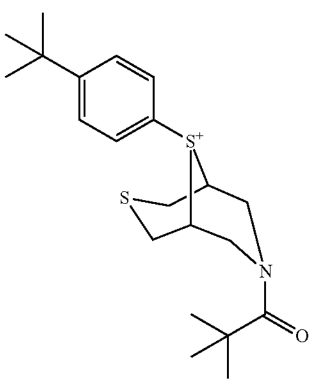
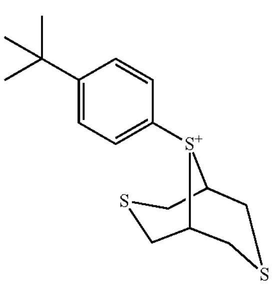
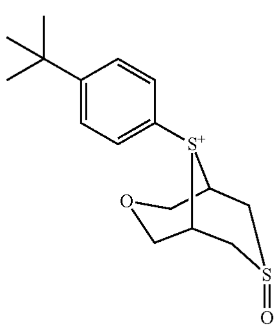
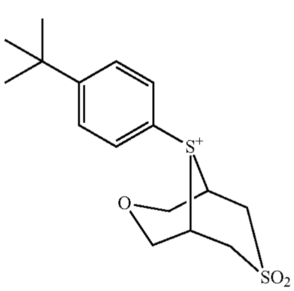
-continued
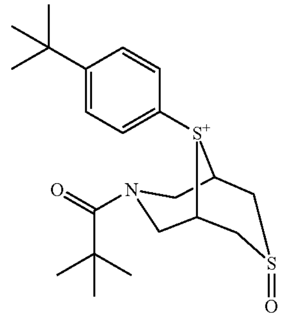
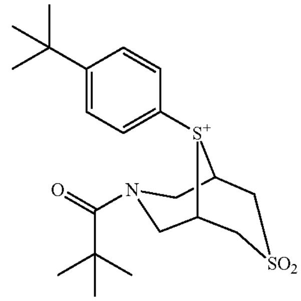
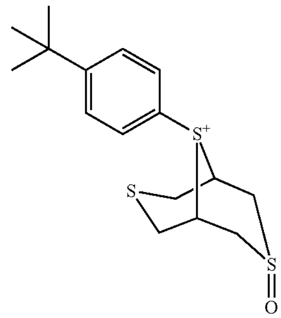
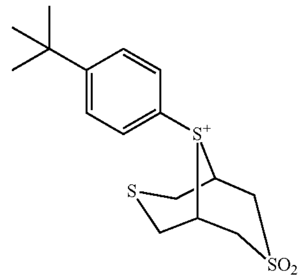
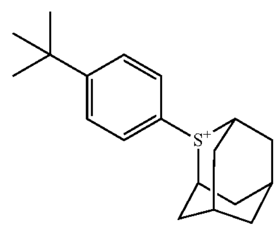
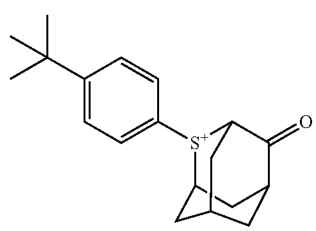
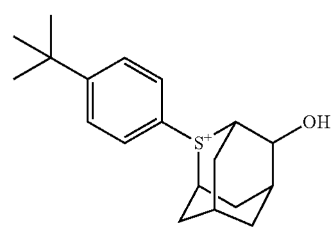
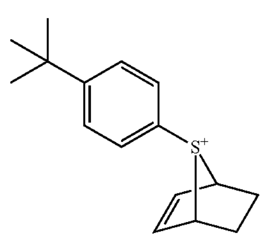
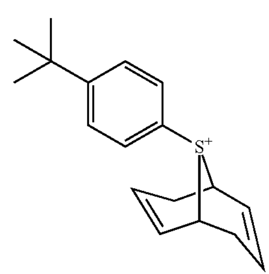

-continued

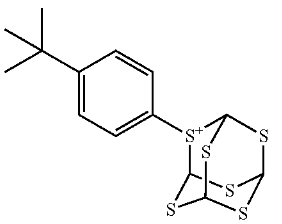

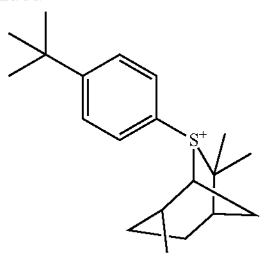

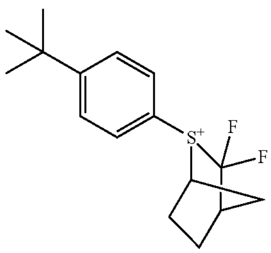

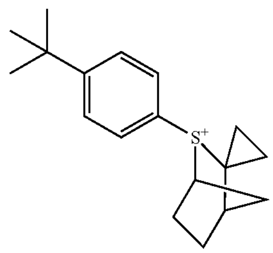

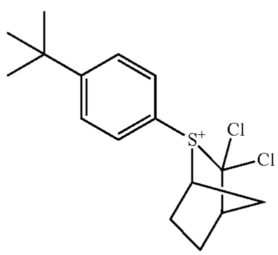

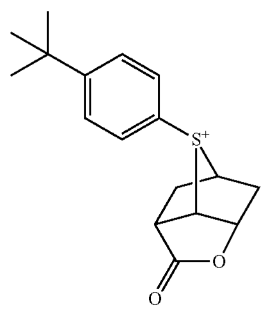

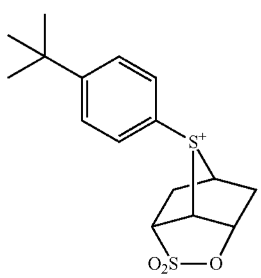

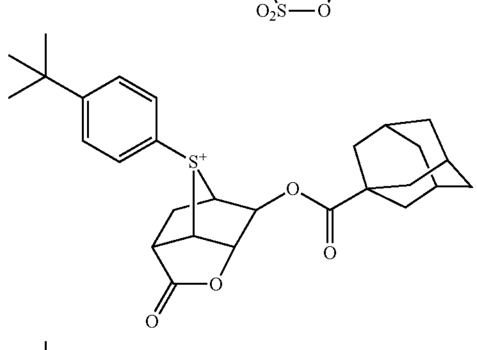

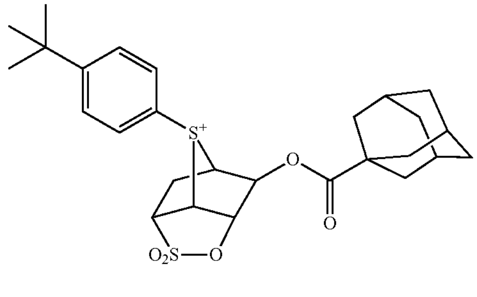

-continued

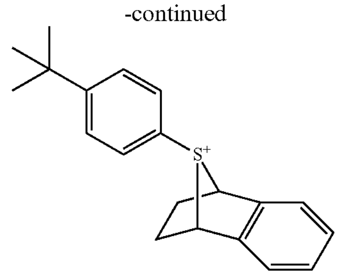

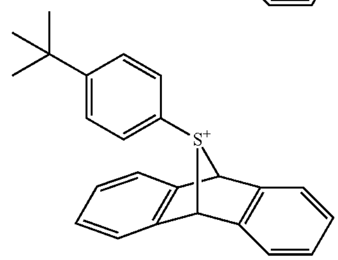

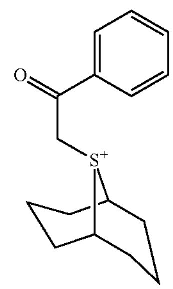

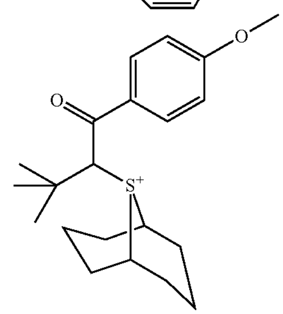

.

4. A chemically amplified resist composition comprising the photoacid generator of claim 1, a base resin, and an organic solvent.

5. The resist composition of claim 4 wherein the base resin is a polymer comprising recurring units having the formula (a) and recurring units having the formula (b):

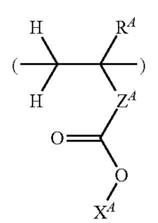

(a)

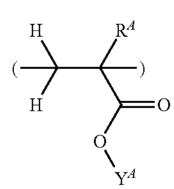

(b)

wherein $R^A$ is each independently hydrogen, fluorine, methyl or trifluoromethyl, $Z^A$ is a single bond, phenylene group, naphthylene group or (backbone)-C(═O)—O—$Z^B$—, $Z^B$ is a $C_1$-$C_{10}$ alkanediyl group which may contain a hydroxyl radical, ether bond, ester bond or lactone ring, or phenylene group or naphthylene group, $X^A$ is an acid labile group, and $Y^A$ is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

6. The resist composition of claim 4, further comprising another photoacid generator.

7. The resist composition of claim 4, further comprising a quencher.

8. The resist composition of claim 4, further comprising a surfactant which is insoluble or substantially insoluble in water and soluble in alkaline developer, and/or a surfactant which is insoluble or substantially insoluble in water and alkaline developer.

9. A pattern forming process comprising the steps of applying the chemically amplified resist composition of claim 4 onto a substrate to form a resist film, exposing the resist film to high-energy radiation, and developing the exposed resist film in a developer.

10. The process of claim 9 wherein the exposure step is carried out by immersion lithography using a liquid having a refractive index of at least 1.0 between the resist film and a projection lens.

11. The process of claim 10, further comprising the step of coating a protective film on the resist film prior to the exposure step, wherein immersion lithography is carried out while the liquid is held between the protective film and the projection lens.

12. The process of claim 9 wherein the high-energy radiation is KrF excimer laser, ArF excimer laser, EB or EUV having a wavelength of 3 to 15 nm.

* * * * *